US010381443B2

(12) United States Patent
Matsumoto et al.

(10) Patent No.: US 10,381,443 B2
(45) Date of Patent: Aug. 13, 2019

(54) BULB-SHAPED MEMORY STACK STRUCTURES FOR DIRECT SOURCE CONTACT IN THREE-DIMENSIONAL MEMORY DEVICE

(71) Applicant: SANDISK TECHNOLOGIES LLC, Plano, TX (US)

(72) Inventors: Kazuyo Matsumoto, Yokkaichi (JP); Yasuo Kasagi, Yokkaichi (JP); Satoshi Shimizu, Yokkaichi (JP); Hiroyuki Ogawa, Yokkaichi (JP); Yohei Masamori, Yokkaichi (JP); Jixin Yu, Milpitas, CA (US); Tong Zhang, Palo Alto, CA (US); James Kai, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/976,442

(22) Filed: May 10, 2018

(65) Prior Publication Data

US 2018/0261671 A1 Sep. 13, 2018

Related U.S. Application Data

(62) Division of application No. 15/458,200, filed on Mar. 14, 2017, now Pat. No. 9,985,098.

(Continued)

(51) Int. Cl.

*H01L 29/10* (2006.01)
*H01L 27/1157* (2017.01)

(Continued)

(52) U.S. Cl.

CPC ...... *H01L 29/1037* (2013.01); *H01L 27/1157* (2013.01); *H01L 27/11524* (2013.01);

(Continued)

(58) Field of Classification Search

CPC ......... H01L 27/11582; H01L 27/11573; H01L 27/1157; H01L 27/11565; H01L 27/11556;

(Continued)

(56) References Cited

U.S. PATENT DOCUMENTS

| | | | | |
|---|---|---|---|---|
| 5,915,167 A * | 6/1999 | Leedy | G11C 5/02 | 257/E21.597 |
| 7,005,350 B2 * | 2/2006 | Walker | H01L 27/115 | 257/344 |

(Continued)

FOREIGN PATENT DOCUMENTS

| | | |
|---|---|---|
| JP | 2015149413 A | 8/2015 |
| WO | WO2002/015277 A2 | 2/2002 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Allen L Parker
*Assistant Examiner* — Charles N Ausar-El
(74) *Attorney, Agent, or Firm* — The Marbury Law Group PLLC

(57) ABSTRACT

A etch stop semiconductor rail is formed within a source semiconductor layer. A laterally alternating stack of dielectric rails and sacrificial semiconductor rails is formed over the source semiconductor layer and the etch stop semiconductor rail. After formation of a vertically alternating stack of insulating layers and spacer material layers, memory stack structures are formed through the vertically alternating stack and through interfaces between the sacrificial semiconductor rails and the dielectric rails. A backside trench is formed through the vertically alternating stack employing (Continued)

the etch stop semiconductor rail as an etch stop structure. Source strap rails providing lateral electrical contact to semiconductor channels of the memory stack structures are formed by replacement of sacrificial semiconductor rails with source strap rails.

10 Claims, 133 Drawing Sheets

Related U.S. Application Data

(60) Provisional application No. 62/416,859, filed on Nov. 3, 2016, provisional application No. 62/417,575, filed on Nov. 4, 2016.

(51) Int. Cl.
*H01L 27/11524* (2017.01)
*H01L 27/11529* (2017.01)
*H01L 27/11556* (2017.01)
*H01L 27/11565* (2017.01)
*H01L 27/11573* (2017.01)
*H01L 27/11582* (2017.01)

(52) U.S. Cl.
CPC .. *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ......... H01L 27/11529; H01L 27/11524; H01L 29/1037
See application file for complete search history.

(56) References Cited

U.S. PATENT DOCUMENTS 7,023,739 B2 * 4/2006 Chen .................. G11C 11/5671 365/185.02
7,177,191 B2 * 2/2007 Fasoli ................ G11C 16/0483 257/E27.103
7,221,588 B2 * 5/2007 Fasoli .................... G11C 16/04 257/314
7,233,522 B2 * 6/2007 Chen .................. G11C 16/0483 257/E21.663
7,514,321 B2 * 4/2009 Mokhlesi .............. H01L 27/115 257/315
7,575,973 B2 * 8/2009 Mokhlesi .............. H01L 27/115 257/E21.103
7,696,559 B2 * 4/2010 Arai ...................... H01L 27/105 257/315
7,745,265 B2 * 6/2010 Mokhlesi .......... H01L 27/11582 257/E21.598
7,808,038 B2 * 10/2010 Mokhlesi .............. H01L 27/115 257/302
7,848,145 B2 * 12/2010 Mokhlesi .......... H01L 27/11568 365/185.05
7,851,851 B2 * 12/2010 Mokhlesi .............. H01L 27/115 257/326
8,008,710 B2 * 8/2011 Fukuzumi ................ G11C 5/02 257/326
8,053,829 B2 * 11/2011 Kang .................... H01L 27/115 257/324
8,187,936 B2 5/2012 Alsmeier et al.
8,394,716 B2 * 3/2013 Hwang ............ H01L 27/11551 257/315
9,230,979 B1 * 1/2016 Pachamuthu ..... H01L 27/11575
9,245,962 B1 * 1/2016 Yang ................. H01L 29/42344
9,356,031 B2 * 5/2016 Lee ................... H01L 27/11521
9,449,980 B2 * 9/2016 Rabkin ................. H01L 29/408
9,449,987 B1 * 9/2016 Miyata ............. H01L 27/11582
9,455,263 B2 9/2016 Zhang et al.
9,548,313 B2 * 1/2017 Yada ................ H01L 27/11524
9,576,967 B1 * 2/2017 Kimura ............ H01L 27/11565
9,601,508 B2 * 3/2017 Sel .......................... H01L 29/04
9,627,405 B1 * 4/2017 Lee ...................... H01L 27/1158
9,659,956 B1 * 5/2017 Pachamuthu ..... H01L 27/11575
9,711,532 B2 7/2017 Miyamoto et al.
9,799,670 B2 10/2017 Nishikawa et al.
9,831,266 B2 11/2017 Kai et al.
9,985,098 B2 5/2018 Matsumoto et al.
10,147,875 B1 * 12/2018 Hansen ................... H01L 45/12
10,224,340 B2 * 3/2019 Hada ................ H01L 27/11565
2007/0210338 A1 * 9/2007 Orlowski .......... H01L 29/66825 257/213
2007/0252201 A1 * 11/2007 Kito .................... H01L 21/8221 257/331
2009/0230449 A1 * 9/2009 Sakaguchi .......... H01L 27/0688 257/298
2009/0242967 A1 * 10/2009 Katsumata ........... H01L 21/764 257/324
2010/0044778 A1 * 2/2010 Seol ................. H01L 21/28273 257/326
2010/0112769 A1 * 5/2010 Son ..................... H01L 21/8221 438/261
2010/0120214 A1 * 5/2010 Park ................. H01L 27/11578 438/287
2010/0133598 A1 * 6/2010 Chae ................ H01L 27/11551 257/314
2010/0155810 A1 * 6/2010 Kim ................. H01L 27/11548 257/316
2010/0155818 A1 * 6/2010 Cho ................. H01L 27/11578 257/324
2010/0181610 A1 * 7/2010 Kim ................. H01L 27/11578 257/314
2010/0207195 A1 * 8/2010 Fukuzumi .......... G11C 16/0483 257/326
2010/0320528 A1 * 12/2010 Jeong .................... H01L 27/105 257/324
2011/0076819 A1 * 3/2011 Kim ................. H01L 27/11551 438/279
2011/0133606 A1 * 6/2011 Yoshida ................. H02N 2/004 310/356
2011/0266606 A1 11/2011 Park et al.
2012/0001247 A1 * 1/2012 Alsmeier .......... H01L 27/11551 257/316
2012/0001249 A1 * 1/2012 Alsmeier .......... H01L 27/11551 257/319
2012/0001250 A1 * 1/2012 Alsmeier .......... H01L 27/11551 257/319
2012/0001252 A1 * 1/2012 Alsmeier .......... H01L 27/11551 257/321
2012/0012920 A1 * 1/2012 Shin ................. H01L 27/11578 257/324
2012/0068255 A1 * 3/2012 Lee ................... H01L 27/11582 257/324
2012/0119287 A1 * 5/2012 Park ................. H01L 27/11519 257/329
2012/0199897 A1 * 8/2012 Chang ................ H01L 21/8221 257/314
2013/0168757 A1 * 7/2013 Hong .................. H01L 29/7926 257/324
2013/0193503 A1 * 8/2013 Lee ................... H01L 27/11573 257/314
2013/0248974 A1 * 9/2013 Alsmeier ............... G11C 16/04 257/321
2013/0264631 A1 * 10/2013 Alsmeier .......... H01L 21/28282 257/324
2015/0149413 A1 * 5/2015 Lee ..................... G06F 16/2386 707/643
2015/0162342 A1 * 6/2015 Lee ................... H01L 27/11582 257/324
2015/0179660 A1 * 6/2015 Yada ................ H01L 21/02164 257/321
2015/0380418 A1 * 12/2015 Zhang ............... H01L 27/11529 257/326
2016/0071861 A1 * 3/2016 Serov ................ H01L 27/11556 365/185.19

(56) References Cited

U.S. PATENT DOCUMENTS

| | | | | |
|---|---|---|---|---|
| 2016/0071881 | A1* | 3/2016 | Lee | H01L 27/11582 257/314 |
| 2016/0079272 | A1* | 3/2016 | Lee | H01L 27/11582 438/269 |
| 2016/0141294 | A1* | 5/2016 | Peri | H01L 21/28512 257/324 |
| 2016/0148946 | A1* | 5/2016 | Hironaga | H01L 27/11556 257/324 |
| 2016/0181264 | A1* | 6/2016 | Miyamoto | H01L 27/11524 257/314 |
| 2016/0240533 | A1* | 8/2016 | Oxland | H01L 27/092 |
| 2016/0322381 | A1* | 11/2016 | Liu | H01L 27/11573 |
| 2017/0025421 | A1* | 1/2017 | Sakakibara | H01L 21/28273 |
| 2017/0117288 | A1* | 4/2017 | Maegawa | H01L 27/11556 |
| 2017/0194346 | A1* | 7/2017 | Lee | H01L 29/66833 |
| 2017/0271261 | A1* | 9/2017 | Tsutsumi | H01L 27/11565 |
| 2017/0271352 | A1* | 9/2017 | Nakamura | H01L 27/1157 |
| 2018/0122905 | A1 | 5/2018 | Ogawa et al. | |
| 2018/0122906 | A1 | 5/2018 | Yu et al. | |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

International Application No. PCT/US2016/049986, Invitation to Pay Additional Fees, dated Dec. 22, 2016, 8pgs.

International Application No. PCT/US2016/062528, Invitation to Pay Additional Fees, dated Feb. 3, 2017, 8pgs.

Invitation to Pay Additional Fees, Where Applicable, Protest Fee from the International Searching Authority for International Patent Application No. PCT/US2017/050367, dated Jan. 25, 2018, 6 pages.

U.S. Patent and Trademark Office Communication, Non-Final Office Action, U.S. Appl. No. 15/458,269, dated Dec. 29, 2017, 28 pages.

U.S. Patent and Trademark Office Communication, Non-Final Office Action, U.S. Appl. No. 15/458,272, dated Dec. 18, 2017, 28 pages.

Transmittal of International Preliminary Report on Patentability and Written Opinion for International Patent Application No. PCT/US2017/050367, dated May 16, 2019, 14 pages.

* cited by examiner

BULB-SHAPED MEMORY STACK STRUCTURES FOR DIRECT SOURCE CONTACT IN THREE-DIMENSIONAL MEMORY DEVICE

RELATED APPLICATIONS

This application is a divisional of U.S. application Ser. No. 15/458,200 filed on Mar. 14, 2017, which claims the benefit of priority of U.S. Provisional Application Ser. No. 62/416,859 filed on Nov. 3, 2016 and 62/417,575 filed on Nov. 4, 2016, the entire contents of which are incorporated herein by reference in their entirety.

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh et al., titled “Novel Ultra High Density Memory With A Stacked-Surrounding Gate Transistor (S-SGT) Structured Cell”, IEDM Proc. (2001) 33-36.

SUMMARY

According to an aspect of the present disclosure, a three-dimensional memory device is provided, which comprises: a vertically alternating stack of electrically conductive layers and insulating layers located over a source semiconductor layer over a substrate; an array of memory stack structures that extend through the vertically alternating stack and into an upper portion of the source semiconductor layer, each memory stack structure including a semiconductor channel and a memory film laterally surrounding the semiconductor channel, wherein a lower portion of each memory stack structure has a bulging portion that has a greater lateral dimension than an overlying portion of the respective memory stack structure that adjoins a top end of the bulging portion; and at least one source strap structure contacting a respective subset of the semiconductor channels of the memory stack structures at a level of the bulging portion of each memory stack structure.

According to another aspect of the present disclosure, a method of forming a three-dimensional memory device is provided, which comprises the steps of: forming at least one sacrificial semiconductor structure over a substrate; forming source-level memory openings at a level of the at least one sacrificial semiconductor structure; forming sacrificial semiconductor pedestals within the source-level memory openings; forming a vertically alternating stack of insulating layers and spacer material layers over the at least one sacrificial structure, wherein the spacer material layers are formed as, or are subsequently replaced with, electrically conductive layers; forming memory openings through the vertically alternating stack by etching through the vertically alternating stack and removing the sacrificial semiconductor pedestals, wherein each of the memory openings includes a volume of a respective one of the sacrificial semiconductor pedestals; forming memory stack structures in the memory openings, each memory stack structure including a semiconductor channel and a memory film laterally surrounding the semiconductor channel; forming at least one source cavity by removing the at least one sacrificial semiconductor structure and portions of each memory film adjacent to the at least one sacrificial semiconductor structure; and forming at least one source strap structure in the at least one source cavity and directly on sidewalls of the semiconductor channels.

According to yet another aspect of the present disclosure, a method of forming a three-dimensional memory device is provided, which comprises the steps of: forming a source conductive layer on a substrate; forming a laterally alternating stack of sacrificial semiconductor rails and dielectric rails over the source conductive layer; forming a vertically alternating stack of insulating layers and spacer material layers over the laterally alternating stack, wherein the spacer material layers are formed as, or are subsequently replaced with, electrically conductive layers; forming memory openings through the vertically alternating stack by etching through the vertically alternating stack, wherein a bottom portion of each of the memory openings extends through the laterally alternating stack of sacrificial semiconductor rails and dielectric rails in a processing step; laterally expanding each bottom portion of the memory openings by partially etching the sacrificial semiconductor rails selective to the dielectric rails; forming memory stack structures in the memory openings after the memory openings are laterally expanded, each memory stack structure including a semiconductor channel and a memory film laterally surrounding the semiconductor channel; forming source cavities by removing the sacrificial semiconductor rails and portions of each memory film adjacent to the sacrificial semiconductor rails; and forming source strap rails in the source cavities and directly on sidewalls of the semiconductor channels.

According to even another aspect of the present disclosure, a three-dimensional memory device is provided, which comprises: a thickness-modulated source semiconductor layer located over a substrate and including a recess region; source strap material portions located over the source semiconductor layer, and the recess region is filled by a same semiconductor material as the source strap material portions; a vertically alternating stack of electrically conductive layers and insulating layers located over the source strap material portions; and an array of memory stack structures that extend through the vertically alternating stack and into an upper portion of the source semiconductor layer, each memory stack structure including a semiconductor channel and a memory film laterally surrounding the semiconductor channel and including an opening through which a respective one of the source strap material portions contacts the semiconductor channel.

According to still another aspect of the present disclosure, a method of forming a three-dimensional memory device is provided, which comprises the steps of: forming a source conductive layer over a substrate; forming a sacrificial semiconductor line and sacrificial semiconductor material portions, wherein the sacrificial semiconductor material portions overlie a topmost surface of the source conductive layer, and the sacrificial semiconductor line overlies a recessed surface of the source conductive layer and is adjoined to the sacrificial semiconductor material portions; forming a vertically alternating stack of insulating layers and spacer material layers over the sacrificial semiconductor line, wherein the spacer material layers are formed as, or are subsequently replaced with, electrically conductive layers; forming memory stack structures through the vertically alternating stack and the sacrificial semiconductor material portions, each memory stack structure including a semiconductor channel and a memory film laterally surrounding the semiconductor channel; forming a backside trench through the vertically alternating stack by an anisotropic etch process that employs the sacrificial semiconductor line as an etch stop structure; forming source cavities by removing the sacrificial semiconductor line, the sacrificial semiconductor material portions, and portions of each memory film adjacent to the sacrificial semiconductor material portions; and forming source strap material portions in the source cavities and directly on sidewalls of the semiconductor channels.

According to another embodiment of the present disclosure, a three-dimensional memory device is provided, which comprises: a source semiconductor layer located over a substrate; an etch stop semiconductor rail located in a trench in the source semiconductor layer; a laterally alternating stack of source strap rails and dielectric rails located over the source semiconductor layer and the etch stop semiconductor rail and having a different composition than the etch stop semiconductor rail, wherein each of the source strap rails and the dielectric rails laterally extends along a first horizontal direction, the etch stop semiconductor rail laterally extends along a second horizontal direction, and the source strap rails straddle the etch stop semiconductor rail; a vertically alternating stack of electrically conductive layers and insulating layers located over the laterally alternating stack of the source strap rails and the dielectric rails; an array of memory stack structures that extend through the vertically alternating stack and into an upper portion of the source semiconductor layer, each memory stack structure including a semiconductor channel and a memory film laterally surrounding the semiconductor channel and including an opening through which a respective one of the source strap rails contacts the semiconductor channel.

According to yet another aspect of the present disclosure, a method of forming a three-dimensional memory device is provided, which comprises the steps of: forming a source semiconductor layer over a substrate; forming a line trench through the source conductive layer; forming a etch stop semiconductor rail within the line trench; forming a laterally alternating stack of dielectric rails and sacrificial semiconductor rails over the source conductive layer and the etch stop semiconductor rail; forming a vertically alternating stack of insulating layers and spacer material layers over the laterally alternating stack, wherein the spacer material layers are formed as, or are subsequently replaced with, electrically conductive layers; forming memory stack structures through the vertically alternating stack and the laterally alternating stack, each memory stack structure including a semiconductor channel and a memory film laterally surrounding the semiconductor channel; forming a backside trench through the vertically alternating stack and the laterally alternating stack by an anisotropic etch process that employs the etch stop semiconductor rail as an etch stop structure; forming source cavities by removing the sacrificial semiconductor rails and portions of each memory film adjacent to the sacrificial semiconductor rails; and forming source strap rails in the source cavities and directly on sidewalls of the semiconductor channels.

BRIEF DESCRIPTION OF THE DRAWINGS

FIG. 82 is vertical cross-sectional view of the sixth exemplary structure after formation of a backside trench according to the sixth embodiment of the present disclosure.

FIG. 83 is a vertical cross-sectional view of the sixth exemplary structure after formation of source cavities according to the sixth embodiment of the present disclosure.

FIG. 84 is a vertical cross-sectional view of the sixth exemplary structure after removal of physically exposed portions of memory films according to the sixth embodiment of the present disclosure.

FIG. 85 is a vertical cross-sectional view of the sixth exemplary structure after formation of source strap rails according to the sixth embodiment of the present disclosure.

FIG. 86A is a vertical cross-sectional view of the sixth exemplary structure after formation of electrically conductive layers, an insulating wall structure, and various contact via structures according to the sixth embodiment of the present disclosure.

FIG. 86B is a vertical cross-sectional view of another region of the sixth exemplary structure of FIG. 86A.

FIG. 87 is a vertical cross-sectional view of the seventh exemplary structure after formation of a first alternating stack of first insulating layers and first sacrificial material layers according to the seventh embodiment of the present disclosure.

FIG. 88 is a vertical cross-sectional view of the seventh exemplary structure after formation of first-tier sacrificial fill structures according to the seventh embodiment of the present disclosure.

FIG. 89 is a vertical cross-sectional view of the seventh exemplary structure after formation of memory stack structures, dielectric cores, and drain regions according to the seventh embodiment of the present disclosure.

FIG. 90 is vertical cross-sectional view of the seventh exemplary structure after formation of a backside trench according to the seventh embodiment of the present disclosure.

FIG. 91 is a vertical cross-sectional view of the seventh exemplary structure after formation of source cavities according to the seventh embodiment of the present disclosure.

FIG. 92 is a vertical cross-sectional view of the seventh exemplary structure after removal of physically exposed portions of memory films according to the seventh embodiment of the present disclosure.

Figure 93:
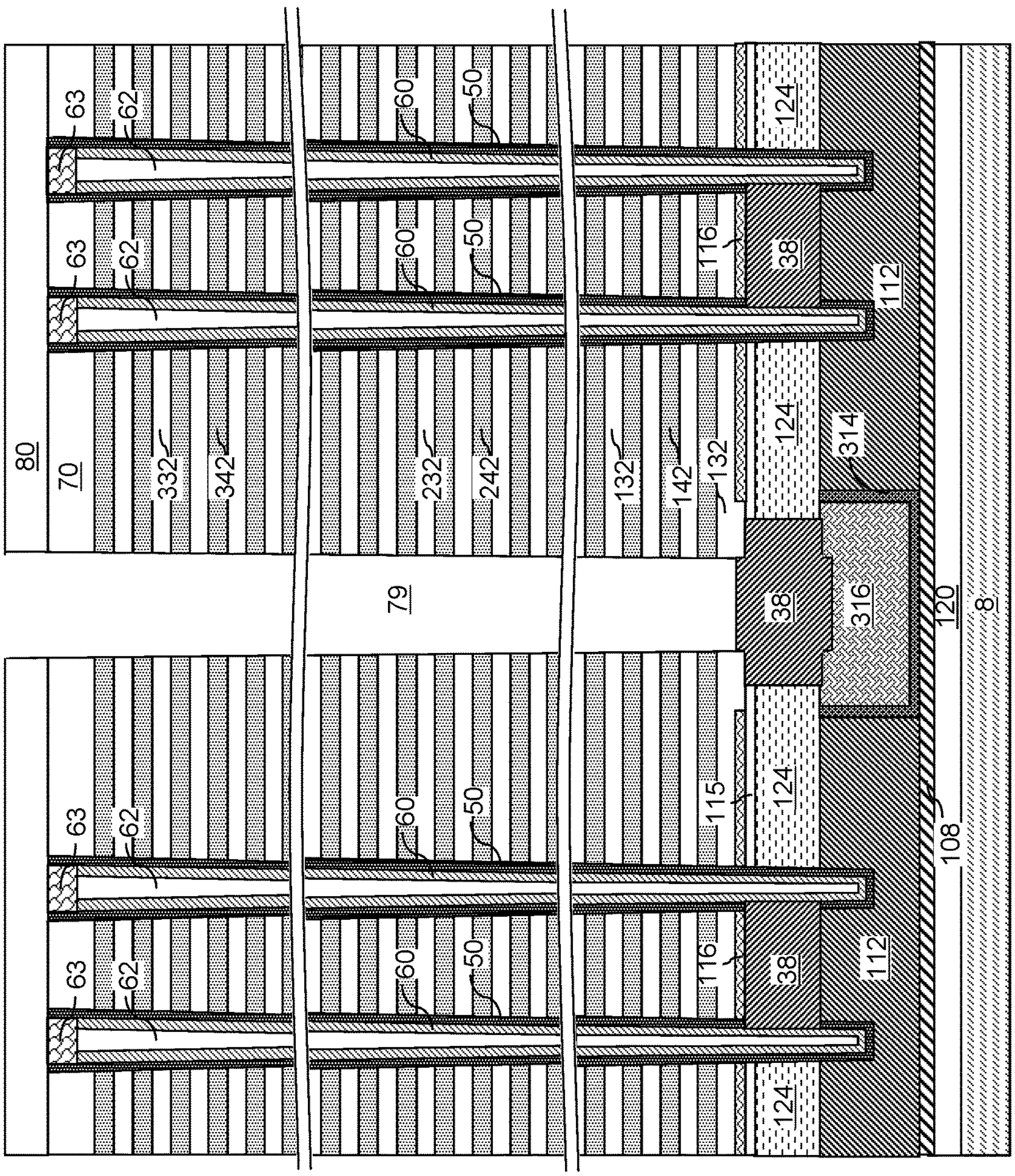

FIG. 93 is a vertical cross-sectional view of the seventh exemplary structure after formation of source strap rails according to the seventh embodiment of the present disclosure.

Figure 94:
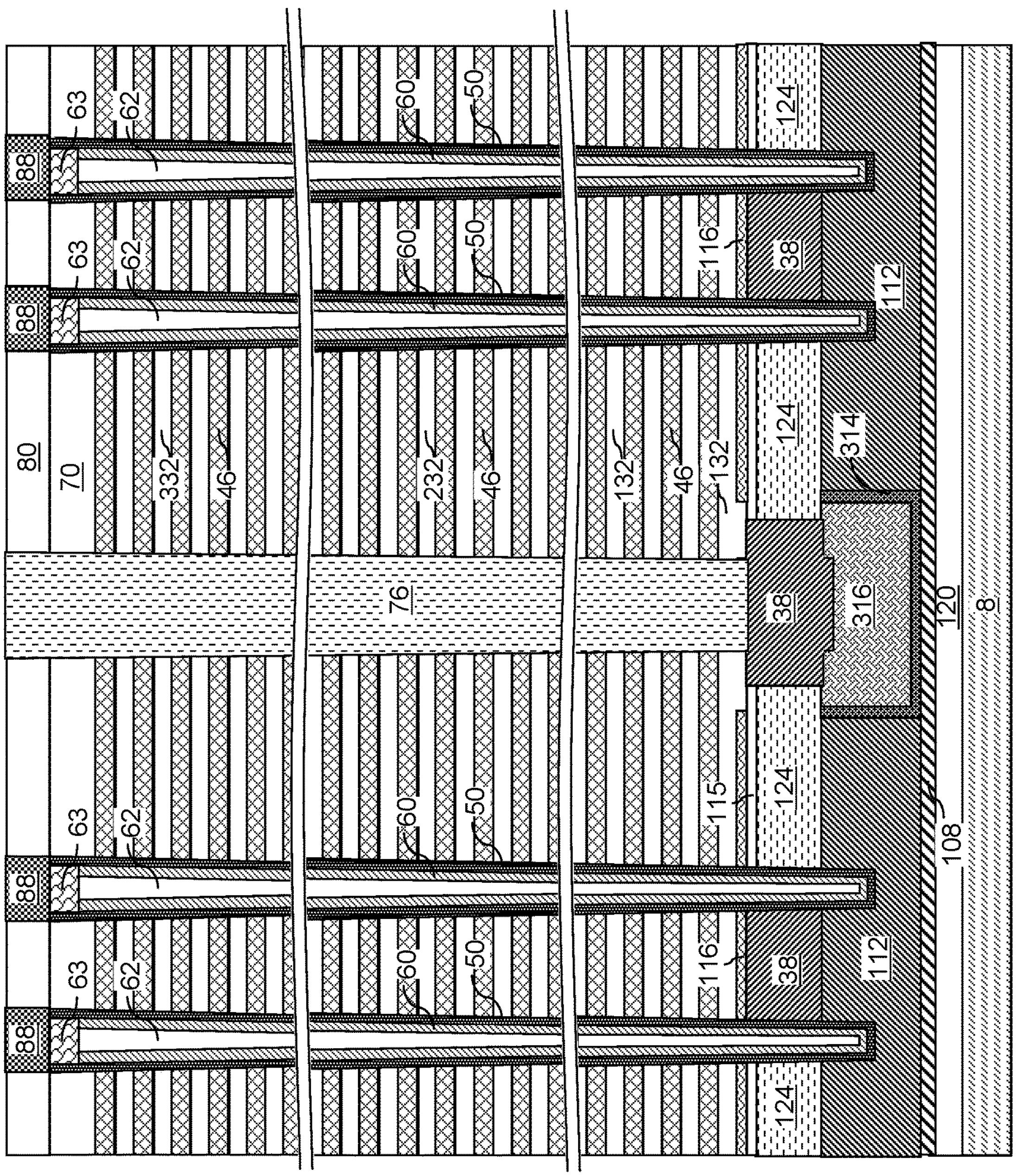

FIG. 94 is a vertical cross-sectional view of the seventh exemplary structure after formation of electrically conductive layers, an insulating wall structure, and various contact via structures according to the seventh embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
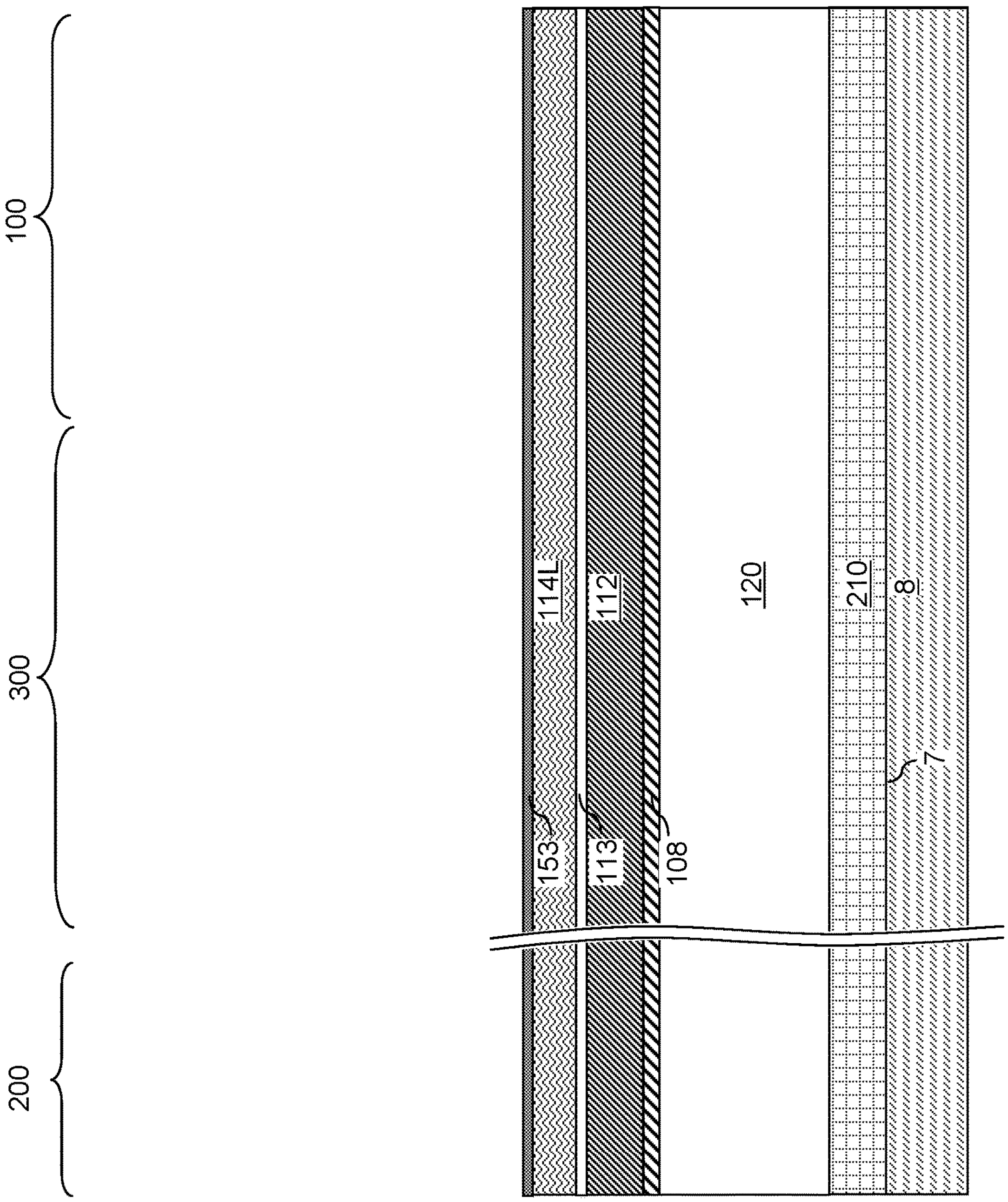
FIG. 1 is a vertical cross-sectional view of a first exemplary structure after formation of a metallic source layer, a source semiconductor layer, a first dielectric liner, a sacrificial semiconductor layer, and a cap insulator layer according to a first embodiment of the present disclosure.

Referring to FIG. 1, a first exemplary structure according to a first embodiment of the present disclosure is illustrated. The first exemplary structure includes a substrate 8, which can be a semiconductor substrate such as a silicon substrate. The substrate 8 can include a substrate semiconductor layer. The substrate semiconductor layer may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate 8 can have a major surface 7, which can be, for example, a topmost surface of the substrate semiconductor layer. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, semiconductor devices 210 can be optionally formed on the substrate 8. The semiconductor devices 210 can include, for example, field effect transistors including respective source regions, drain regions, channel regions, and gate structures. Shallow trench isolation structures (not expressly shown) can be formed in an upper portion of the semiconductor substrate 8 to provide electrical isolation among the semiconductor devices. The semiconductor devices 210 can include any semiconductor circuitry to support operation of a memory structure to be subsequently formed, which is typically referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer can be optionally formed over the semiconductor devices 210 and/or the substrate 8, which is herein referred to as at least one lower level dielectric layer 120. The at least one lower level dielectric layer 120 functions as a matrix for lower level metal interconnect structures (not explicitly shown) that provide electrical wiring among the various nodes of the semiconductor devices 210 and landing pads for through-memory-level via structures to be subsequently formed. The lower level metal interconnect structures can include various device contact via structures, lower level metal lines, lower level via structures, and lower level topmost metal structures that are configured to function as landing pads for through-memory-level via structures to be subsequently formed.

The first exemplary structure can include a memory array region 100, a contact region 300, and an optional peripheral device region 200. An array of memory stack structures can be subsequently formed in the memory array region 100 and over the at least one lower level dielectric layer 120 (if present). Contacts to word lines of the memory stack structures can be subsequently formed in the contact region 300. If present, additional semiconductor devices and/or through-memory-level via structures can be formed in the peripheral device region 200. The semiconductor devices 200 may be present in any, and/or each, of the areas of the memory array region 100, the contact region 300, and the peripheral device region 200. The region of the semiconductor devices 210 and the combination of the at least one lower level dielectric layer 120 and the lower level metal interconnect structures embedded therein is herein referred to an underlying peripheral device region, which may be located underneath a memory-level assembly to be subsequently formed and includes peripheral devices for the memory-level assembly. The semiconductor devices 210 and the at least one lower level dielectric layer 120 are optional, and thus, may be omitted.

An optionally metallic source layer 108, a source semiconductor layer 112, a first dielectric liner 113, a sacrificial semiconductor layer 114L, and a cap insulator layer 153 can be sequentially formed over the at least one lower level dielectric layer 120 and/or the substrate 8. The optional metallic source layer 108 includes a metallic material such as an elemental metal (such as tungsten), an intermetallic alloy of at least two elemental metals, a conductive metal nitride (such as TiN), or a metal silicide (such as cobalt silicide, nickel silicide, or tungsten silicide). The optional metallic source layer 108 provides a highly conductive horizontal current path for source electrodes to be subsequently formed. The optional metallic source layer 108 can be formed by a conformal deposition method or a non-conformal deposition method, and can have a thickness in a range from 20 nm to 200 nm, although lesser and greater thicknesses can also be employed.

The source semiconductor layer 112 includes a doped semiconductor material. The dopant concentration of the source semiconductor layer 112 can be in a range from $1.0\times10^{19}/cm^3$ to $2.0\times10^{21}/cm^3$, although lesser and greater dopant concentrations can also be employed. In one embodiment, the source semiconductor layer 112 can include n-doped polysilicon, n-doped amorphous silicon that is converted into n-doped polysilicon in a subsequent processing step (such as an anneal process), or any p-doped or n-doped polycrystalline semiconductor material or any p-doped or n-doped amorphous semiconductor material that can be subsequently converted into a polycrystalline semiconductor material. In one embodiment, the type of doping of the source semiconductor layer 112 can be the same as the type of charge carriers injected into channels of memory stack structures to be subsequently formed. For example, if electrons are injected into the channels of the memory stack structures to be subsequently formed, the source semiconductor layer 112 can be n-doped. The type of doping of the source semiconductor layer 112 is herein referred to as a first conductivity type. The source semiconductor layer 112 can be deposited by a conformal deposition method (such as chemical vapor deposition) or a non-conformal deposition method. The thickness of the source semiconductor layer 112 can be in a range from 30 nm to 600 nm, although lesser and greater thicknesses can also be employed.

The first dielectric liner 113 includes a dielectric material that can function as an etch stop layer during removal of a sacrificial semiconductor material to be subsequently employed. For example, the first dielectric liner 113 can include doped silicate glass or undoped silicate glass (i.e., silicon oxide). The first dielectric liner 113 can include a doped silicate glass having a greater etch rate in hydrofluoric acid than thermal oxide by a factor of at least 2 (which may be, for example, in a range from 3 to 30). The first dielectric liner 113 can be deposited by a plasma enhanced chemical vapor deposition (PECVD) or low pressure chemical vapor deposition (LPCVD). The thickness of the first dielectric liner 113, as measured at horizontal portions, can be in a range from 10 nm to 50 nm, although lesser and greater thicknesses can also be employed.

The sacrificial semiconductor layer 114L includes a semiconductor material that can be removed selective to the first dielectric liner 113 by an etch process. As used herein, a removal of a first material is “selective to” a second material if the removal process removes the first material at a rate that is at least twice the rate of removal of the second material. The ratio of the rate of removal of the first material to the rate of removal of the second material is herein referred to as a “selectivity” of the removal process for the first material with respect to the second material. For example, the sacrificial semiconductor layer 114L can include amorphous silicon, an amorphous silicon-germanium alloy, or a polycrystalline semiconductor material. The semiconductor material of the sacrificial semiconductor layer 114L may be intrinsic, p-doped, or n-doped. In one embodiment, the semiconductor material of the sacrificial semiconductor material layer 114L may be deposited without intentional doping with electrical dopants, and may be intrinsic or “lightly doped,” i.e., have a doping at a dopant concentration less than $3.0\times10^{15}/cm^3$ caused by residual dopants incorporated during a deposition process that does not flow a dopant gas including p-type dopant atoms or n-type dopant atoms. The sacrificial semiconductor layer 114L can be deposited by chemical vapor deposition. The thickness of the sacrificial semiconductor layer 114L can be in a range from 50 nm to 200 nm, although lesser and greater thicknesses can also be employed.

The cap insulator layer 153 can include a dielectric material that can function as a stopping layer in a planarization process to be subsequently employed. For example, the cap insulator layer 153 can include silicon nitride having a thickness in a range from 15 nm to 100 nm, although lesser and greater thicknesses can also be employed.

Figure 2A:
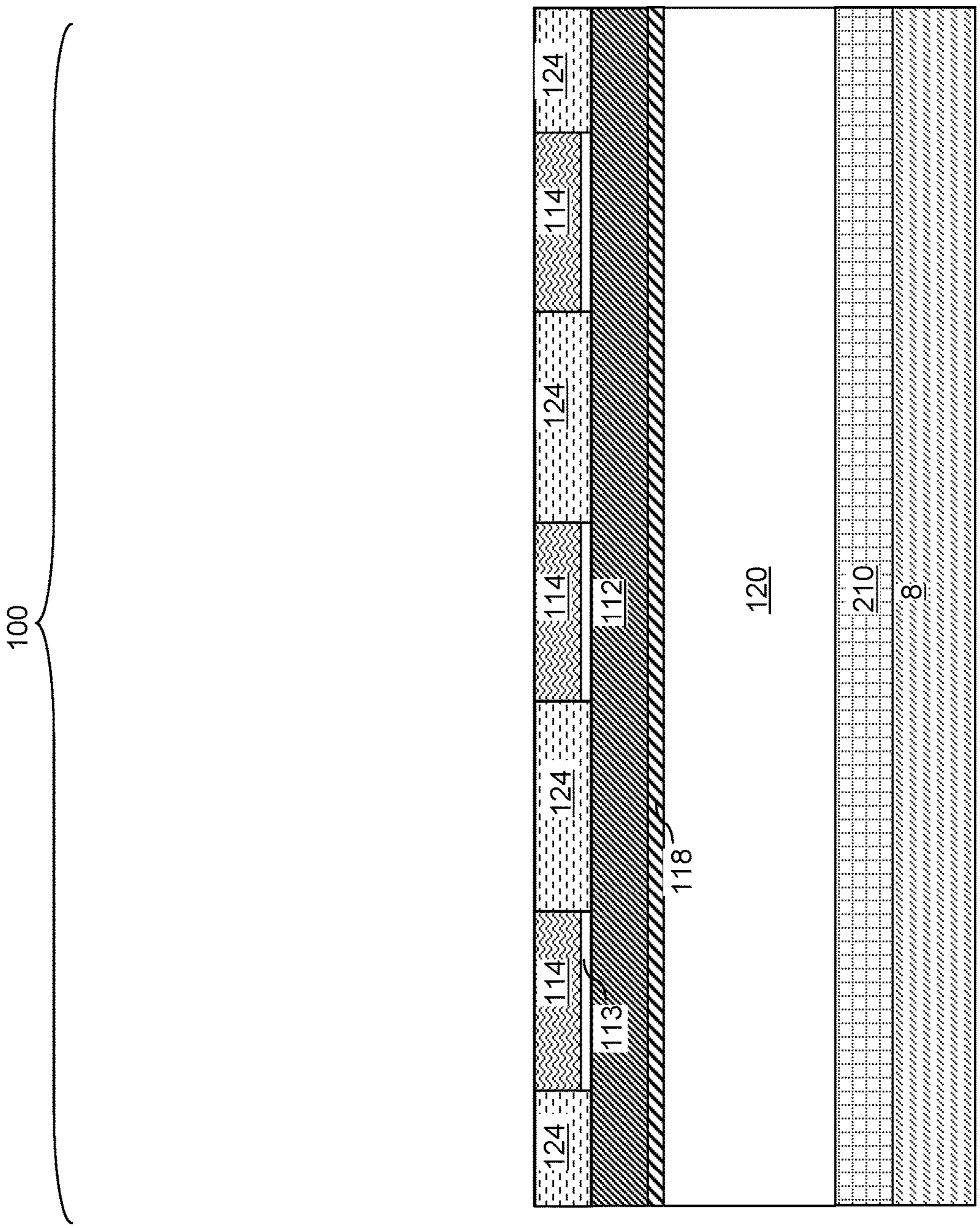
FIG. 2A is a vertical cross-sectional view of the first exemplary structure after forming sacrificial semiconductor rails and dielectric rails according to the first embodiment of the present disclosure.
Figure 2B:
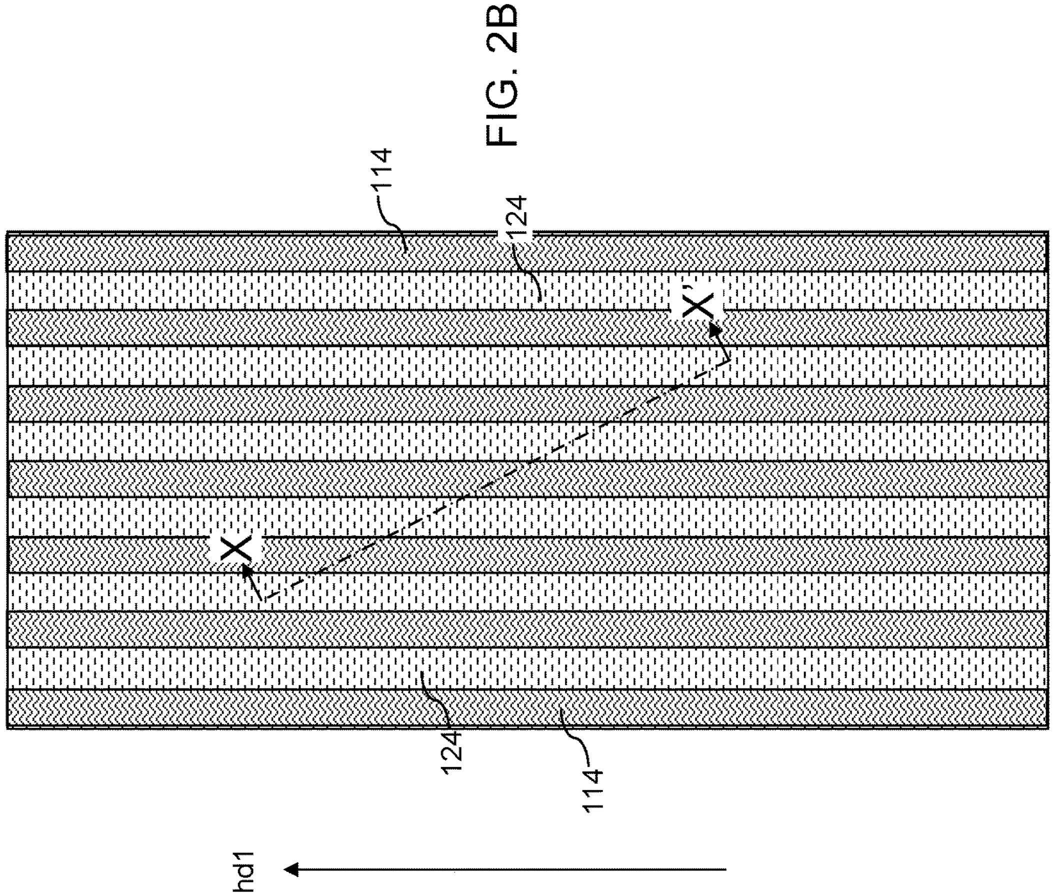
FIG. 2B is a top-down view of the first exemplary structure of FIG. 2A. The plane X-X' is the plane of the vertical cross-section of FIG. 2A.

Referring to FIGS. 2A and 2B, line trenches may be optionally formed through the cap insulator layer 153 and the sacrificial semiconductor layer 114L. As used herein, a “line trench” refers to a trench that laterally extends along a lengthwise direction and having a uniform width throughout. The line trenches can laterally extend along a first horizontal direction hd1 and can be parallel among one another. The line trenches can be formed, for example, by applying and patterning a photoresist layer over the sacrificial semiconductor layer 114L, lithographically patterning the photoresist layer to form a line-and-space pattern that extends along the first horizontal direction, and removing unmasked portions of the cap insulator layer 153, the sacrificial semiconductor layer 114L, and optionally the first dielectric liner 113 by an anisotropic etch process. In one embodiment, the line trenches can extend to the top surface of the first dielectric liner 113, in which case the first dielectric liner 113 can function as an etch stop layer. In another embodiment, the line trenches can extend to the top surface of the source semiconductor layer 112. The photoresist layer can be subsequently removed, for example, by ashing. Each remaining portion of the sacrificial semiconductor layer 114L constitutes a sacrificial semiconductor rail 114. A plurality of sacrificial semiconductor rails 114 laterally extending along the first horizontal direction hd1 and laterally spaced apart by the line trenches is formed. As used herein, a “rail” refers to a laterally extending structure having two sets of at least one sidewall that are laterally spaced apart by a uniform width throughout. The at least one sidewall may be a single sidewall, or may be multiple sidewalls that are laterally spaced apart by lateral dimples along the lengthwise direction of the rail.

A dielectric material, such as an undoped silicate glass, can be deposited in the line trenches by a deposition process such as chemical vapor deposition. Excess portions of the dielectric material can be removed from above the top surface of the cap insulator layer 153 by a planarization process such as chemical mechanical planarization and/or a recess etch. Upon planarization, the deposited dielectric material can be divided into discrete portions that fill the line trenches. Each remaining portion of the deposited and planarized dielectric material is herein referred to as a dielectric rail 124.

The sacrificial semiconductor rails 114 and the dielectric rails 124 can laterally alternate to form a laterally alternating stack. As used herein, an “alternating stack of first elements and second elements” refers to a structure in which instances of a first element and instances of a second element alternate along the direction of the stack. As used herein, a “laterally alternating stack” refers to an alternating stack in which the direction of alternation is along a horizontal direction. As used herein, a “vertically alternating stack” refers to an alternating stack in which the direction of alternation is along a vertical direction. In one embodiment, the sacrificial semiconductor rails 114 may have a same first width along the direction of alternation, and the dielectric rails 124 may have a same second width along the direction of alternation. In this case, the laterally alternating stack may form a periodic one-dimensional array having a pitch. The pitch may be in a range from 100 nm to 500 nm, although lesser and greater pitches may also be employed.

Optionally, the dielectric rails 124 may be vertically recessed below the top surface of the patterned cap insulator layer 153 such that top surfaces of the dielectric rails 124, as recessed, may be approximately at the level of the top surfaces of the sacrificial semiconductor rails 114. The cap insulator layer 153 can be subsequently removed selective to the laterally alternating stack (114, 124). For example, if the cap insulator layer 153 includes silicon nitride, a wet etch employing hot phosphoric acid may be employed to remove the cap insulator layer 153.

Figure 2C:
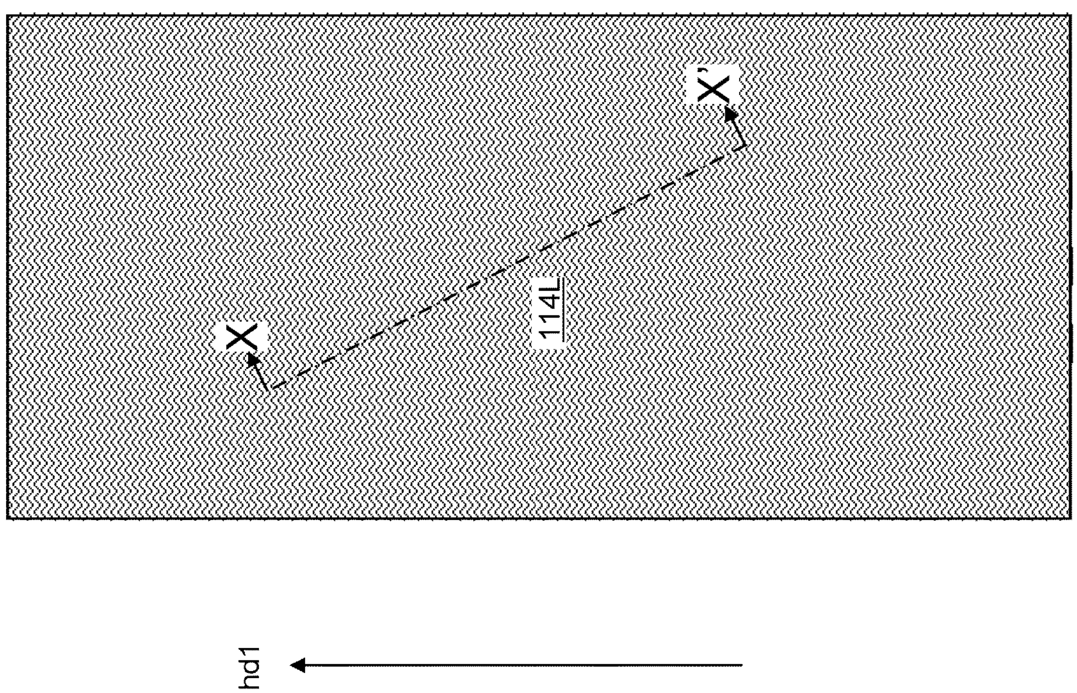
FIG. 2C is a vertical cross-sectional view of an alternate implementation of the first exemplary structure.

Referring to FIG. 2C, an alternative implementation of the first exemplary structure is illustrated, which is derived from the first exemplary structure of FIG. 1 by omitting formation of the cap insulator layer 153 and by omitting the processing steps of FIGS. 2A and 2B. Thus, instead of the laterally alternating stack (114, 124), a top surface of a blanket sacrificial semiconductor layer 114L (i.e., an unpatterned sacrificial semiconductor layer) is physically exposed in the case of the alternative implementation of the first exemplary structure.

Figure 3:
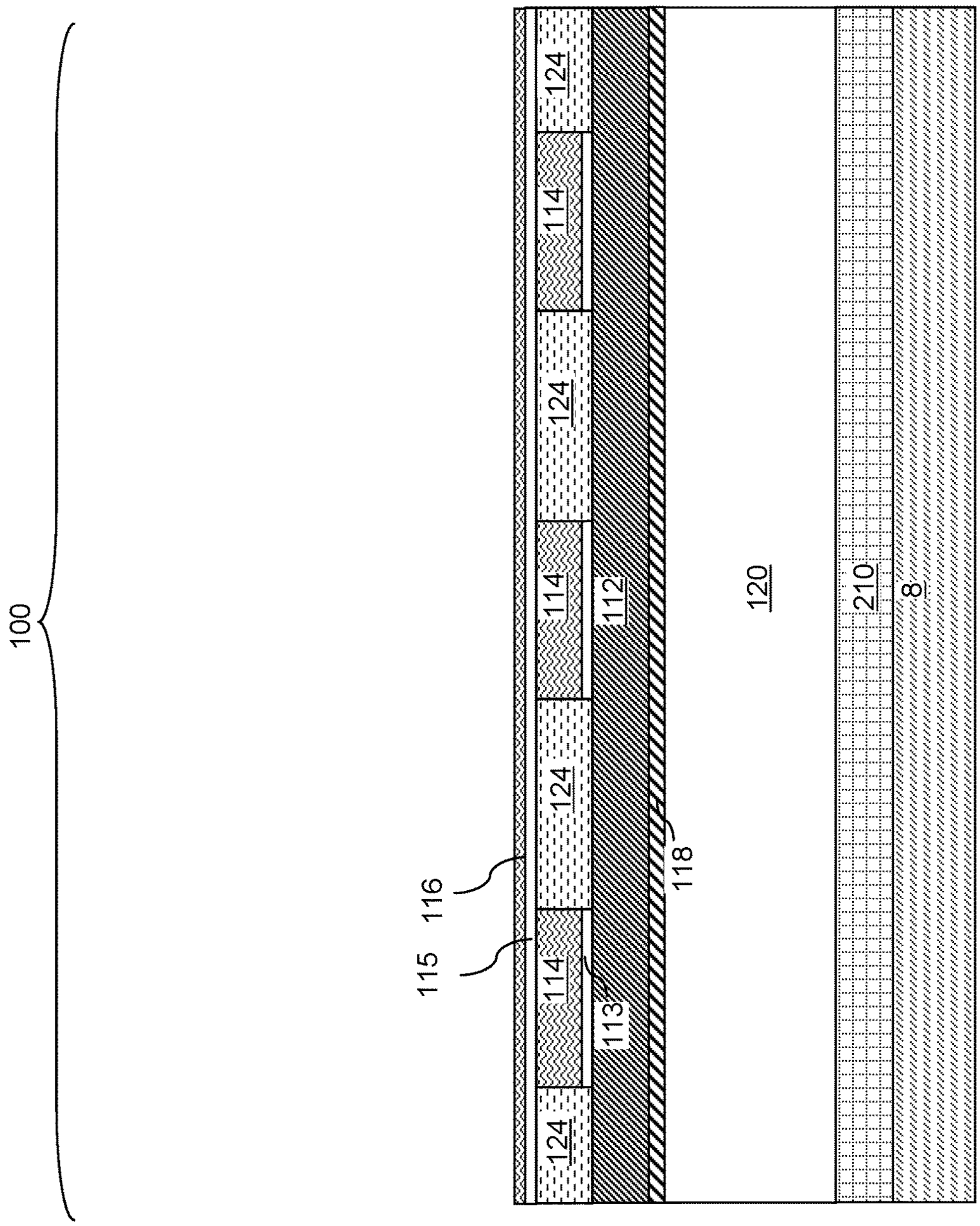
FIG. 3 is a vertical cross-sectional view of the first exemplary structure after formation of a second dielectric liner and a cap semiconductor layer according to the first embodiment of the present disclosure.

Referring to FIG. 3, a second dielectric liner 115 can be formed over the laterally alternating stack (114, 124) of the dielectric rails 124 and the sacrificial semiconductor rails 114 illustrated in FIGS. 2A and 2B, or over the sacrificial semiconductor layer 114L illustrated in FIG. 2C. The second dielectric liner 115 can include a dielectric material can function as an etch stop layer during subsequent removal of the sacrificial semiconductor rails 114. For example, the second dielectric liner 115 can include doped silicate glass or undoped silicate glass. The second dielectric liner 115 can include a doped silicate glass having a greater etch rate in hydrofluoric acid than thermal oxide by a factor of at least 2 (which may be, for example, in a range from 3 to 30). The second dielectric liner 115 can be deposited by a plasma enhanced atomic layer deposition (PEALD), plasma enhanced chemical vapor deposition (PECVD) or low pressure chemical vapor deposition (LPCVD). The thickness of the second dielectric liner 115 can be in a range from 10 nm to 50 nm, although lesser and greater thicknesses can also be employed.

A cap semiconductor layer 116 can be formed on a top surface of the second dielectric liner 115. The cap semiconductor layer 116 can include a semiconductor material layer that can function as an etch stop layer during subsequent etch of the second dielectric liner 115. For example, the cap semiconductor layer 116 can include amorphous silicon, polysilicon, or a silicon-germanium alloy. The thickness of the cap semiconductor layer 116 can be in a range from 10 nm to 40 nm, although lesser and greater thicknesses can also be employed.

Figure 4A:
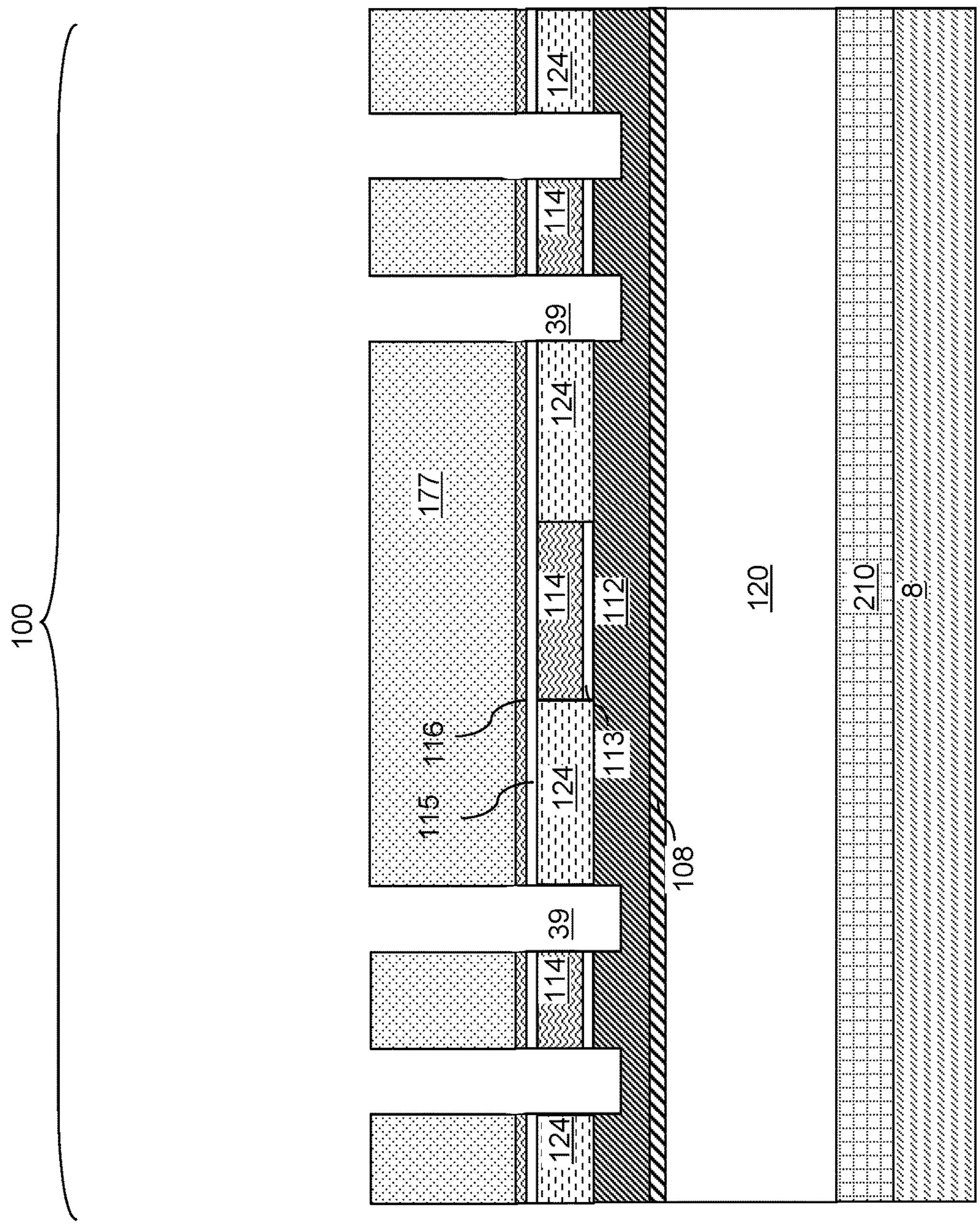
FIG. 4A is a vertical cross-sectional view of the first exemplary structure after formation of source-level memory openings according to the first embodiment of the present disclosure.
Figure 4B:
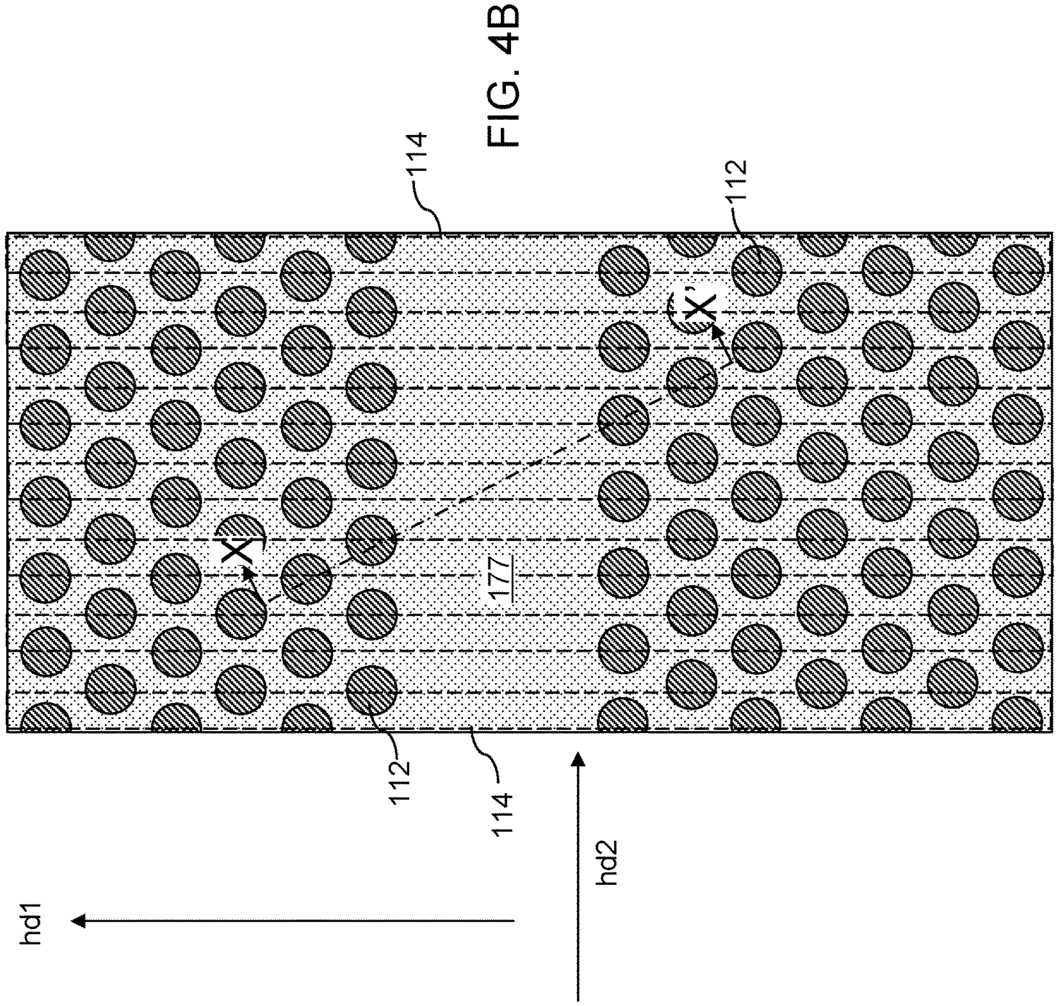
FIG. 4B is a top-down view of the first exemplary structure of FIG. 4A. The plane X-X' is the plane of the vertical cross-section of FIG. 4A.

Referring to FIGS. 4A and 4B, source-level memory openings 39 can be formed, for example, by applying a photoresist layer 177 over the cap semiconductor layer 116, lithographically patterning the photoresist layer 177 with a pattern of openings, and transferring the pattern of the openings in the photoresist layer 177 through the cap semiconductor layer 116, the second dielectric liner 115, and the laterally alternating stack (114, 124) (or the sacrificial semiconductor layer 114L), and optionally through the first dielectric liner 113 and an upper portion of the source semiconductor layer 112. The photoresist layer 177 can be subsequently removed, for example, by ashing. In one embodiment, each of the source-level memory openings 39 can straddle an interface between a respective pair of a dielectric rail 124 and a sacrificial semiconductor rail 114. Thus, each source-level memory opening 39 can include a sidewall of a respective one of the sacrificial semiconductor rails 114 and a sidewall of a respective one of the dielectric rails 124. In one embodiment, the source-level memory openings 39 can include a plurality of two-dimensional array of source-level memory openings 39 that are laterally spaced apart from one another by regions that do not include source-level memory openings 39. In one embodiment, each of the regions that do not include source-level memory openings 39 can laterally extend along a lengthwise direction of the region, which is herein referred to as a second horizontal direction hd2. In one embodiment, the source-level memory openings can be formed only in the memory array region 100, and not formed in the contact region 300. In another embodiment, the source-level memory openings 39 may be formed both in the memory array region 100 and the contact region 300. The photoresist layer 177 can be subsequently removed, for example, by ashing.

Figure 5:
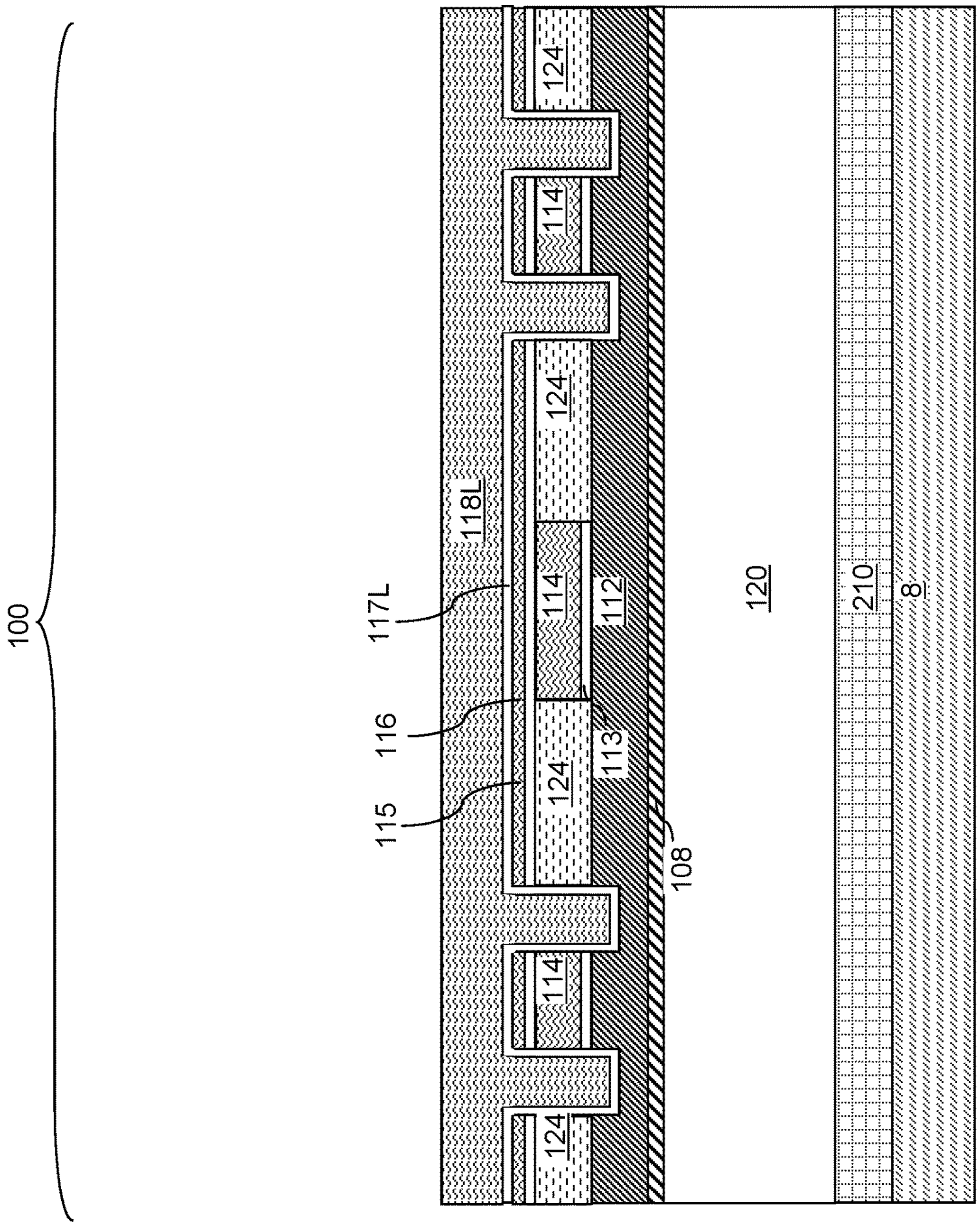
FIG. 5 is a vertical cross-sectional view of the first exemplary structure after formation of a pedestal liner layer and a sacrificial semiconductor pedestal material layer according to the first embodiment of the present disclosure.

Referring to FIG. 5, a pedestal liner layer 117L and a sacrificial semiconductor pedestal material layer 118L are sequentially deposited to fill each of the source-level memory openings 39. The pedestal liner layer 117L includes a dielectric material such as silicon oxide. The pedestal liner layer 117L can be formed, for example, by a conformal deposition process. The thickness of the pedestal liner layer 117L can be in a range from 10 nm to 50 nm, although lesser and greater thicknesses can also be employed. The sacrificial semiconductor pedestal material layer 118L includes a sacrificial material that can be removed selective to the material of the pedestal liner layer 117L. For example, the sacrificial semiconductor pedestal material layer 118L can include amorphous silicon, polycrystalline silicon, or a silicon-germanium alloy.

Figure 6:
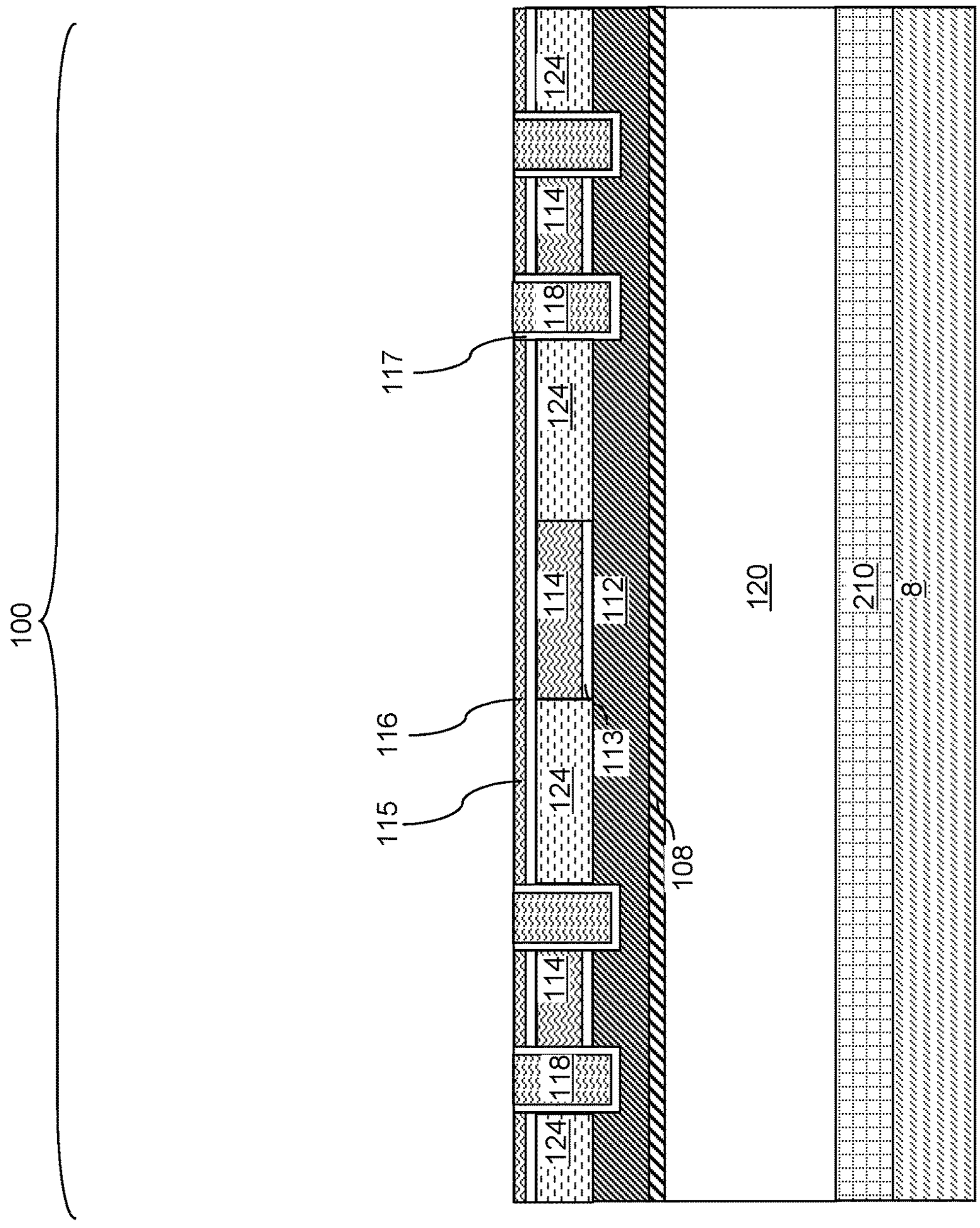
FIG. 6 is a vertical cross-sectional view of the first exemplary structure after formation of pedestal liners and sacrificial semiconductor pedestals according to the first embodiment of the present disclosure.

Referring to FIG. 6, the sacrificial semiconductor pedestal material layer 118L can be planarized, for example, by a recess etch. The pedestal liner layer 117L can be employed as an etch stop layer. Alternatively, the sacrificial semiconductor pedestal material layer 118L can be planarized by chemical mechanical planarization. In this case, the pedestal liner layer 117L can be employed as a stopping layer. Subsequently, physically exposed horizontal portions of the pedestal liner layer 117L can be removed by an etch process that is selective to the material of the sacrificial semiconductor pedestal material layer 118L. For example, if the sacrificial semiconductor pedestal material layer 118L includes amorphous silicon and if the pedestal liner layer 117L includes silicon oxide, a wet etch employing hydrofluoric acid can be employed to remove horizontal portions of the pedestal liner layer 117L that overlies the cap semiconductor layer 116. Each remaining portion of the sacrificial semiconductor pedestal material layer 118L constitutes a sacrificial semiconductor pedestal 118. Each remaining portion of the pedestal liner layer 117L constitutes a pedestal liner 117 that laterally surrounds a respective sacrificial semiconductor pedestal 118. A combination of a pedestal liner 117 and a sacrificial semiconductor pedestal 118 fills a respective source-level memory opening 39.

Figure 7:
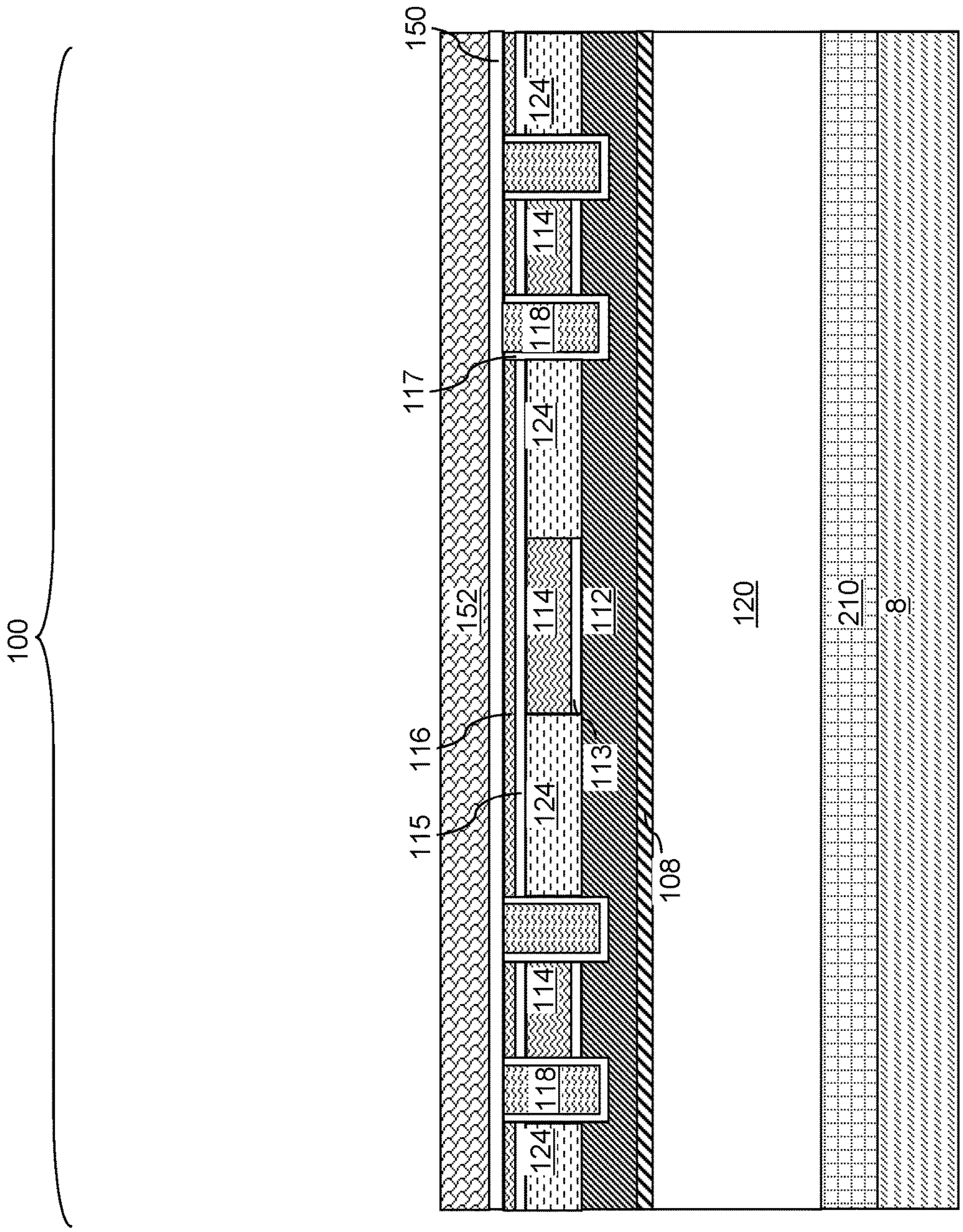
FIG. 7 is a vertical cross-sectional view of the first exemplary structure after formation of a gate dielectric layer and a doped semiconductor layer according to the first embodiment of the present disclosure.

Referring to FIG. 7, a gate dielectric layer 150 and a doped semiconductor layer 152 can be sequentially formed. The gate dielectric layer 150 includes a dielectric material such as silicon oxide, a dielectric metal oxide, or a combination thereof. The thickness of the gate dielectric layer 150 can be in a range from 3 nm to 10 nm, although lesser and greater thicknesses can also be employed. The doped semiconductor layer 152 includes a doped semiconductor material such as n-doped amorphous silicon that can be converted into n-doped polysilicon in an anneal process. The thickness of the doped semiconductor layer 152 can be in a range from 100 nm to 300 nm, although lesser and greater thicknesses can also be employed. The doped semiconductor layer 152 can be subsequently employed as an etch stop layer during formation of memory openings or backside trenches through an alternating stack of material layers to be subsequently formed.

Figure 8A:
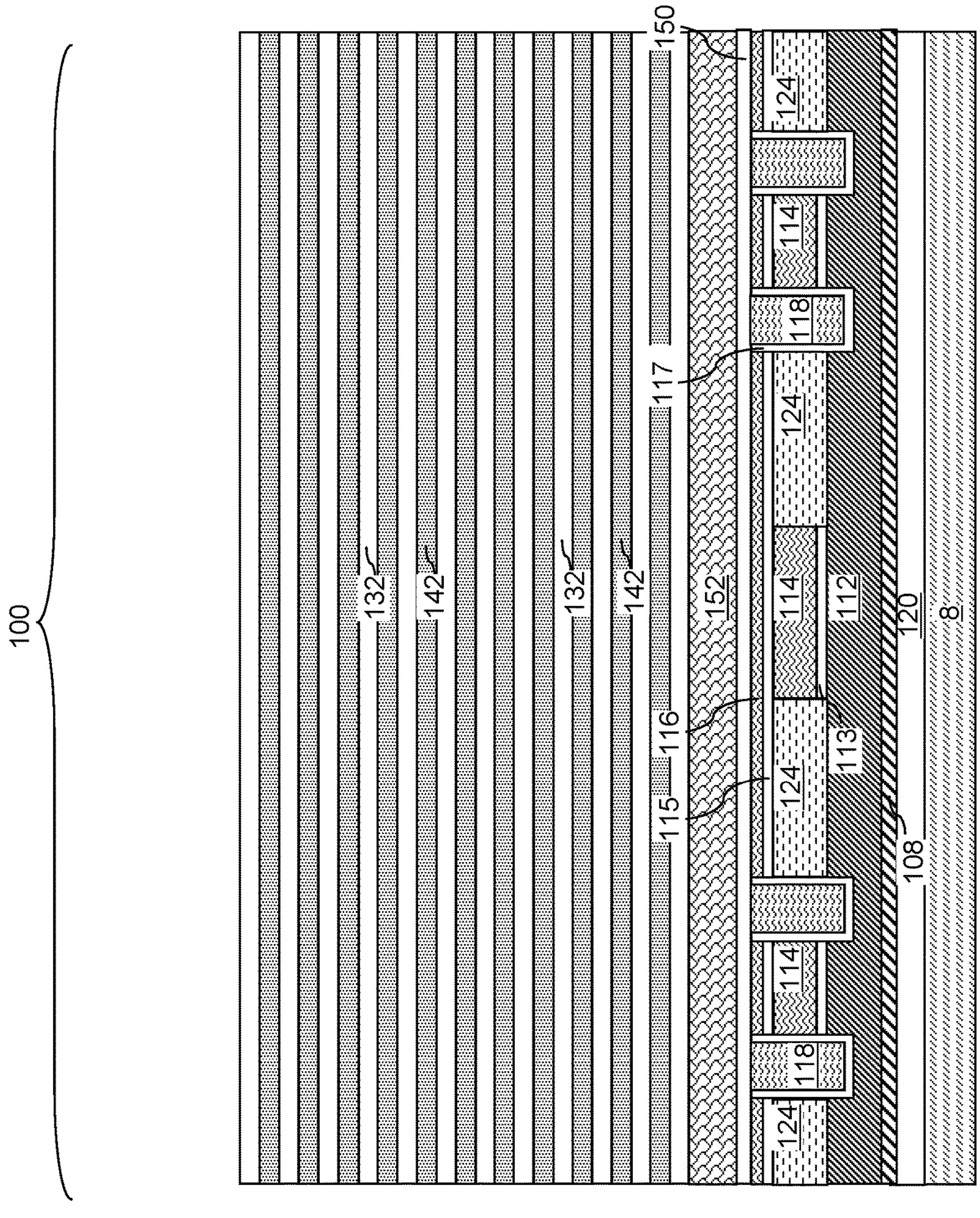
FIG. 8A is a vertical cross-sectional view of a memory array region of the first exemplary structure after formation of a first alternating stack of first insulating layers and first sacrificial material layers according to the first embodiment of the present disclosure.
Figure 8B:
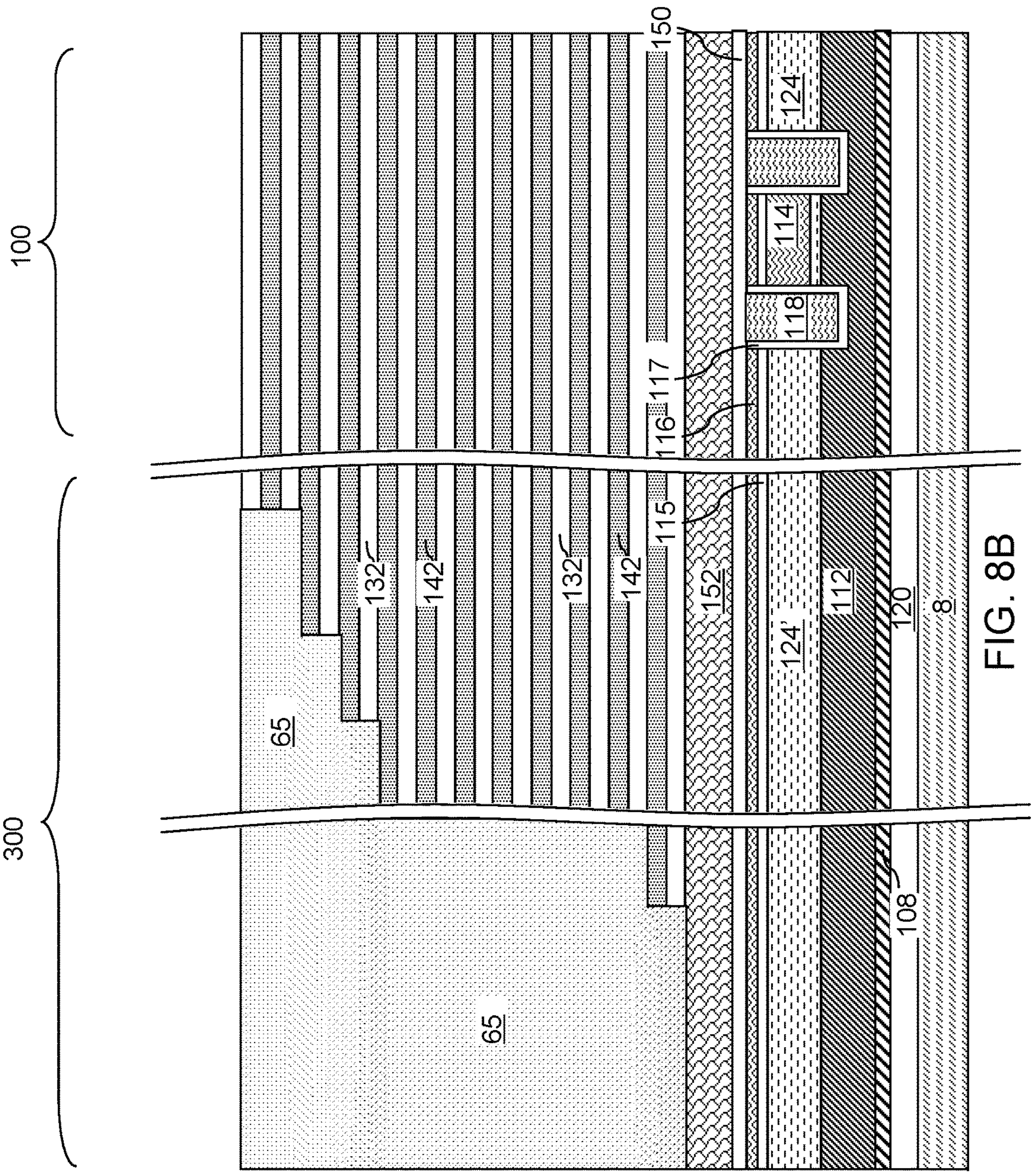
FIG. 8B is a vertical cross-sectional view of a contact region of the first exemplary structure after formation of stepped surfaces and a retro-stepped dielectric material portion according to the first embodiment of the present disclosure.

Referring to FIGS. 8A and 8B, a stack of an alternating plurality of first material layers (which can be first insulating layers 132) and second material layers (which can be first sacrificial material layer 142) is formed over the doped semiconductor layer 152. As used herein, a "material layer" refers to a layer including a material throughout the entirety thereof. Instances of the first material layers may have the same thickness thereamongst, or may have different thicknesses. Instances of the second elements may have the same thickness thereamongst, or may have different thicknesses. Each first material layer includes a first material, and each second material layer includes a second material that is different from the first material. In one embodiment, each first material layer can be a first insulating layer 132, and each second material layer can be a first sacrificial material layer 142. In this case, a first vertically alternating stack (132, 142) of the first insulating layers 132 and the first sacrificial material layers 142 can be formed over the doped semiconductor layer 152. The levels of the layers in the first alternating stack (132, 142) are collectively referred to as first-tier levels. The set of all structures formed in the first-tier levels is herein referred to as a first-tier structure.

Thus, the first vertically alternating stack (132, 142) can include the first insulating layers 132 composed of the first material, and the sacrificial material layers 142 composed of a second material different from that of the first insulating layers 132. The first material of the first insulating layers 132 can be at least one insulating material. Insulating materials that can be employed for the first insulating layers 132 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be spacer material layers that comprise silicon nitride or a semiconductor material including at least one of silicon and germanium.

In one embodiment, the first insulating layers 132 can include silicon oxide, and the first sacrificial material layers 142 can include silicon nitride. The first material of the first insulating layers 132 can be deposited, for example, by chemical vapor deposition (CVD). For example, if silicon oxide is employed for the first insulating layers 132, tetraethyl orthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first vertically alternating stack (132, 142) can have a uniform thickness that is substantially invariant within each respective first sacrificial material layer 142.

Generally, the spacer material layers may be formed as, or may be subsequently replaced with, electrically conductive layers. While the present disclosure is described employing an embodiment in which the spacer material layers are first sacrificial material layers 142 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

As shown in FIG. 8B, a stepped cavity can be formed within the contact region 300 which is located between the device region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the first vertically alternating stack (132, 142) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the first vertically alternating stack (132, 142). Each first sacrificial material layer 142 other than a topmost first sacrificial material layer 142 within the first vertically alternating stack (132, 142) laterally extends farther than any overlying first sacrificial material layer 142 within the first vertically alternating stack (132, 142). The terrace region includes stepped surfaces of the first vertically alternating stack (132, 142) that continuously extend from a bottommost layer within the first vertically alternating stack (132, 142) to a topmost layer within the first vertically alternating stack (132, 142).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the first vertically alternating stack (132, 142), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 9A:
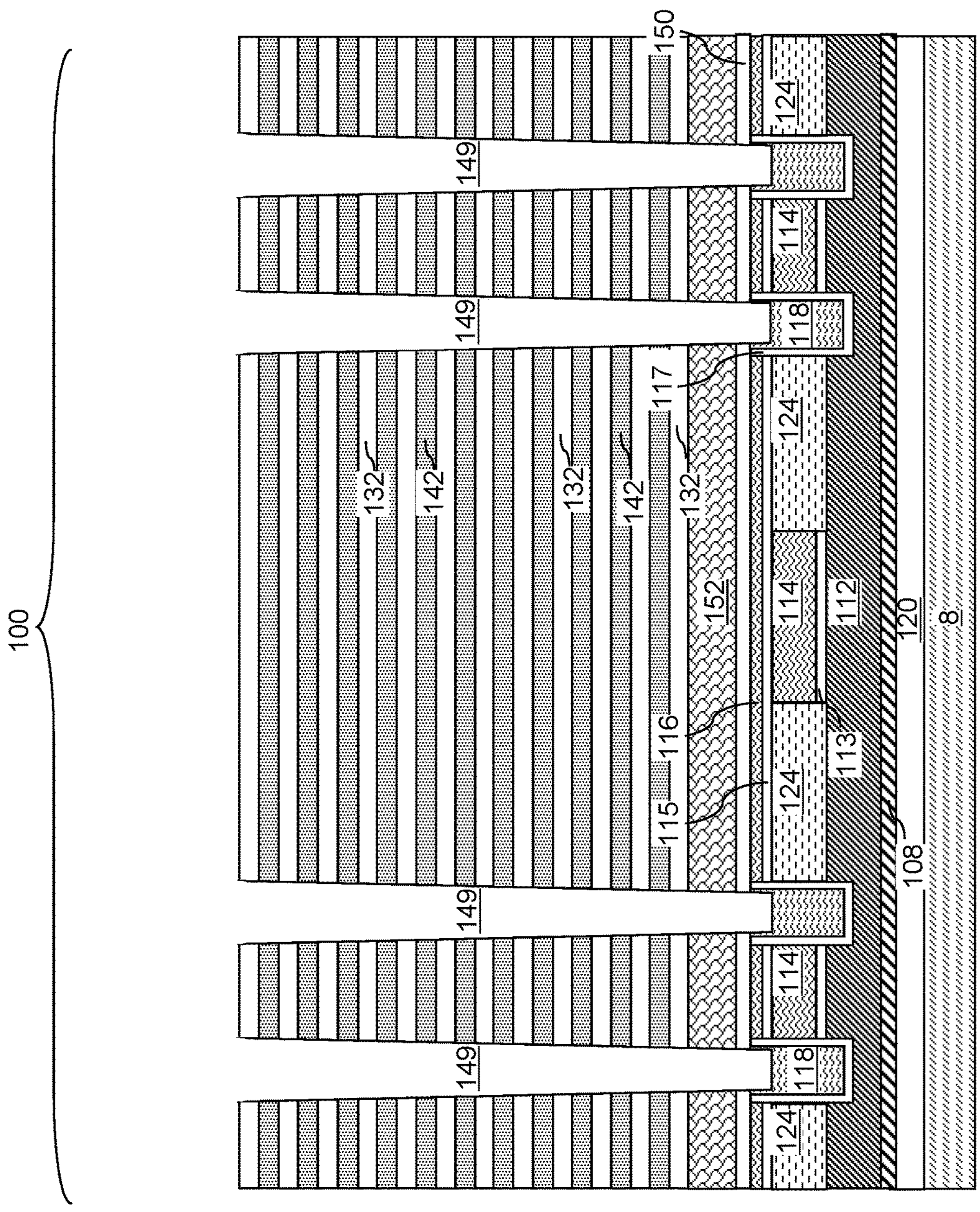
FIG. 9A is a vertical cross-sectional view of the first exemplary structure after formation of first-tier memory openings according to the first embodiment of the present disclosure.
Figure 9B:
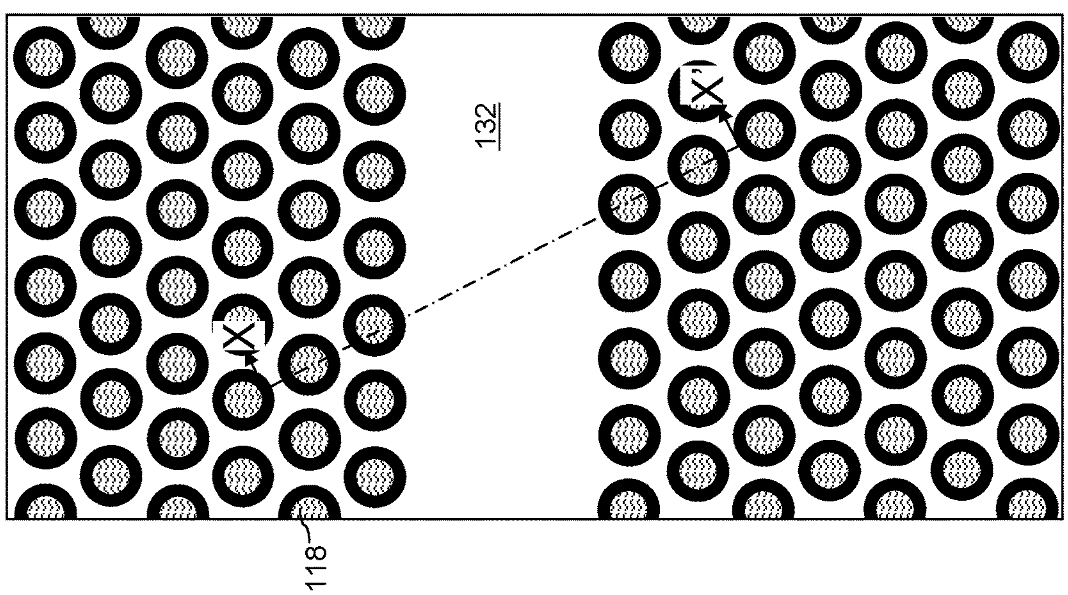
FIG. 9B is a horizontal cross-sectional view of the first exemplary structure of FIG. 9A. The plane X-X' is the plane of the vertical cross-section of FIG. 9A.
Figure 10:
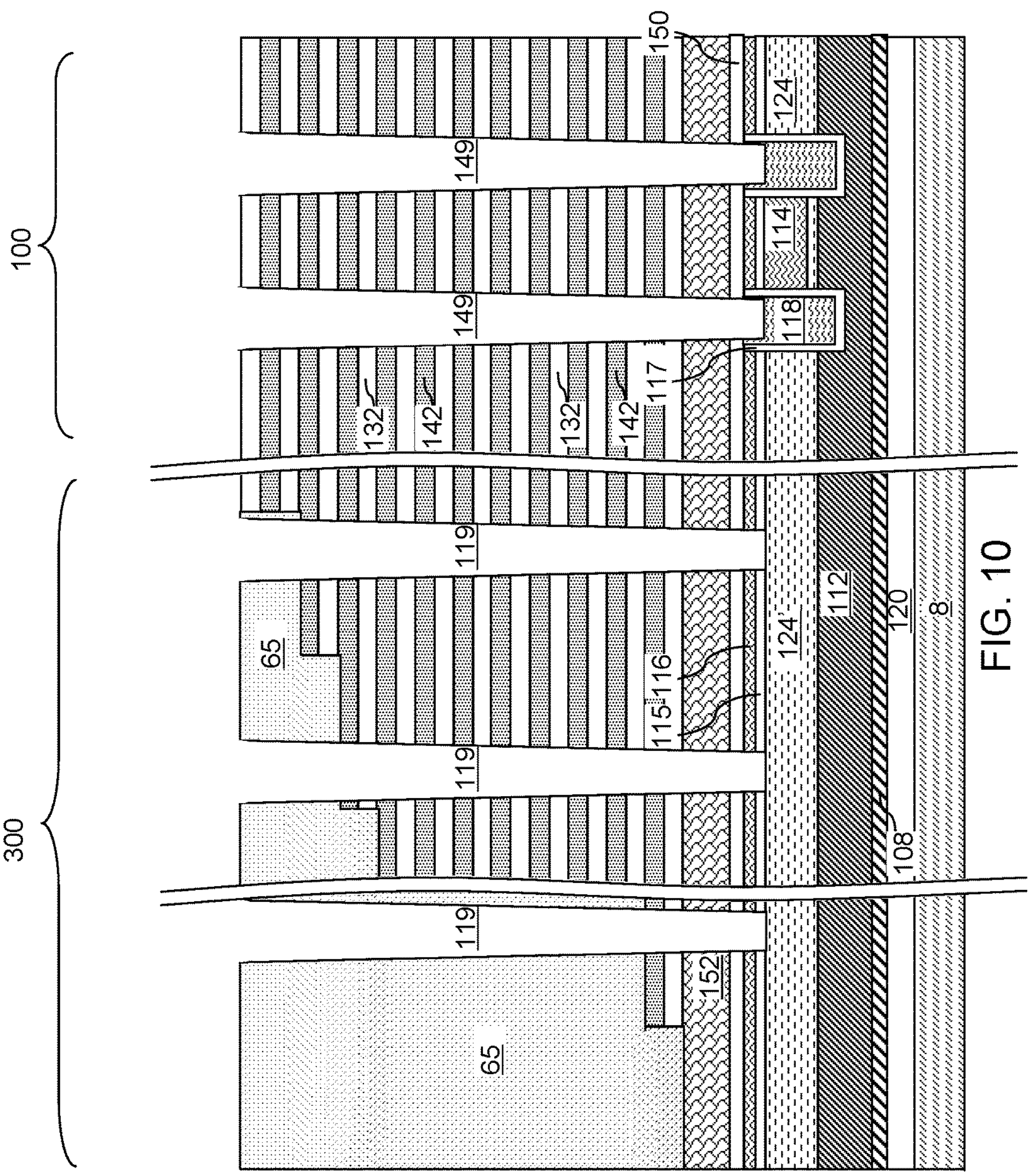
FIG. 10 is a vertical cross-sectional view of another region of the first exemplary structure of FIGS. 9A and 9B.

Referring to FIGS. 9A, 9B, and 10, a lithographic material stack (not shown) including at least a photoresist layer can be formed over the first vertically alternating stack (132, 142) and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the retro-stepped dielectric material portion 65 and through the first vertically alternating stack (132, 142) by at least one anisotropic etch that employs the patterned lithographic material stack as an etch mask. Portions of the first vertically alternating stack (132, 142) underlying the openings in the patterned lithographic material stack are etched to form first-tier memory openings 149 and first-tier support openings 119. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The first-tier memory openings 149 are formed through the entirety of the first vertically alternating stack (132, 142) in the memory array region 100. The first-tier support openings 119 are formed through the retro-stepped dielectric material portion 65 and the portion of the first vertically alternating stack (132, 142) that underlie the stepped surfaces in the contact region 300.

The first-tier memory openings 149 extend through the entirety of the first vertically alternating stack (132, 142). The first-tier support openings 119 extend through the first vertically alternating stack (132, 142). The chemistry of the anisotropic etch process employed to etch through the materials of the first vertically alternating stack (132, 142) can alternate to optimize etching of the first and second materials in the first vertically alternating stack (132, 142). The anisotropic etch can be, for example, a series of reactive ion etches. The sidewalls of the first-tier memory openings 149 and the first-tier support openings 119 can be substantially vertical, or can be tapered. The patterned lithographic material stack can be subsequently removed, for example, by ashing. A source-level dielectric material layer 124' including the same material as the dielectric rails 124 may be provided in the contact region 300 and the peripheral region 200. The source-level dielectric material layer 124' can be formed concurrently with the dielectric rails 124 at the processing steps of FIGS. 2A and 2B.

In the first exemplary structure of FIGS. 9A, 9B, and 10, the locations of the first-tier memory openings 149 can be selected to overlap with locations of the source-level memory openings 149, i.e., the pairs of a pedestal liner 117 and a sacrificial semiconductor pedestal 118. Thus, each bottom surface of the first-tier memory openings 39 can be formed within an area defined by a top periphery of an underlying source-level memory opening 39, which can coincide with a top periphery of an underlying pedestal liner 117. In one embodiment, the sacrificial semiconductor pedestals 118 can function as an etch stop structure during an anisotropic etch process that forms the first-tier memory openings 149 and the first-tier support openings 119. Alternatively, the source-level dielectric material layer 124' can function as an etch stop structure during an anisotropic etch process that forms the first-tier support openings 119.

Each of the first-tier memory openings 149 and the first-tier support openings 119 may have vertical sidewalls or tapered sidewalls. A two-dimensional array of first-tier memory openings 149 can be formed in the memory array region 100. A two-dimensional array of first-tier support openings 119 can be formed in the contact region 300.

Figure 11:
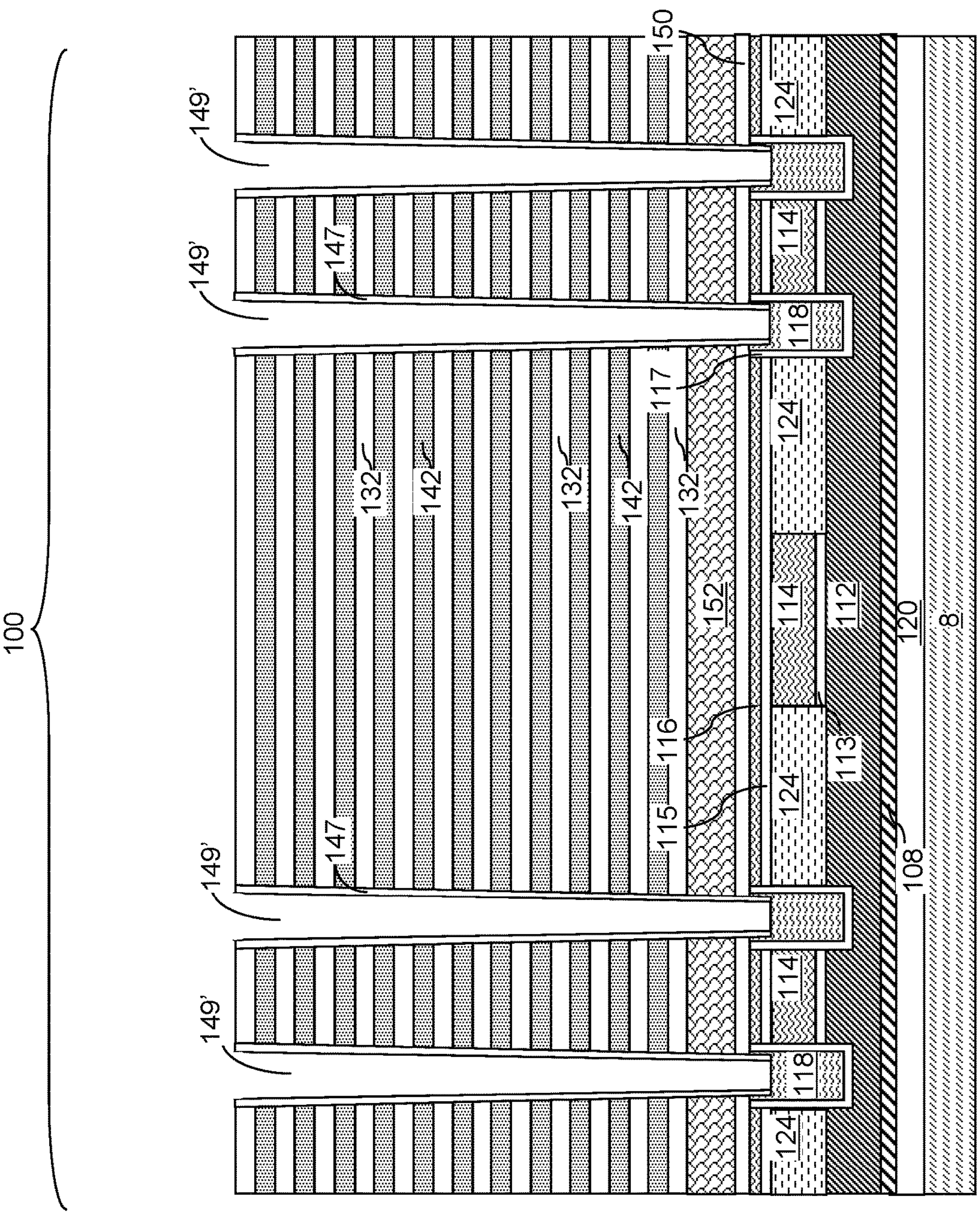
FIG. 11 is a vertical cross-sectional view of the first exemplary structure after formation of first-tier sacrificial liners according to the first embodiment of the present disclosure.

Referring to FIG. 11, first-tier sacrificial liners 147 can be formed on the sidewalls of the first-tier memory openings 149 and the first-tier support openings 119, for example, by deposition of a conformal dielectric material layer (such as a silicon oxide layer) and an anisotropic etch that removes horizontal portions of the conformal dielectric material layer. The thickness of the first-tier sacrificial liners 147 can be in a range from 1 nm to 20 nm, although lesser and greater thicknesses can also be employed. A first-tier cavity 149' can be present within each first-tier sacrificial liner 147.

Figure 12:
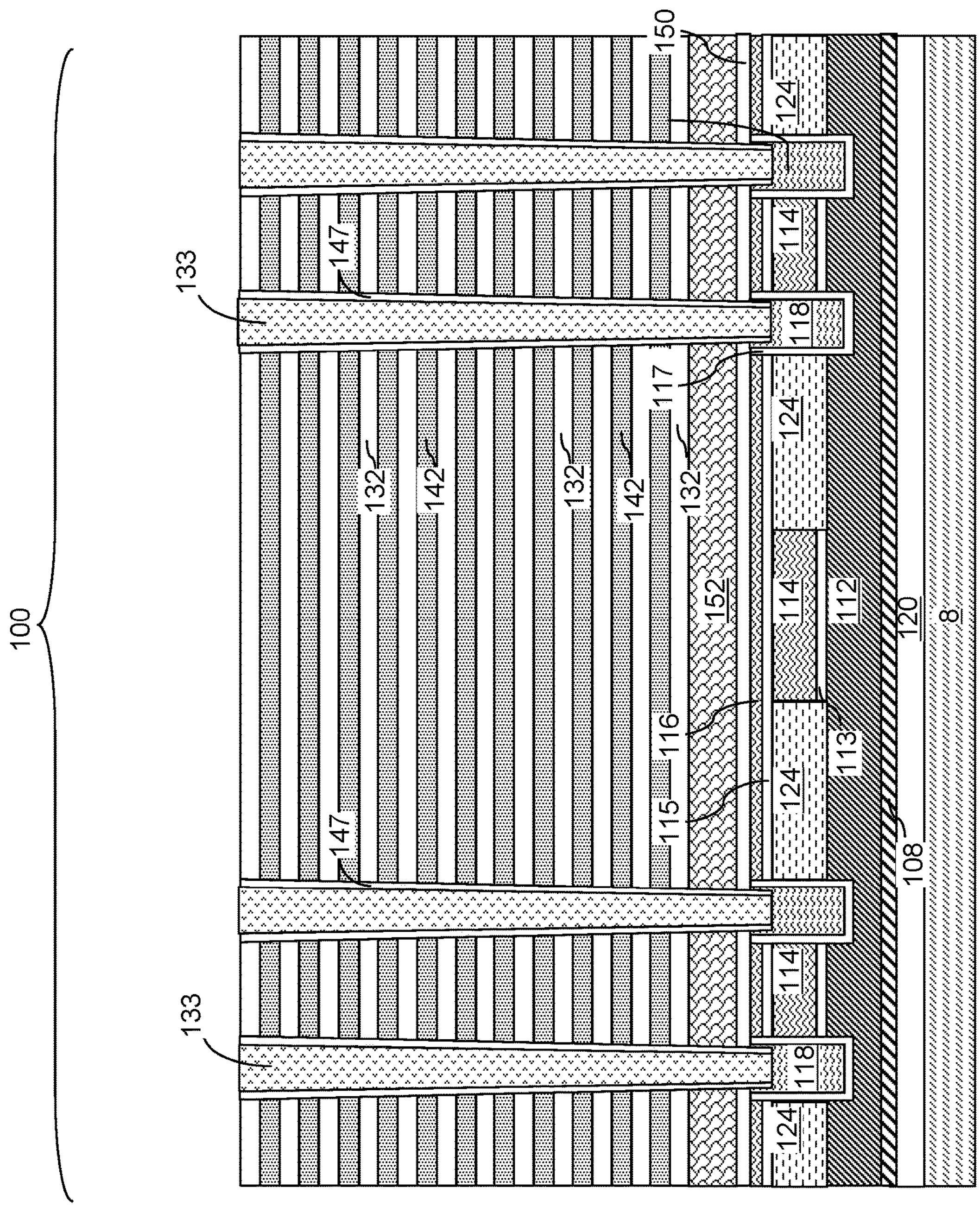
FIG. 12 is a vertical cross-sectional view of the first exemplary structure after formation of first-tier sacrificial fill structures according to the first embodiment of the present disclosure.

Referring to FIG. 12, a sacrificial fill material is deposited in the first-tier cavities 149'. The sacrificial fill material includes a material that can be removed selective to the material of the first-tier sacrificial liners 147. For example, the sacrificial fill material can include amorphous silicon, polysilicon, or a silicon-germanium alloy. Excess portions of the sacrificial fill material can be removed from above the topmost surface of the first vertically alternating stack (132, 142) by a planarization process, which can include a recess etch or chemical mechanical planarization. Each remaining portion of the sacrificial fill material in the first-tier cavities 149' constitutes a first-tier sacrificial fill structure 133.

Figure 13:
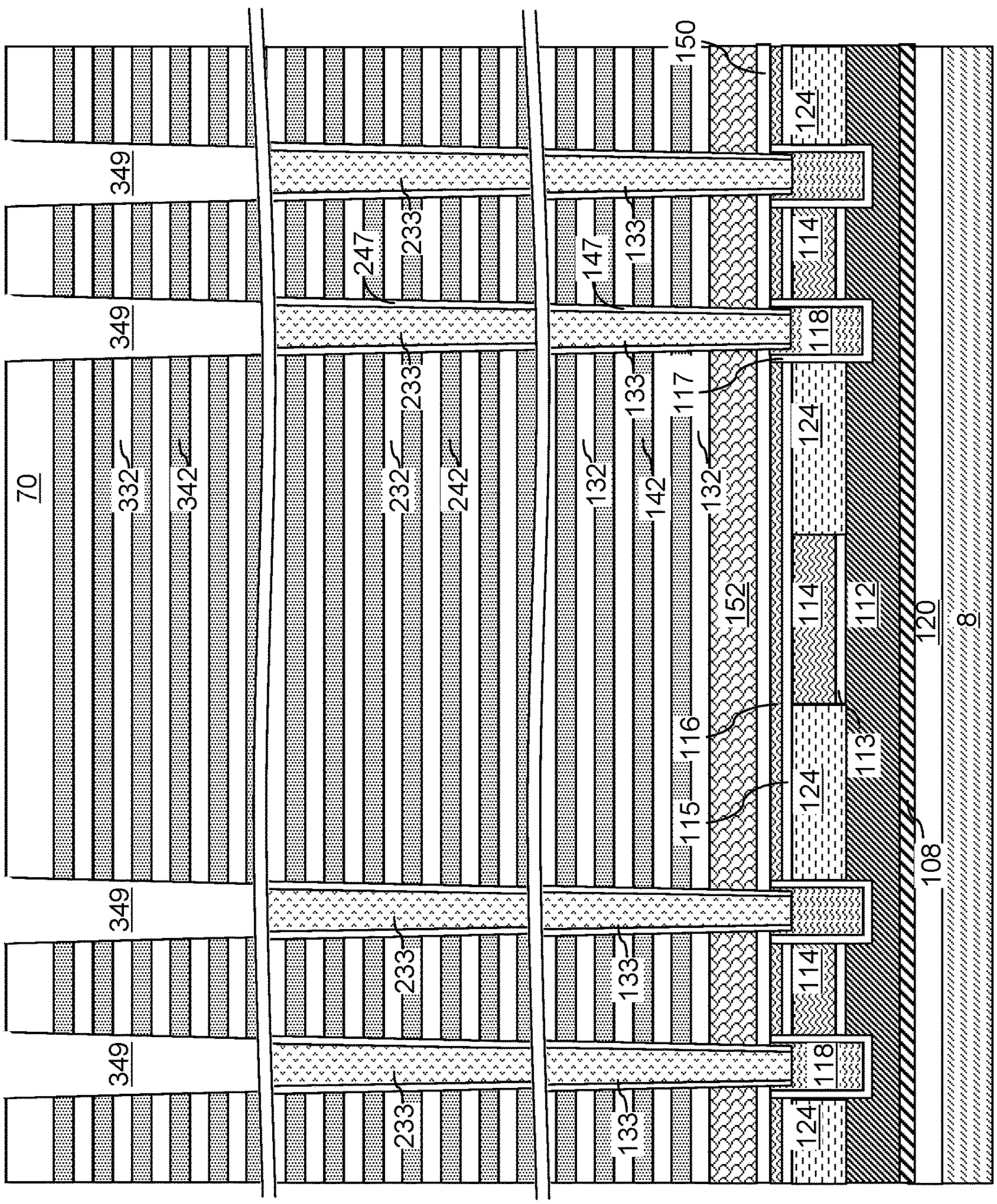
FIG. 13 is a vertical cross-sectional view of the first exemplary structure after formation of a topmost-tier structure and topmost-tier memory openings according to the first embodiment of the present disclosure.

Referring to FIG. 13, the processing steps of FIGS. 8A, 8B, 9A, 9B, 10, 11, and 12 may be optionally repeated to form at least one intermediate-tier structure, each of which can include an intermediate vertically alternating stack (232, 242) of intermediate insulating layers 232 and intermediate sacrificial material layers 242, intermediate-tier memory openings that vertically extend through the intermediate vertically alternating stack (232, 242) and landing on underlying memory openings, intermediate-tier sacrificial liners 247 and intermediate-tier sacrificial fill structures 233. In an illustrative embodiment, a total of (N−2) intermediate tier structures may be formed, which includes a second-tier structure as a bottommost intermediate tier structure, and (N−1)-th tier structure as a topmost tier structure and in which N is an integer greater than 2. For each integer i that is greater than 1 and less than N, the i-th-tier structure can include an i-th vertically alternating stack (232, 242) of i-th insulating layers 232 and i-th sacrificial material layers 242, i-th-tier memory openings vertically extending through the i-th vertically alternating stack (232, 242), i-th-tier sacrificial liners 247, and i-th-tier sacrificial fill structures 233.

Subsequently, the processing steps of FIGS. 8A, 8B, 9A, 9B, and 10 can be repeated once again to form a topmost-tier structure, which can include an N-th vertically alternating stack (332, 342) of N-th insulating layers 332 (i.e., topmost-tier insulating layers) and N-th sacrificial material layers 342 (i.e., topmost-tier sacrificial material layers) and N-th-tier memory openings 349 (i.e., topmost-tier memory openings) that vertically extend through the N-th vertically alternating stack (232, 242) and landing on the (N−1)-th memory openings that are filled with (N−1)-th-tier sacrificial liners 247 and (N−1)-th-tier sacrificial fill structures 233. Optionally, the topmost insulating layer of the N-th vertically alternating stack (332, 342) can have a greater thickness than other N-th insulating layers 332, in which case the topmost insulating layer of the N-th vertically alternating stack (332, 342) is herein referred to as an insulating cap layer 70.

While the present disclosure is described employing an embodiment in which N is greater than 2, embodiments are expressly contemplated in which N is 2. In this case, the intermediate tier structure(s) can be omitted. Further, embodiments are expressly contemplated in which only the first-tier structure is formed, i.e., in which N is 1. In this case, the processing steps of FIGS. 11, 12, and 13 can be omitted.

The processing steps of FIGS. 8A and 8B through FIG. 13 form at least one vertically alternating stack {(132, 142), (232, 242), (332, 342)} of insulating layers (131, 232, 332) and spacer material layers (142, 242, 342) over the laterally alternating stack, (114, 124) (or the sacrificial semiconductor layer 114L). The spacer material layers (142, 242, 342) can be formed as, or are subsequently replaced with, electrically conductive layers.

Figure 14:
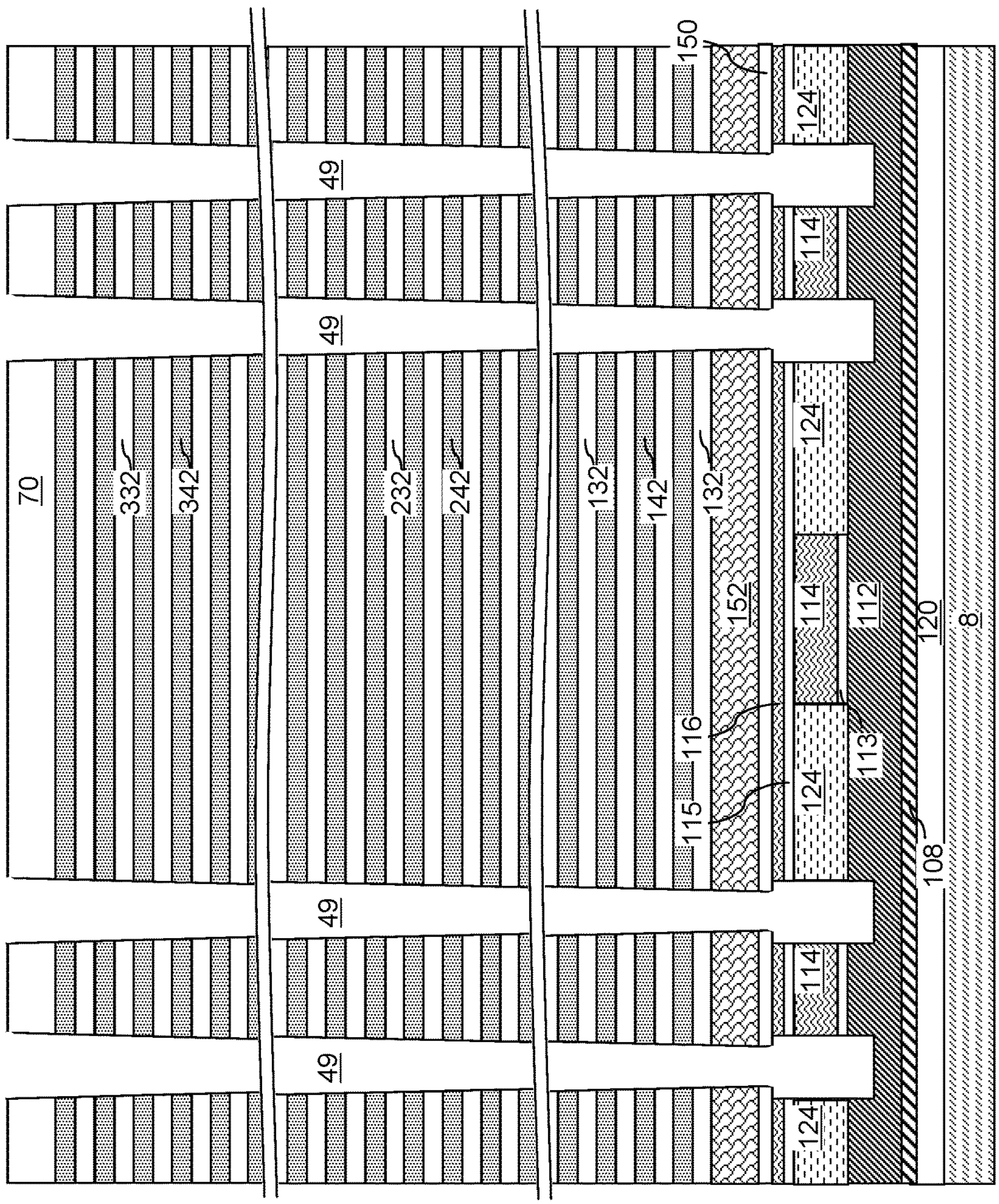
FIG. 14 is a vertical cross-sectional view of the first exemplary structure after formation of memory openings according to the first embodiment of the present disclosure.

Referring to FIG. 14, the intermediate-tier sacrificial fill structures 233 and the first-tier sacrificial fill structures 133 can be removed selective to the various sacrificial liners (117, 147, 247) by an isotropic etch or an anisotropic etch that removes the materials of the intermediate-tier tier sacrificial fill structures 233 and the first-tier sacrificial fill structures 133. For example, if the intermediate-tier sacrificial fill structures 233 and the first-tier sacrificial fill structures 133 include amorphous silicon, and if the various sacrificial liners (117, 147, 247) include silicon oxide, a wet etch employing a KOH solution may be employed to remove the intermediate-tier sacrificial fill structures 233 and the first-tier sacrificial fill structures 133 selective to the various sacrificial liners (117, 147, 247).

Subsequently, an isotropic etch can be performed to etch the various sacrificial liners (117, 147, 247). Memory openings 49, which are also referred to as inter-tier memory openings, are formed by combinations of vertically adjoined cavities of the source-level memory openings 39, first-tier memory openings 149, intermediate-tier memory openings, and topmost-tier memory openings 349. Specifically, each memory opening 49 can include a volume of a source-level memory opening 39, a volume of a first-tier memory opening 149, one or more volumes of (N−2) intermediate-tier memory openings, and a topmost-tier memory opening 349 that are vertically joined among one another. Overlapping first-tier support openings, intermediate-tier support openings, and topmost-tier support openings may be adjoined among one another in the same manner to form support openings (not shown), which are also referred to as inter-tier support openings.

Thus, the memory openings 49 are formed through the at least one vertically alternating stack {(132, 142), (232, 242), (332, 342)} of insulating layers (131, 232, 332) and spacer material layers (142, 242, 342) by etching through each of the at least one vertically alternating stack {(132, 142), (232, 242), (332, 342)} and by removing the sacrificial semiconductor pedestals 118 and the pedestal liners 117. Each of the memory openings 49 includes a volume of a respective one of the sacrificial semiconductor pedestals 118.

In one embodiment, the first-tier memory opening 149 can include a tapered portion that extends through the first alternating stack (132, 142) and the doped semiconductor layer 152. In this case, each of the memory openings 49 can be formed with a bulging portion formed by removal of a respective one of the sacrificial semiconductor pedestals 118 and a tapered portion that extend through at least a bottom portion of the first vertically alternating stack (132, 142) and having a bottom end that adjoins the bulging portion. Each of the sacrificial semiconductor pedestals 118 may be formed with a greater lateral extent than the bottom end of the tapered portion. In one embodiment, the bulging portion of each memory opening 49 can have a greater lateral extent (such as a diameter of a major axis or otherwise a greatest lateral dimension for a given two-dimensional cross-sectional shape) than a bottom end of the tapered portion.

Figure 15:
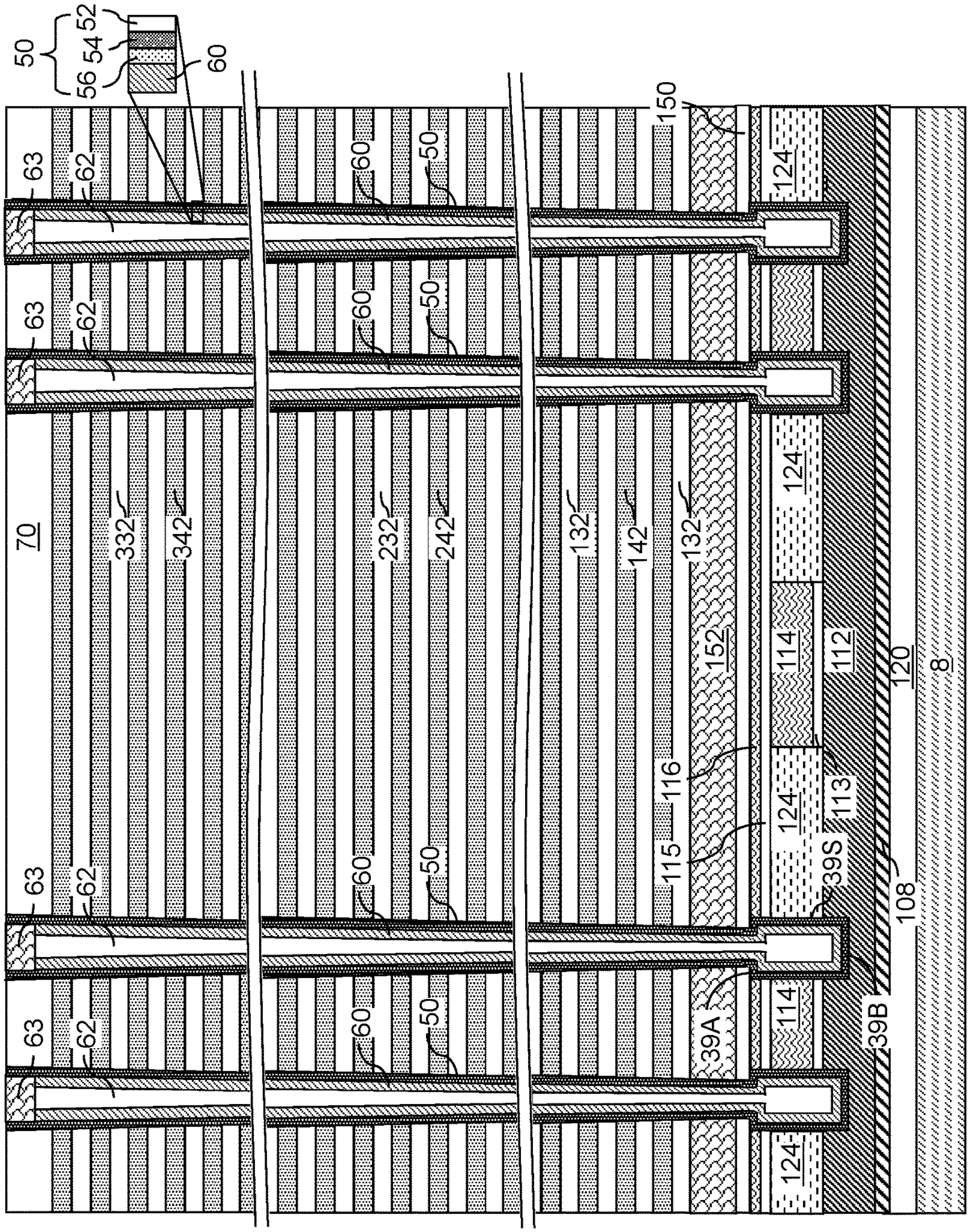
FIG. 15 is a vertical cross-sectional view of the first exemplary structure after formation of memory stack structures, dielectric cores, and drain regions according to the first embodiment of the present disclosure.

Referring to FIG. 15, memory stack structures (50, 60) can be formed in the memory openings 49. Specifically, a stack of layers including a blocking dielectric layer 52, a charge storage layer 54, a tunneling dielectric layer 56, and a semiconductor channel layer can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The combination of the blocking dielectric layer 52, the charge storage layer 54, and the tunneling dielectric layer 56 is herein referred to as a memory film 50.

The semiconductor channel layer includes a semiconductor material that is employed to form semiconductor channels 60. The semiconductor channel layer includes at least one semiconductor material that may include at least one elemental semiconductor material, at least one III-V compound semiconductor material, at least one II-VI compound semiconductor material, at least one organic semiconductor material, or other semiconductor materials known in the art. In one embodiment, the semiconductor channel layer includes amorphous silicon or polysilicon. The semiconductor channel layer can be formed by a conformal deposition method such as low pressure chemical vapor deposition (LPCVD). The thickness of the semiconductor channel layer can be in a range from 2 nm to 10 nm, although lesser and greater thicknesses can also be employed. A memory cavity may be present in the volume of each memory opening 49 that is not filled with the deposited material layers (52, 54, 56, 60).

A dielectric fill material can be deposited to fill the memory cavities within the memory openings. The dielectric fill material can include, for example, silicon oxide or organosilicate glass. The material can be deposited by a conformal deposition method such as low pressure chemical vapor deposition (LPCVD), or by a self-planarizing deposition process such as spin coating. The dielectric fill material and the memory film 50 can be removed from above the top surface of the insulating cap layer 70 by a planarization process, which can include a recess etch process and/or chemical mechanical planarization (CMP) process. A remaining portion of the memory film 50 is present within each memory opening 49. A remaining portion of the semiconductor channel layer is present within each memory opening 49 and constitutes a semiconductor channel 60. A remaining portion of the dielectric fill material is present within each memory opening 49, and is herein referred to as a dielectric core 62.

The dielectric core 62 can be vertically recessed below a horizontal plane including the top surface of the insulating cap layer 70 prior to, during, or after removal of the horizontal portions of the memory film 50 from above the horizontal plane including the top surface of the insulating cap layer 70. Subsequently, a doped semiconductor material having a doping of the first conductivity type can be deposited within the recessed volumes overlying the dielectric cores 62 inside the memory openings 49 to form drain regions 63. For example, the drain regions 63 can include n-doped polysilicon or n-doped amorphous silicon that can be converted into n-doped polysilicon in a subsequent anneal process.

Each combination of a memory film 50 and a semiconductor channel 60 within a memory opening 49 constitutes a memory stack structure (50, 60). The memory stack structure (50, 60) is a combination of a semiconductor channel 60, a tunneling dielectric layer 56, a plurality of memory elements as embodied as portions of the charge storage layer 54, and an optional blocking dielectric layer 52. Each combination of a memory stack structure (50, 60), a dielectric core 62, and a drain region 63 within a memory opening 49 is herein referred to as a memory opening fill structure (50, 60, 62, 63). The same combination can be formed within each support opening to provide a support pillar structure in the contact region 300. The support pillar structures are electrically inactive structures that provide structural support during subsequent replacement of the sacrificial material layers (142, 242, 342) and the sacrificial semiconductor rails 114.

Thus, each memory stack structure (50, 60) includes a semiconductor channel 60 and a memory film 50 laterally surrounding the semiconductor channel 60. An array of memory stack structures (50, 60) can extend through each of the at least one vertically alternating stack {(132, 142), (232, 242), (332, 342)} and into an upper portion of the source semiconductor layer 112. A lower portion of each memory stack structure (50, 60) can have a bulging portion that has a greater lateral dimension than an overlying portion of the respective memory stack structure (50, 60) that adjoins a top end of the bulging portion.

Figure 16:
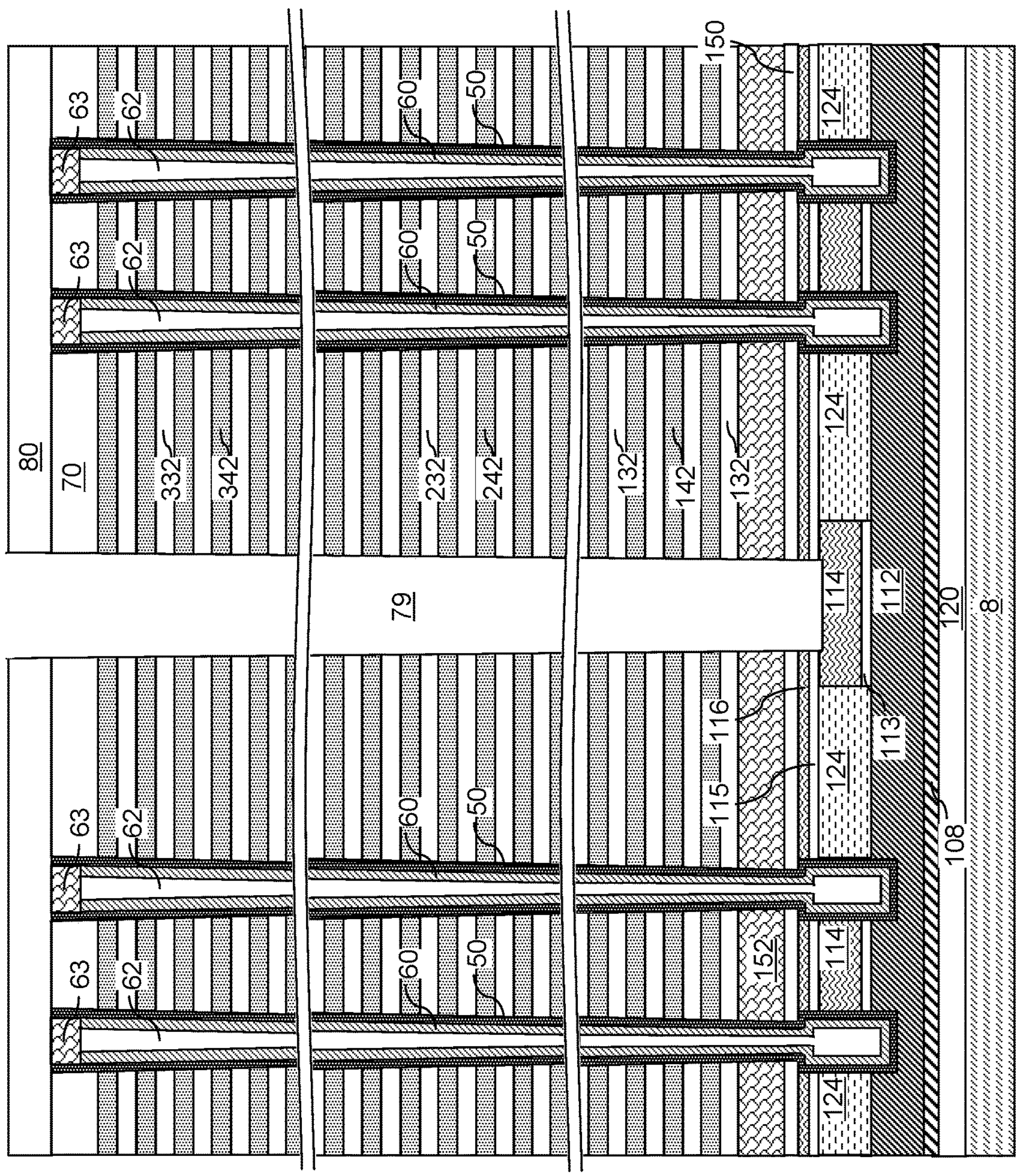
FIG. 16 is vertical cross-sectional view of the first exemplary structure after formation of a backside trench according to the first embodiment of the present disclosure.

Referring to FIG. 16, a contact level dielectric layer 80 can be optionally formed over the insulating cap layer 70. The contact level dielectric layer 80 includes a dielectric material that is different from the dielectric material of the sacrificial material layers (142, 242, 342). For example, the contact level dielectric layer 80 can include silicon oxide. The contact level dielectric layer 80 can have a thickness in a range from 50 nm to 500 nm, although lesser and greater thicknesses can also be employed.

A photoresist layer (not shown) can be applied over the contact level dielectric layer 80, and can be lithographically patterned to form openings in areas between clusters of memory stack structures (50, 60). The pattern in the photoresist layer can be transferred through the contact level dielectric layer 80, the at least one vertically alternating stack {(132, 142), (232, 242), (332, 342)} and/or the at least one retro-stepped dielectric material portion 65 employing an anisotropic etch to form backside trenches 79. The backside trenches 79 vertically extend from the top surface of the contact level dielectric layer 80, through the doped semiconductor layer 152, the gate dielectric layer 150, the cap semiconductor layer 116, and the second dielectric liner 115, and at least to the top surface of the sacrificial semiconductor rails 114. In one embodiment, the backside trenches 79 can laterally extend through the memory array region 100 and the contact region 300. The backside trenches 79 can be formed between clusters of memory stack structures (50, 60), and can laterally extend along a different horizontal direction than the sacrificial semiconductor rails 114. In one embodiment, the backside trenches 79 can laterally extend along the second horizontal direction hd2 illustrated in FIG. 4B. The photoresist layer can be removed, for example, by ashing.

In one embodiment, the backside trenches 79 can be formed through the at least one vertically alternating stack {(132, 142), (232, 242), (332, 342)} by an anisotropic etch employing the doped semiconductor layer 152 as an etch stop layer. Subsequently, the backside trenches 79 can be vertically extended through the doped semiconductor layer 152 and to upper surfaces of the sacrificial semiconductor rails 114 by another anisotropic etch.

Figure 17:
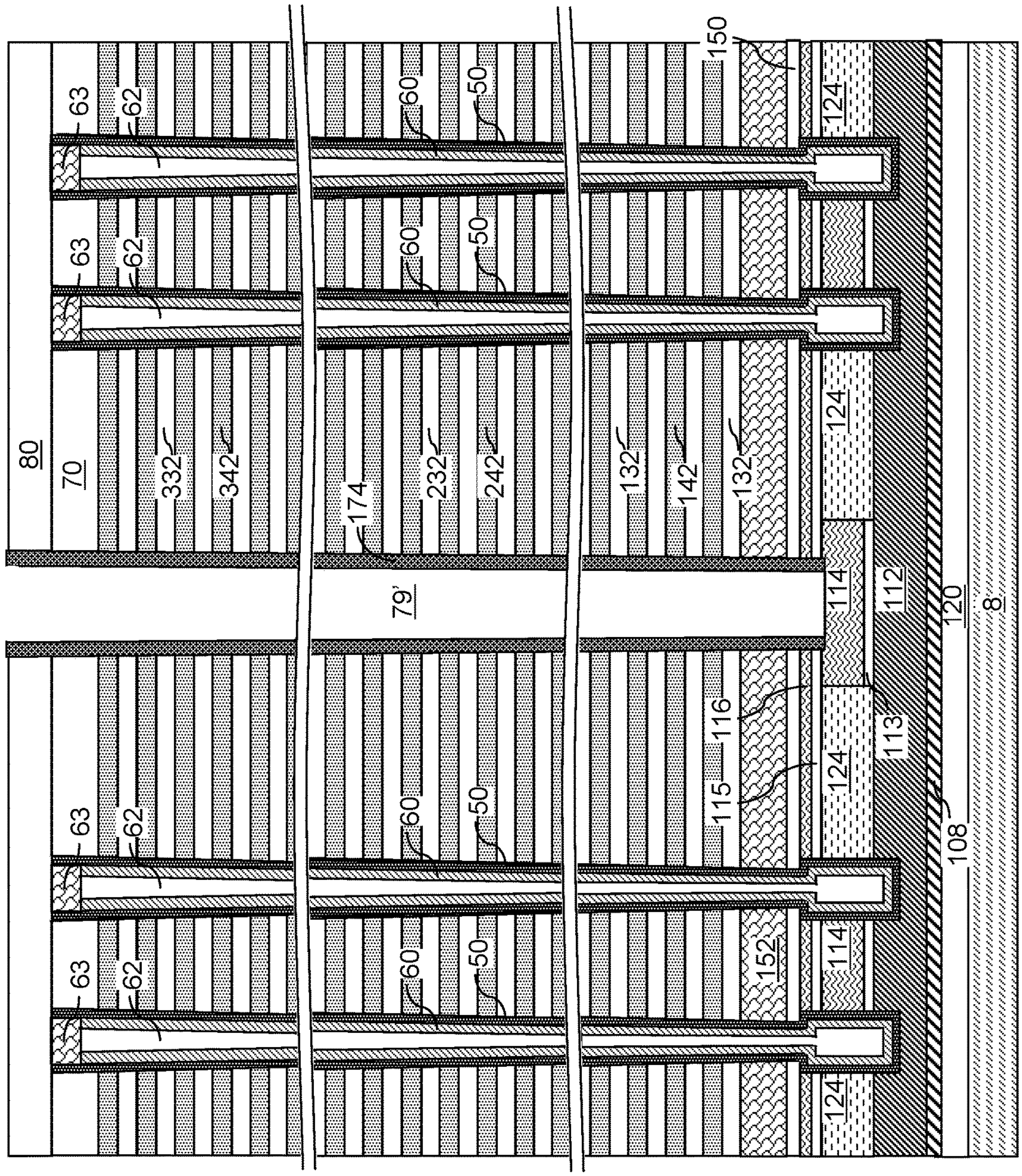
FIG. 17 is a vertical cross-sectional view of the first exemplary structure after formation of a trench spacer according to the first embodiment of the present disclosure.

Referring to FIG. 17, a trench spacer 174 can be formed on the sidewalls of each backside trench 79 by deposition of a conformal material layer and an anisotropic etch. The trench spacer 174 includes a material that is resistant to an etchant to be subsequently employed to etch the sacrificial semiconductor rails 114. For example, the trench spacer 174 can include silicon nitride. The thickness of the trench spacer 174 can be in a range from 10 nm to 30 nm, although lesser and greater thicknesses can also be employed. A trench cavity 79' can be located inside a trench spacer 174 within each backside trench 79.

Figure 18A:
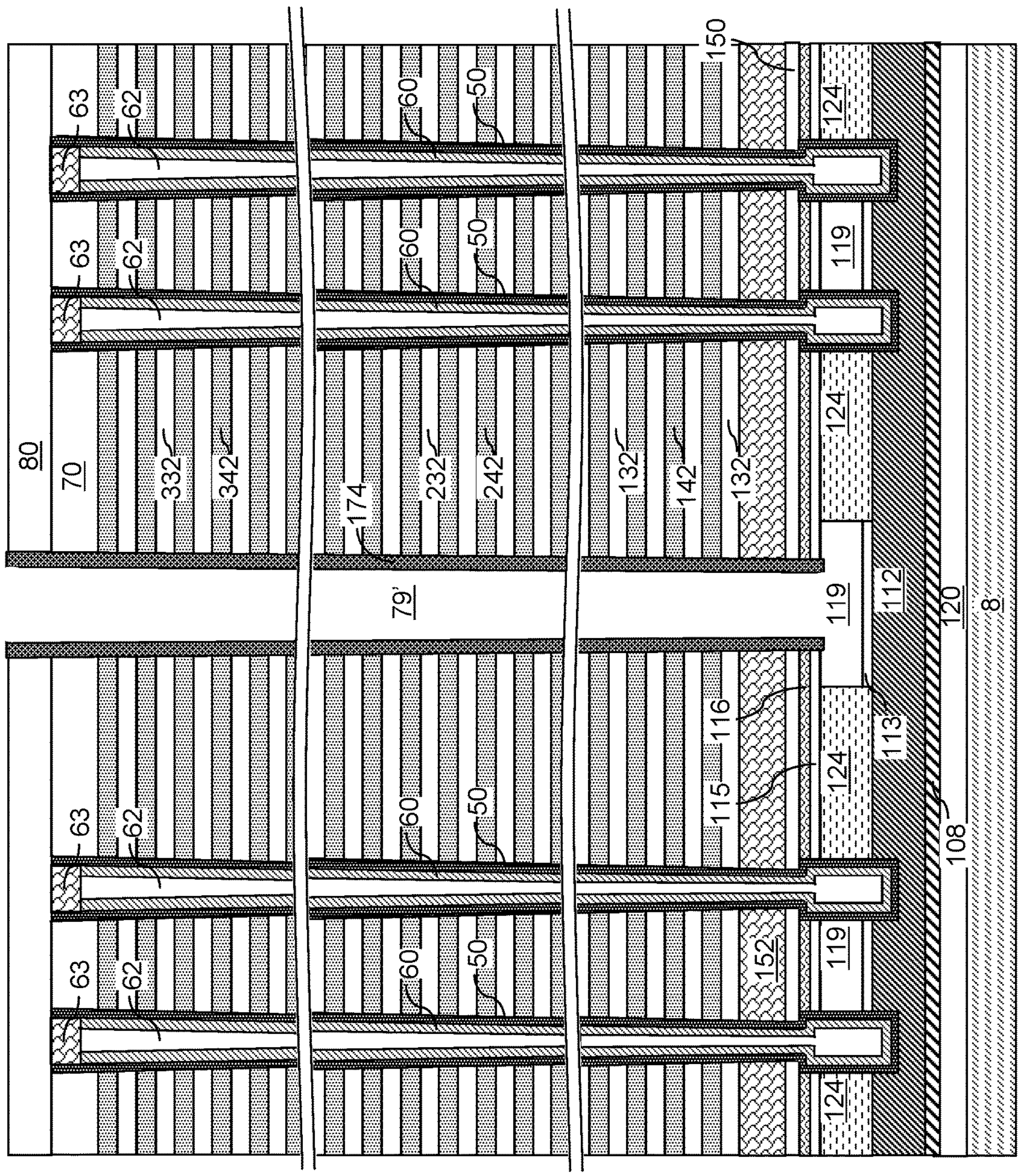
FIG. 18A is a vertical cross-sectional view of the first exemplary structure after formation of source cavities according to the first embodiment of the present disclosure.

Referring to FIG. 18A, a first isotropic etch process can be performed employing an etchant that etches the material of the sacrificial source rails 114 selective to the dielectric rails 124. The etchant can be introduced through the backside trenches 79. In one embodiment, the etchant can be selected such that the etchant etches the semiconductor material of the sacrificial semiconductor rails 114 selective to the dielectric materials of the first dielectric liner 113, the second dielectric liner 115, the dielectric rails 124, and the trench spacers 174. The etchant can be a liquid phase etchant applied in a wet etch process, or a gas phase etchant applied in a dry etch process. For example, if the sacrificial semiconductor rails 114 include amorphous silicon, a wet etch process employing a trimethyl-2 hydroxyethyl ammonium hydroxide (TMY) solution, a wet etch process employing a KOH solution, or other wet etch processes employing TMAH, SCl, or $NH_4OH$ solutions, or a dry etch process employing gas phase HCl may be employed to isotropically etch that sacrificial semiconductor rails 114. Source cavities 119 are formed by removal of the sacrificial semiconductor rails 114 selective to the dielectric materials of the first dielectric liner 113, the second dielectric liner 115, the dielectric rails 124, and the trench spacers 174.

Figure 18B:
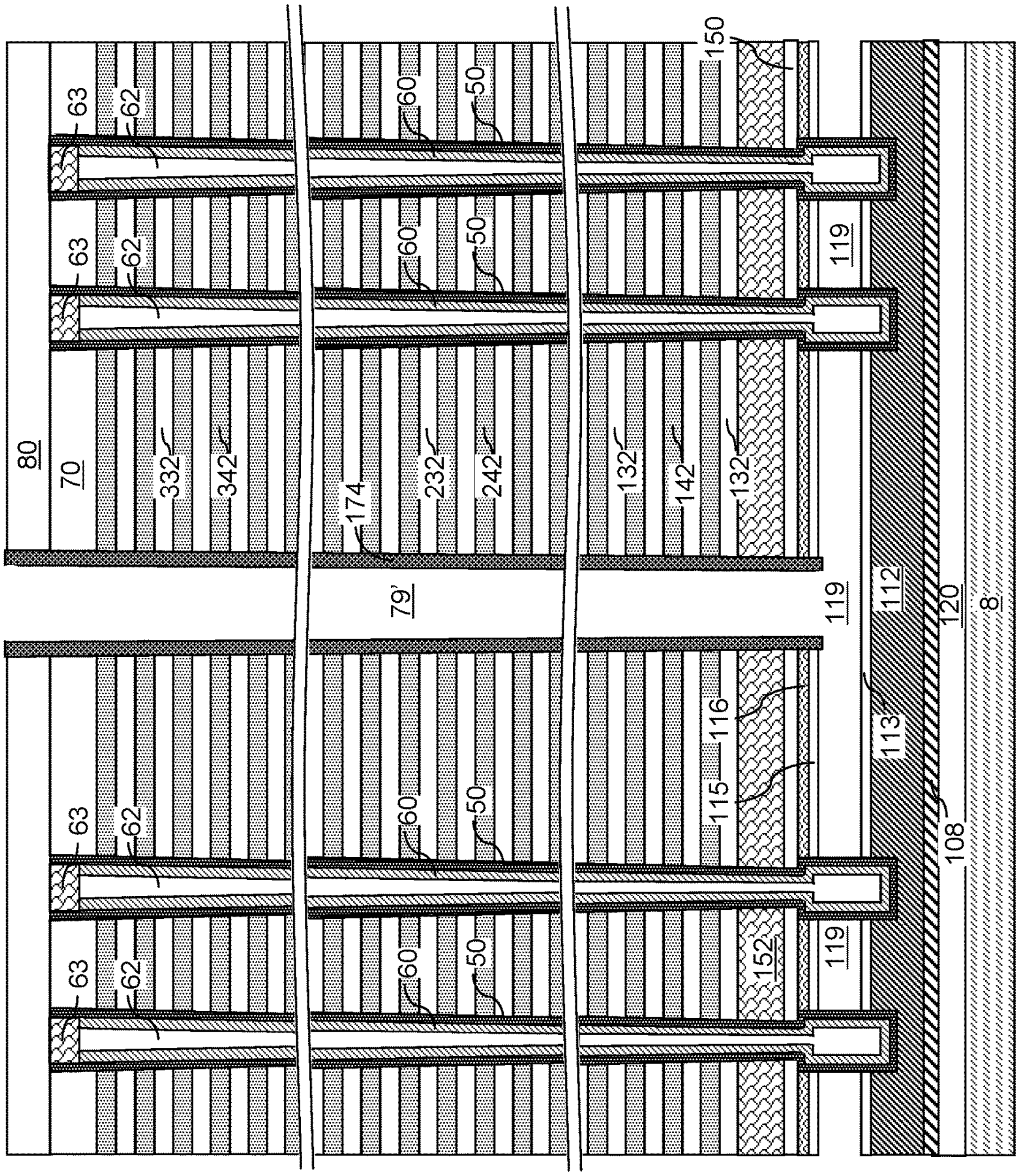
FIG. 18B is an alternative implementation of the first exemplary structure at the processing steps of FIG. 18A.

FIG. 18B shows the alternative implementation of the first exemplary structure at the processing steps of FIG. 18A. Specifically, if the sacrificial semiconductor layer 114L is employed in lieu of the laterally alternating stack (114, 124), the entirety of the sacrificial semiconductor layer 114L can be removed to form a continuous source cavity 119 that laterally surrounds the memory stack structures (50, 60). In this case, the bulging portions of the memory stack structures (50, 60) and the dielectric cores 62 provide structural support to the alternating stacks of the insulating layers (132, 232, 332) and sacrificial material layers (142, 242, 342).

Figure 19A:
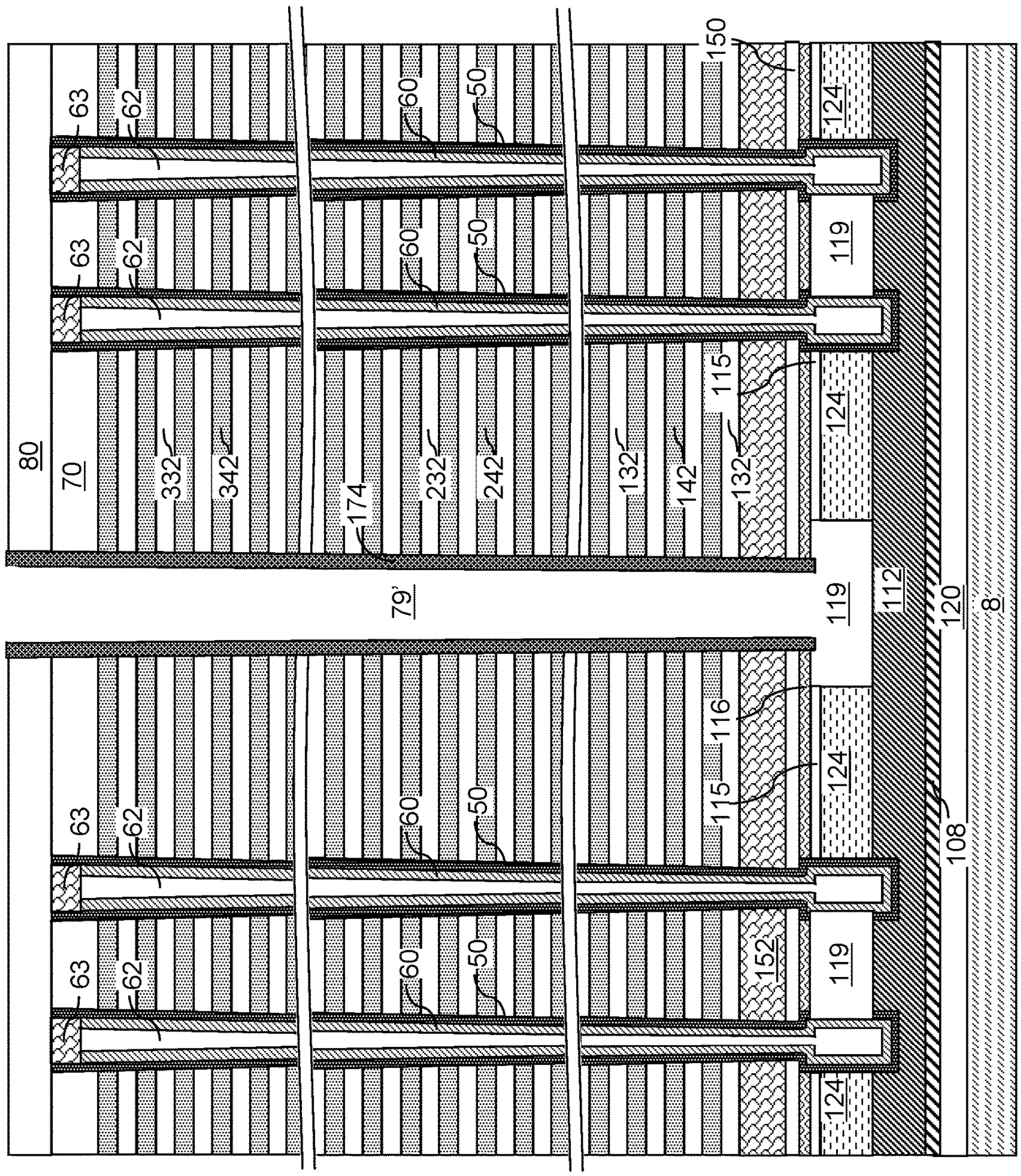
FIG. 19A is a vertical cross-sectional view of the first exemplary structure after removal of physically exposed portions of memory films according to the first embodiment of the present disclosure.

Referring to FIG. 19A, a second isotropic etch process can be performed by introducing at least another etchant through the backside trenches 79 into the source cavities 119. The second isotropic etch process removes materials of the memory films 50 and the dielectric liners (113, 115) selective to the cap semiconductor layer 116 and the semiconductor channels 60. Thus, the physically exposed portions of the memory films 50 adjacent to the source cavities 119 can be removed by the second isotropic etch process to physically expose outer sidewalls of the semiconductor channels 60 in the bulging portions of the memory stack structures (50, 60). Portions of the memory films 50 that are adjacent to the sacrificial semiconductor rails 114 at the processing steps of FIG. 17 are removed to form a lateral opening through each memory film 50. In an illustrative example, a wet etch employing hydrofluoric acid can be employed for the second isotropic etch process. The source cavities 119 can be expanded in volume by removal of the physically exposed portions of the memory films 50 and the portions of the dielectric liners (113, 115) that overlie or underlie the source cavities 119.

Figure 19B:
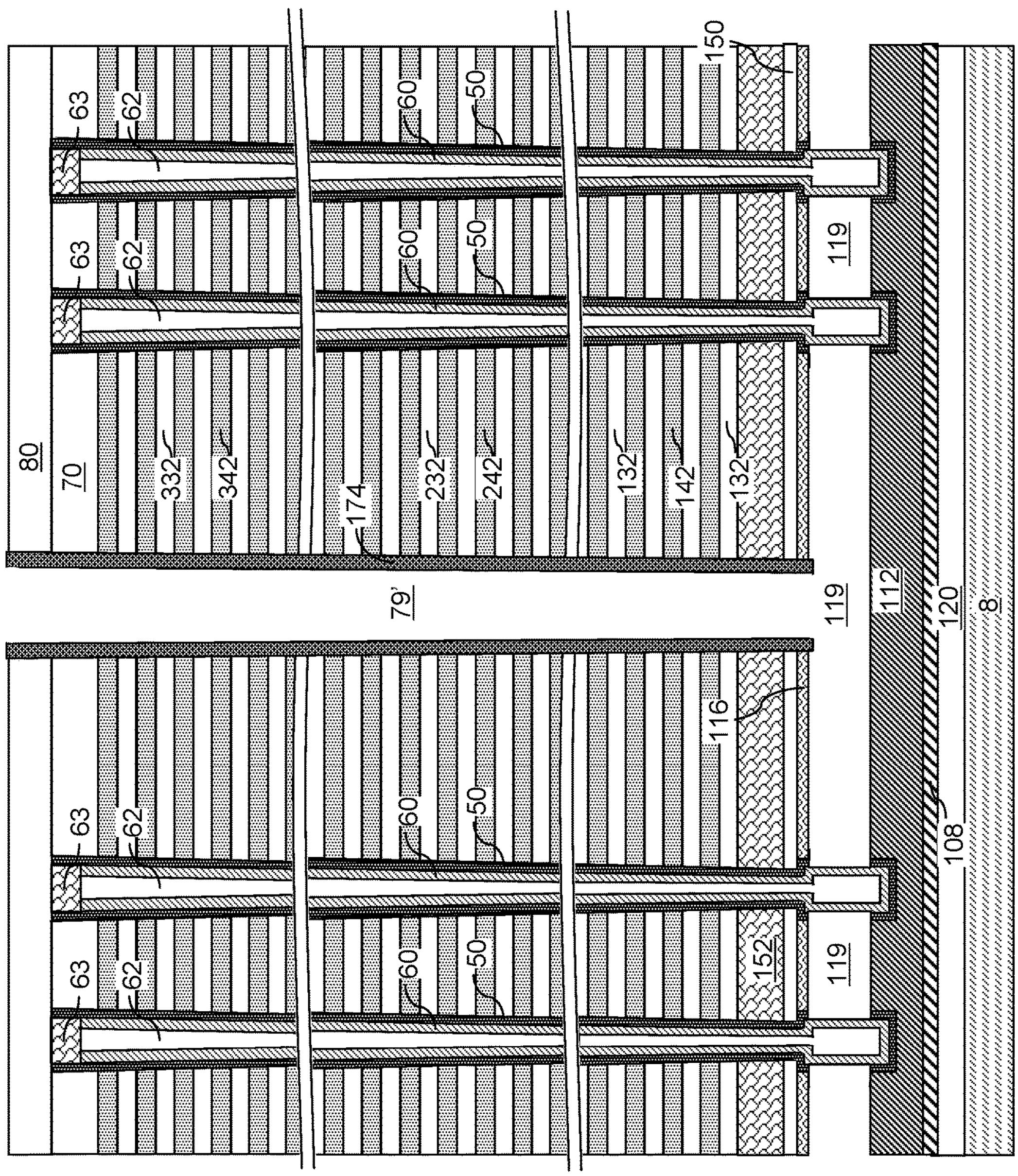
FIG. 19B is an alternative implementation of the first exemplary structure at the processing steps of FIG. 19A.

FIG. 19B shows the alternative implementation of the first exemplary structure at the processing steps of FIG. 19A. Specifically, if the sacrificial semiconductor layer 114L is employed in lieu of the laterally alternating stack (114, 124), the continuous source cavity 119 laterally surrounds the memory stack structures (50, 60), and the portions of the memory films 50 at the level of the continuous source cavity 119 are removed by the etch process. Thus, each physically exposed sidewall of the vertical semiconductor channels 60 at the bulging portions can azimuthally extend by 360 degrees around a vertical axis passing through the geometrical center of a respective memory opening. In this case, the bulging portions of the vertical semiconductor channels 60 and the dielectric cores 62 provide structural support to the alternating stacks of the insulating layers (132, 232, 332) and sacrificial material layers (142, 242, 342).

Figure 20:
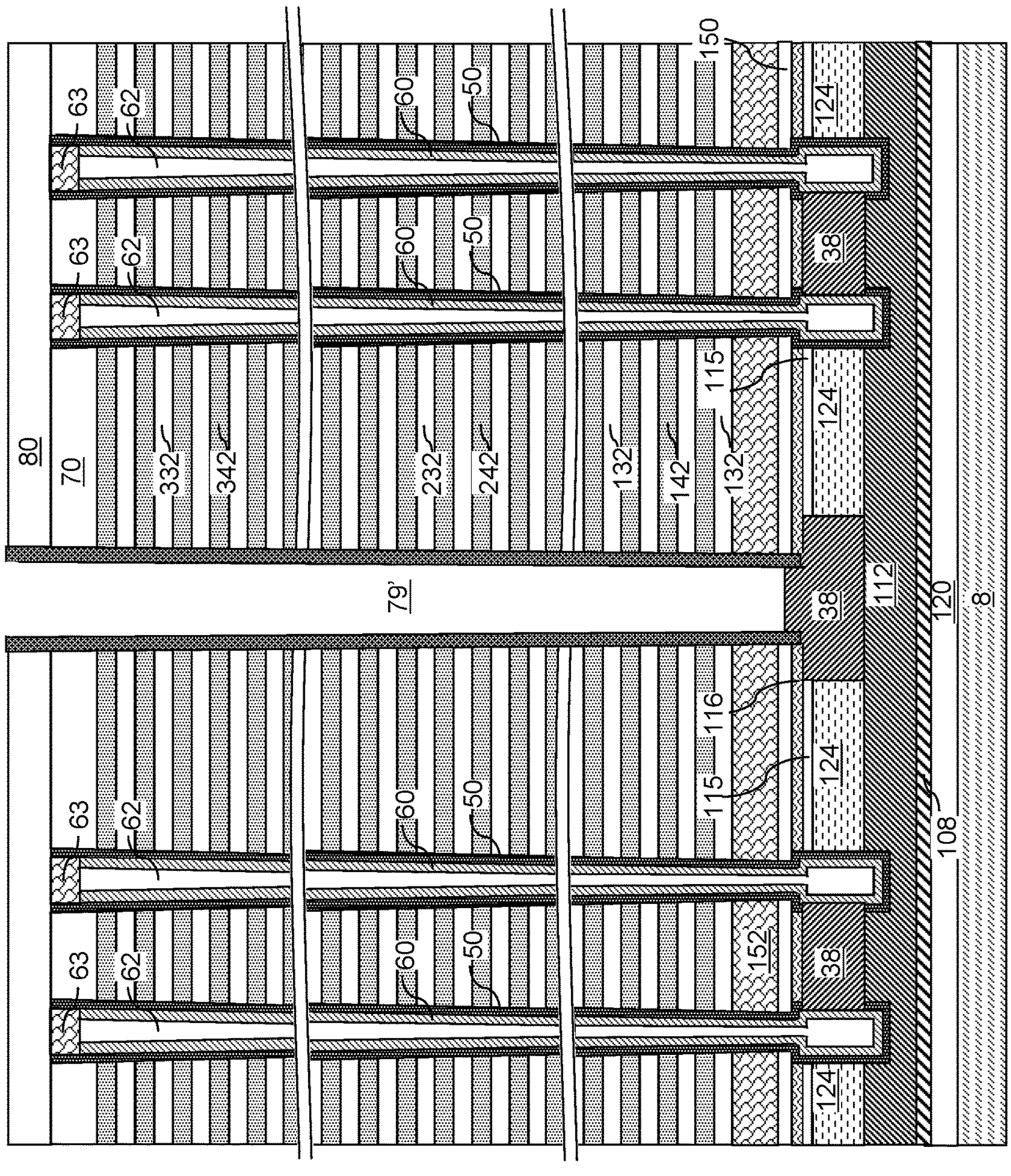
FIG. 20 is a vertical cross-sectional view of the first exemplary structure after formation of source strap rails according to the first embodiment of the present disclosure.

Referring to FIG. 20, a selective semiconductor deposition process can be performed to grow doped semiconductor material portions from physically exposed semiconductor surfaces. A selective semiconductor deposition process is a deposition process in which a reactant for depositing a semiconductor material and an etchant that etches the semiconductor material are concurrently or alternately flowed into a process chamber such that the etch rate of the semiconductor material provided by the etchant is between the higher growth rate of the semiconductor material on semiconductor surfaces and the lower growth rate (or the nucleation rate) of the semiconductor material on dielectric surfaces. A net deposition of the semiconductor material occurs only on the semiconductor surfaces, and the semiconductor material does not grow from the dielectric surfaces. A dopant can be flowed concurrently with the reactant for deposition of the semiconductor material to provide in-situ doping of the deposited semiconductor material. The deposited semiconductor material may be polycrystalline if the underlying semiconductor surfaces are polycrystalline or amorphous, or single crystalline (epitaxial) or polycrystalline if the underlying semiconductor surfaces are single crystalline.

The doped semiconductor material can grow directly from the physically exposed outer sidewall surfaces of the semiconductor channels 60, the physically exposed top surfaces of the source semiconductor layer 112, and the physically exposed bottom surfaces of the cap semiconductor layer 116. The doped semiconductor material can have a doping of the first conductivity type, i.e., the same conductivity type as the conductivity type of the source semiconductor layer 112. For example, if the source semiconductor layer 112 includes an n-doped semiconductor material, the deposited doped semiconductor material is also n-doped. The source strap rails 38 are formed directly on the outer sidewalls of the semiconductor channels 60, portions of the top surface of the source conductive layer 112 that do not contact the dielectric rails 124, and portions of the bottom surface of the cap semiconductor layer 116 that do not contact the dielectric rails 124. The deposited doped semiconductor material fill the source cavities 119 to form source strap rails 38 that laterally extend along the first horizontal direction hd1 (shown in FIG. 4B). Thus, the source strap rails 38 can laterally extend along the first horizontal direction hd1, and can contact a respective subset of the semiconductor channels 60 of the memory stack structures (50, 60) at a level of the bulging portion of each memory stack structure (50, 60). The source strap rails 38 provide electrically conductive paths between the source semiconductor layer 112 and bottom sidewall portions of the semiconductor channels 60.

Figure 21:
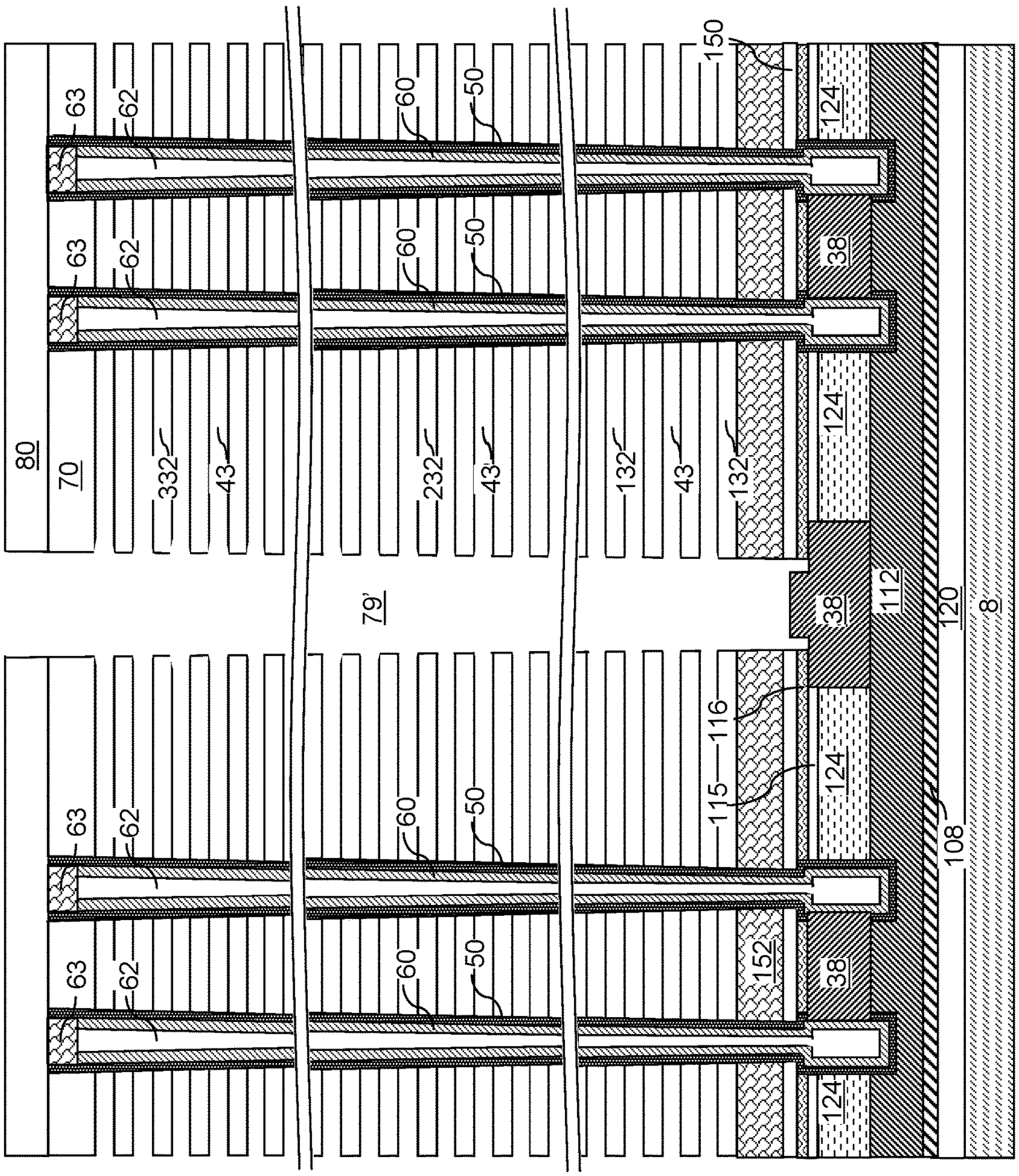
FIG. 21 is a vertical cross-sectional view of the first exemplary structure after formation of backside recesses according to the first embodiment of the present disclosure.

Referring to FIG. 21, an etchant that selectively etches the second material of the sacrificial material layers (142, 242, 342) with respect to the first material of the insulating layers (132, 232, 332) can be introduced into the backside trenches 79 employing an isotropic etch process such as a wet etch process. If the trench spacer 174 includes the same material as the sacrificial material layers (142, 242, 342), the trench spacer 174 can be removed in the same etch process as the etch process employed to remove the sacrificial material layers (142, 242, 342). If the trench spacer 174 includes a different material than the sacrificial material layers (142, 242, 342), the trench spacer 174 may be removed by an isotropic etch prior to removal of the sacrificial material layers (142, 242, 342). In an illustrative example, if the trench spacer 174 and the sacrificial material layers (142, 242, 342) include silicon nitride, a wet etch employing hot phosphoric acid can be employed to remove the trench spacer 174 and the sacrificial material layers (142, 242, 342).

Backside recesses 43 are formed in volumes from which the sacrificial material layers (142, 242, 342) are removed. The removal of the second material of the sacrificial material layers (142, 242, 342) can be selective to the first material of the insulating layers (132, 232, 332), the material of retro-stepped dielectric material portions, the material of the outermost layer of the memory films 50, and the semiconductor materials of the doped semiconductor layer 152, the cap semiconductor layer 116, and the source strap rails 38. In one embodiment, the sacrificial material layers (142, 242, 342) can include silicon nitride, and the materials of the insulating layers (132, 232, 332) and the retro-stepped dielectric material portions can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers (142, 242, 342) include silicon nitride, the etch process can be a wet etch process in which the exemplary structure is immersed within a wet etch tank including phosphoric acid, which etches silicon nitride selective to silicon oxide, silicon, and various other materials employed in the art. The memory stack structures (50, 60) in the memory array region 100, the support pillar structure provided in the contact region 300, and the retro-stepped dielectric material portions can provide structural support while the backside recesses 43 are present within volumes previously occupied by the sacrificial material layers (142, 242, 342).

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers (142, 242, 342) is removed. The memory openings in which the memory stack structures (50, 60) are formed are herein referred to as front side openings or front side cavities in contrast with the backside recesses 43. In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings. Each of the plurality of backside recesses 43 can extend substantially parallel to the top surface of the substrate 8. A backside recess 43 can be vertically bounded by a top surface of an underlying insulating layer (132, 232, 332) and a bottom surface of an overlying insulating layer (132, 232, 332). In one embodiment, each backside recess 43 can have a uniform height throughout.

Figure 22:
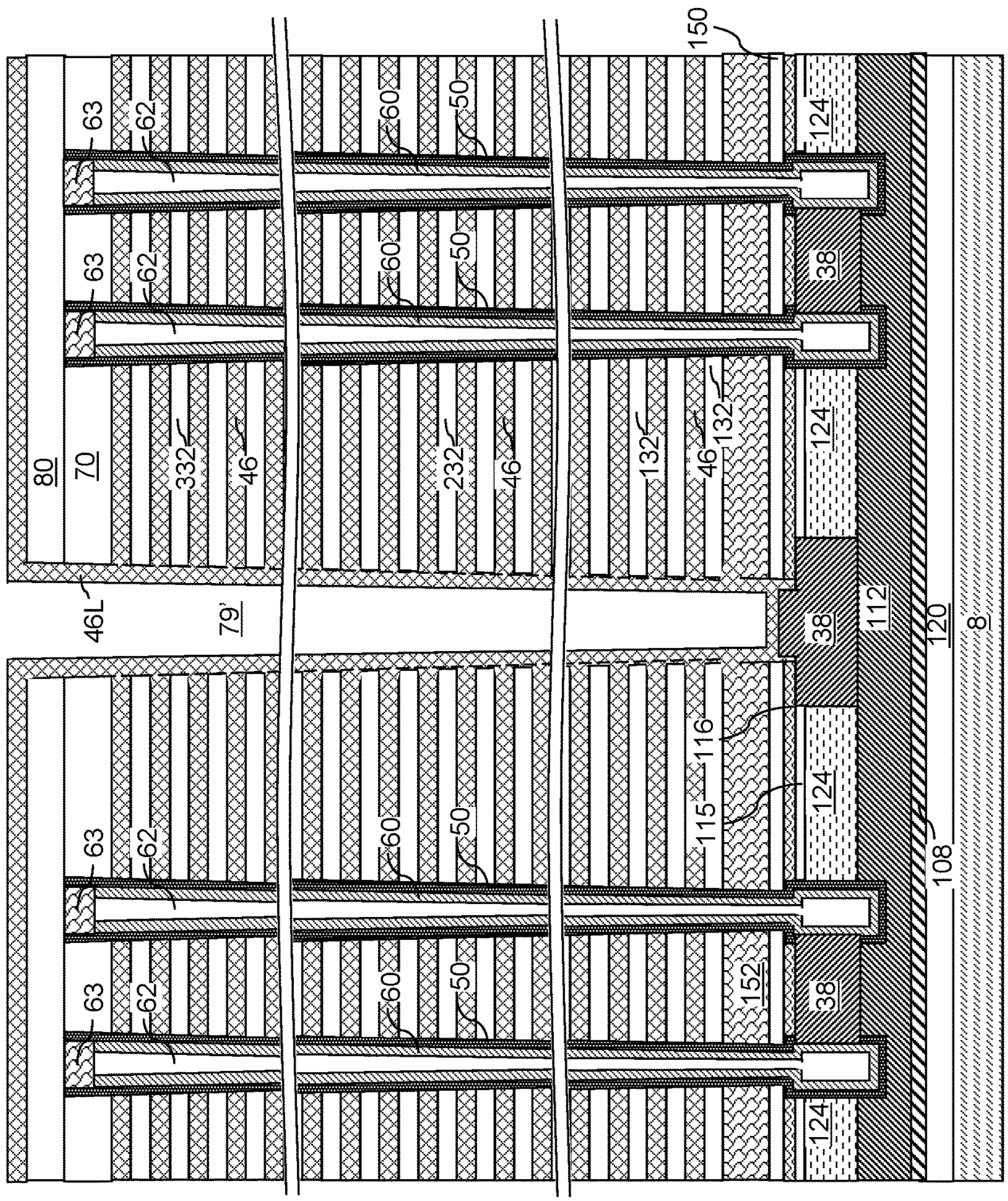
FIG. 22 is a vertical cross-sectional view of the first exemplary structure after deposition of at least one conductive material to form electrically conductive lines according to the first embodiment of the present disclosure.

Referring to FIG. 22, a backside blocking dielectric layer (not shown) can be optionally formed as a continuous material layer in the backside recesses 43 and the backside trenches 79 and over the contact level dielectric layer 80. The backside blocking dielectric layer, if present, comprises a dielectric material that functions as a control gate dielectric for the control gates to be subsequently formed in the backside recesses 43. At least one metallic material can be subsequently deposited in the backside recesses 43 and the backside trenches 79. For example, a combination of a metallic barrier layer (which may include a conductive metallic nitride material such as TiN, TaN, WN, or a stack thereof) and at least one metal fill material layer (such as a tungsten layer) can be deposited by conformal deposition processes such as chemical vapor deposition (CVD) or atomic layer deposition (ALD). A plurality of electrically conductive layers 46 can be formed in the plurality of backside recesses 43, and a continuous metallic material layer 46L can be formed on the sidewalls of each backside trench 79 and over the contact level dielectric layer 80. Each electrically conductive layer 46 includes a portion of the metallic barrier layer and a metallic fill material portion. Thus, each sacrificial material layer (142, 242, 342) can be replaced with an electrically conductive layer 46. A backside cavity 79' is present in the portion of each backside trench 79 that is not filled with the backside blocking dielectric layer and the continuous metallic material layer 46L.

Figure 23:
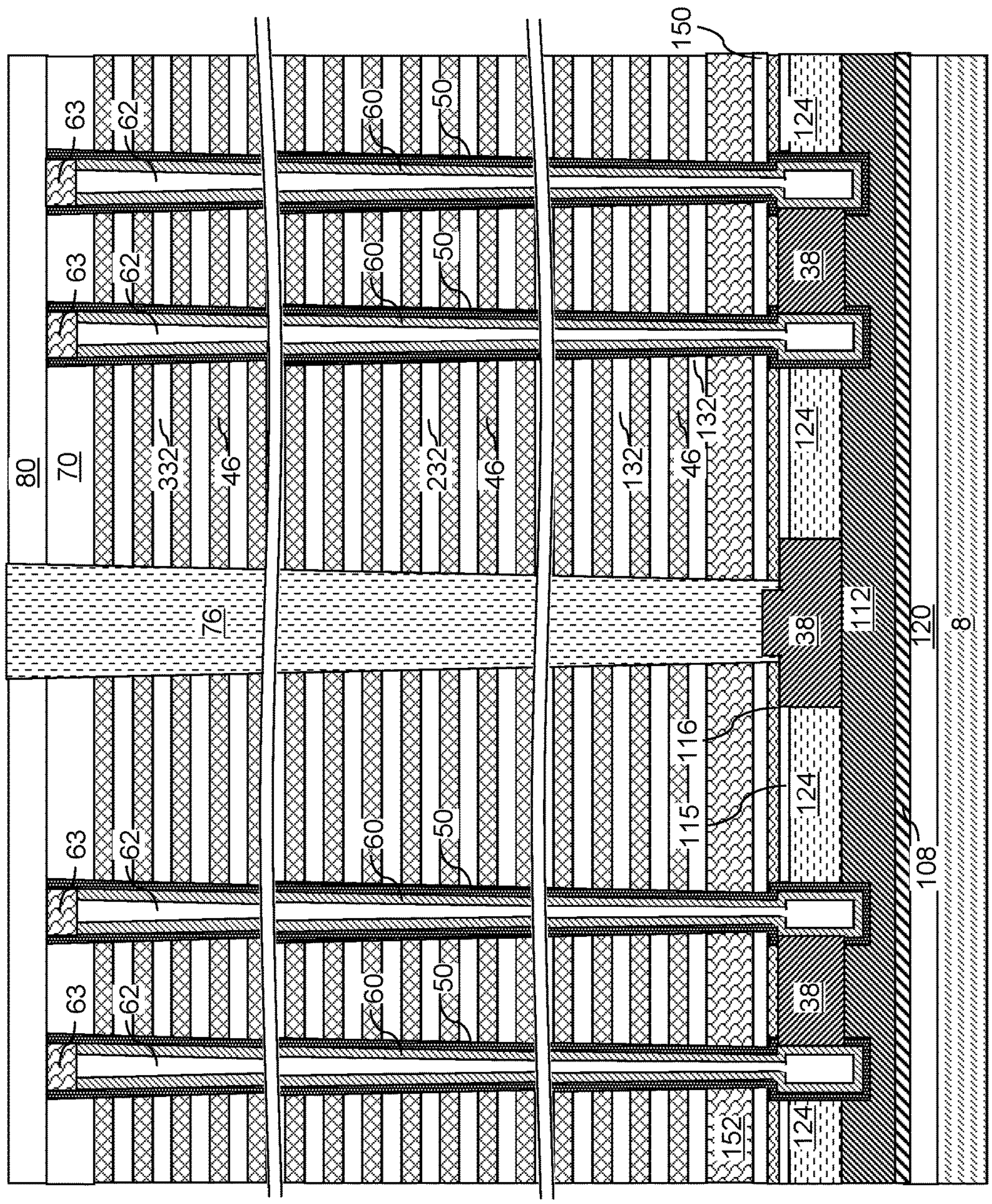
FIG. 23 is a vertical cross-sectional view of the first exemplary structure after removal of the deposited at least one conductive material from inside the backside trench and formation of an insulating wall structure according to the first embodiment of the present disclosure.

Referring to FIG. 23, the deposited metallic material of the continuous electrically conductive material layer 46L is etched back from the sidewalls of each backside trench 79 and from above the contact level dielectric layer 80, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers (142, 242, 343) are replaced with the electrically conductive layers 46. In an alternative embodiment in which the spacer material layers are formed as electrically conductive layers in lieu of sacrificial material layers (142, 242, 343), the processing steps of FIGS. 21 and 22 can be omitted.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 can include the control gate electrodes for the vertical memory devices including the memory stack structures (50, 60). In other words, each electrically conductive layer 46 can be a word line that functions as a common control gate electrode for the plurality of vertical memory devices.

Subsequently, an insulating material (such as silicon oxide) can be deposited in the backside cavities 79' to form insulating wall structure 76. Excess portions of the insulating material overlying the contact level dielectric layer 80 may, or may not, be removed. Each insulating wall structure 76 contacts sidewalls of the insulating layers (132, 232, 332) and the electrically conductive layers 46 and top surfaces of the source strap rails 38.

Figure 24A:
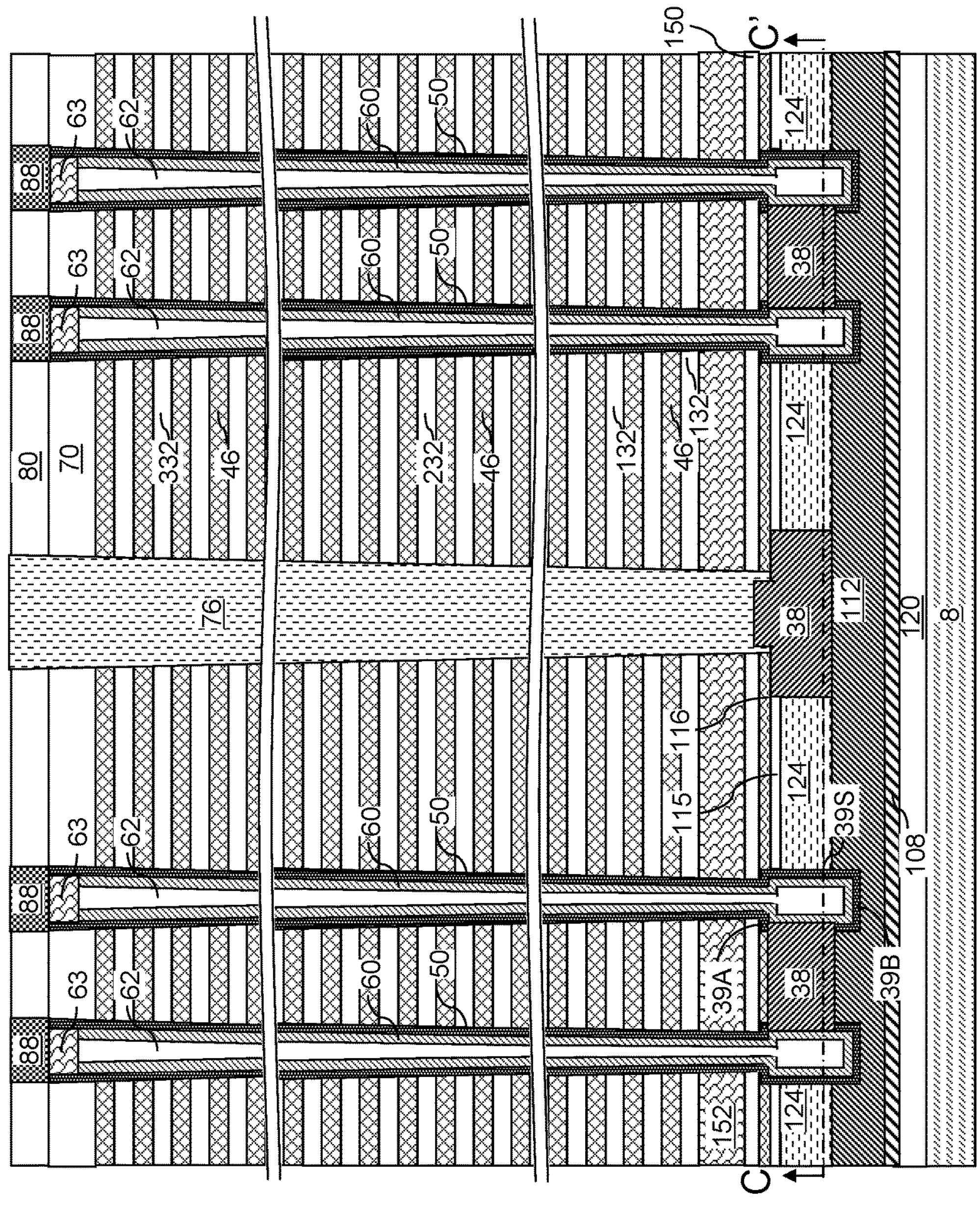
FIG. 24A is a vertical cross-sectional view of the first exemplary structure after formation of various contact via structures according to the first embodiment of the present disclosure.
Figure 24B:
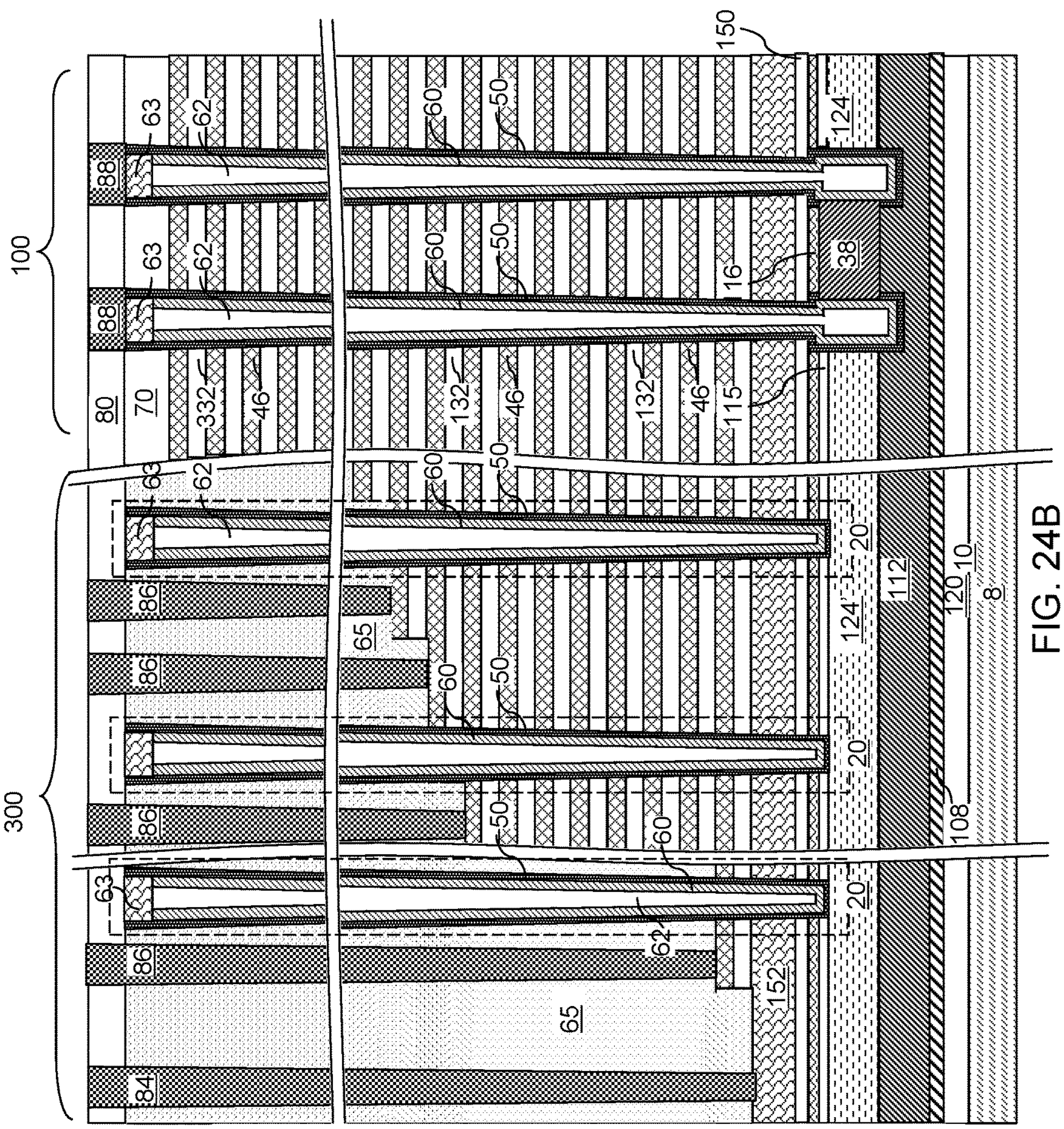
FIG. 24B is a vertical cross-sectional view of another region of the first exemplary structure of FIG. 24A.
Figure 24C:
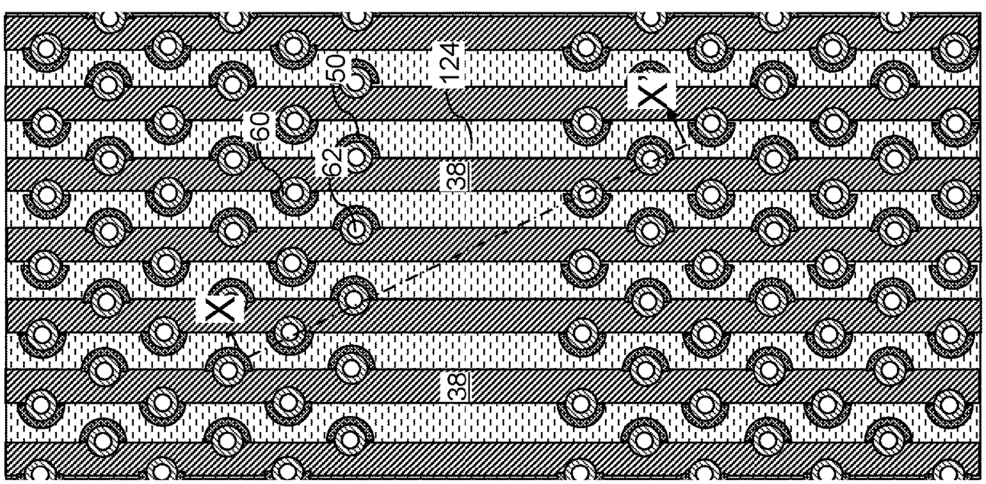
FIG. 24C is a horizontal cross-sectional view of the first exemplary structure of FIG. 24A along the horizontal plane C-C'. The vertical plane X-X' in FIG. 24C corresponds to the plane of the vertical cross-sectional view of FIG. 24A.

Referring to FIGS. 24A-24C, contact via structures (88, 86) can be formed through the contact level dielectric layer 80, and through the retro-stepped dielectric material portions 65. For example, drain contact via structures 88 can be formed through the contact level dielectric layer 80 on each drain region 63. Word line contact via structures 86 can be formed on the electrically conductive layers 46 through the contact level dielectric layer 80, and through the retro-stepped dielectric material portions 65. Additionally, peripheral device contact via structures (not shown) can be formed through the retro-stepped dielectric material portions 65 on respective nodes of the peripheral devices directly and/or through the various lower level metal interconnect structures within the at least one lower level dielectric layer 120.

Each bulging portion at the bottom of a memory stack structure (50, 60) includes an annular top surface 39A having an inner periphery that adjoins an outer periphery of the overlying portion of the respective memory stack structure (50, 60); a sidewall 39S (which may be vertical) having an upper periphery that adjoins an outer periphery of the annular top surface 39A; and a planar bottom surface 39B contacting a horizontal surface of the source semiconductor layer 112.

Figure 24D:
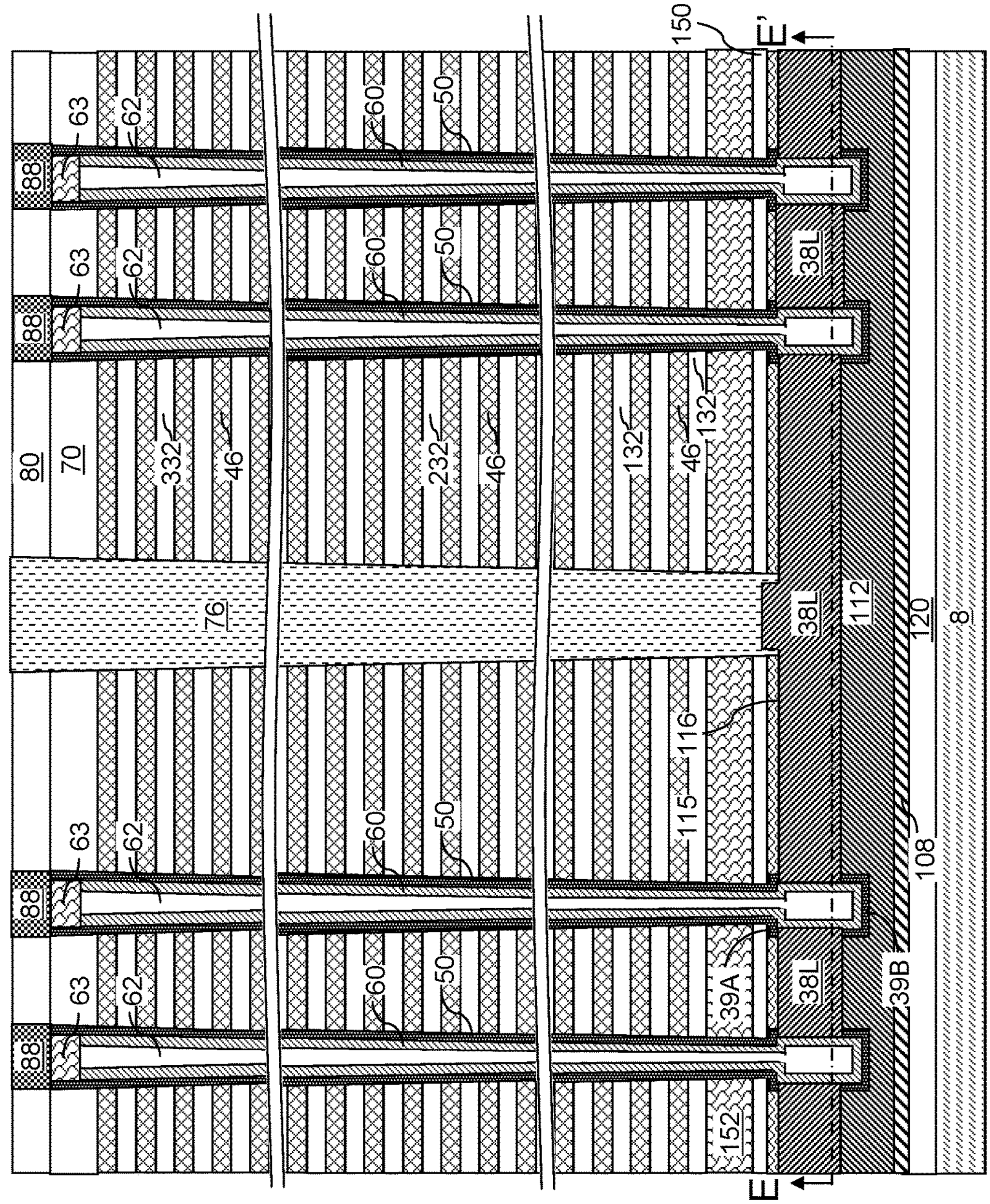
FIG. 24D is a vertical cross-sectional view of the alternative implementation of the first exemplary structure at the processing steps of FIGS. 24A-24C.
Figure 24E:
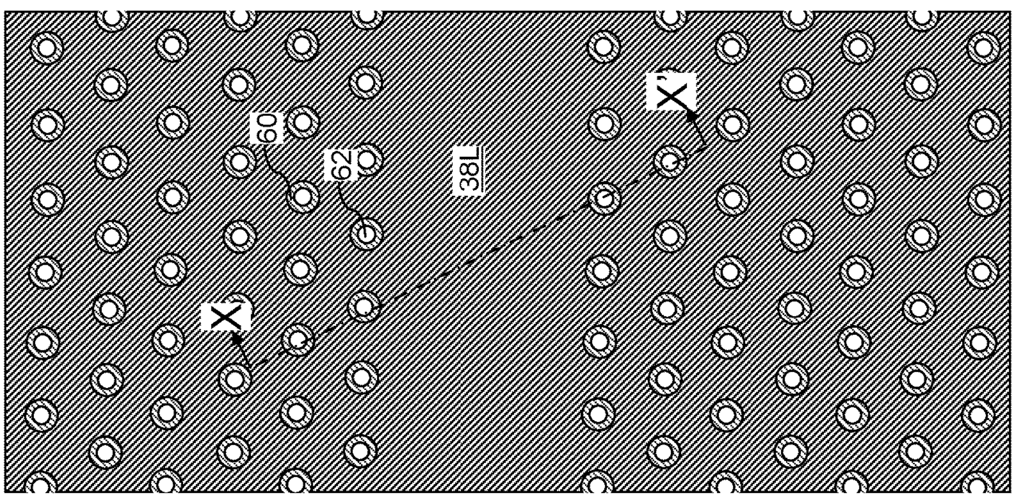
FIG. 24E is a horizontal cross-sectional view of the alternative implementation of the first exemplary structure of FIG. 24D along the horizontal plane E-E'. The vertical plane X-X' in FIG. 24E corresponds to the plane of the vertical cross-sectional view of FIG. 24D.

Referring to FIGS. 24D and 24E, the alternative implementation of the first exemplary structure is illustrated. A source strap layer 38L is formed in lieu of the laterally alternating stack of source strap rails 38 and dielectric rails 124 shown in FIGS. 24A-24C. The source strap layer 38L is a continuous material layer that contacts, and laterally surrounds, sidewalls of each of the vertical semiconductor channels 60.

Figure 25A:
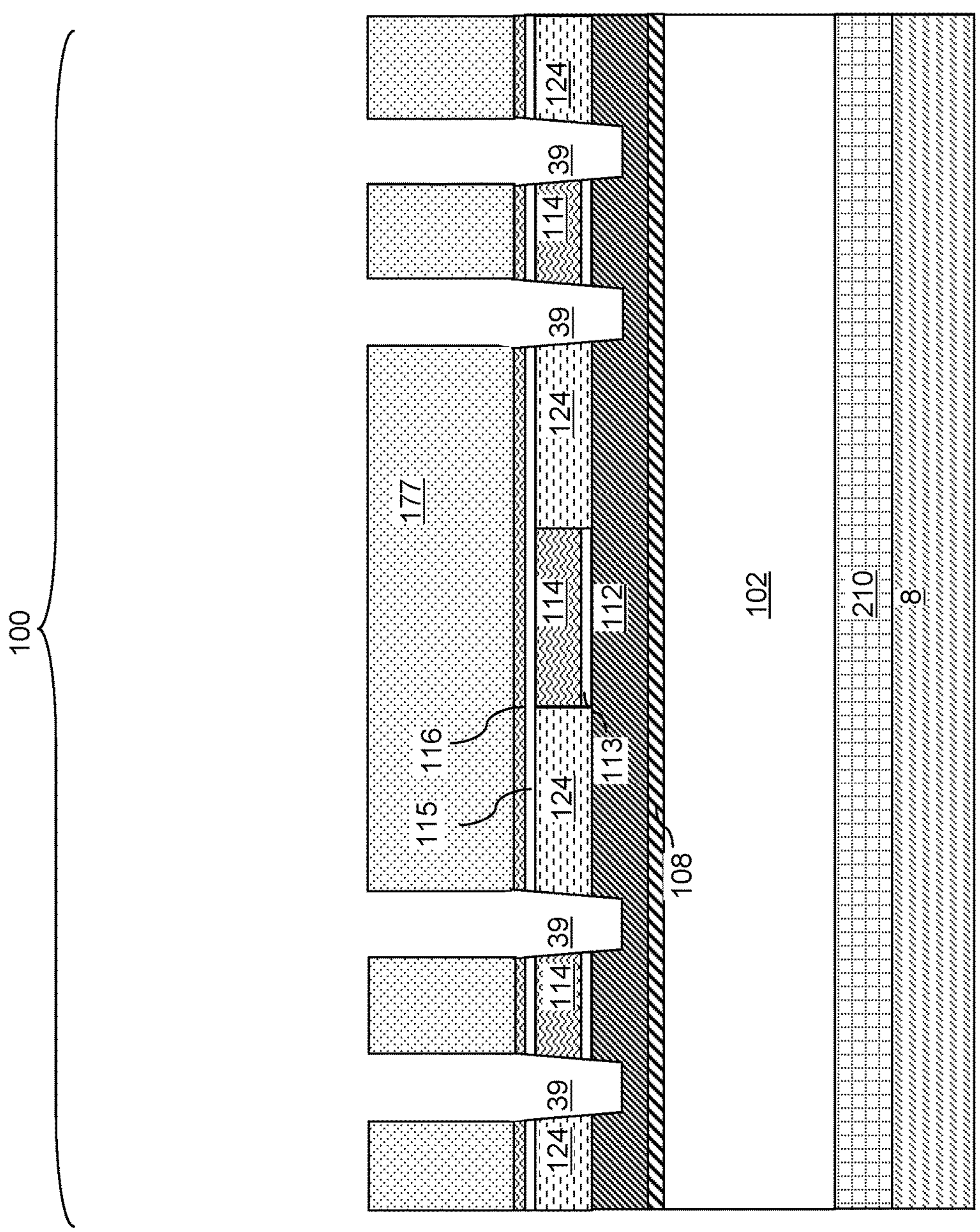
FIG. 25A is a vertical cross-sectional view of a first alternative configuration of the first exemplary structure after formation of source-level memory openings according to the first embodiment of the present disclosure.

Referring to FIG. 25A, a first alternative configuration of the first exemplary structure according to the first embodiment of the present disclosure is shown at the processing step of FIG. 4A. In this configuration, the source-level memory openings 39 can be formed with a taper. Specifically, the sidewalls of the source-level memory openings 39 can have a taper angle in a range from 1 degrees to 10 degrees with respect to a vertical axis that is perpendicular to the top surface of the substrate 8. A greater or a lesser taper angle can also be employed.

Figure 25B:
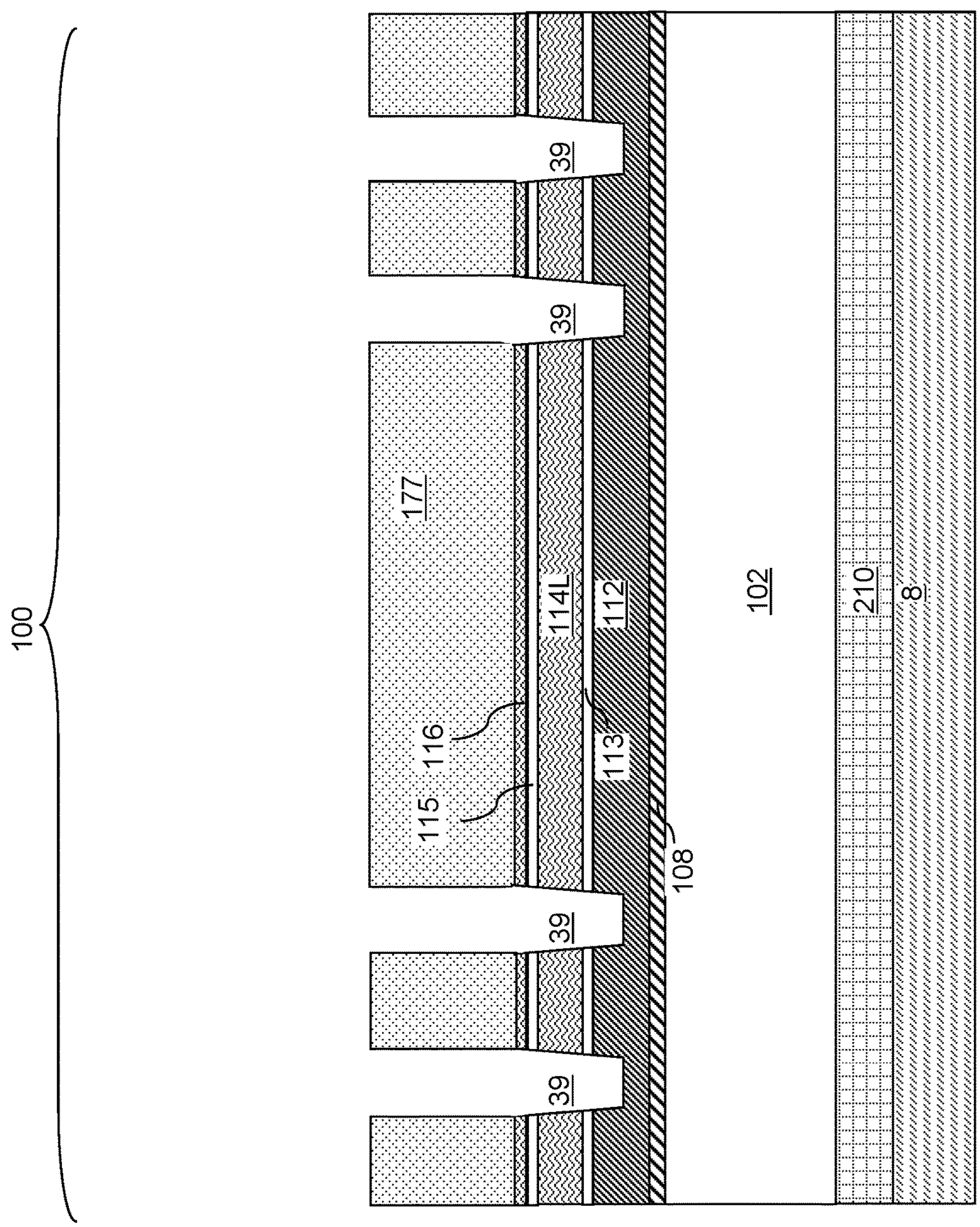
FIG. 25B is a vertical cross-sectional view of an alternative implementation of the first alternative configuration of the first exemplary structure in which a blanket sacrificial semiconductor layer is employed in lieu of a laterally alternating stack of sacrificial semiconductor rails and dielectric rails according to the first embodiment of the present disclosure.

FIG. 25B illustrates an alternative implementation of the first alternative configuration of the first exemplary structure shown in FIG. 25A. A sacrificial semiconductor layer 114L is employed in lieu of a laterally alternating stack of sacrificial semiconductor rails 114 and dielectric rails 124.

Subsequently, the processing steps of FIG. 5 through FIGS. 24A-24C can be performed to provide the first alternative configuration of the first exemplary structure illustrated in FIG. 26A. In the first alternative configuration, each semiconductor channel 60 can contact a respective source strap rail 38 at a tapered sidewall, thereby increasing the total contact area. Each bulging portion at the bottom of a memory stack structure (50, 60) includes an annular top surface 39A having an inner periphery that adjoins an outer periphery of the overlying portion of the respective memory stack structure (50, 60); a sidewall 39S (which may be tapered) having an upper periphery that adjoins an outer periphery of the annular top surface 39A; and a planar bottom surface 39B contacting a horizontal surface of the source semiconductor layer 112.

Figure 26A:
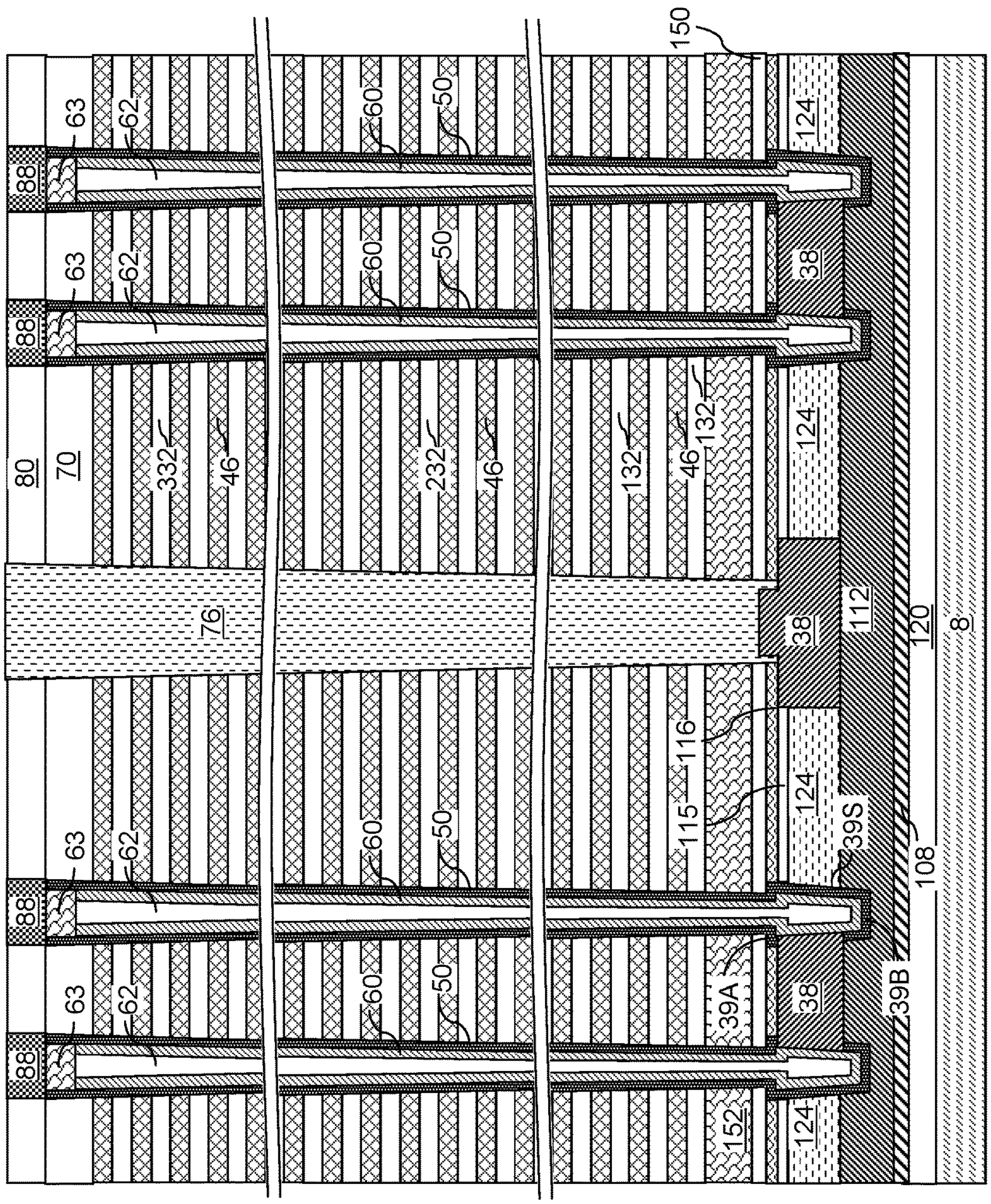
FIG. 26A is a vertical cross-sectional view of the first alternative configuration of the first exemplary structure after formation of various contact via structures according to the first embodiment of the present disclosure.
Figure 26B:
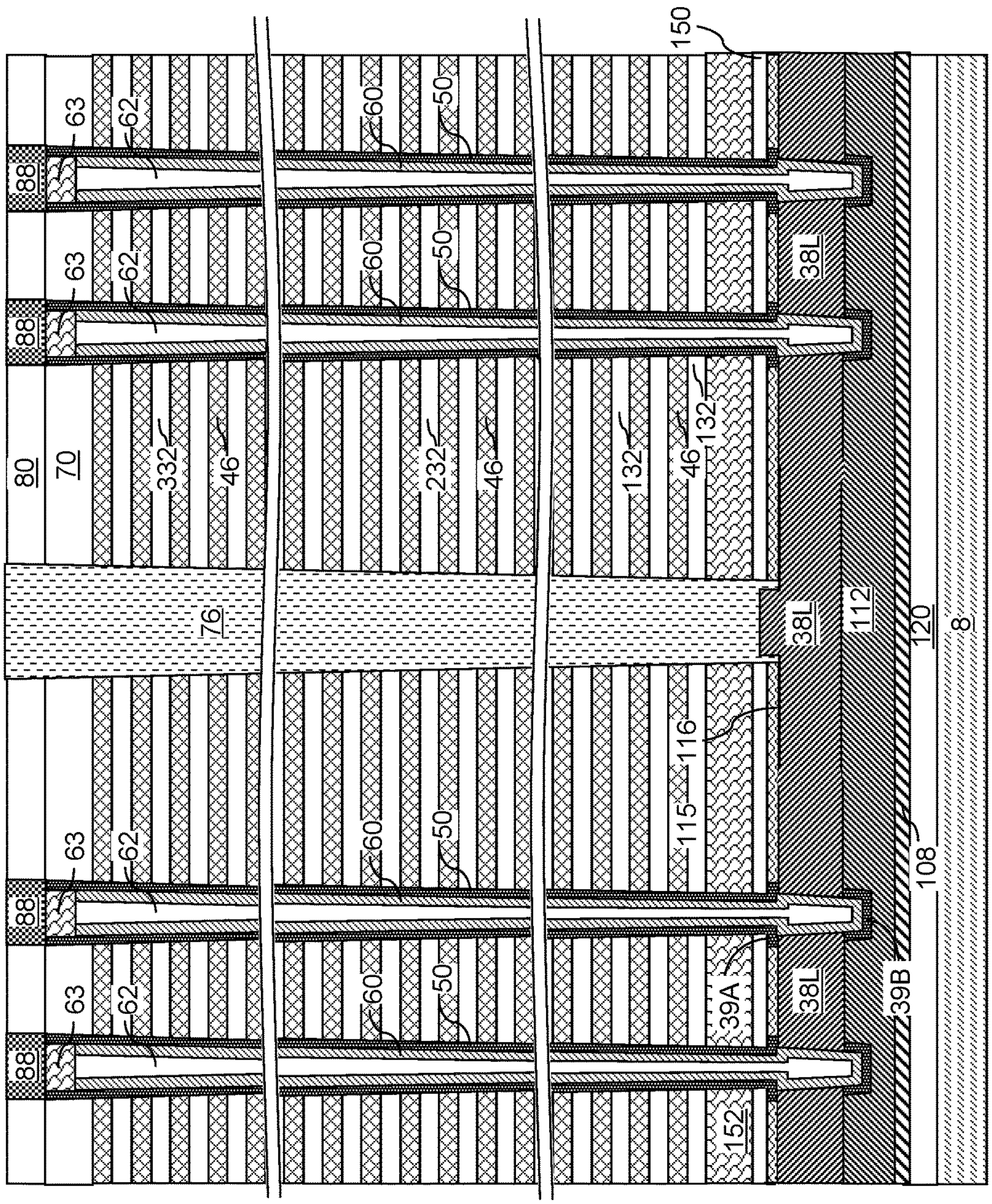
FIG. 26B is a vertical cross-sectional view of an alternative implementation of the first alternative configuration of the first exemplary structure in which a continuous source strap layer is employed in lieu of a laterally alternating stack of source strap rails and dielectric rails according to the first embodiment of the present disclosure.

FIG. 26B illustrates an alternative implementation of the first alternative configuration of the first exemplary structure shown in FIG. 26A. A continuous source strap layer 38L is employed in lieu of a laterally alternating stack of source strap rails 38 and dielectric rails 124.

Figure 27A:
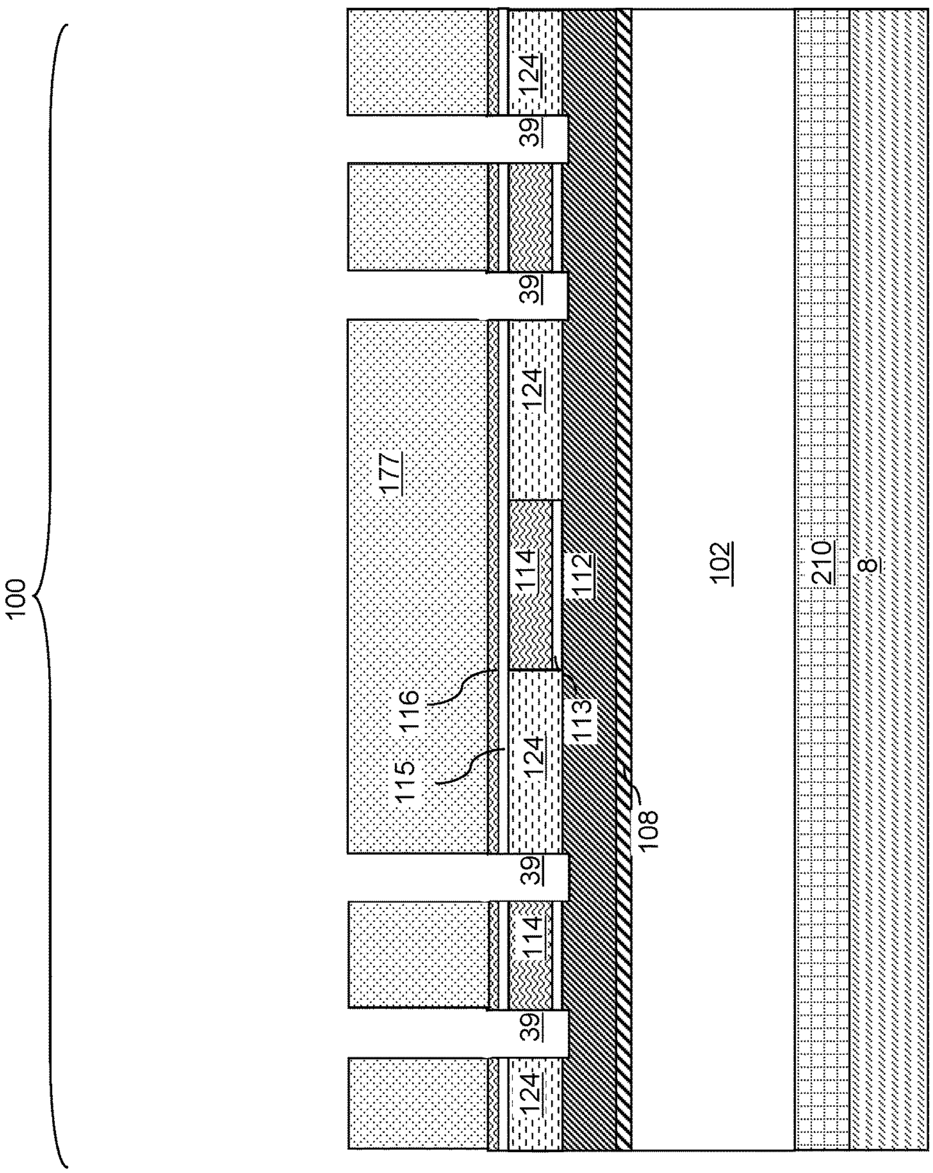
FIG. 27A is a vertical cross-sectional view of a second alternative configuration of the first exemplary structure during formation of source-level memory openings according to the first embodiment of the present disclosure.

Referring to FIG. 27A, a second alternative configuration of the first exemplary structure according to the first embodiment of the present disclosure is illustrated at the processing steps of FIGS. 4A and 4B. The size of the openings in the photoresist layer 177 can be reduced relative to the size of the openings illustrated in FIGS. 4A and 4B, and the duration of the anisotropic etch can be reduced so that the source-level memory openings 39 are shallower than the source-level memory openings 39 illustrated in FIGS. 4A and 4B.

Figure 27B:
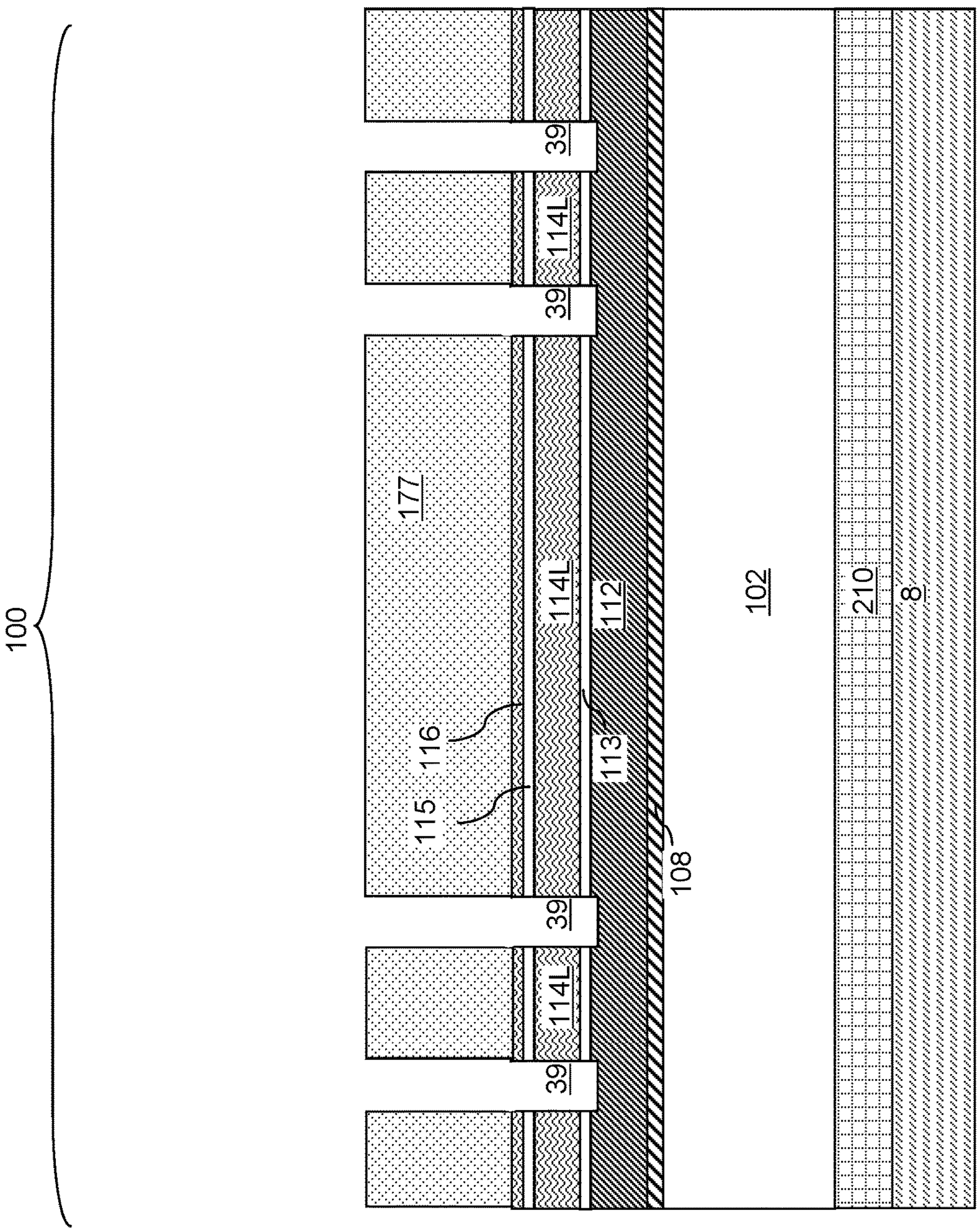
FIG. 27B is a vertical cross-sectional view of an alternative implementation of the first alternative configuration of the first exemplary structure in which a blanket sacrificial semiconductor layer is employed in lieu of a laterally alternating stack of sacrificial semiconductor rails and dielectric rails according to the first embodiment of the present disclosure.

FIG. 27B illustrates an alternative implementation of the first alternative configuration of the first exemplary structure of FIG. 27A. A sacrificial semiconductor layer 114L is employed in lieu of a laterally alternating stack of sacrificial semiconductor rails 114 and dielectric rails 124.

Figure 28:
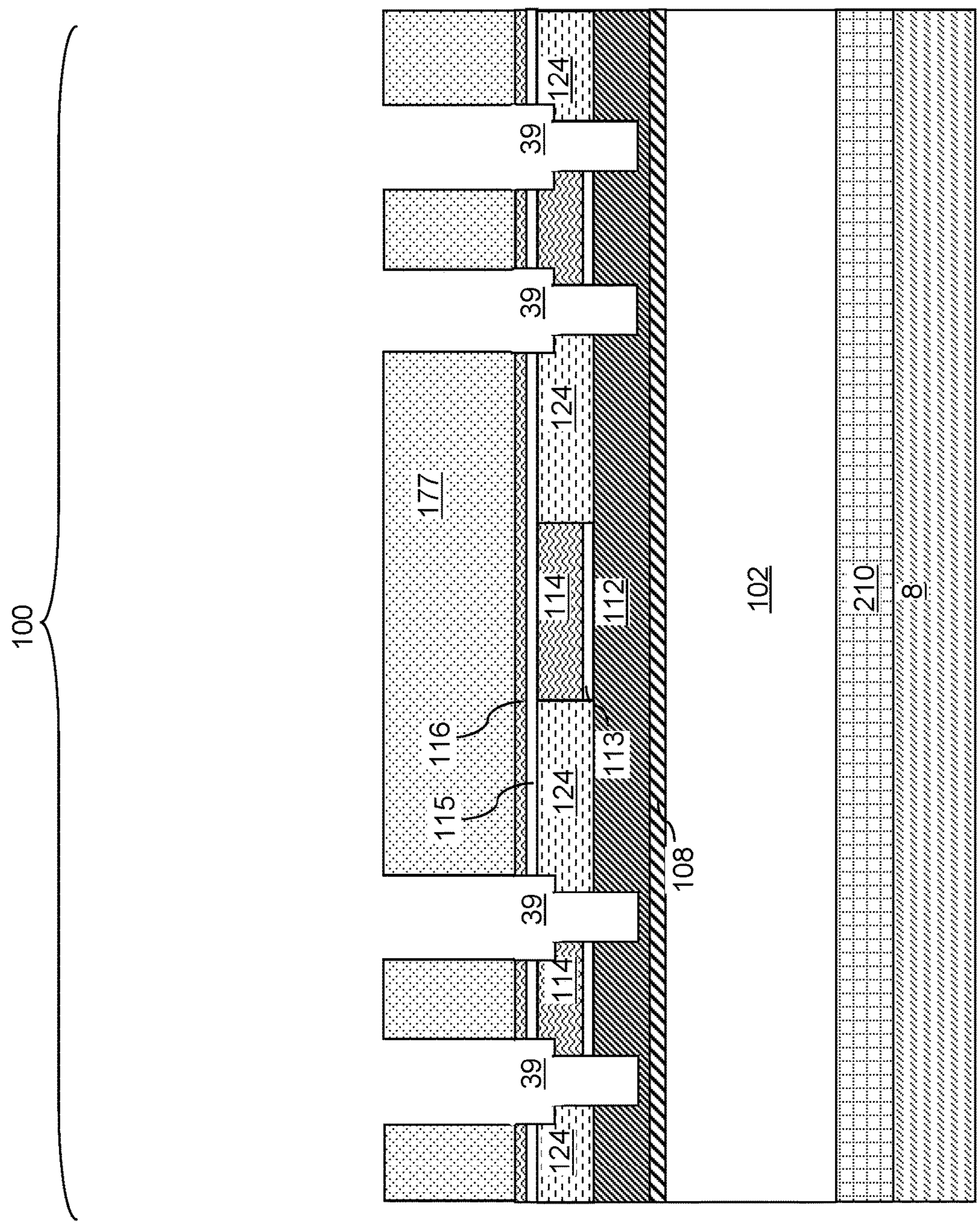
FIG. 28 is a vertical cross-sectional view of the second alternative configuration of the first exemplary structure after formation of the source-level memory openings according to the first embodiment of the present disclosure.

Referring to FIG. 28, the photoresist layer 177 can be isotropically trimmed so that the size of the openings in the photoresist layer 177 increases. Another anisotropic etch is performed to etch the materials of the cap semiconductor layer 116, the second dielectric liner 115, the laterally alternating stack (114, 124), and the source semiconductor layer 112. The source-level memory openings 39 as vertically extended by the anisotropic etch includes annular horizontal surfaces including an outer periphery that is adjoined to a bottom periphery of an overlying sidewall and an inner periphery that is adjoined to a top periphery of an underlying sidewall. In other words, each of the source-level memory openings 39 can have a stepped profile that provides a greater lateral dimension at an upper portion than at a lower portion.

Subsequently, the processing steps of FIG. 5 through FIGS. 24A-24C can be performed to provide the second alternative configuration of the first exemplary structure illustrated in FIG. 29A. In the second alternative configuration, each semiconductor channel 60 can contact a respective source strap rail 38 at stepped surfaces, thereby increasing the total contact area. Each bulging portion at the bottom of a memory stack structure (50, 60) includes an annular top surface 39A having an inner periphery that adjoins an outer periphery of the overlying portion of the respective memory stack structure (50, 60); a first sidewall 39S1 having an upper periphery that adjoins an outer periphery of the annular top surface 39A; a planar bottom surface 39B contacting a horizontal surface of the source semiconductor layer 112; and a second sidewall 39S2 having a lower periphery that adjoins an outer periphery of the planar bottom surface 39B. The first sidewall 39S1 and the second sidewall 39S2 may be adjoined by a horizontal surface that forms a lateral step.

Figure 29A:
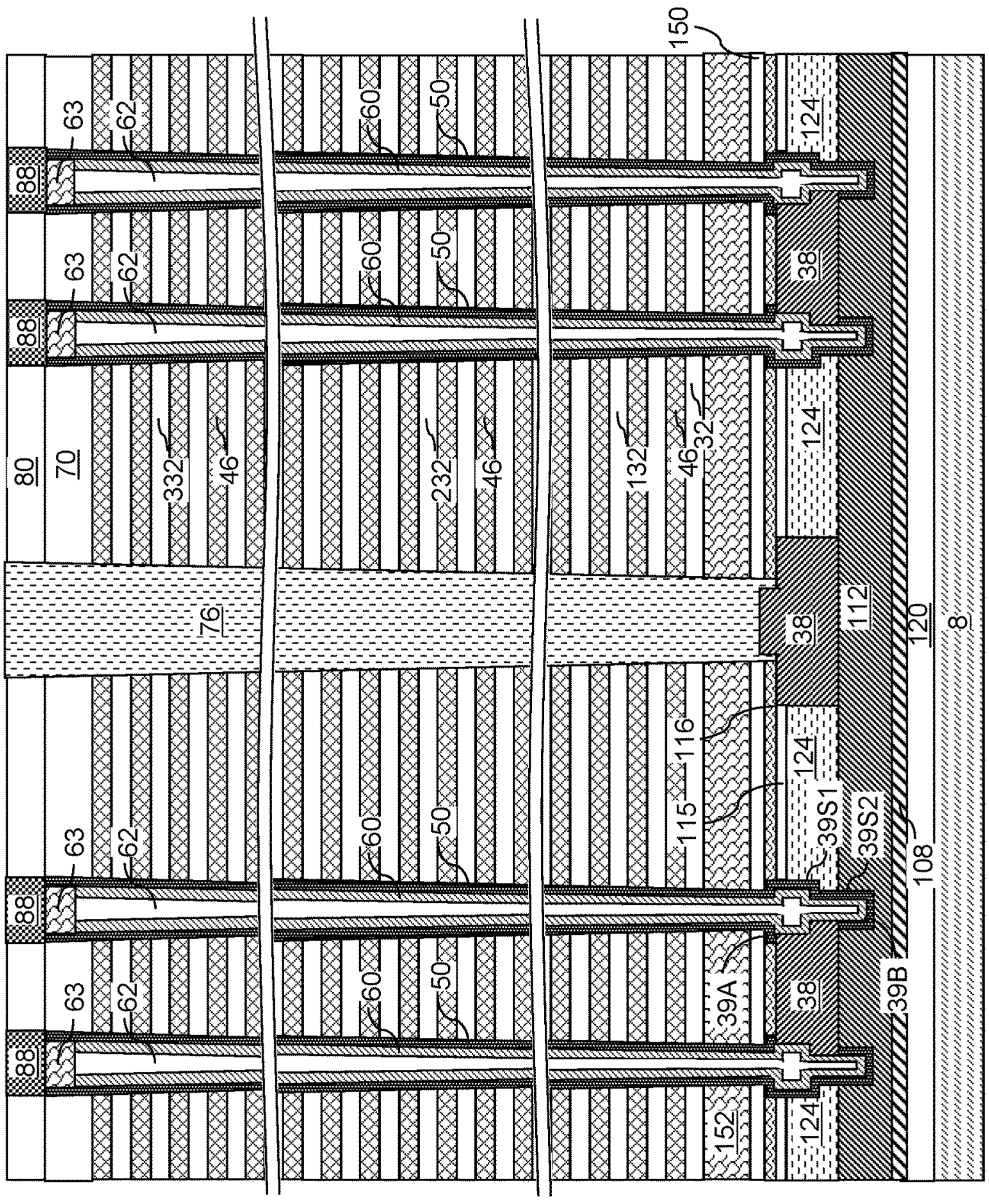
FIG. 29A is a vertical cross-sectional view of the second alternative configuration of the first exemplary structure after formation of various contact via structures according to the first embodiment of the present disclosure.
Figure 29B:
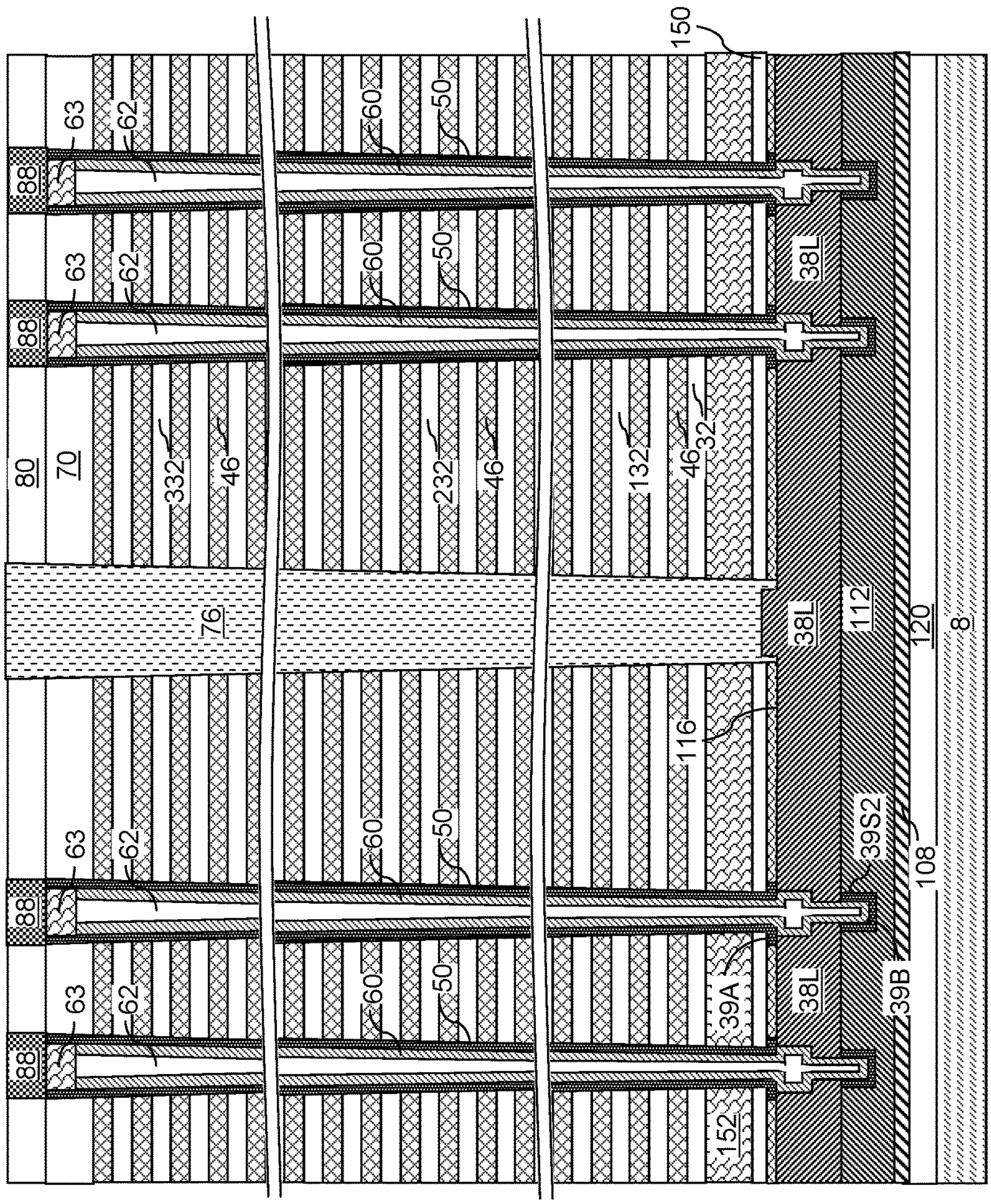
FIG. 29B is a vertical cross-sectional view of an alternative implementation of the second alternative configuration of the first exemplary structure in which a continuous source strap layer is employed in lieu of a laterally alternating stack of source strap rails and dielectric rails according to the first embodiment of the present disclosure.

FIG. 29B illustrates an alternative implementation of the second alternative configuration of the first exemplary structure of FIG. 29A. A continuous source strap layer 38L is employed in lieu of a laterally alternating stack of source strap rails 38 and dielectric rails 124.

Figure 30A:
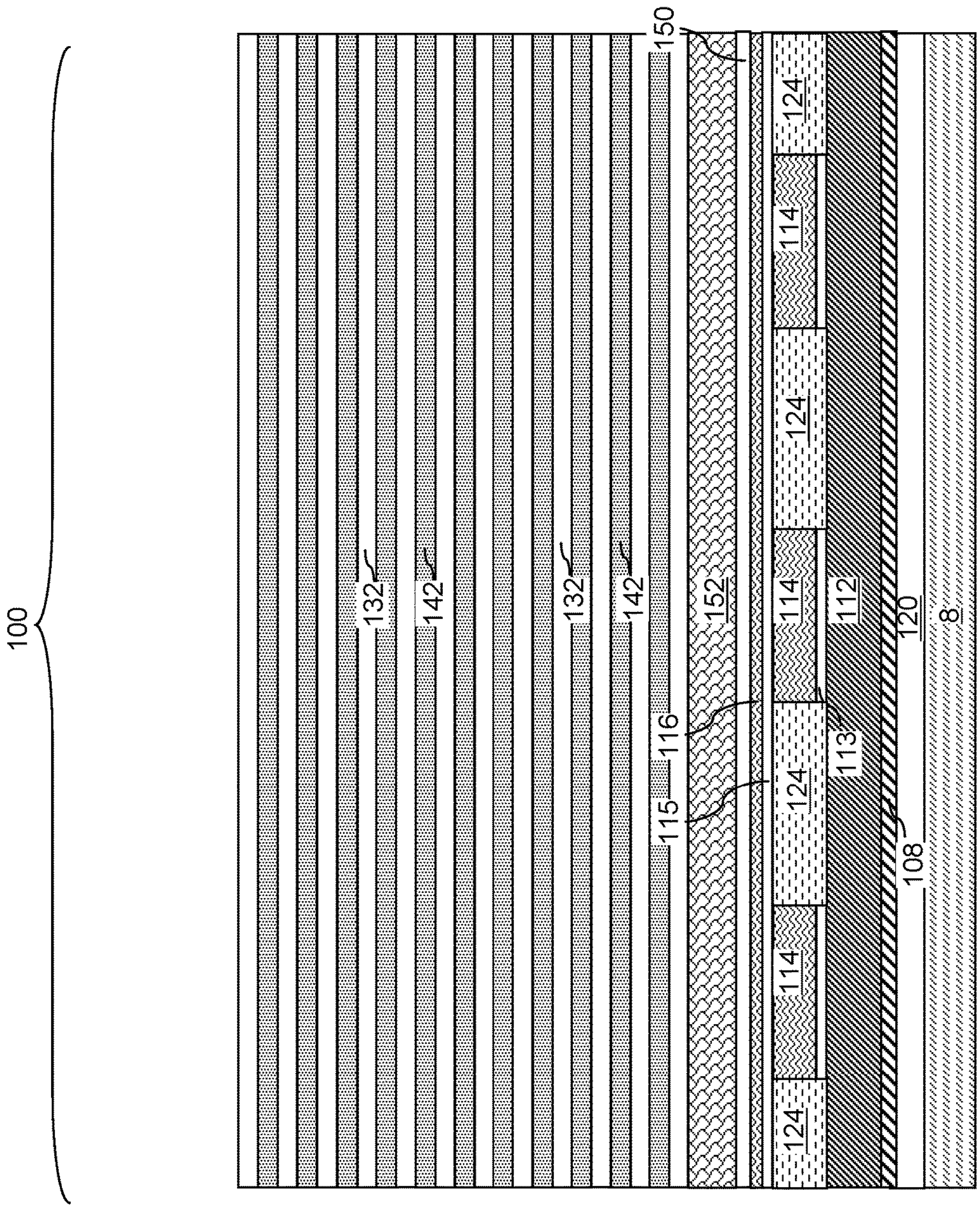
FIG. 30A is a vertical cross-sectional view of a second exemplary structure after formation of a first alternating stack of first insulator layers and first sacrificial material layers according to a second embodiment of the present disclosure.

Referring to FIG. 30A, a second exemplary structure according to a second embodiment of the present disclosure can be derived from the first exemplary structure of FIGS. 8A and 8B by omitting the processing steps of FIGS. 4A, 4B, 5 and 6. As a consequence, the pedestal liners 117 and the sacrificial semiconductor pedestals 118 illustrated in the first exemplary structure of FIGS. 8A and 8B are not present in the second exemplary structure illustrated in FIG. 30.

Figure 30B:
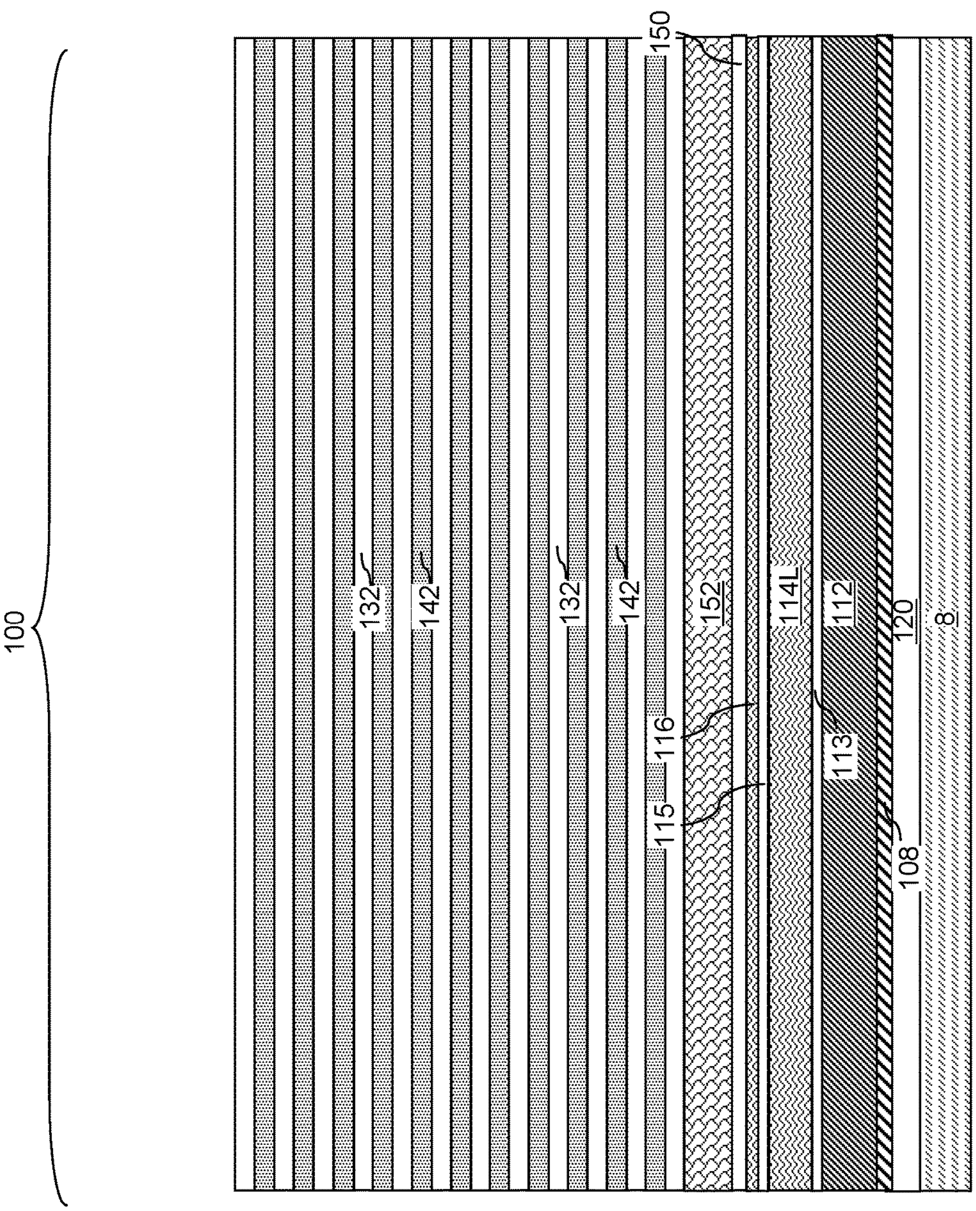
FIG. 30B is a vertical cross-sectional view of an alternative implementation of the second exemplary structure in which a blanket sacrificial semiconductor layer is employed in lieu of a laterally alternating stack of sacrificial semiconductor rails and dielectric rails according to the first embodiment of the present disclosure.

FIG. 30B illustrates an alternative implementation of the second exemplary structure of FIG. 30A. A sacrificial semiconductor layer 114L is employed in lieu of a laterally alternating stack of sacrificial semiconductor rails 114 and dielectric rails 124.

Figure 31:
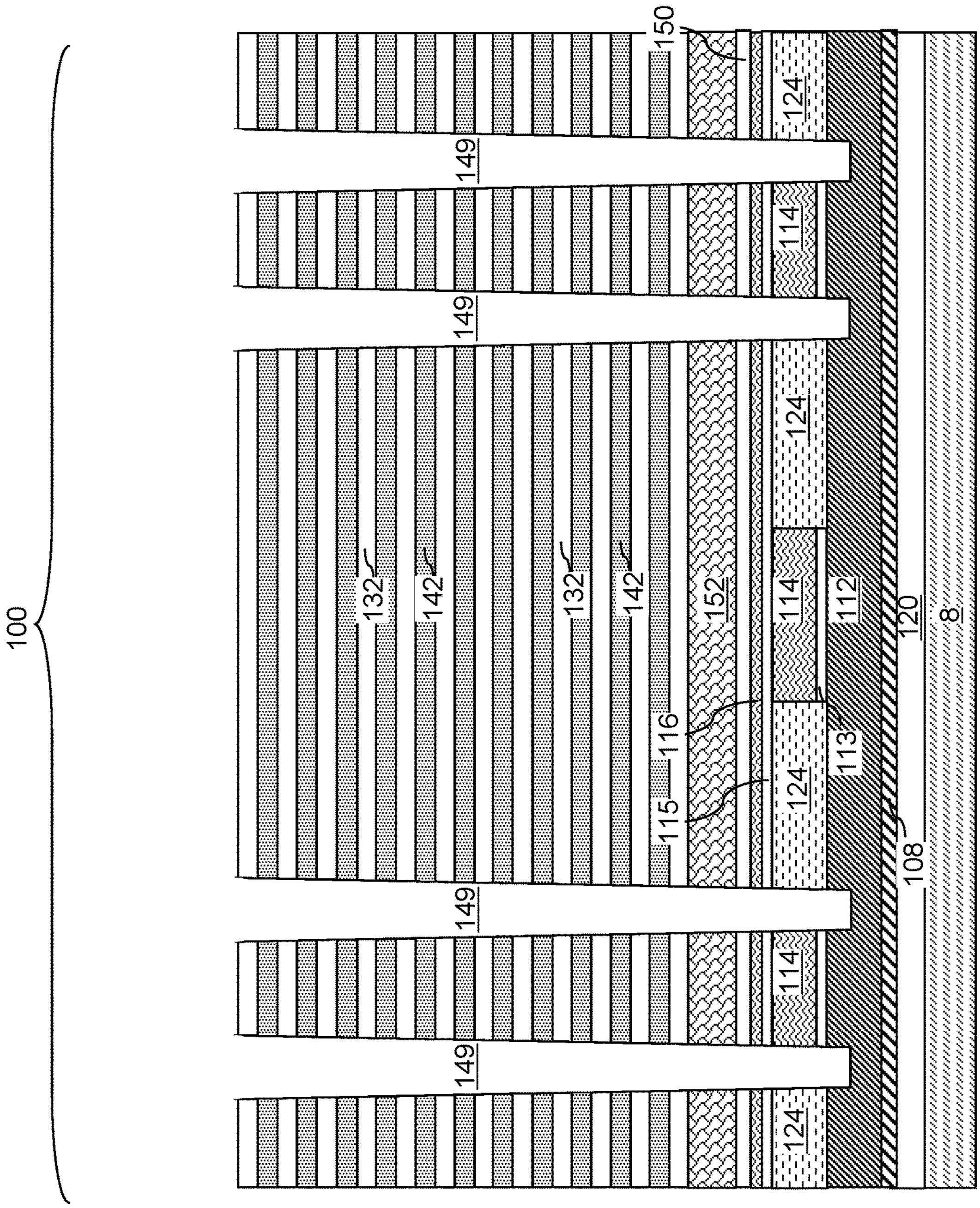
FIG. 31 is a vertical cross-sectional view of the second exemplary structure after formation of first-tier memory openings according to the second embodiment of the present disclosure.

Referring to FIG. 31, the processing steps of FIGS. 9A, 9B, and 10 can be performed with a modification to the duration of the overetch after etching through the layer stack of the doped semiconductor layer 152, the gate dielectric layer 150, the cap semiconductor layer 116, and the second dielectric liner 115. After forming the first-tier support openings 119 through the first vertically alternating stack (132, 142), the anisotropic etch can be extended (with optional changes in the etch chemistry) to vertically extend the first-tier memory openings 149 in the memory array region 100 and the first tier support openings (not shown) in the contact region 200. Each first-tier memory opening 149 can extend through the entirety of the laterally alternating stack (114, 124) and into an upper portion of the source semiconductor layer 112. The sidewalls of the first-tier memory openings 149 can be substantially vertical, or can be tapered. The patterned lithographic material stack can be subsequently removed, for example, by ashing.

The locations of the first-tier memory openings 149 can be selected such that each of the first-tier memory openings 149 can straddle an interface between a respective pair of a dielectric rail 124 and a sacrificial semiconductor rail 114. Thus, each first-tier memory opening 149 can include a sidewall of a respective one of the sacrificial semiconductor rails 114 and a sidewall of a respective one of the dielectric rails 124. In one embodiment, the first-tier memory openings 149 can include a plurality of two-dimensional array of first-tier memory openings 149 that are laterally spaced apart from one another by regions that do not include first-tier memory openings 149 as in the first exemplary structure. A two-dimensional array of first-tier memory openings 149 can be formed in the memory array region 100. A two-dimensional array of first-tier support openings can be formed in the contact region 300.

Figure 32A:
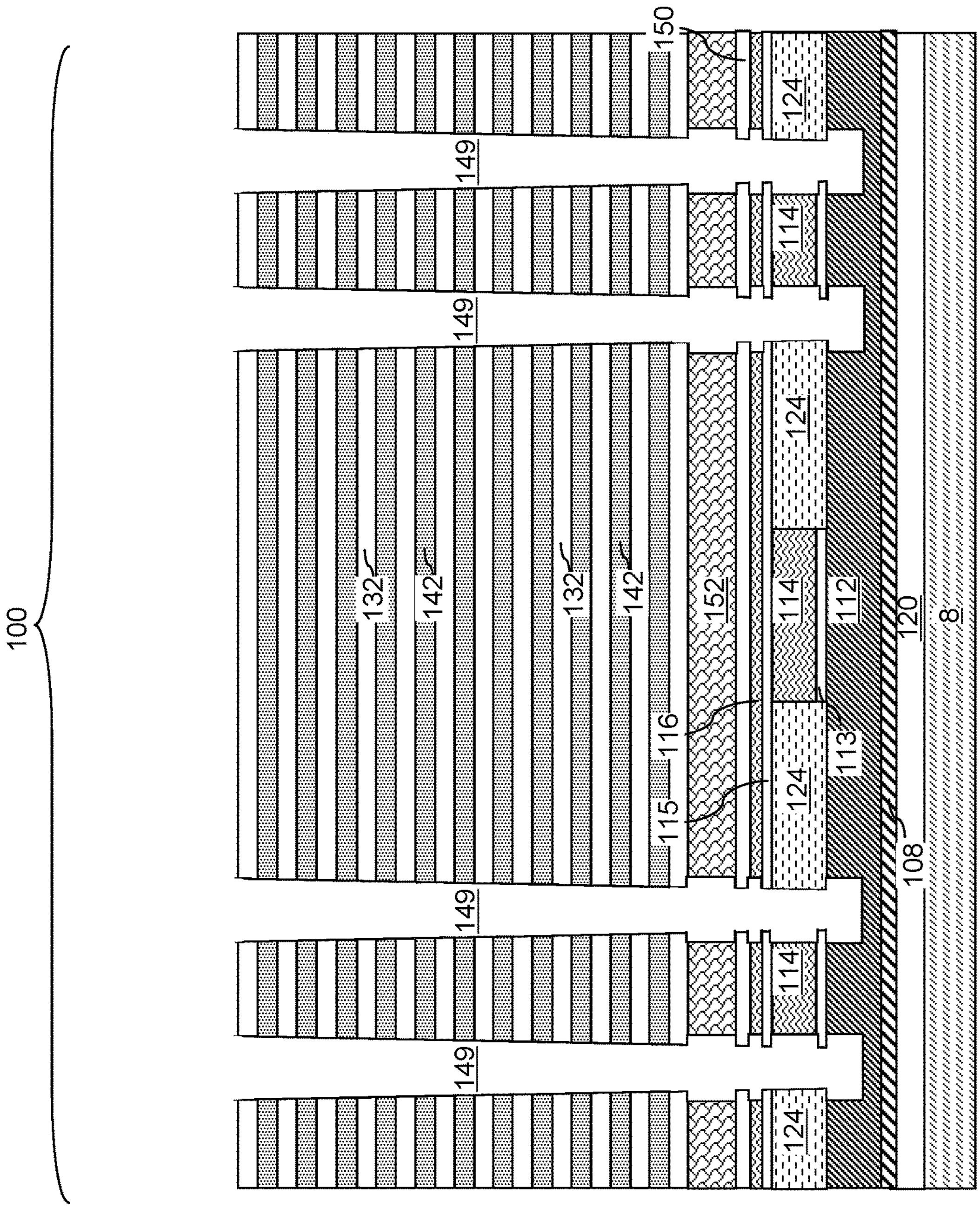
FIGS. 32A-32C are sequential vertical cross-sectional views of the second exemplary structure during formation of memory stack structures, source strap rails, an insulating wall structure, and contact via structures according to the second embodiment of the present disclosure.

Referring to FIG. 32A, an isotropic etch process can be performed to etch the semiconductor materials of the doped semiconductor layer 152, the cap semiconductor layer 116, the sacrificial semiconductor rails 114, and the source semiconductor layer 112 selective to the dielectric materials of the first vertically alternating stack (132, 142), the gate dielectric layer 150, and the dielectric liners (113, 115). For example, if the doped semiconductor layer 152, the cap semiconductor layer 116, the sacrificial semiconductor rails 114, and the source semiconductor layer 112 include amorphous silicon or polysilicon, and if the first insulating layers 132, the gate dielectric layer 150, and the dielectric liners (113, 115) include silicon oxide, and if the first sacrificial material layers 142 include silicon nitride, a wet etch process employing a KOH solution can be employed to etch the semiconductor materials of the doped semiconductor layer 152, the cap semiconductor layer 116, the sacrificial semiconductor rails 114, and the source semiconductor layer 112 selective to the dielectric materials of the first vertically alternating stack (132, 142), the gate dielectric layer 150, and the dielectric liners (113, 115). Each bottom portion of the first-tier memory openings 149 can be laterally expanded by partially laterally etching the sacrificial semiconductor rails 114, the cap semiconductor layer 116, and the doped semiconductor layer 152 selective to the dielectric rails 114 and other dielectric material portions. A lower portion of each first-tier memory opening 149 can have a bulging portion that has a greater lateral dimension than an overlying portion of the first-tier memory opening 149.

Figure 32B:
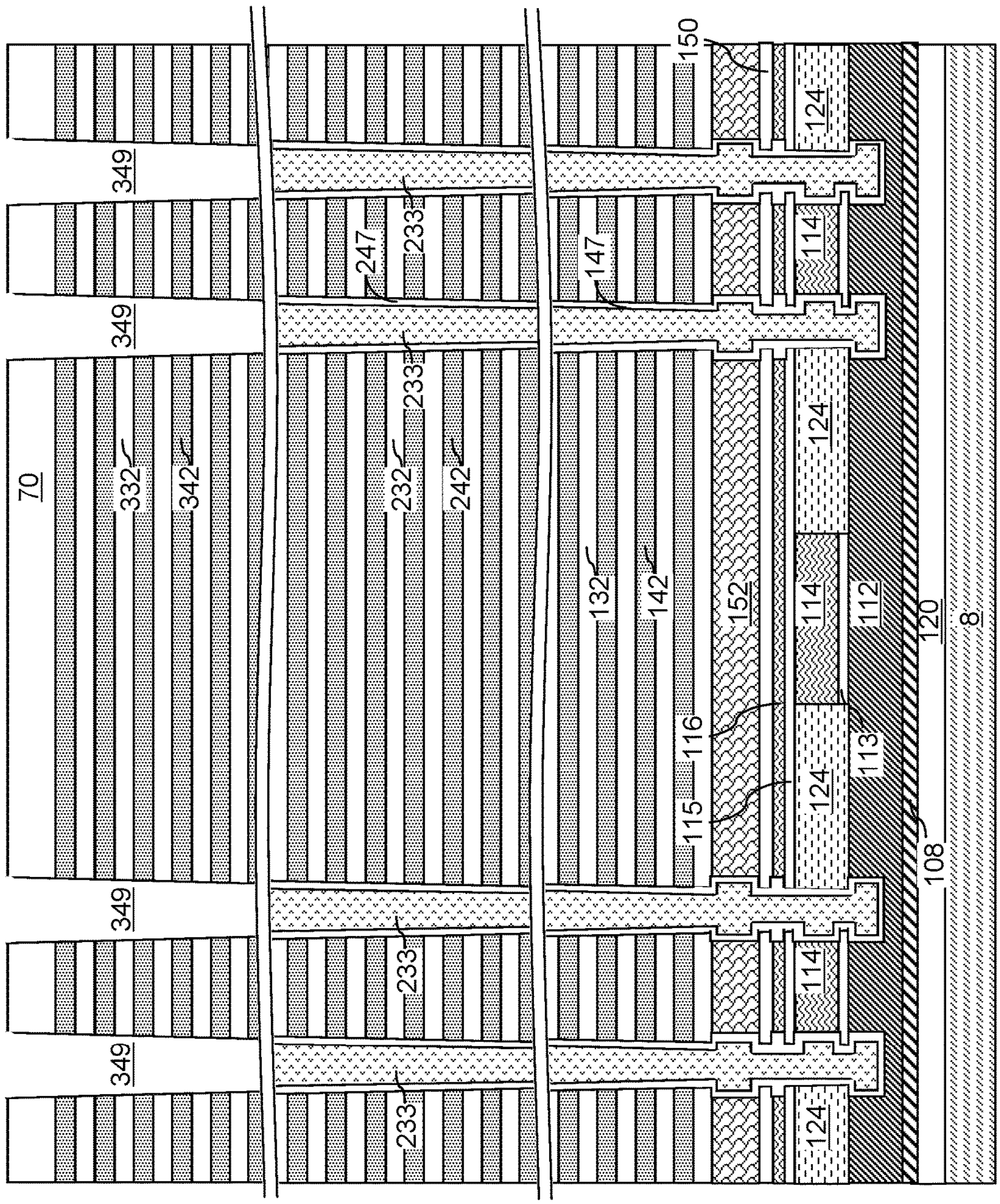

Referring to FIG. 32B, the processing steps of FIGS. 11, 12, and 13 can be subsequently performed to form first-tier sacrificial liners 147, first-tier sacrificial fill structures 133, at least one optional intermediate-tier structure, a topmost vertically alternating stack (332, 342) of topmost-tier insulating layers 332 and topmost-tier sacrificial material layers 342, and topmost-tier memory openings 349.

Figure 32C:
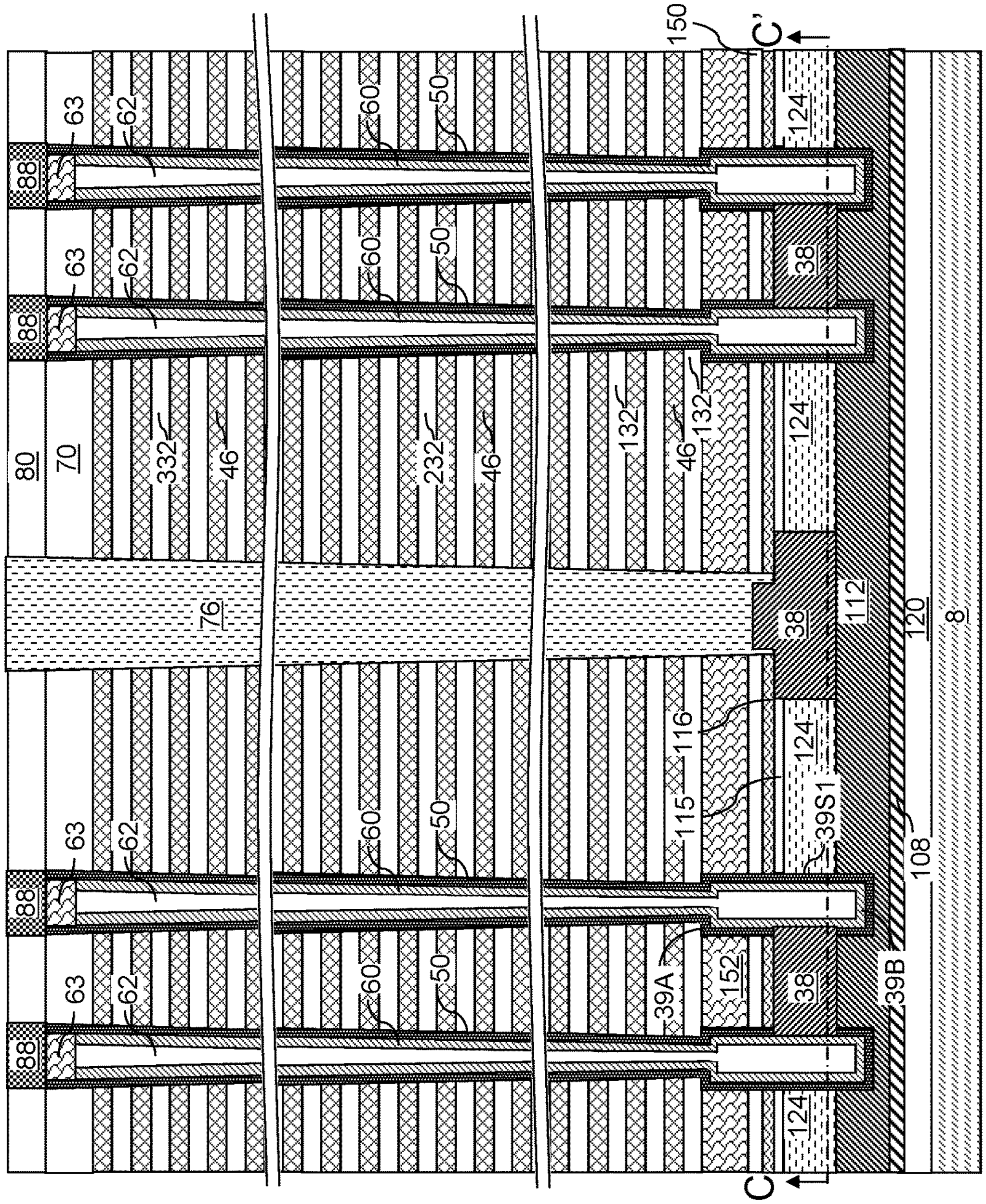

Referring to FIG. 32C, the intermediate-tier sacrificial fill structures 233 and the first-tier sacrificial fill structures 133 can be removed selective to the various sacrificial liners (147, 247) by an isotropic etch or an anisotropic etch that removes the materials of the intermediate-tier tier sacrificial fill structures 233 and the first-tier sacrificial fill structures 133. For example, if the intermediate-tier sacrificial fill structures 233 and the first-tier sacrificial fill structures 133 include amorphous silicon, and if the various sacrificial liners (147, 247) include silicon oxide, a wet etch employing a KOH solution may be employed to remove the intermediate-tier sacrificial fill structures 233 and the first-tier sacrificial fill structures 133 selective to the various sacrificial liners (147, 247).

During formation of the second exemplary structure, the first-tier memory openings 149 are formed through the first-tier vertically alternating stack (132, 142) prior to formation of the second-tier vertically alternating stack (232, 242). The second-tier memory openings 249 are formed through the second-tier vertically alternating stack (232, 242) after formation of the second-tier vertically alternating stack (232, 242). The memory openings 49 are formed by adjoining vertically adjoining pairs of a respective first-tier memory opening 149 and a respective second-tier memory opening 249. The sacrificial semiconductor rails 114 are partially etched selective to the dielectric rails 124 prior to formation of the second-tier vertically alternating stack (232, 242) to laterally expand each bottom portion of the memory openings 49.

Subsequently, the processing steps of FIG. 14 can be performed. Specifically, an isotropic etch can be performed to etch the various sacrificial liners (147, 247). Memory openings 49, which are also referred to as inter-tier memory openings, are formed by combinations of vertically adjoined cavities of the first-tier memory openings 149, the intermediate-tier memory openings, and topmost-tier memory openings 349. Specifically, each memory opening 49 can include a volume of a volume of a first-tier memory opening 149, one or more volumes of (N−2) intermediate-tier memory openings, and a topmost-tier memory opening 349 that are vertically joined among one another. Overlapping first-tier support openings, intermediate-tier support openings, and topmost-tier support openings may be adjoined among one another in the same manner to form support openings (not shown), which are also referred to as inter-tier support openings.

Laterally protruding portions of the gate dielectric layer 150, the second dielectric liner 115, and the first dielectric liner 113 can be collaterally etched during removal of the sacrificial liners (147, 247). In this case, the bottom portion of each memory opening 49 can have a relatively smooth sidewall in which the undulations of the lateral extent as provided at the processing steps of FIG. 32A is reduced by the collateral etching of the gate dielectric layer 150, the second dielectric liner 115, and the first dielectric liner 113 during removal of the sacrificial liners (147, 247). In one embodiment, each of the memory openings 49 can include a tapered portion that extends through the first alternating stack (132, 142) and the doped semiconductor layer 152 and an underlying bulging portion. In one embodiment, the bulging portion of each memory opening 49 can have a greater lateral extent (such as a diameter of a major axis or otherwise a greatest lateral dimension for a given two-dimensional cross-sectional shape) than a bottom end of the tapered portion. In some embodiments, each of the bulging portions may have substantially vertical sidewalls that extend from a bottom surface to a top surface.

Referring to FIG. 32C, memory stack structures (50, 60) can be formed in the memory openings 49 employing the processing steps of FIG. 15. Thus, the memory stack structures (50, 60) are formed in the memory openings 49 after the memory openings 49 are laterally expanded through lateral expansion of the first-tier memory openings 149. Each bulging portion at the bottom of a memory stack structure (50, 60) includes an annular top surface 39A having an inner periphery that adjoins an outer periphery of the overlying portion of the respective memory stack structure (50, 60); a sidewall 39S (which may be tapered) having an upper periphery that adjoins an outer periphery of the annular top surface 39A; and a planar bottom surface 39B contacting a horizontal surface of the source semiconductor layer 112.

Subsequent processing steps of the first embodiment can be performed to form backside trenches 79, the source cavities 119, the source strap rails 38, the electrically conductive layers 46, the insulating wall structure 76, and various contact via structures. As in the first embodiment, the backside trenches 79 can be formed through each of the vertically alternating stacks {(132, 142), (232, 242), (332, 342)} by an anisotropic etch employing the doped semiconductor layer 152 as an etch stop layer. The backside trenches 79 can be vertically extended through the doped semiconductor layer 152 and to upper surfaces of the sacrificial semiconductor rails 114. The sacrificial semiconductor rails 114 are removed by introduction of an etchant through the backside trenches 79. The source cavities 119 can be formed by removing the sacrificial semiconductor rails 114 and portions of each memory film 50 adjacent to the sacrificial semiconductor rails 114. The source strap rails 38 can be formed in the source cavities 119 and directly on sidewalls of the semiconductor channels 60.

Figure 32D:
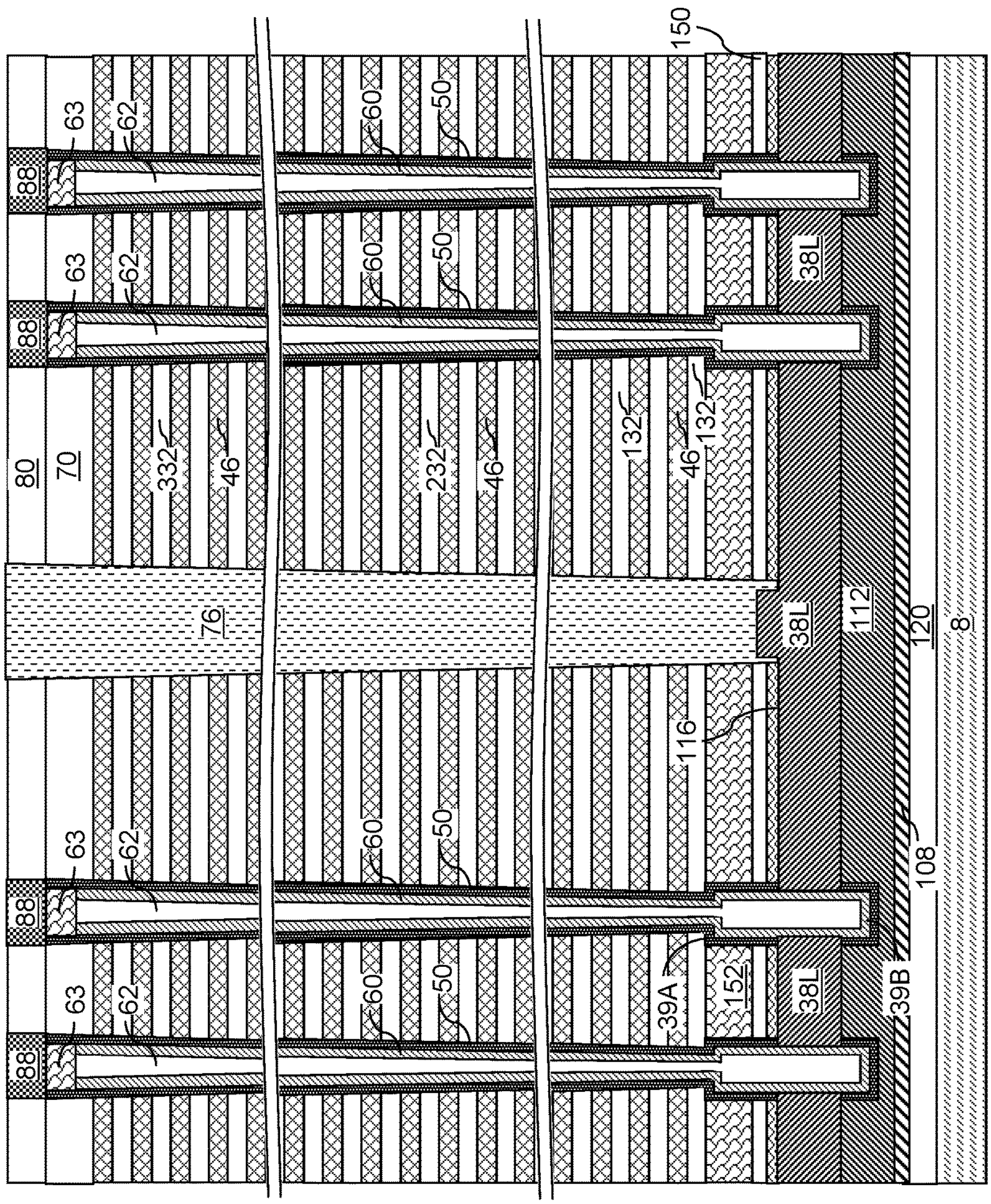
FIG. 32D is a vertical cross-sectional view of an alternative implementation of the second exemplary structure in which a continuous source strap layer is employed in lieu of a laterally alternating stack of source strap rails and dielectric rails according to the second embodiment of the present disclosure.

FIG. 32D illustrates an alternative implementation of the second exemplary structure of FIG. 32C. A continuous source strap layer 38L is employed in lieu of a laterally alternating stack of source strap rails 38 and dielectric rails 124.

FIGS. 33E-33H are sequential vertical cross-sectional views of another alternative configuration of the second exemplary structure. A sacrificial semiconductor layer 114L is employed in lieu of a laterally alternating stack of sacrificial semiconductor rails 114 and dielectric rails. A continuous source strap layer 38L is formed in lieu of a laterally alternating stack of source strap rails 38 and dielectric rails 124.

Figure 33A:
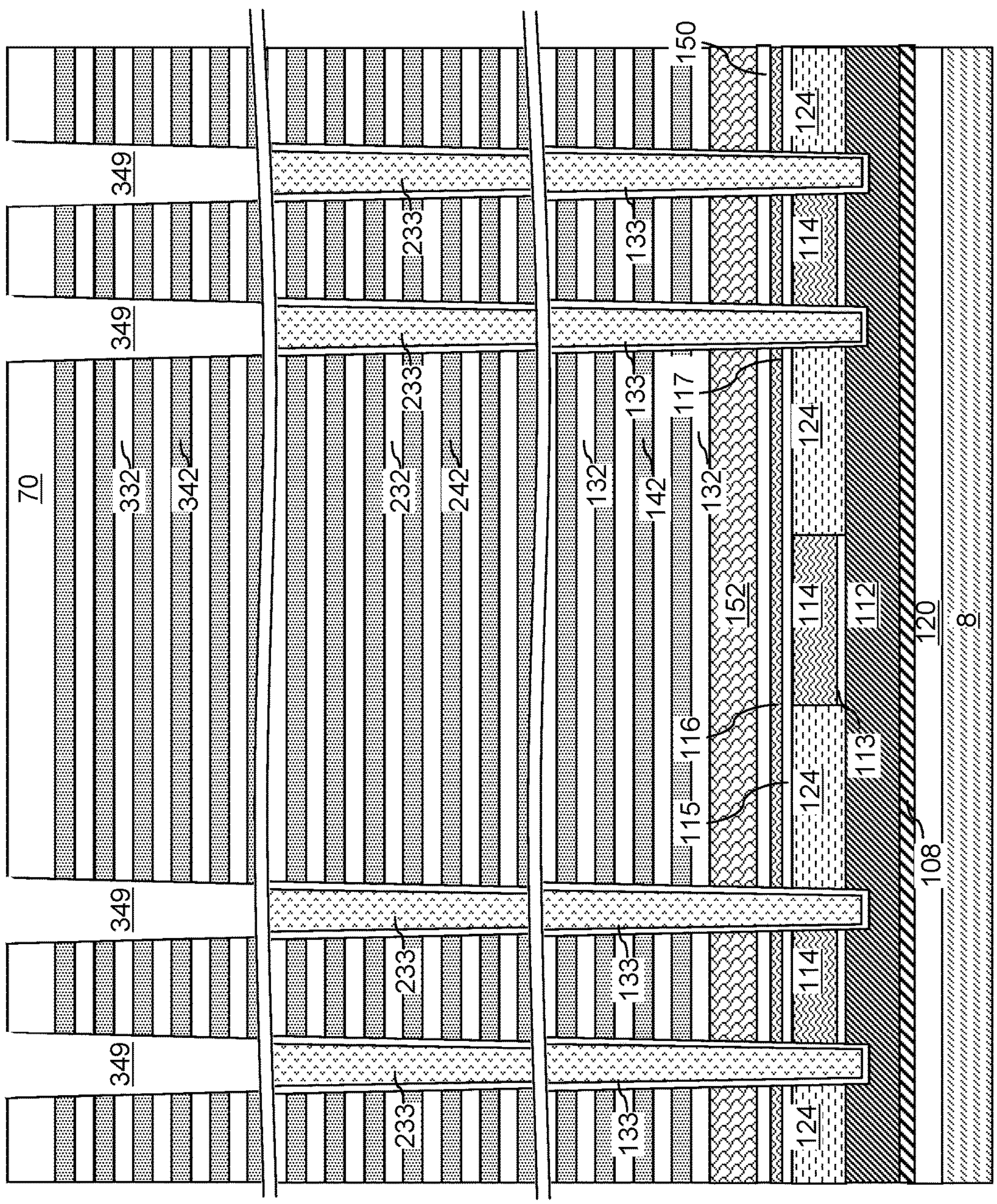
FIGS. 33A-33D are sequential vertical cross-sectional views of an alternative configuration of the second exemplary structure during formation of memory stack structures, source strap rails, an insulating wall structure, and contact via structures according to the second embodiment of the present disclosure.

Referring to FIG. 33A, an alternative configuration of the second exemplary structure according to the second embodiment of the present disclosure can be derived from the second exemplary structure of FIG. 31 by omitting the processing steps of FIG. 32A and performing the processing steps of FIG. 32B.

Figure 33B:
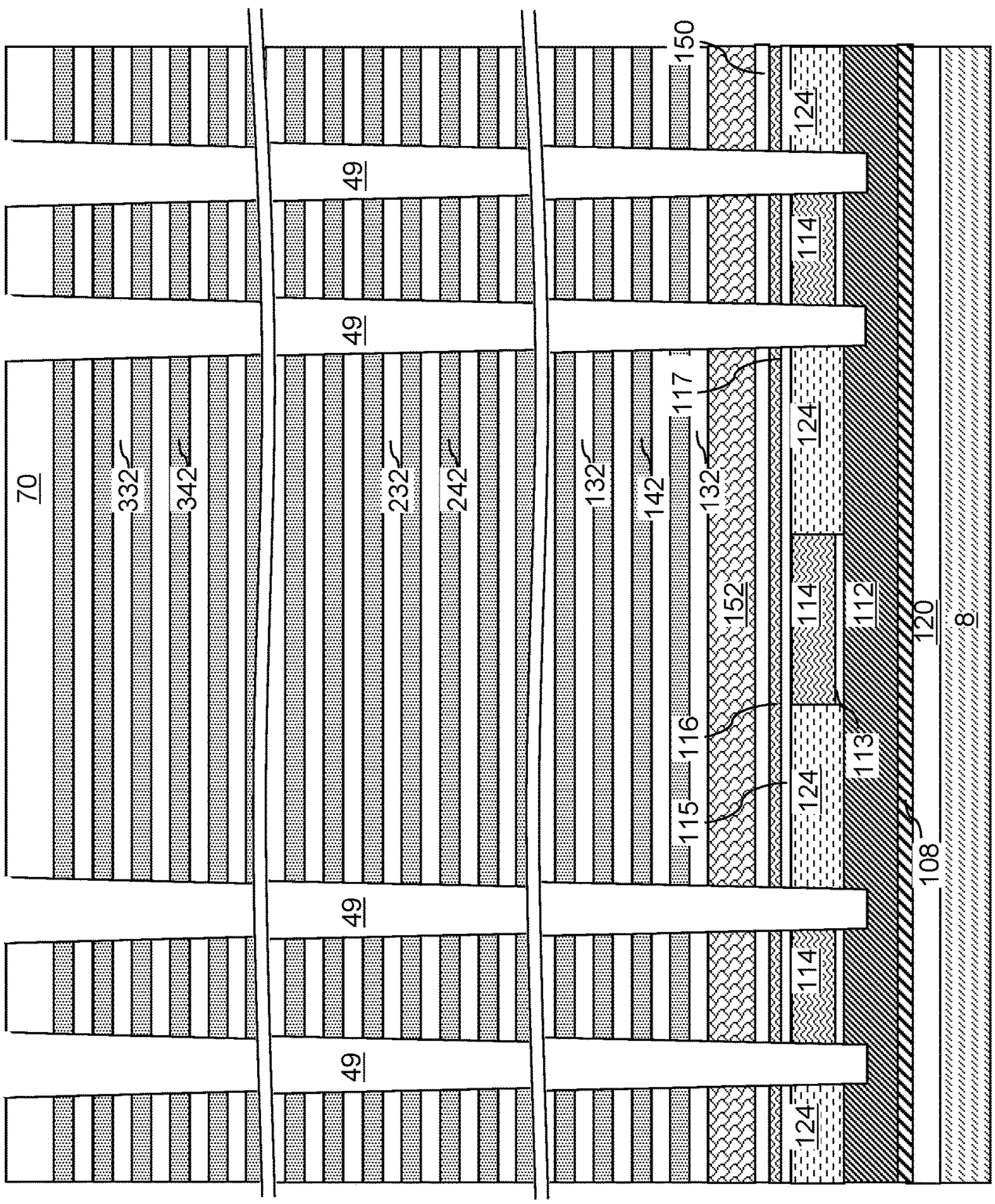

Referring to FIG. 33B, the processing steps of FIG. 14 can be performed. Specifically, an isotropic etch can be performed to etch the various sacrificial liners (147, 247). Memory openings 49, which are also referred to as inter-tier memory openings, are formed by combinations of vertically adjoined cavities of the first-tier memory openings 149, the intermediate-tier memory openings, and topmost-tier memory openings 349. Specifically, each memory opening 49 can include a volume of a volume of a first-tier memory opening 149, one or more volumes of (N−2) intermediate-tier memory openings, and a topmost-tier memory opening 349 that are vertically joined among one another. Overlapping first-tier support openings, intermediate-tier support openings, and topmost-tier support openings may be adjoined among one another in the same manner to form support openings (not shown), which are also referred to as inter-tier support openings.

Figure 33C:
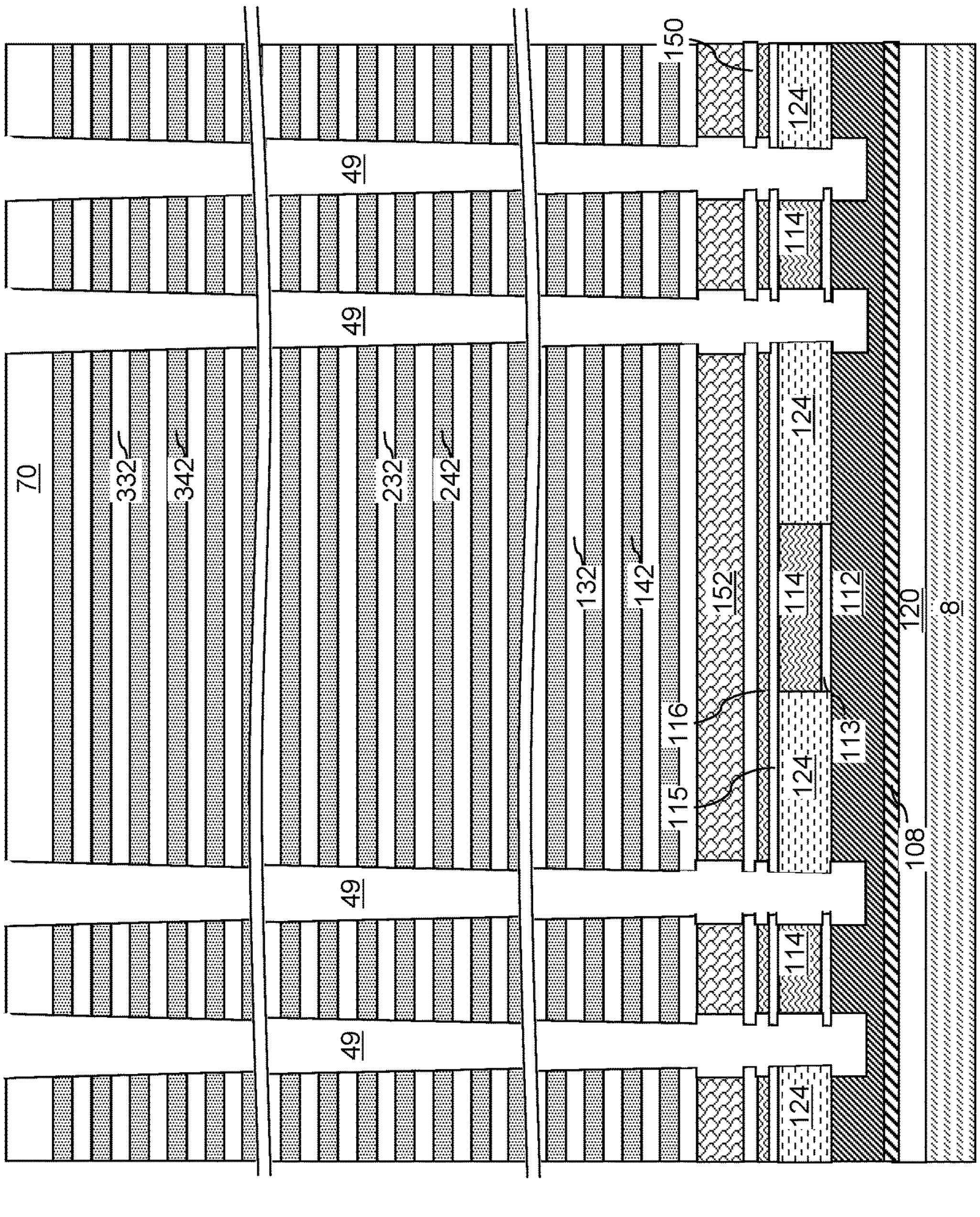

Referring to FIG. 33C, the processing steps of FIG. 32A can be performed. Specifically, an isotropic etch process can be performed to etch the semiconductor materials of the doped semiconductor layer 152, the cap semiconductor layer 116, the sacrificial semiconductor rails 114, and the source semiconductor layer 112 selective to the dielectric materials of the vertically alternating stacks {(132, 142), (232, 242), 332, 342}}, the gate dielectric layer 150, and the dielectric liners (113, 115). For example, if the doped semiconductor layer 152, the cap semiconductor layer 116, the sacrificial semiconductor rails 114, and the source semiconductor layer 112 include amorphous silicon or polysilicon, and if the insulating layers (132, 232, 332), the gate dielectric layer 150, and the dielectric liners (113, 115) include silicon oxide, and if the sacrificial material layers (142, 242, 343) include silicon nitride, a wet etch process employing a KOH solution can be employed to laterally etch the semiconductor materials of the doped semiconductor layer 152, the cap semiconductor layer 116, the sacrificial semiconductor rails 114, and the source semiconductor layer 112 selective to the dielectric materials of the vertically alternating stacks {(132, 142), (232, 242), 332, 342}}, the gate dielectric layer 150, and the dielectric liners (113, 115). Each bottom portion of the memory openings 49 can be laterally expanded by partially etching the sacrificial semiconductor rails 114, the cap semiconductor layer 116, and the doped semiconductor layer 152 selective to the dielectric rails 114 and other dielectric material portions. A lower portion of each memory opening 49 can have a bulging portion that has a greater lateral dimension than an overlying portion of the memory opening 49.

Figure 33D:
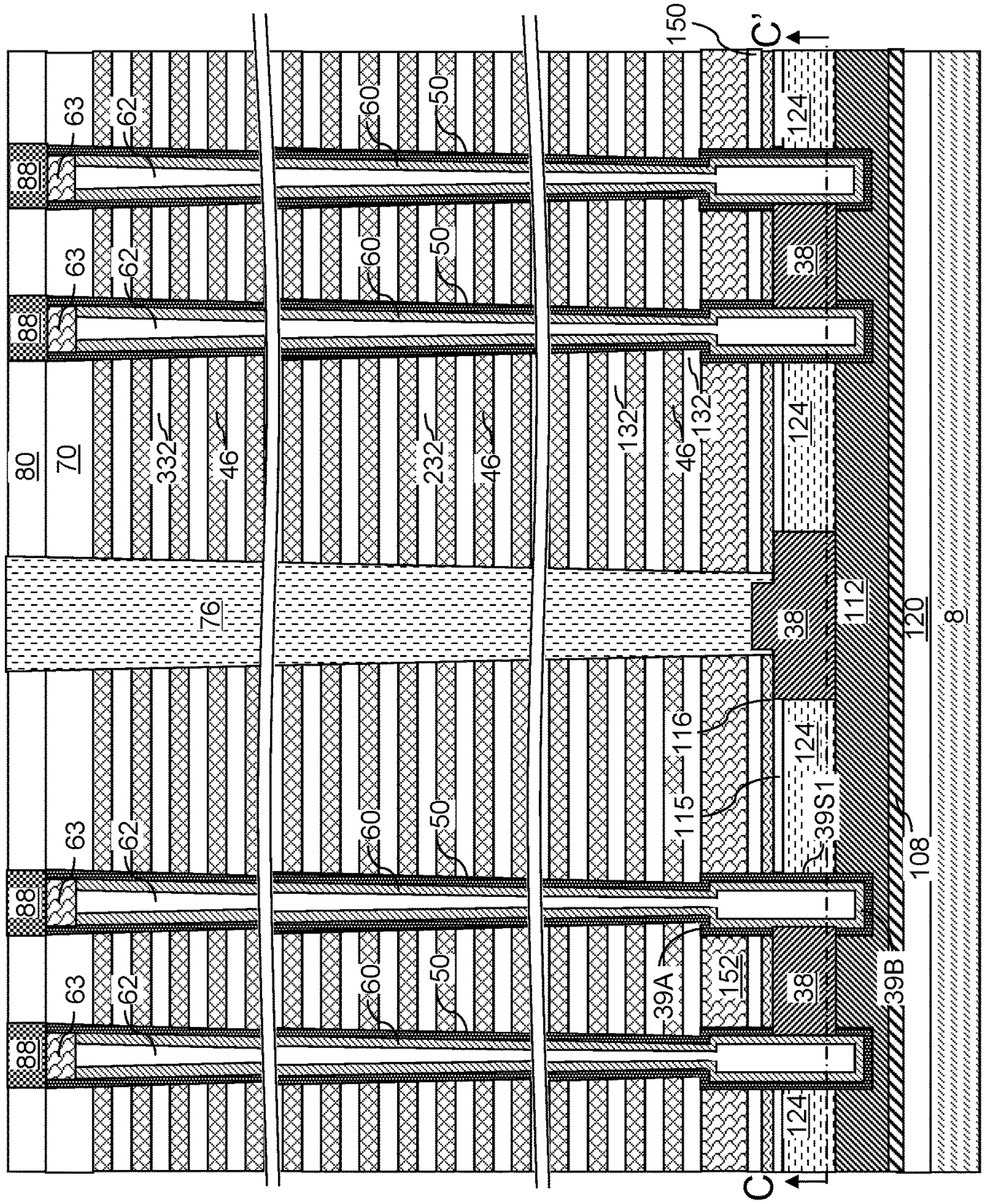
Figure 33E:
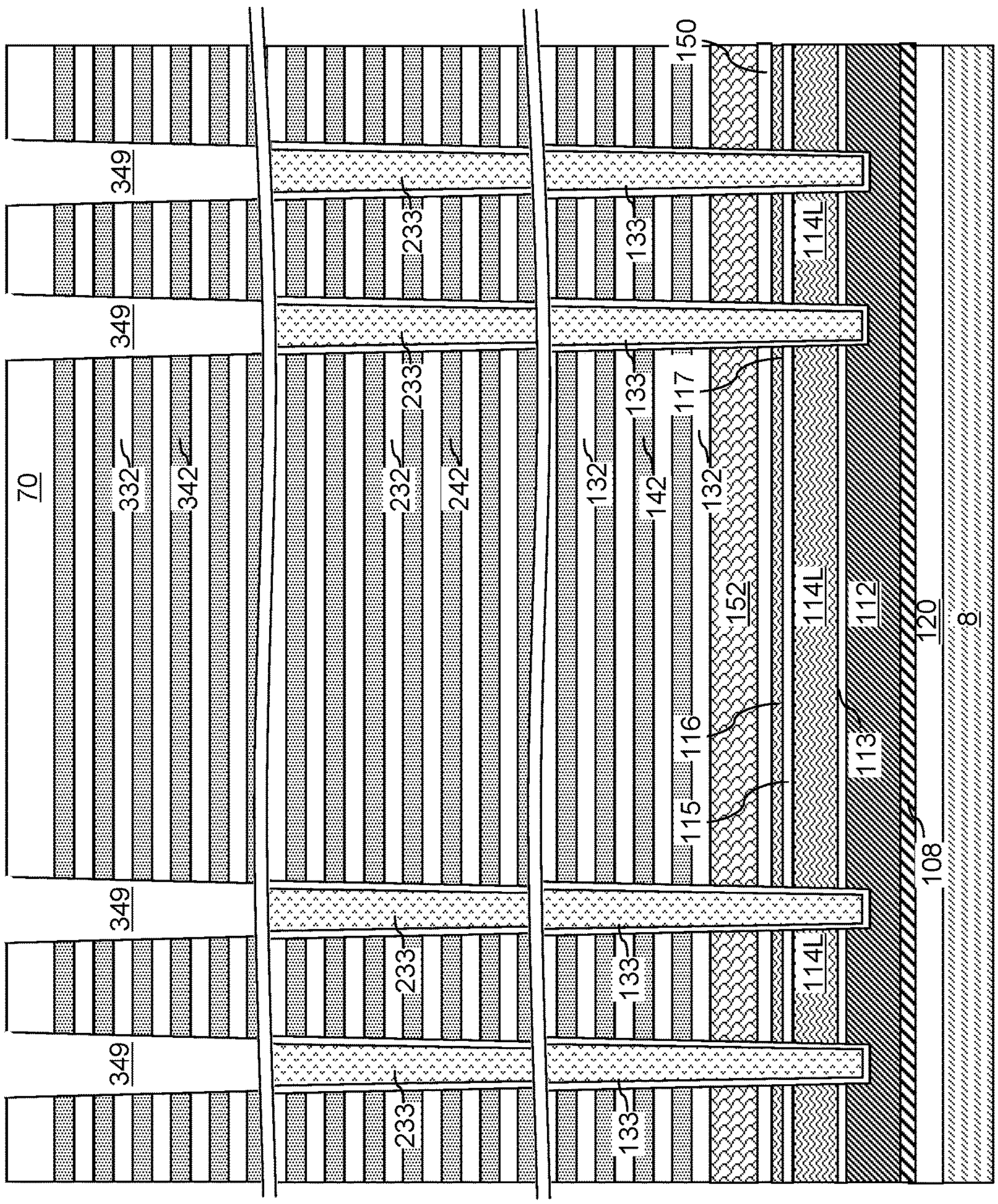
FIGS. 33E-33H are sequential vertical cross-sectional views of another alternative configuration of the second exemplary structure during formation of memory stack structures, source strap rails, an insulating wall structure, and contact via structures according to the second embodiment of the present disclosure.
Figure 33F:
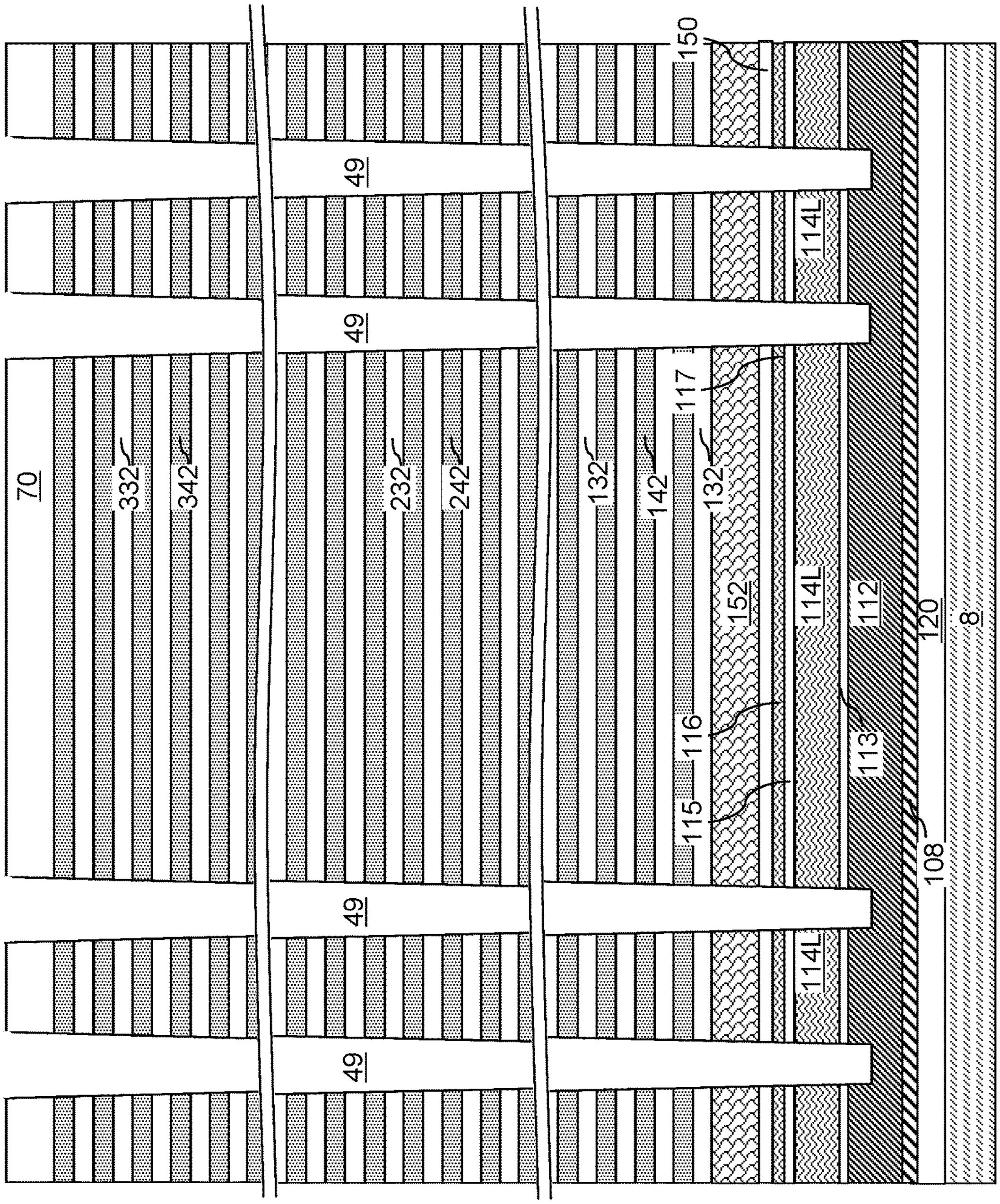
Figure 33G:
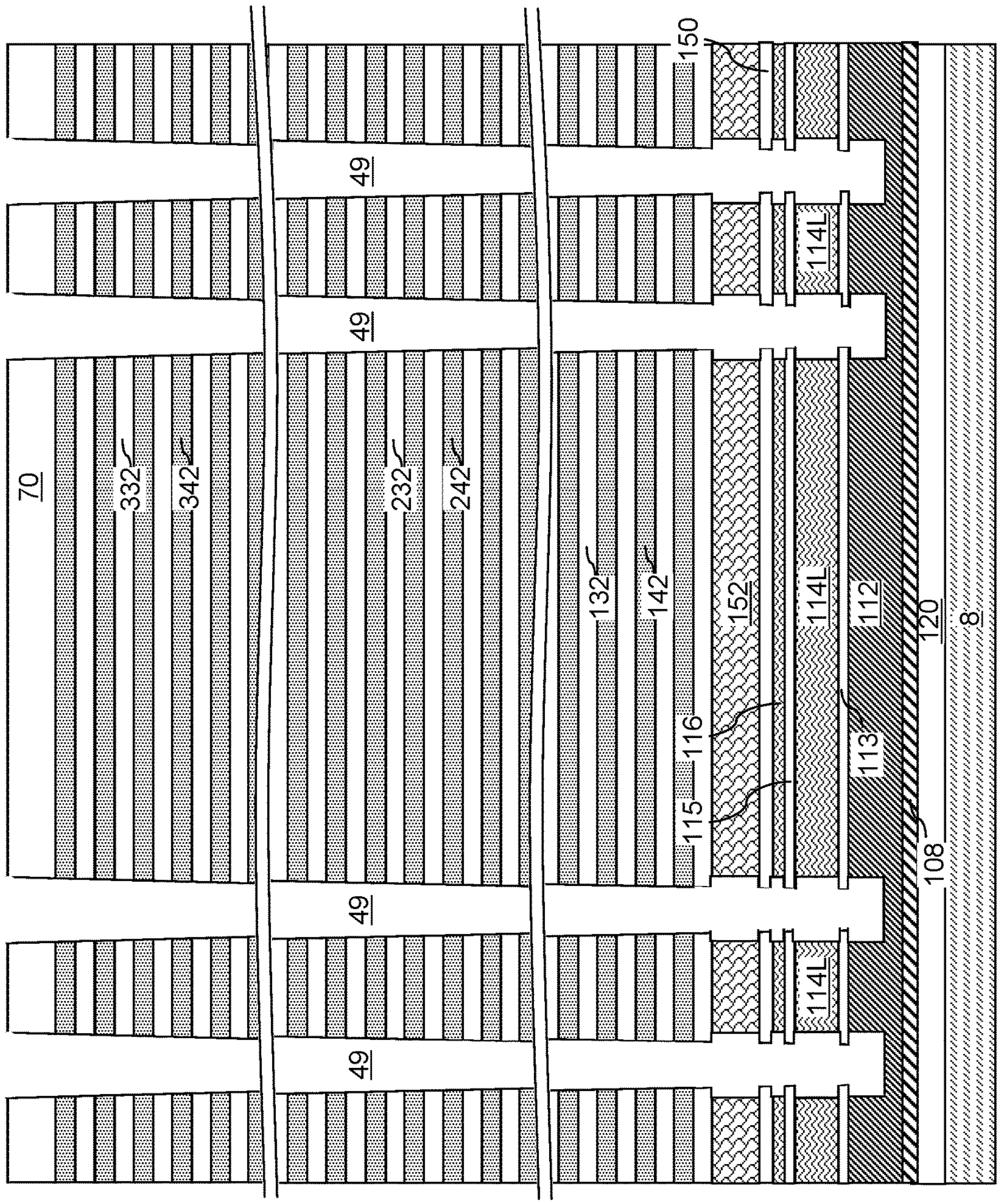
Figure 33H:
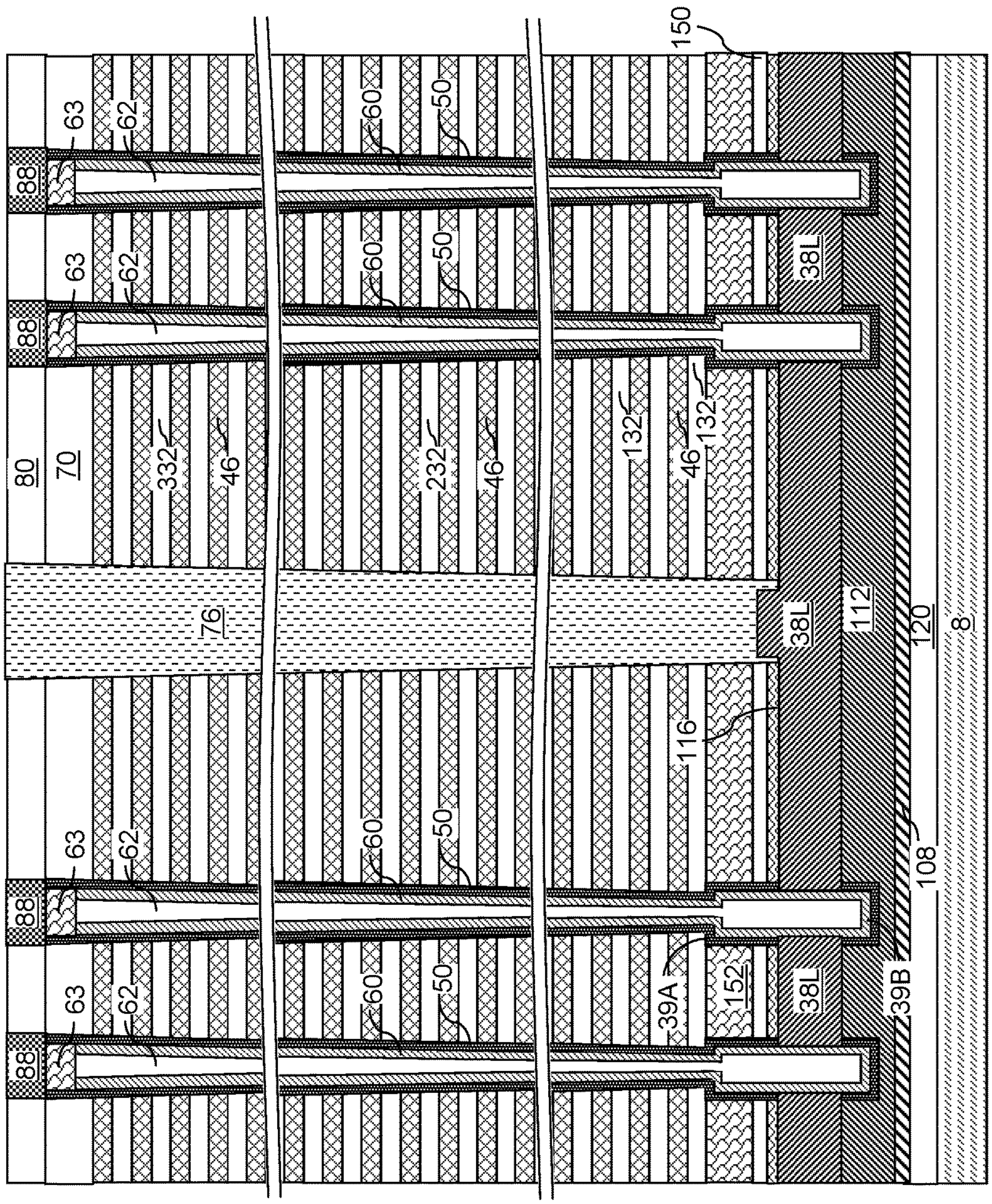

Referring to FIG. 33D, memory stack structures (50, 60) can be formed in the memory openings 49 employing the processing steps of FIG. 15. Thus, the memory stack structures (50, 60) are formed in the memory openings 49 after the memory openings 49 are laterally expanded after multiple tier-level memory openings are adjoined to form the memory openings 49. Each bulging portion at the bottom of a memory stack structure (50, 60) includes an annular top surface 39A having an inner periphery that adjoins an outer periphery of the overlying portion of the respective memory stack structure (50, 60); a sidewall 39S (which may be tapered) having an upper periphery that adjoins an outer periphery of the annular top surface 39A; and a planar bottom surface 39B contacting a horizontal surface of the source semiconductor layer 112.

Subsequent processing steps of the first embodiment can be performed to form backside trenches 79, the source cavities 119, the source strap rails 38, the electrically conductive layers 46, the insulating wall structure 76, and various contact via structures. As in the first embodiment, the backside trenches 79 can be formed through each of the vertically alternating stacks {(132, 142), (232, 242), (332, 342)} by an anisotropic etch employing the doped semiconductor layer 152 as an etch stop layer. The backside trenches 79 can be vertically extended through the doped semiconductor layer 152 and to upper surfaces of the sacrificial semiconductor rails 114. The sacrificial semiconductor rails 114 are removed by introduction of an etchant through the backside trenches 79. The source cavities 119 can be formed by removing the sacrificial semiconductor rails 114 and portions of each memory film 50 adjacent to the sacrificial semiconductor rails 114. The source strap rails 38 can be formed in the source cavities 119 and directly on sidewalls of the semiconductor channels 60.

Optionally, laterally protruding portions of the gate dielectric layer 150, the second dielectric liner 115, and the first dielectric liner 113 may be etched prior to formation of the memory stack structures (50, 60). In this case, the bottom portion of each memory opening 49 can have a relatively smooth sidewall in which the undulations of the lateral extent as provided at the processing steps of FIG. 33C is reduced by etching of the gate dielectric layer 150, the second dielectric liner 115, and the first dielectric liner 113. Alternatively, if laterally protruding portions of the gate dielectric layer 150, the second dielectric liner 115, and the first dielectric liner 113 may be etched prior to formation of the memory stack structures (50, 60), the bottom bulging portion of the memory stack structures (50, 60) can have undulating outer sidewalls.

Referring collectively to the first and second exemplary structures and their alternative configurations, each of the first and second exemplary structures and their alternative configurations can include a three-dimensional memory device. The three-dimensional memory device includes: a vertically alternating stack of electrically conductive layers 46 and insulating layers (132, 232, 332) located over a source semiconductor layer 112 over a substrate 8; an array of memory stack structures (50, 60) that extend through the vertically alternating stack (132, 232, 332, 46) and into an upper portion of the source semiconductor layer 112, each memory stack structure (50, 60) including a semiconductor channel 60 and a memory film 50 laterally surrounding the semiconductor channel 60, wherein a lower portion of each memory stack structure (50, 60) has a bulging portion that has a greater lateral dimension than an overlying portion of the respective memory stack structure (50, 60) that adjoins a top end of the bulging portion; and source strap rails 38 laterally extending along a first horizontal direction hd1 and contacting a respective subset of the semiconductor channels of 60 the memory stack structures (50, 60) at a level of the bulging portion of each memory stack structure (50, 60).

In one embodiment, the memory film 50 of each memory stack structure (50, 60) can include a lateral opening through which a respective source strap rail 38 extends to provide physical contact between a respective semiconductor channel 60 and the respective source strap rail 38. In one embodiment, dielectric rails 124 can be located between neighboring pairs of the source strap rails 38, wherein the memory film 50 of each memory stack structure (50, 60) contacts a sidewall of a respective one of the dielectric rails 124. In one embodiment, the source strap rails 38 contact a respective portion of a planar top surface of the source semiconductor layer 112, and the source strap rails 38 comprise a doped semiconductor material having a doping of a same conductivity type as the source semiconductor layer 112.

In one embodiment, a gate dielectric layer 150 can overlie the source strap rails 38 and can laterally surround the memory stack structures (50, 60). A doped semiconductor layer 152 can underlie each of at least one vertically alternating stack (132, 232, 332, 46), overlie the gate dielectric layer 150, and laterally surround the memory stack structures (50, 60). In one embodiment, the gate dielectric layer 150 overlies top surfaces of the bulging portions of the memory stack structures (50, 60). Optionally, the doped semiconductor layer 152 comprises source select gate electrodes of the memory stack structures (50, 60) (i.e., of the vertical NAND strings) and the gate dielectric layer 150 functions as the gate dielectric of the source side select transistor. Alternatively, one or more lower electrically conductive layers 46 may function as the source select gate electrode(s) instead of or in addition to the doped semiconductor layer 152. In one embodiment, the gate dielectric layer 150 laterally surrounds the bulging portions of the memory stack structures (50, 60), and a top surface of the doped semiconductor layer 152 is within a same horizontal plane as top surfaces of the bulging portions. An insulating wall structure 76 can be provided, which vertically extends through each of the at least one vertically alternating stack (132, 232, 332, 46) and laterally extends along a second horizontal direction hd2 that is different from the first horizontal direction hd1 and straddles each of the source strap rails 38.

Figure 34:
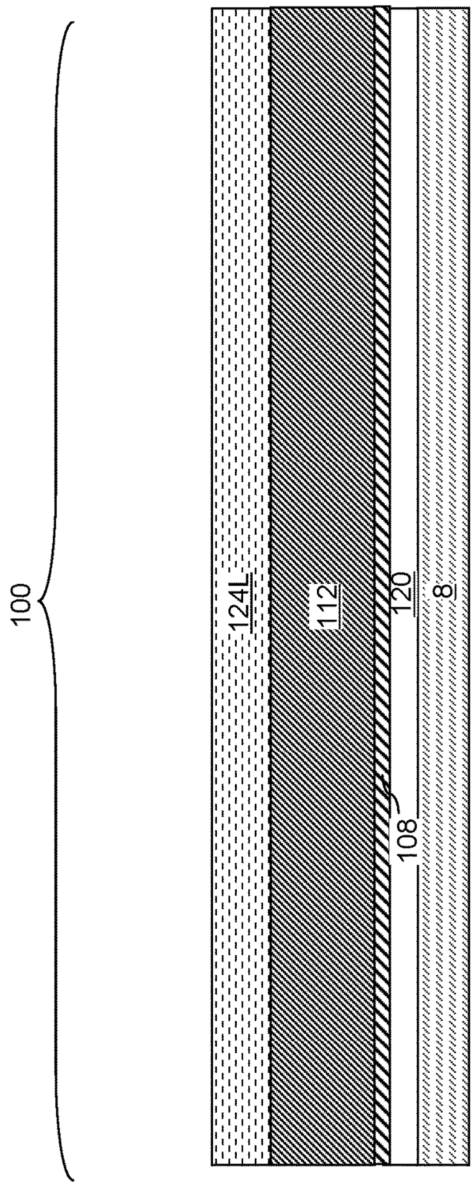
FIG. 34 is a vertical cross-sectional view of a third exemplary structure after formation of a metallic source layer, a source semiconductor layer, and a dielectric material layer according to a third embodiment of the present disclosure.

Referring to FIG. 34, a third exemplary structure according to a third embodiment of the present disclosure can be derived employing a subset of the processes used to form the first exemplary structure of FIG. 1. Specifically, optional semiconductor devices 210, at least one lower level dielectric layer 120 and optional lower level metal interconnect structures embedded therein, and an optional metallic source layer 108 can be formed on a substrate 8, which may be a semiconductor substrate. A source conductive layer, which can be the above described source semiconductor layer 112 can be formed in the same manner as in the first embodiment.

A dielectric material, such as an undoped silicate glass, can be optionally deposited to form an optional dielectric material layer 124L. The optional dielectric material layer 124L can be deposited by a conformal or non-conformal deposition method. The thickness of the dielectric material layer 124L can be in a range from 50 nm to 200 nm, although lesser and greater thicknesses can also be employed.

Figure 35A:
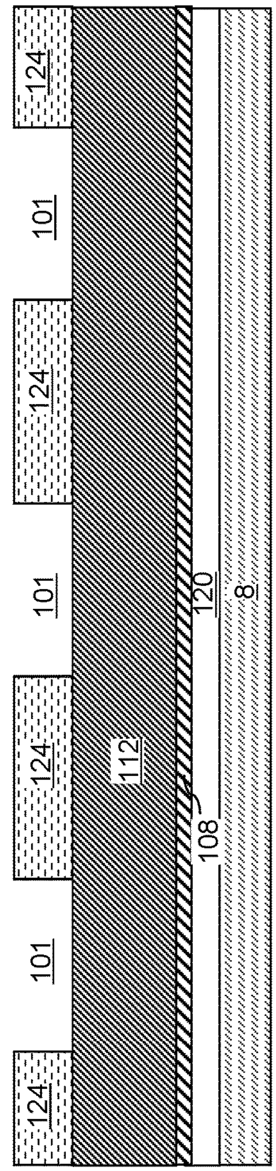
FIG. 35A is a vertical cross-sectional view of the third exemplary structure after formation of dielectric rails according to the third embodiment of the present disclosure.
Figure 35B:
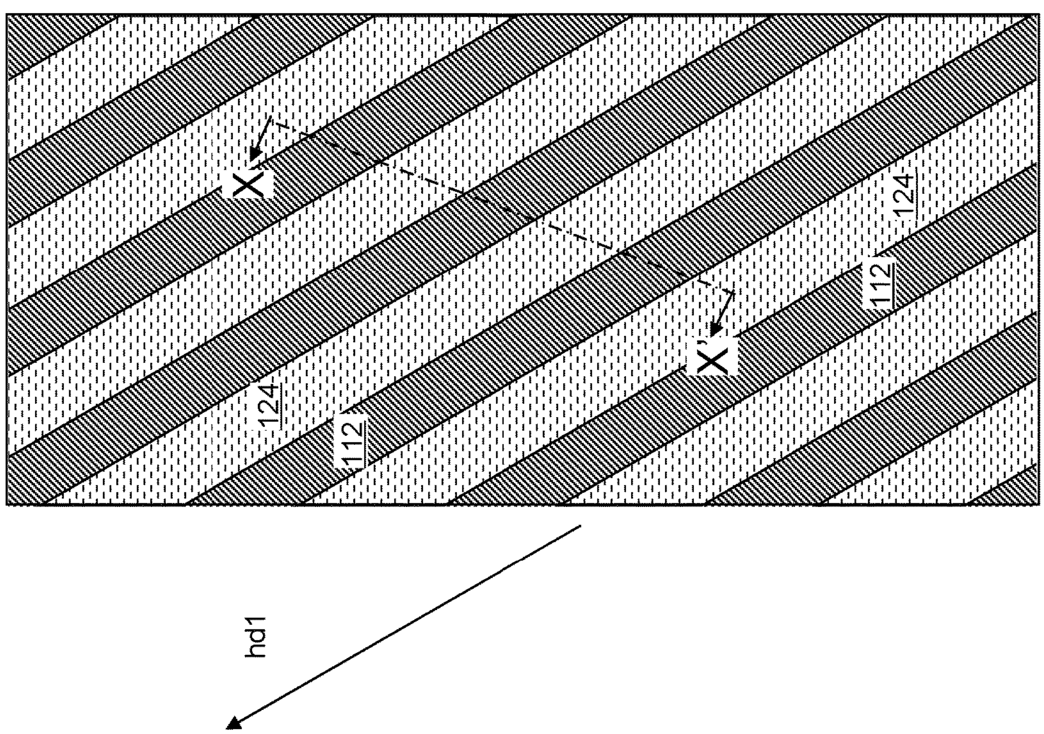
FIG. 35B is a top-down view of the third exemplary structure of FIG. 35A. The vertical plane X-X' is the plane of the vertical cross-sectional view of FIG. 35A.

Referring to FIGS. 35A and 35B, the optional dielectric material layer 124L can be patterned to form line trenches therethrough. For example, a photoresist layer (not shown) can be applied over the dielectric material layer 124L, and can be lithographically patterned to form a line-and-space pattern. The pattern in the photoresist layer can be transferred through the dielectric material layer 124L by an anisotropic etch. First line trenches 101 are formed through the level of the dielectric material layer 124L. The first line trenches 101 can vertically extend to the topmost surface of the source conductive layer 112, and the dielectric material layer 124L can be divided into dielectric material portions 124 which are in-process dielectric material portions that are subsequently patterned further. In some embodiment, the dielectric material portions 124 can be dielectric rails. As used herein, an "in-process" structure refers to a structure that is further modified in shape and/or composition in a subsequent processing step. In one embodiment, each of the first line trenches 101 can laterally extend a long a first horizontal direction hd1, and can have a respective uniform width. Thus, the dielectric material layer 124L can be divided into a plurality of dielectric material portions 124 that laterally extend along the first horizontal direction hd1 and laterally spaced apart from one another by the first line trenches 101. The photoresist layer can be subsequently removed, for example, by ashing. In case the dielectric material layer 124L and the dielectric material portions 124 are not employed, the processing steps of FIGS. 34, 35A, and 35B for forming the dielectric material layer 124L and the dielectric material portions 124 may be omitted.

Figure 36:
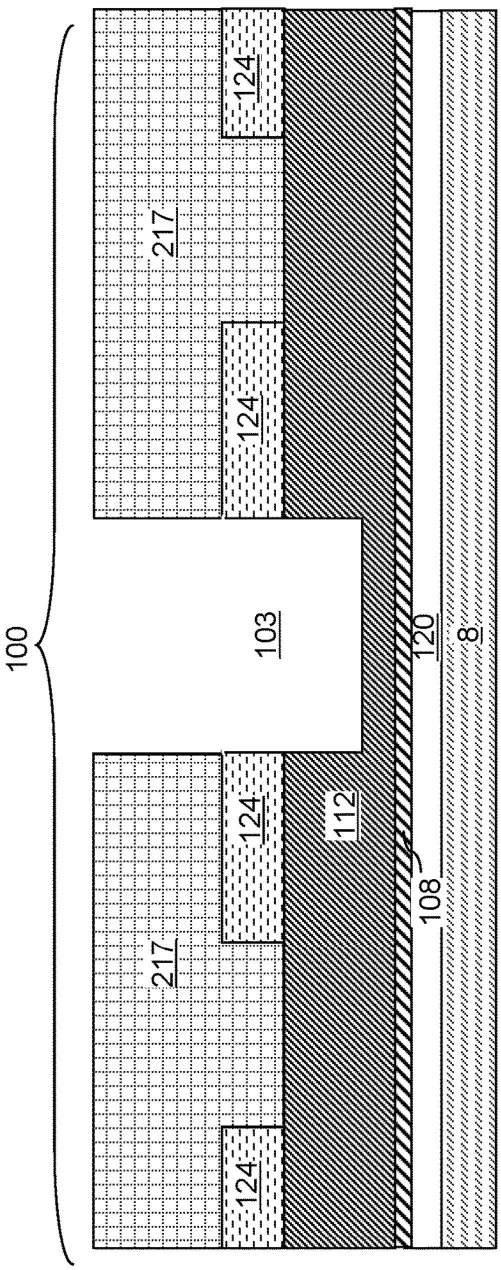
FIG. 36 is a vertical cross-sectional view of the third exemplary structure after formation of an etch stop cavity according to the third embodiment of the present disclosure.

Referring to FIG. 36, a photoresist layer 217 is applied over the optional dielectric material portions 124 and the source semiconductor layer 112, and can be lithographically patterned to form linear openings that extend along a second horizontal direction that is different from the first horizontal direction hd1. Each of the linear openings can have a uniform width throughout. An anisotropic etch can be performed to remove physically exposed portions of the optional dielectric material portions 124 and an upper region of the source semiconductor layer 112. A second line trench 103 is formed underneath each linear opening in the photoresist layer 217. In one embodiment, the anisotropic etch process can include a first step that etches the dielectric material of the optional dielectric material portions 124 selective to the semiconductor material of the source semiconductor layer 112, and a second step for etching the semiconductor material of the source semiconductor layer 112 to reduce overall height variation of the bottom surface of the second line trenches 103. The second line trenches 103 can have a greater depth than the first line trenches 101. The bottom surface of each second line trench 103 is located below the horizontal plane of the topmost surface of the source semiconductor layer 112, and at, or above, the horizontal plane of the bottom surface of the source semiconductor layer 112. Thus, a bottom surface of each second line trench 103 can be a recessed surface of the source conductive layer 112, and the optional dielectric material portions 124 are divided into multiple portions by the second line trenches 103. The photoresist layer 217 can be subsequently removed, for example, by ashing.

The source conductive layer 112 has a height modulation due the presence of the second line trenches 103 therein. Specifically, each portion of the source conductive layer 112 underlying a second line trench 103 has a lesser thickness than portion of the source conductive layer 112 located outside the second line trenches 103. As such, the source conductive layer 112 is a thickness-modulated source semiconductor layer.

Figure 37A:
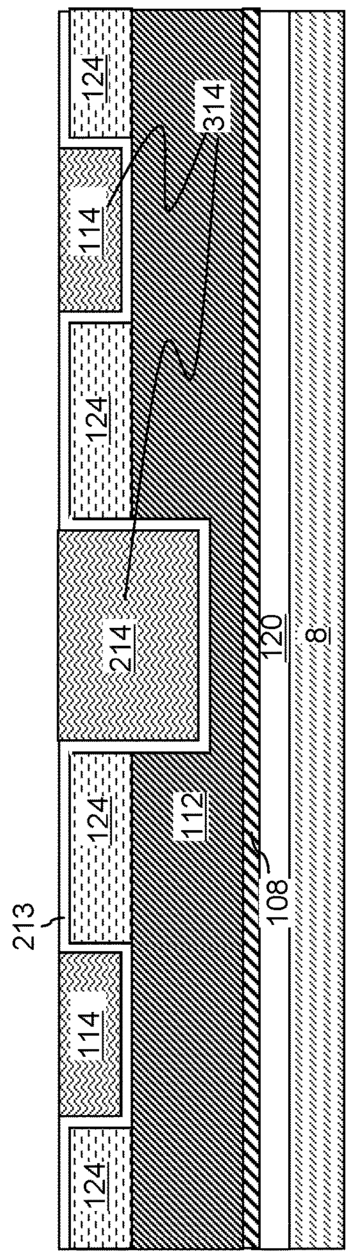
FIG. 37A is a vertical cross-sectional view of the third exemplary structure after formation of a first dielectric liner and sacrificial semiconductor rails according to the third embodiment of the present disclosure.
Figure 37B:
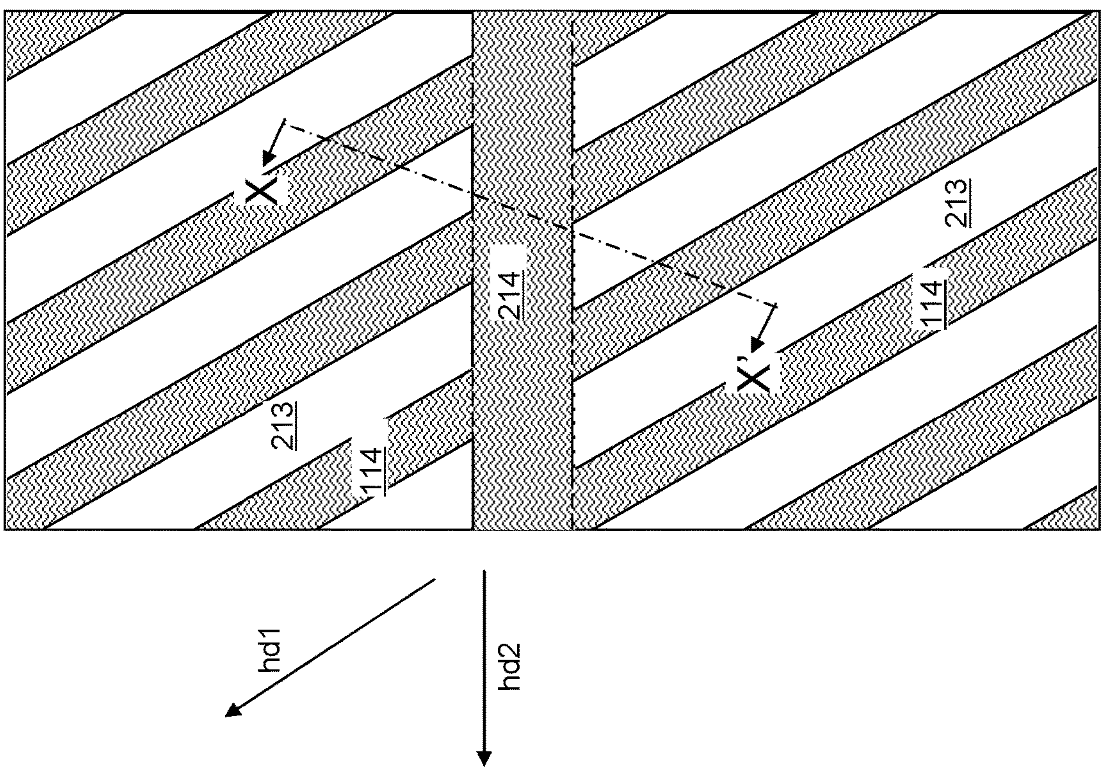
FIG. 37B is a top-down view of the third exemplary structure of FIG. 37A. The vertical plane X-X' is the plane of the vertical cross-sectional view of FIG. 37A.

Referring to FIGS. 37A and 37B, a first dielectric liner 213 can be formed in the first and second line trenches (101, 103) by conformal deposition of a dielectric material. The dielectric material of the first dielectric liner 213 can be, for example, silicon oxide. The thickness of the first dielectric liner 213 can be in a range from 10 nm to 50 nm, although lesser and greater thicknesses can also be employed.

A sacrificial semiconductor material such as amorphous silicon or polysilicon can be deposited in the first and second line trenches (101, 103) by a deposition process such as chemical vapor deposition. Excess portions of the sacrificial semiconductor material can be removed from above a horizontal plane including topmost surfaces of the first dielectric liner 213 by a planarization process, which can include a recess etch and/or chemical mechanical planarization. The deposited sacrificial semiconductor material can be planarized to form a continuous semiconductor structure 314 that includes sacrificial semiconductor material portions 114 that laterally extend along the first horizontal direction hd1 and a sacrificial semiconductor line 214 that laterally extends along the second horizontal direction hd2. In one embodiment, the sacrificial semiconductor material portions 114 can be semiconductor rails. Remaining portions of the sacrificial semiconductor material in the first line trenches 101 constitute the sacrificial semiconductor material portions 114, and a remaining portion of the sacrificial semiconductor material in the second line trench 103 constitutes the sacrificial semiconductor line 214.

In one embodiment, the sacrificial semiconductor material portions 114 and the dielectric material portions 124 can laterally alternate to form a laterally alternating stack. The laterally alternating stack (114, 124) overlies a topmost surface of the source conductive layer 112, and the sacrificial semiconductor line 124 overlies a recessed surface of the source conductive layer 112, and is adjoined to the sacrificial semiconductor material portions 114. In one embodiment, the sacrificial semiconductor material portions 114 may have a same first width along the direction of alternation, and the dielectric material portions 124 may have a same second width along the direction of alternation. In this case, the laterally alternating stack may form a periodic one-dimensional array having a pitch. The pitch may be in a range from 100 nm to 500 nm, although lesser and greater pitches may also be employed.

Figure 37C:
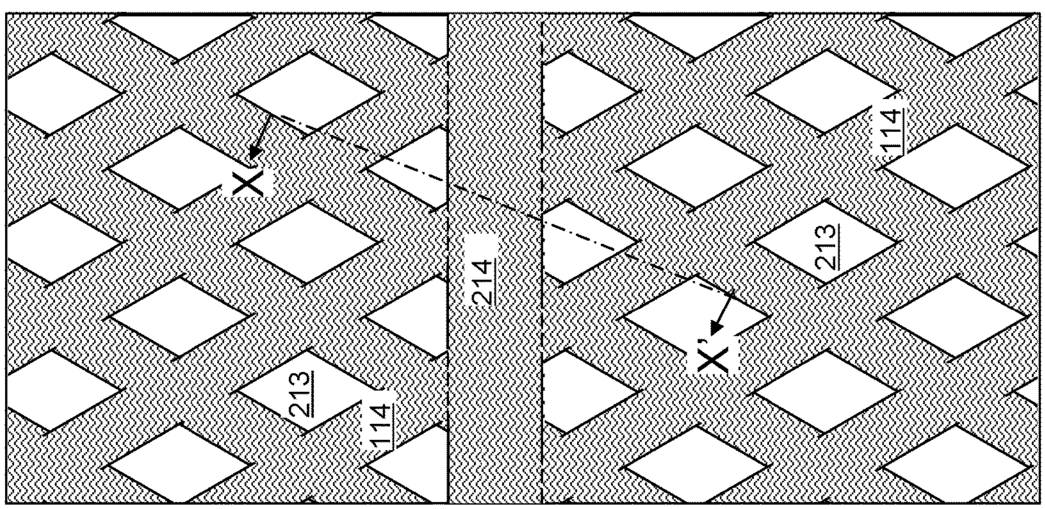
FIG. 37C is a top-down view of a first alternative configuration of the third exemplary structure of FIG. 37A. The vertical plane X-X' is the plane of the vertical cross-sectional view of FIG. 37A.

FIG. 37C is a top-down view of a first alternative configuration of the third exemplary structure of FIG. 37A. The vertical plane X-X' is the plane of the vertical cross-sectional view of FIG. 37A. In this configuration, the sacrificial semiconductor material portions 114 can be formed as a criss-cross array of two sets of intersecting line structures that extend along two different horizontal directions. The dielectric material portions 124 are located in areas that are not occupied by the sacrificial semiconductor material portions 114. The dielectric material portions 124 provide structural support to overlying structures during a subsequent processing step in which the sacrificial semiconductor material portions 114 and the sacrificial semiconductor line 214 are removed to form cavities.

Figure 37D:
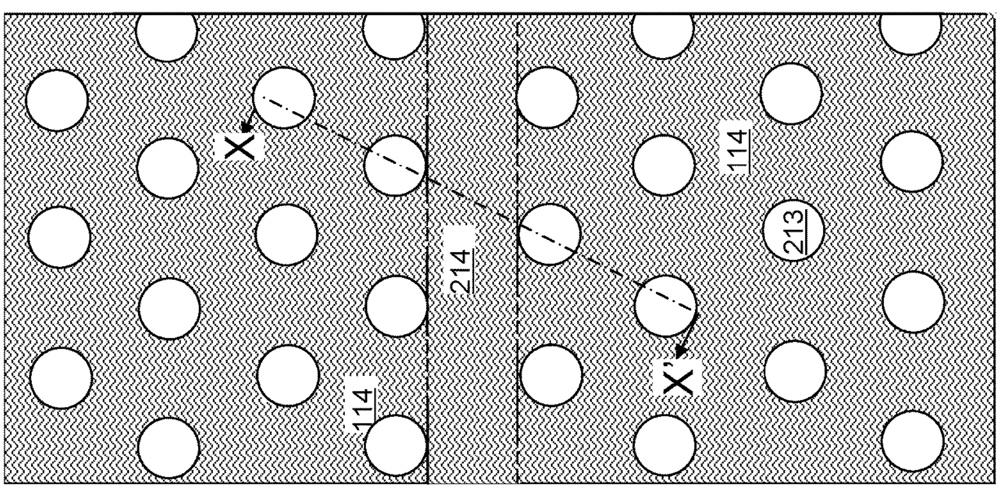
FIG. 37D is a top-down view of a second alternative configuration of the third exemplary structure of FIG. 37A. The vertical plane X-X' is the plane of the vertical cross-sectional view of FIG. 37A.

FIG. 37D is a top-down view of a second alternative configuration of the third exemplary structure of FIG. 37A. The vertical plane X-X' is the plane of the vertical cross-sectional view of FIG. 37A. In this configuration, each of the sacrificial semiconductor material portions 114 can be formed as a matrix layer in which dielectric material portions 124 are embedded as discrete structures. The dielectric material portions 124 provide structural support to overlying structures during a subsequent processing step in which the sacrificial semiconductor material portions 114 and the sacrificial semiconductor line 214 are removed to form cavities.

Figure 37E:
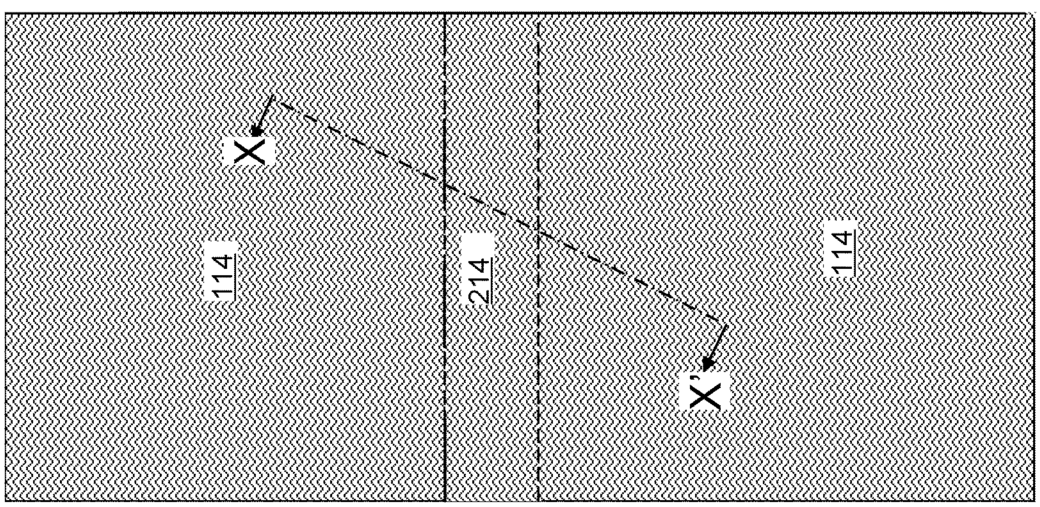
FIG. 37E is a top-down view of a third alternative configuration of the third exemplary structure of FIG. 37A. The vertical plane X-X' is the plane of the vertical cross-sectional view of FIG. 37A.

FIG. 37E is a top-down view of a third alternative configuration of the third exemplary structure of FIG. 37A. The vertical plane X-X' is the plane of the vertical cross-sectional view of FIG. 37A. In this configuration, the dielectric material portions are omitted, and the entire area outside of the sacrificial semiconductor line 214 can be filled with the sacrificial semiconductor material portions 114.

Figure 38:
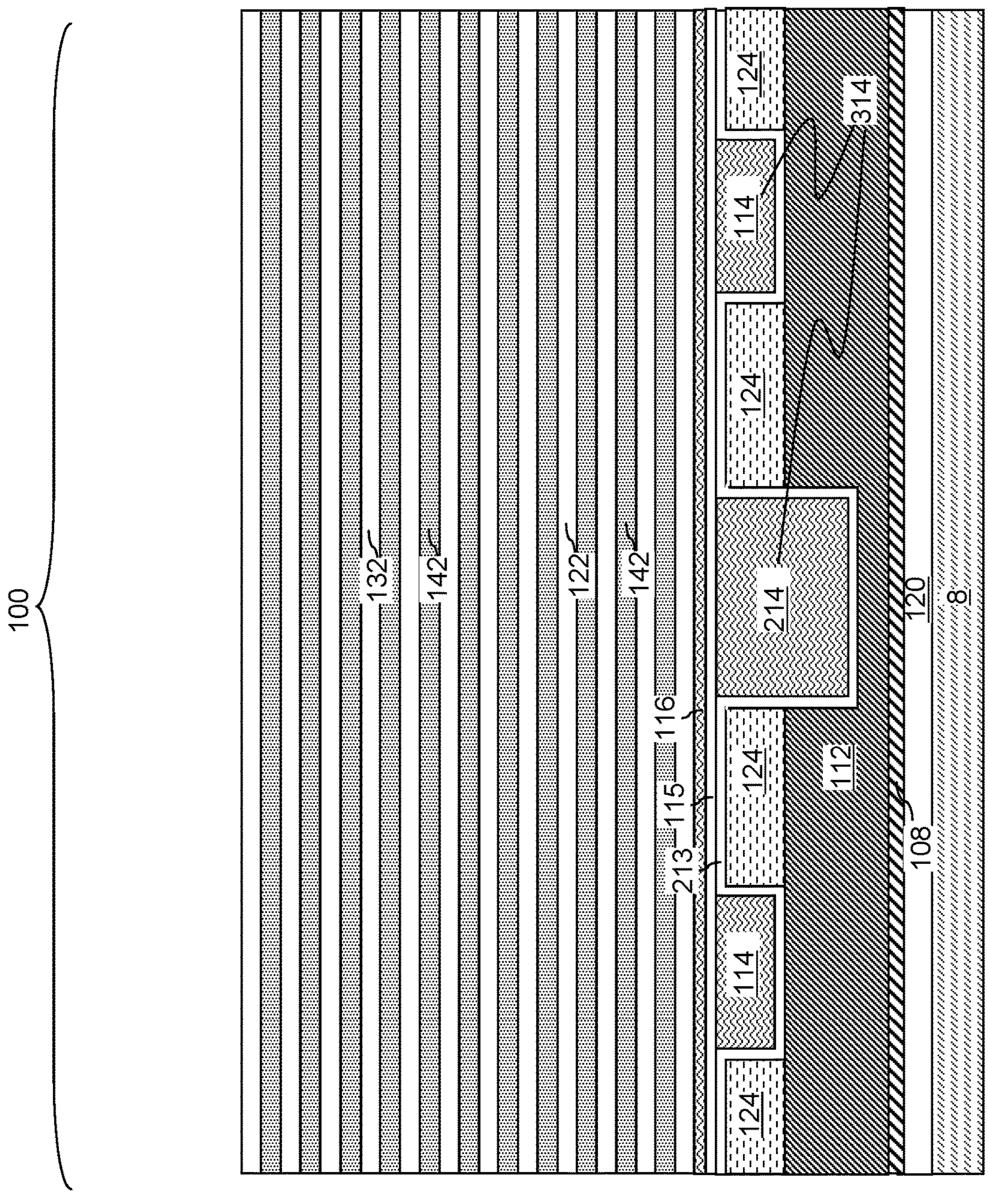
FIG. 38 is a vertical cross-sectional view of the third exemplary structure after formation of a second dielectric liner, a cap semiconductor layer, and a first alternating stack of first insulating layers and first sacrificial material layers according to the third embodiment of the present disclosure.

Referring to FIG. 38, the processing steps of FIG. 3 can be performed to form a second dielectric liner 115 and a cap semiconductor layer 116. A vertically alternating stack of insulating layers and spacer material layers is subsequently formed over the sacrificial semiconductor line 214. As discussed above, the spacer material layers are formed as, or are subsequently replaced with, electrically conductive layers. In one embodiment, the processing steps of FIGS. 8A and 8B can be performed to form a first vertically alternating stack (132, 142) of first insulating layers 132 and first sacrificial material layers 142.

Figure 39:
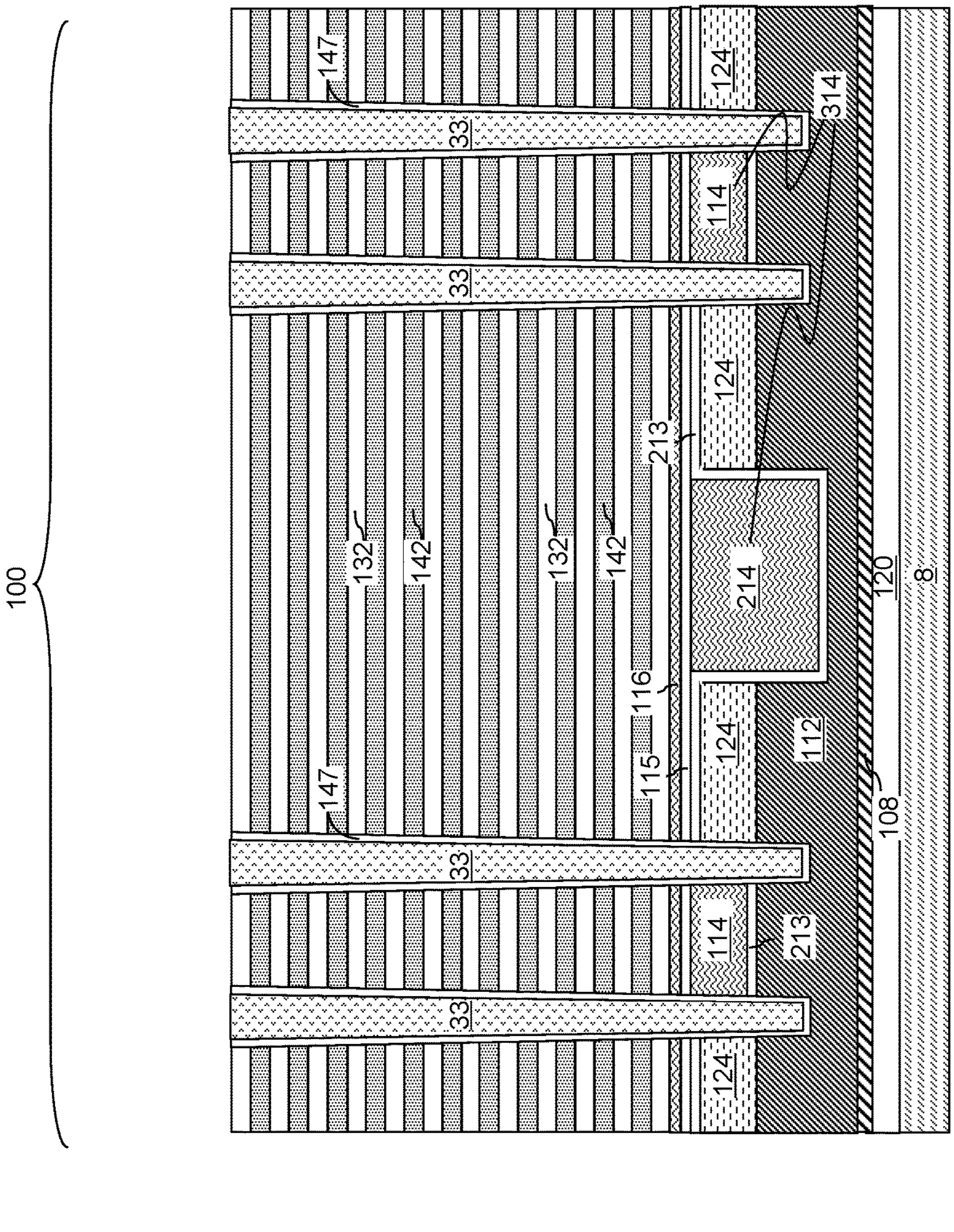
FIG. 39 is a vertical cross-sectional view of the third exemplary structure after formation of first-tier memory openings and first-tier sacrificial liners according to the third embodiment of the present disclosure.

Referring to FIG. 39, the processing steps of FIGS. 9A, 9B, 10, 11, and 12 can be performed to form first-tier memory openings 149 and first tier support openings, first-tier sacrificial liners 147, and first-tier sacrificial fill structures 133.

Figure 40:
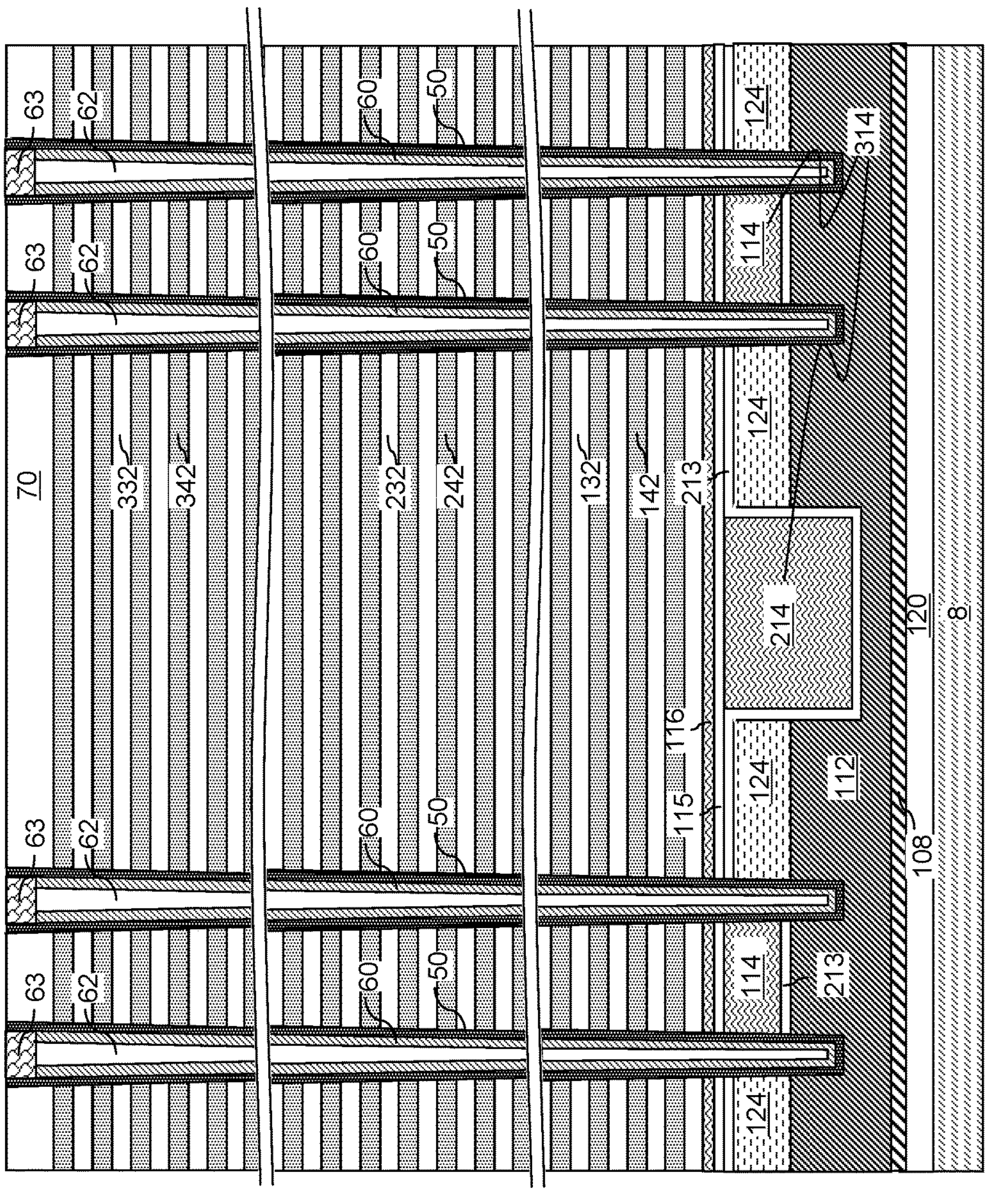
FIG. 40 is a vertical cross-sectional view of the third exemplary structure after formation of memory stack structures, dielectric cores, and drain regions according to the third embodiment of the present disclosure.

Referring to FIG. 40, the processing steps of FIGS. 13, 14, and 15 can be performed to form memory stack structures (50, 60), dielectric cores 62, and drain regions 63 within each memory opening 49 and each support opening. As in the first and second exemplary structures, the memory stack structures (50, 60) are formed through each of the at least one vertically alternating stack {(132. 142), (232, 242), (332, 342)} and the laterally alternating stack (114, 124). In one embodiment, each of the memory stack structures (50, 60) contacts a sidewall of a respective one of the sacrificial semiconductor material portions 114 and a sidewall of a respective one of the dielectric material portions 124.

Figure 41:
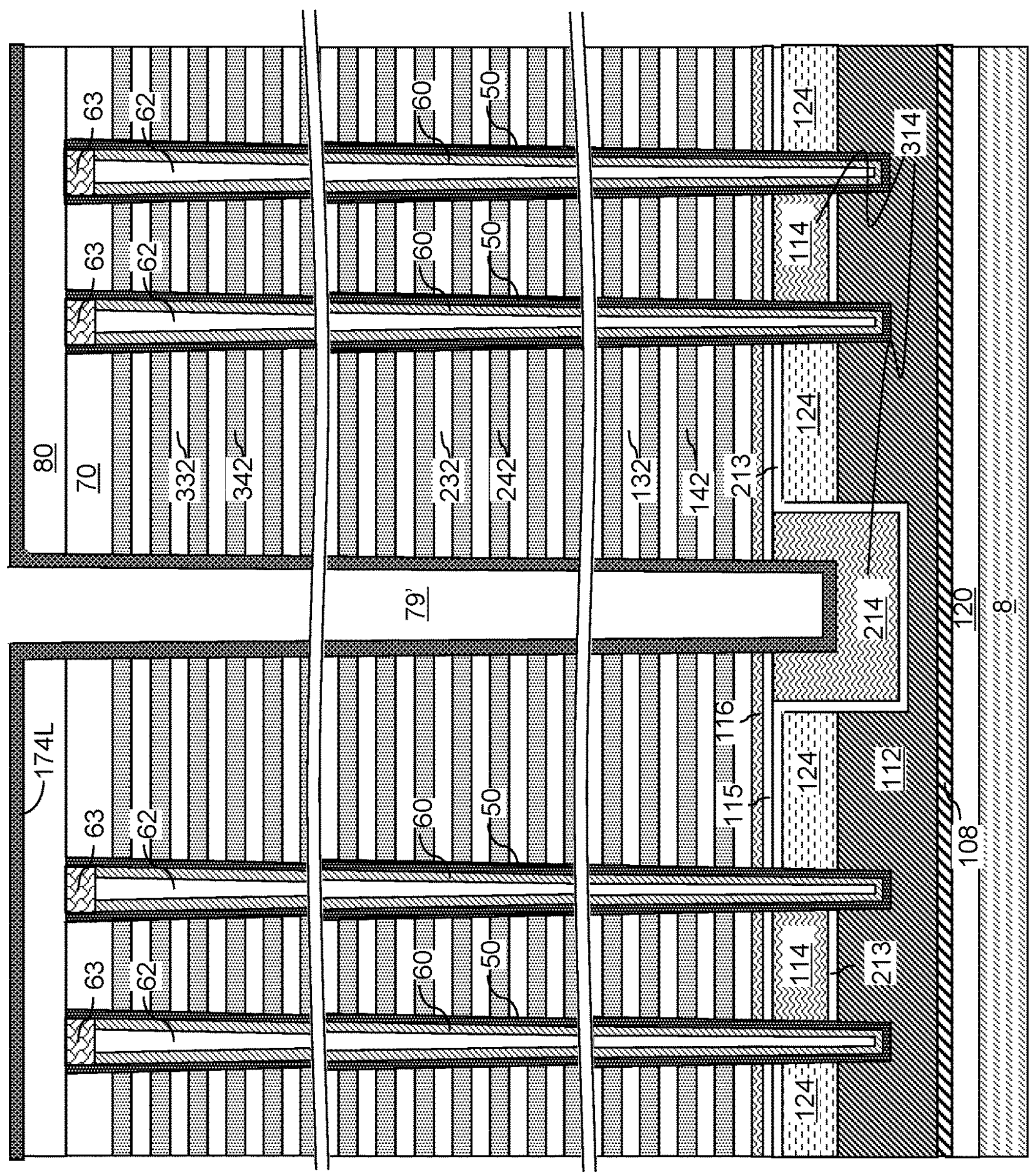
FIG. 41 is vertical cross-sectional view of the third exemplary structure after formation of a backside trench and a trench liner layer according to the third embodiment of the present disclosure.

Referring to FIG. 41, the processing steps of FIG. 16 can be performed to form a contact level dielectric layer 80 and backside trenches 79. The backside trenches 79 can be formed by an anisotropic etch process that etches the materials of the at least one vertically alternating stack {(132. 142), (232, 242), (332, 342)} selective to the semiconductor material of the sacrificial semiconductor line 214. Thus, the sacrificial semiconductor line 214 can be employed as an etch stop structure during formation of the backside trenches 79. A bottom surface of each backside trench 79 can protrude into a recessed portion of an underlying sacrificial semiconductor line 214. In one embodiment, an entire bottom surface of a backside trench 79 can be a recessed top surface of the underlying sacrificial semiconductor line 214.

A trench liner layer 174L can be formed as a continuous conformal material layer at the periphery of each backside trench 79 and over the top surface of the contact level dielectric layer 80. The trench liner layer 174L includes a sacrificial material that can be employed as a protective material for the at least one vertically alternating stack {(132. 142), (232, 242), (332, 342)} during a subsequent etch process that etches the sacrificial semiconductor material portions 114 and the sacrificial semiconductor lines 214. In one embodiment, the trench liner layer 174L can include silicon nitride having a thickness in a range from 10 nm to 30 nm, although lesser and greater thicknesses can also be employed. The trench liner layer 174L can be formed by a conformal deposition process such as low pressure chemical vapor deposition (LPCVD). A backside cavity 79' can be provided within each backside trench 79.

Figure 42A:
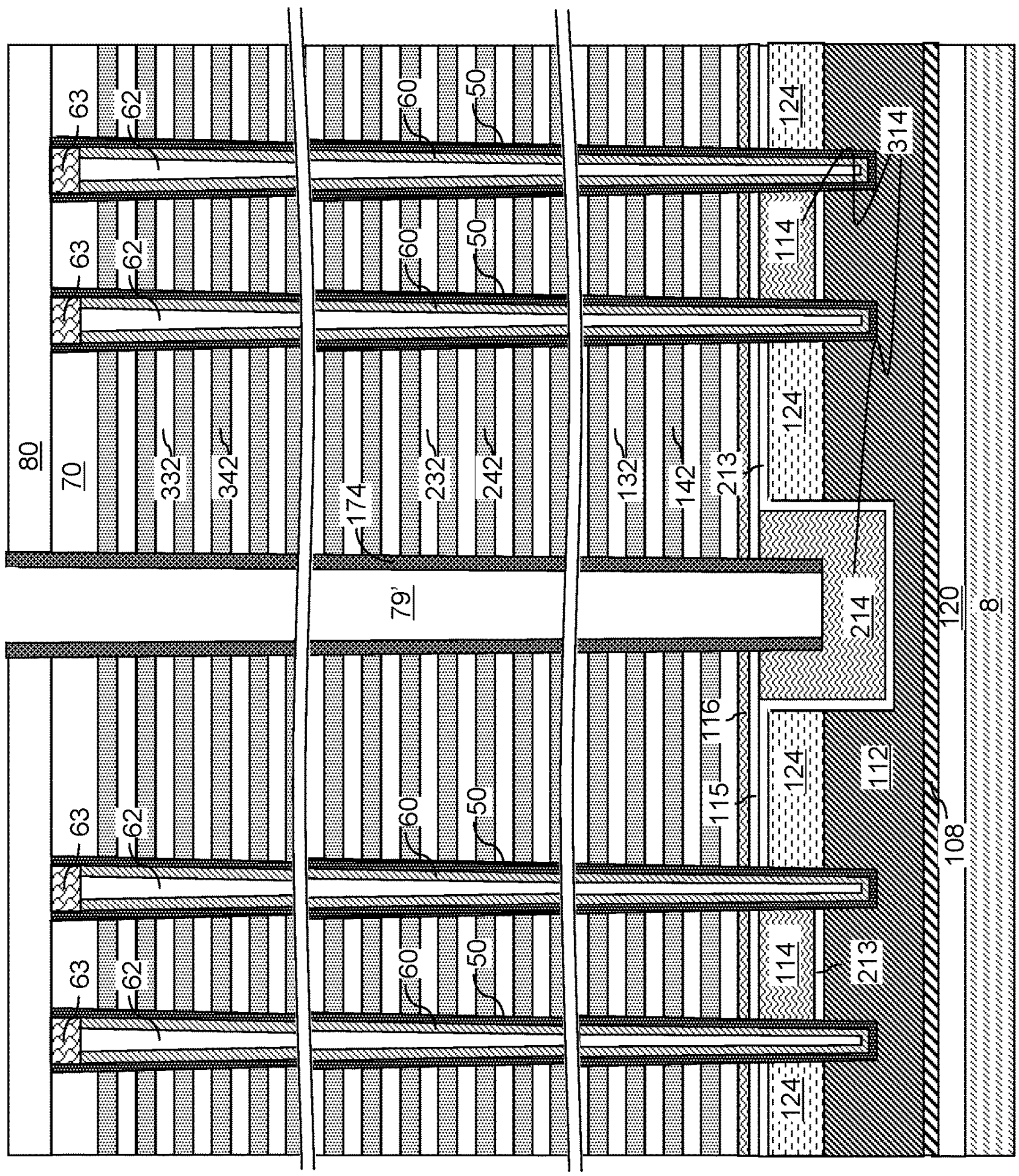
FIG. 42A is a vertical cross-sectional view of the third exemplary structure after formation of a trench spacer according to the third embodiment of the present disclosure.
Figure 42B:
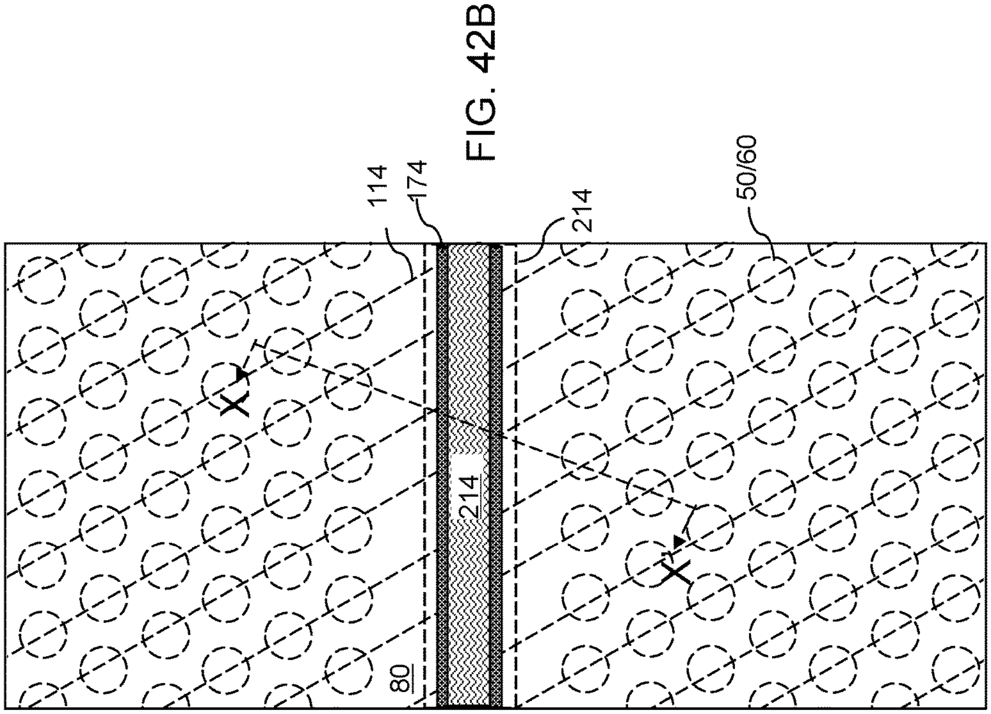
FIG. 42B is a top-down view of the third exemplary structure of FIG. 42A. The vertical plane X-X' is the plane of the vertical cross-section of FIG. 42A.

Referring to FIGS. 42A and 42B, an anisotropic etch process can be performed to etch horizontal portions of the trench liner layer 174L. Each remaining vertical portion of the trench liner layer 174L constitutes a trench spacer 174. Each trench spacer 174 can be located at a periphery of a respective backside trench 79, and covers sidewalls of the at least one vertically alternating stack {(132. 142), (232, 242), (332, 342)}. A top surface of a sacrificial semiconductor line 214 is physically exposed at the bottom of each trench cavity 79'.

Figure 43:
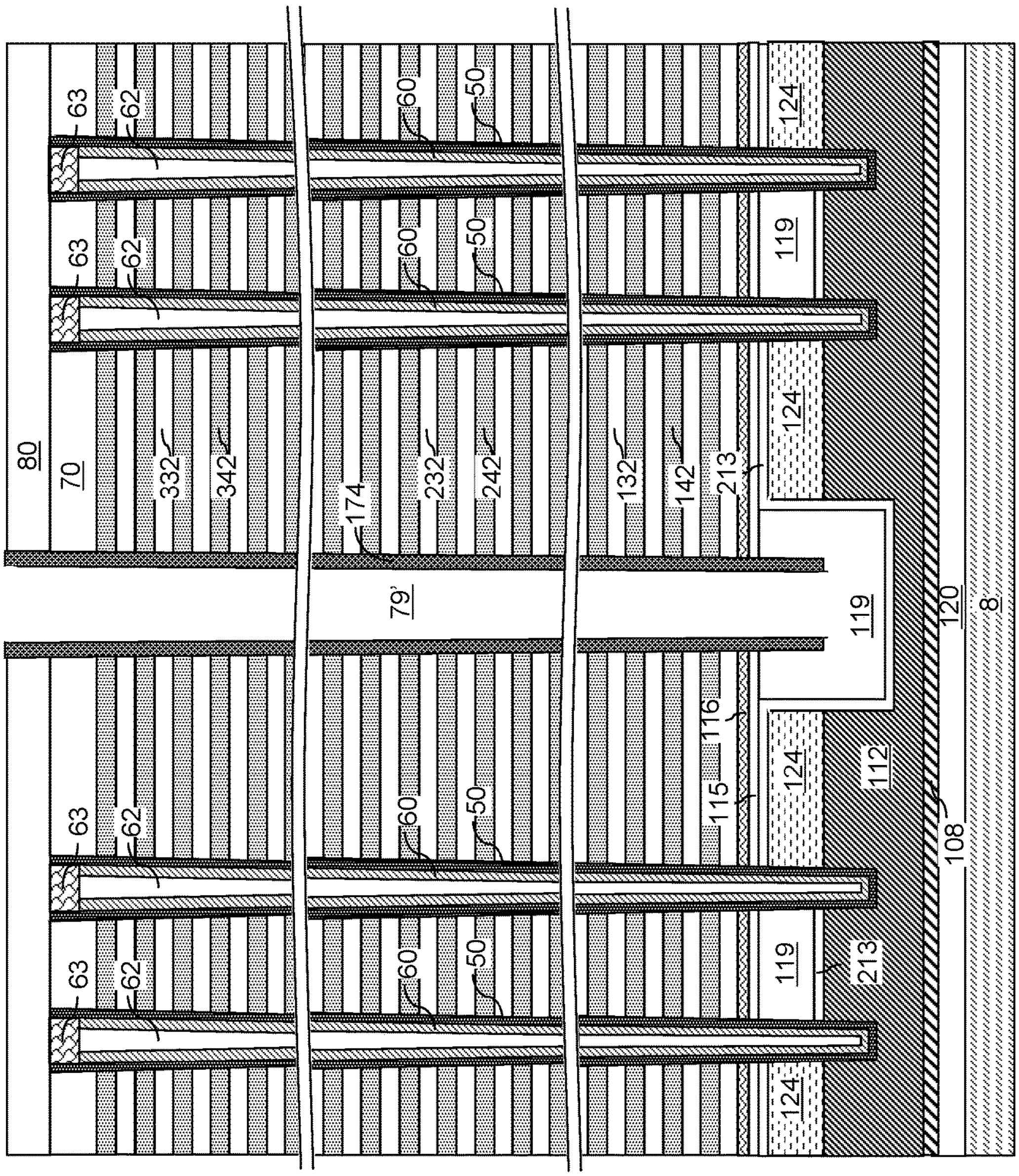
FIG. 43 is a vertical cross-sectional view of the third exemplary structure after formation of source cavities according to the third embodiment of the present disclosure.

Referring to FIG. 43, the processing steps of FIG. 18 can be performed to form source cavities 119. Specifically, a first isotropic etch process can be performed employing an etchant that etches the material of the sacrificial semiconductor line 214 and the sacrificial source material portions 114 selective to the dielectric material portions 124. The etchant can be introduced through the backside trenches 79. In one embodiment, the etchant can be selected such that the etchant etches the semiconductor material of the sacrificial semiconductor material portions 114 selective to the dielectric materials of the first dielectric liner 213, the second dielectric liner 115, the optional dielectric material portions 124, and the trench spacers 174. The etchant can be a liquid phase etchant applied in a wet etch process, or a gas phase etchant applied in a dry etch process. For example, if the sacrificial semiconductor material portions 114 include amorphous silicon, a wet etch process employing a trimethyl-2 hydroxyethyl ammonium hydroxide (TMY) solution, a wet etch process employing a KOH solution, or a dry etch process employing gas phase HCl may be employed to isotropically etch that sacrificial semiconductor material portions 114. Source cavities 119 are formed by removal of the sacrificial semiconductor line 214 and the sacrificial semiconductor material portions 114 selective to the dielectric materials of the first dielectric liner 213, the second dielectric liner 115, the optional dielectric material portions 124, and the trench spacers 174.

Figure 44:
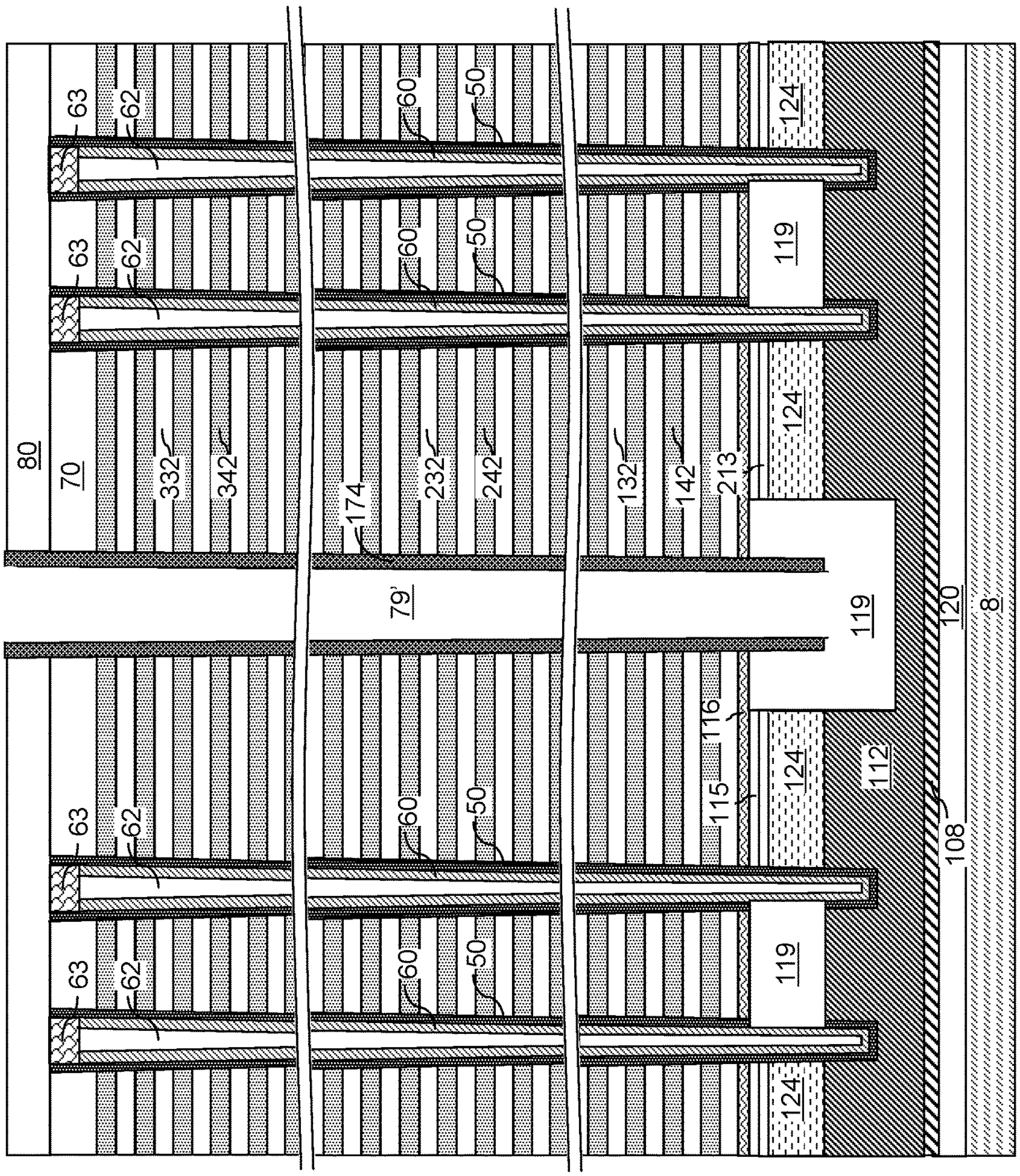
FIG. 44 is a vertical cross-sectional view of the third exemplary structure after removal of physically exposed portions of memory films according to the third embodiment of the present disclosure.

Referring to FIG. 44, the processing steps of FIG. 19 can be performed to expand the source cavities 119. Specifically, a second isotropic etch process can be performed by introducing at least another etchant through the backside trenches 79 into the source cavities 119. The second isotropic etch process removes materials of the memory films 50 and the dielectric liners (213, 115) selective to the cap semiconductor layer 116 and the semiconductor channels 60. Thus, the physically exposed portions of the memory films 50 adjacent to the source cavities 119 can be removed by the second isotropic etch process to physically expose outer sidewalls of the semiconductor channels 60. Portions of the memory films 50 that are adjacent to the sacrificial semiconductor material portions 114 at the processing steps of FIGS. 42A and 42B are removed to form a lateral opening through each memory film 50. In an illustrative example, a wet etch employing hydrofluoric acid can be employed for the second isotropic etch process. The source cavities 119 can be expanded in volume by removal of the physically exposed portions of the memory films 50 and the portions of the dielectric liners (213, 115) that overlie or underlie the source cavities 119.

Figure 45:
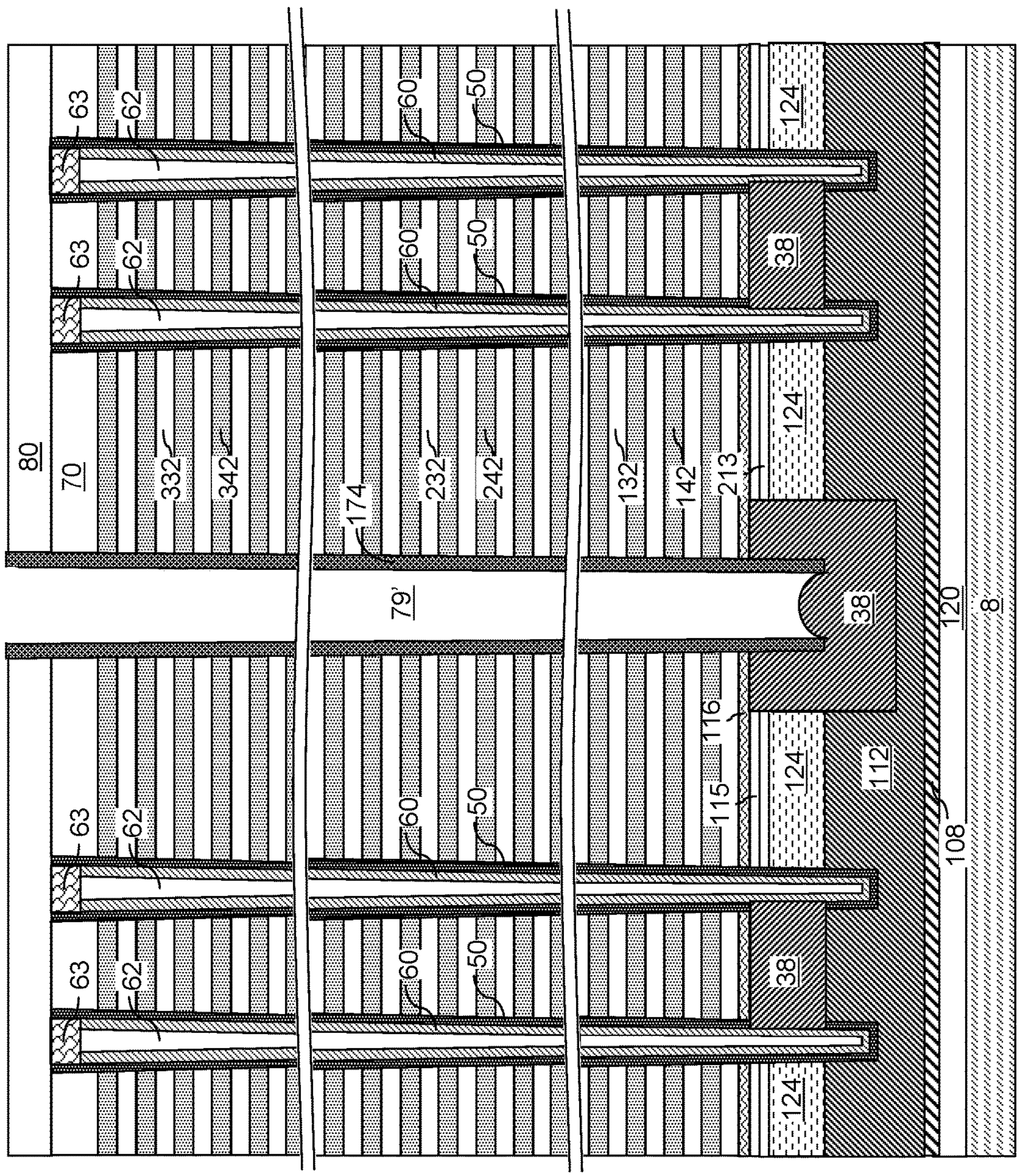
FIG. 45 is a vertical cross-sectional view of the third exemplary structure after formation of source strap rails according to the third embodiment of the present disclosure.

Referring to FIG. 45, the processing steps of FIG. 20 can be performed to form source strap material portions 38 in the source cavities 119. The source strap material portions 38 can be formed directly on sidewalls of the semiconductor channels 60, portions of the top surface of the source semiconductor layer 112, and portions of the bottom surface of the cap semiconductor layer 116. Each source strap material portion 38 can have first portions having a first thickness and located outside areas of the backside trenches 79, and second portions having a second thickness and located under and around the backside trenches 79. The first thickness can be about the sum of the thickness of the dielectric material portions 124, the first dielectric liner 213, and the second dielectric liner 115. The second thickness can be the vertical distance between the bottom surface of the cap semiconductor layer 116 and the recessed top surface of the source semiconductor layer 112.

Figure 46:
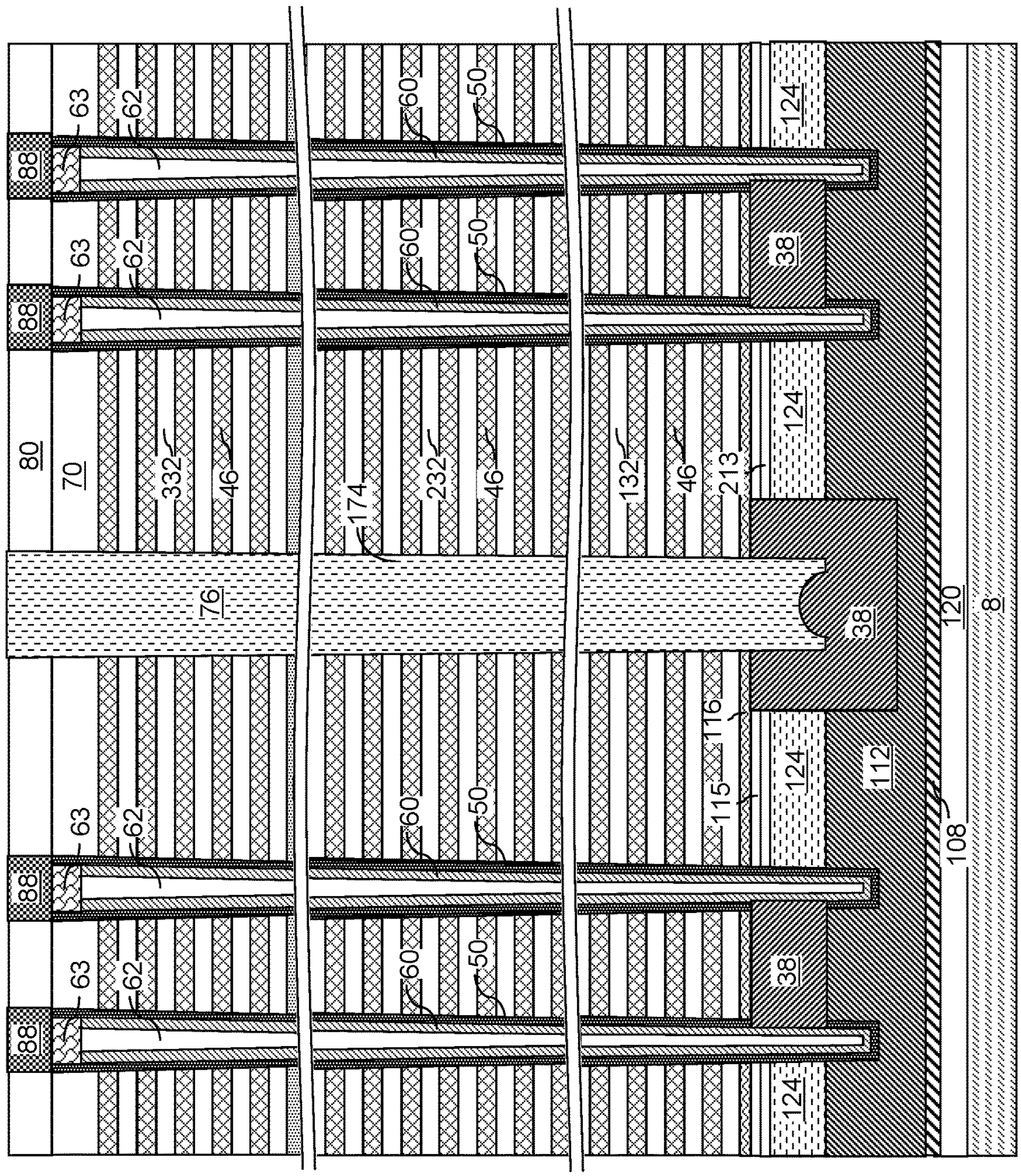
FIG. 46 is a vertical cross-sectional view of the third exemplary structure after formation of electrically conductive layers, an insulating wall structure, and various contact via structures according to the third embodiment of the present disclosure.

Referring to FIG. 46, the processing steps of FIGS. 21, 22, 23, and 24A-24C can be sequentially performed to remove the trench spacer 174, to replace the sacrificial material layers (142, 242, 342) with electrically conductive layers 46, and to form an insulating wall structure 76. The insulating wall structure 76 contacts sidewalls of the insulating layers (132, 232, 332) and the electrically conductive layers 46 and top surfaces of the source strap material portions 38. Various contact via structures can be formed as in the previous embodiments.

Figure 47:
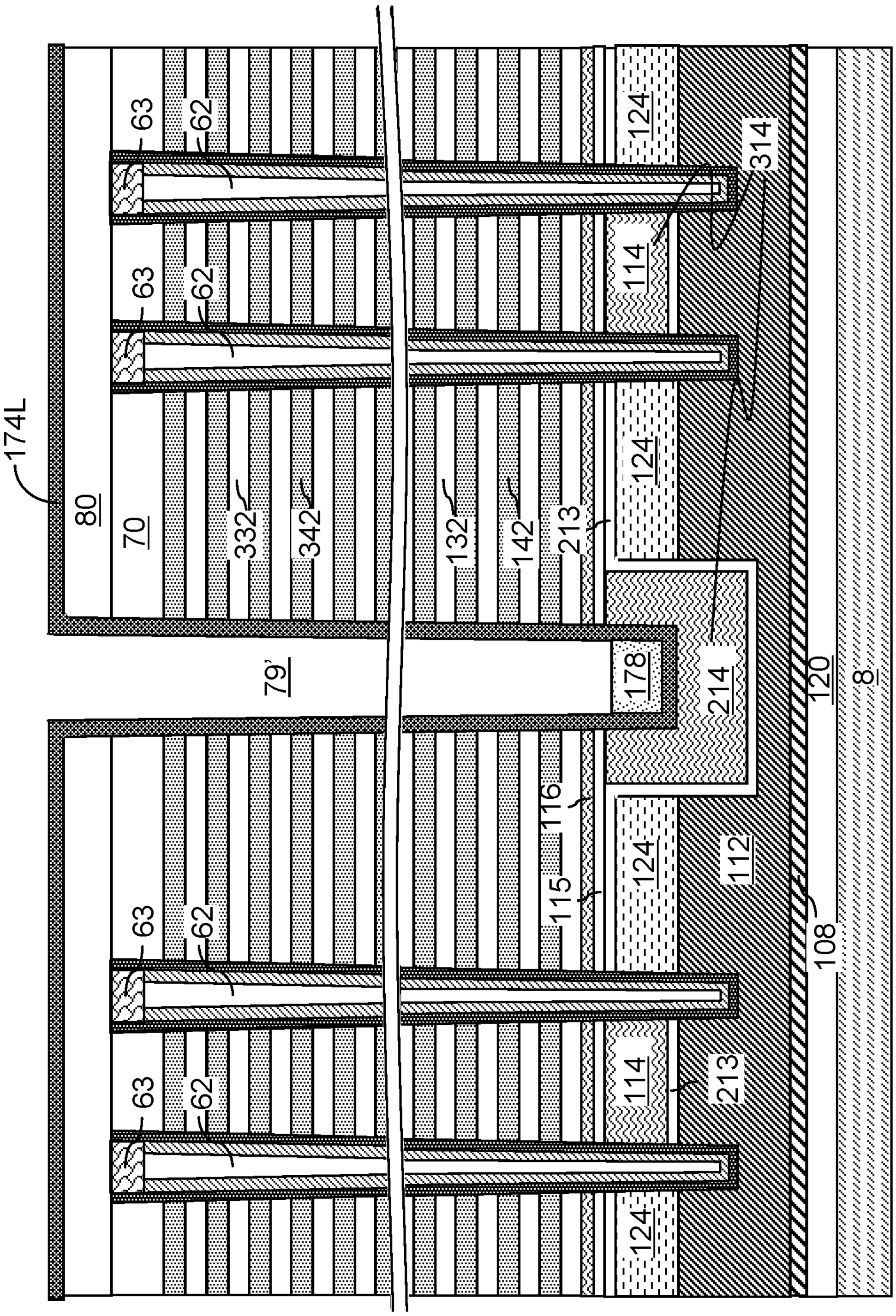
FIG. 47 is a vertical cross-sectional view of a fourth exemplary structure after deposition of a structural-reinforcement portion according to a fourth embodiment of the present disclosure.

Referring to FIG. 47, a fourth exemplary structure according to a fourth embodiment of the present disclosure can be derived from the third exemplary structure of FIG. 41 by forming a structural-reinforcement portion 178 at a bottom portion of each backside trench 79. Each structural-reinforcement portion 178 can be formed as a single continuous structure that covers the entire bottom surface of the trench liner layer 174L. The structural-reinforcement portion 178 can be formed, for example, by deposition and recessing of a material so that the remaining material is present only at a bottom portion of each backside trench 79, or can be formed by a self-planarizing deposition process (such as spin coating) and an optional recess etch. In a non-limiting illustrative example, polysilazane can be deposited by chemical vapor deposition, and can be vertically recessed by a recess etch to form a silicon oxide structural-reinforcement portion 178. The thickness of the structural-reinforcement portion 178 can be in a range from 100 nm to 500 nm, although lesser and greater thicknesses can also be employed.

Figure 48A:
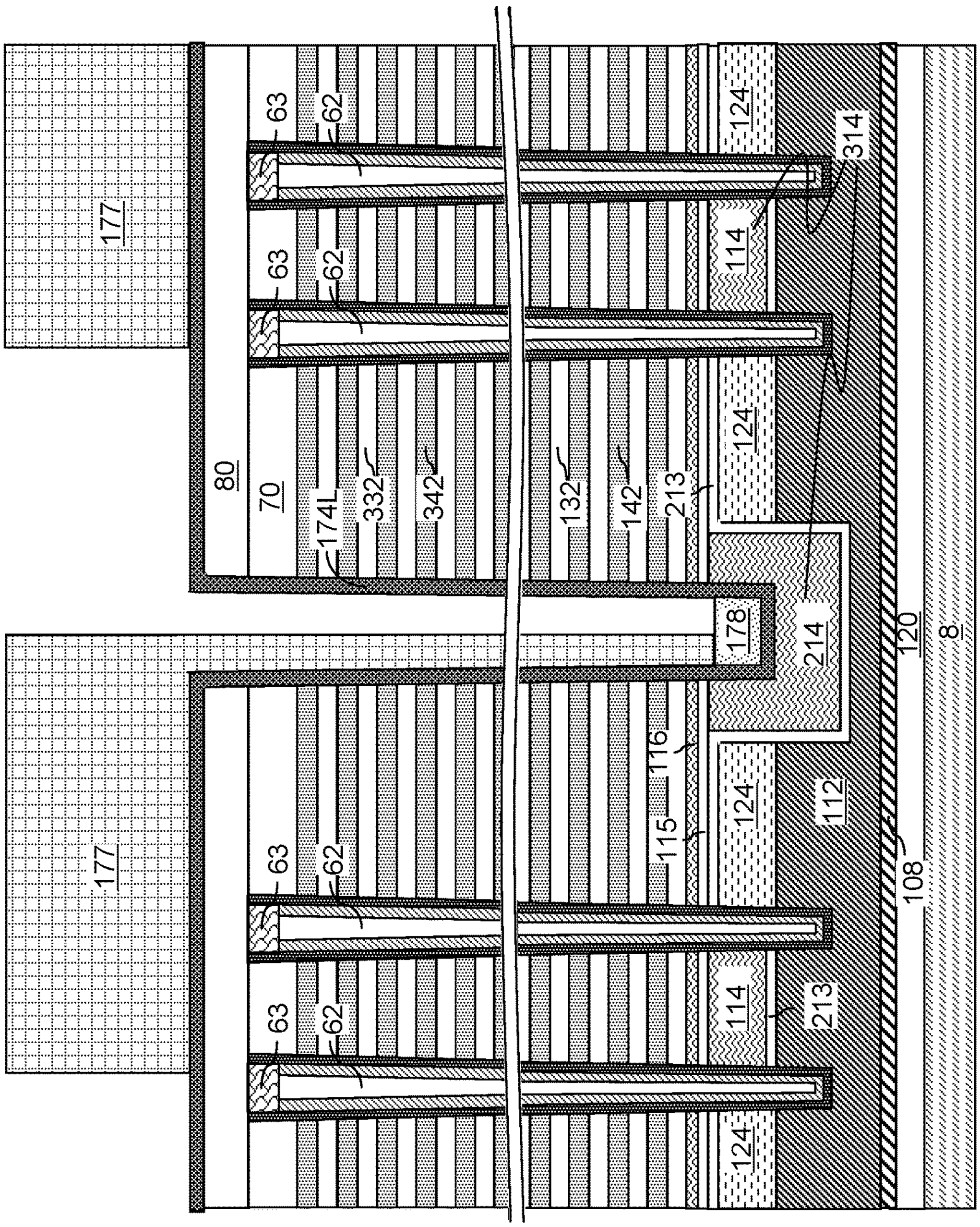
FIG. 48A is a vertical cross-sectional view of the fourth exemplary structure after application and patterning of a photoresist layer according to the fourth embodiment of the present disclosure.
Figure 48B:
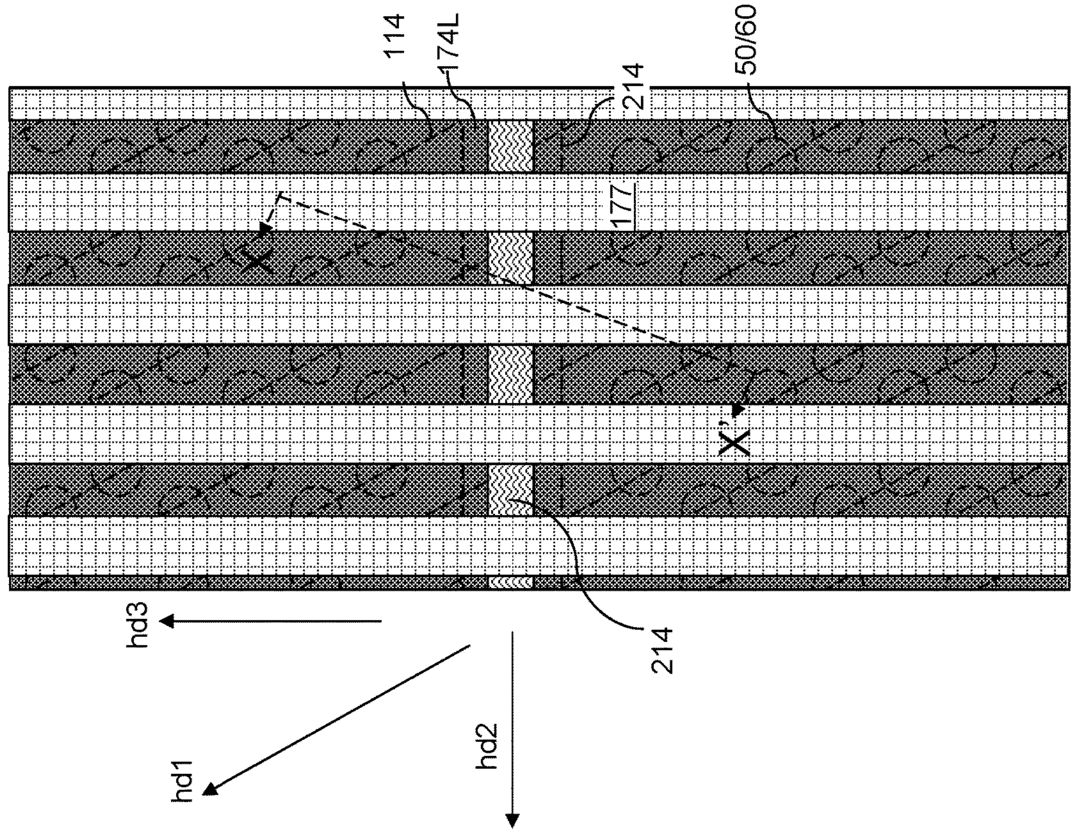
FIG. 48B is a top-down view of the fourth exemplary structure of FIG. 48A. The vertical plane X-X' is the plane of the vertical cross-section of FIG. 48A.
Figure 49A:
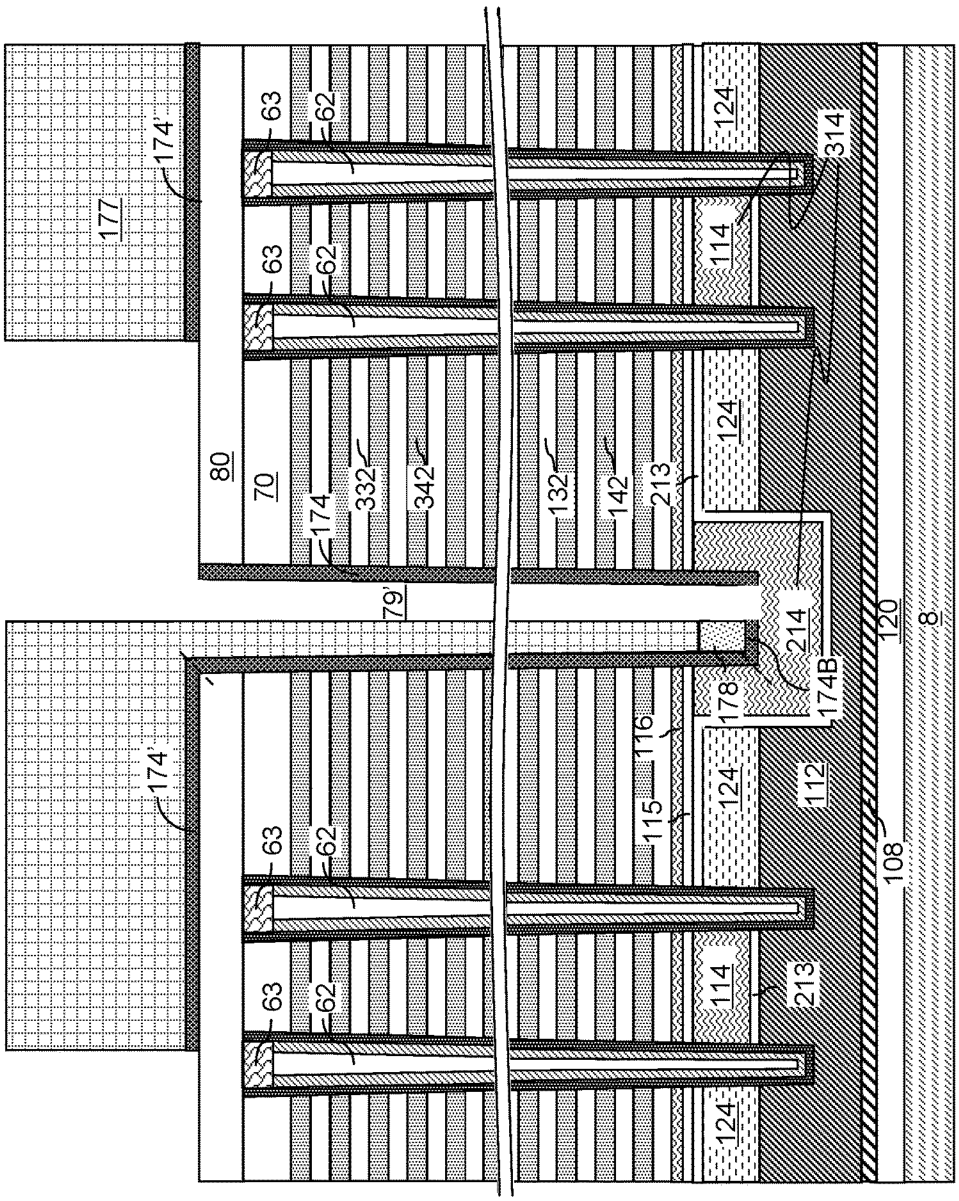
FIG. 49A is a vertical cross-sectional view of the fourth exemplary structure after patterning of a trench liner layer into trench spacers and trench liner strips according to the fourth embodiment of the present disclosure.
Figure 49B:
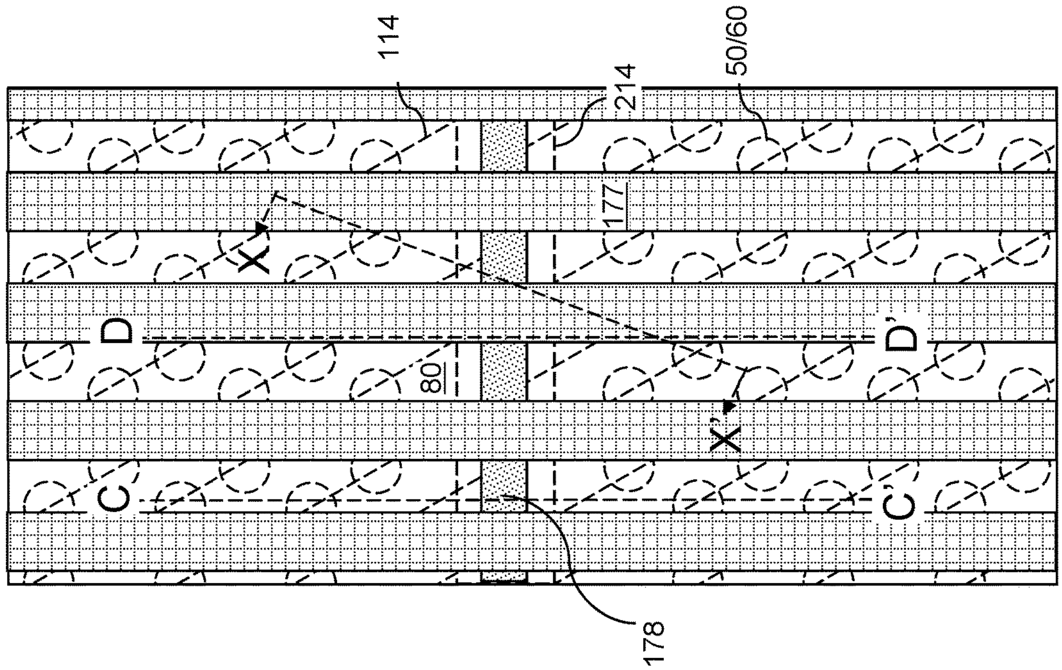
FIG. 49B is a top-down view of the fourth exemplary structure of FIG. 49A. The vertical plane X-X' is the plane of the vertical cross-section of FIG. 49A. The vertical plane C-C' is the plane of the vertical cross-section of FIG. 49C. The vertical plane D-D' is the plane of the vertical cross-section of FIG. 49D.
Figure 49C:
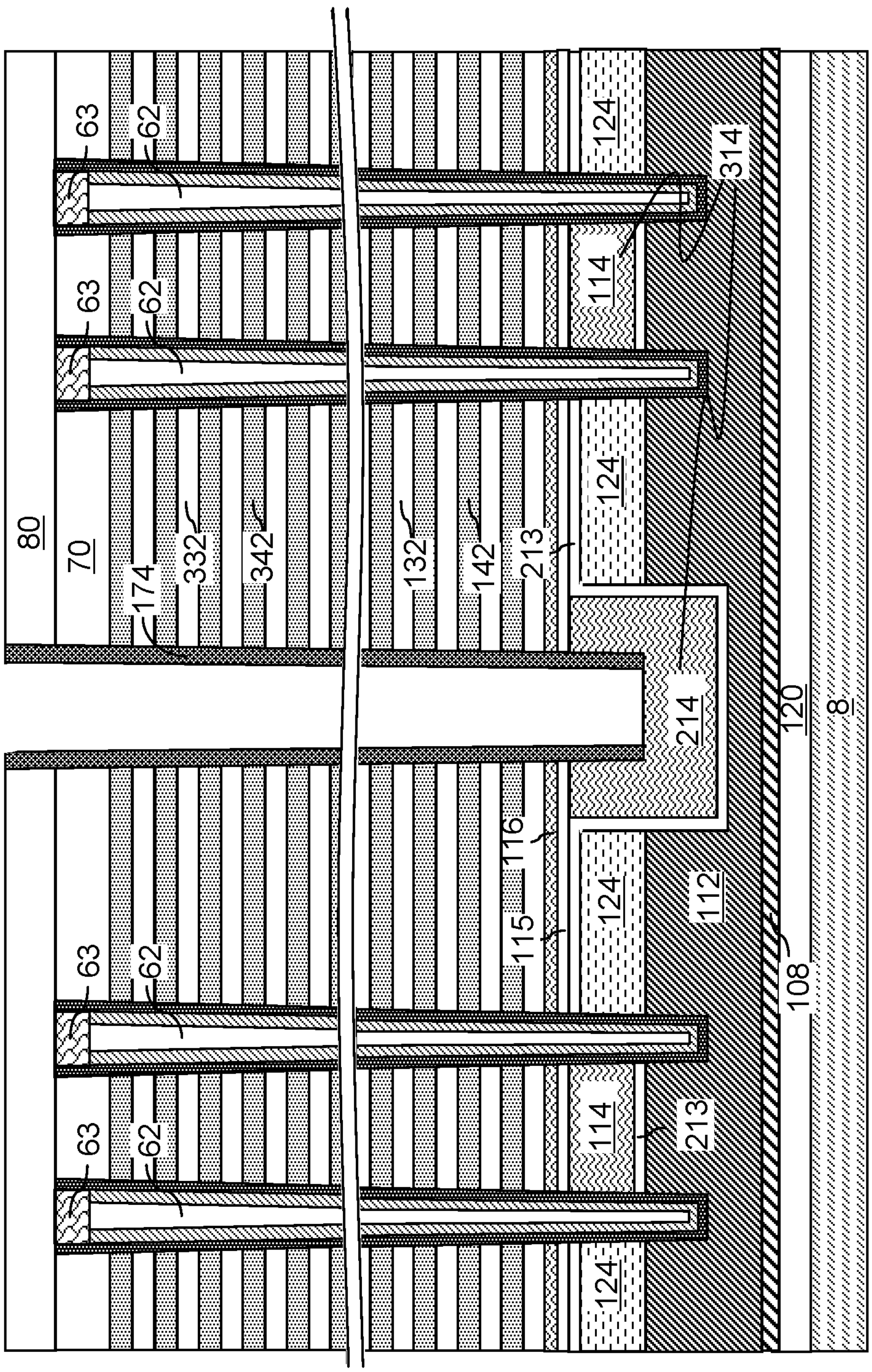
FIG. 49C is a vertical cross-sectional view of the fourth exemplary structure of FIG. 49B along the vertical plane C-C'.
Figure 49D:
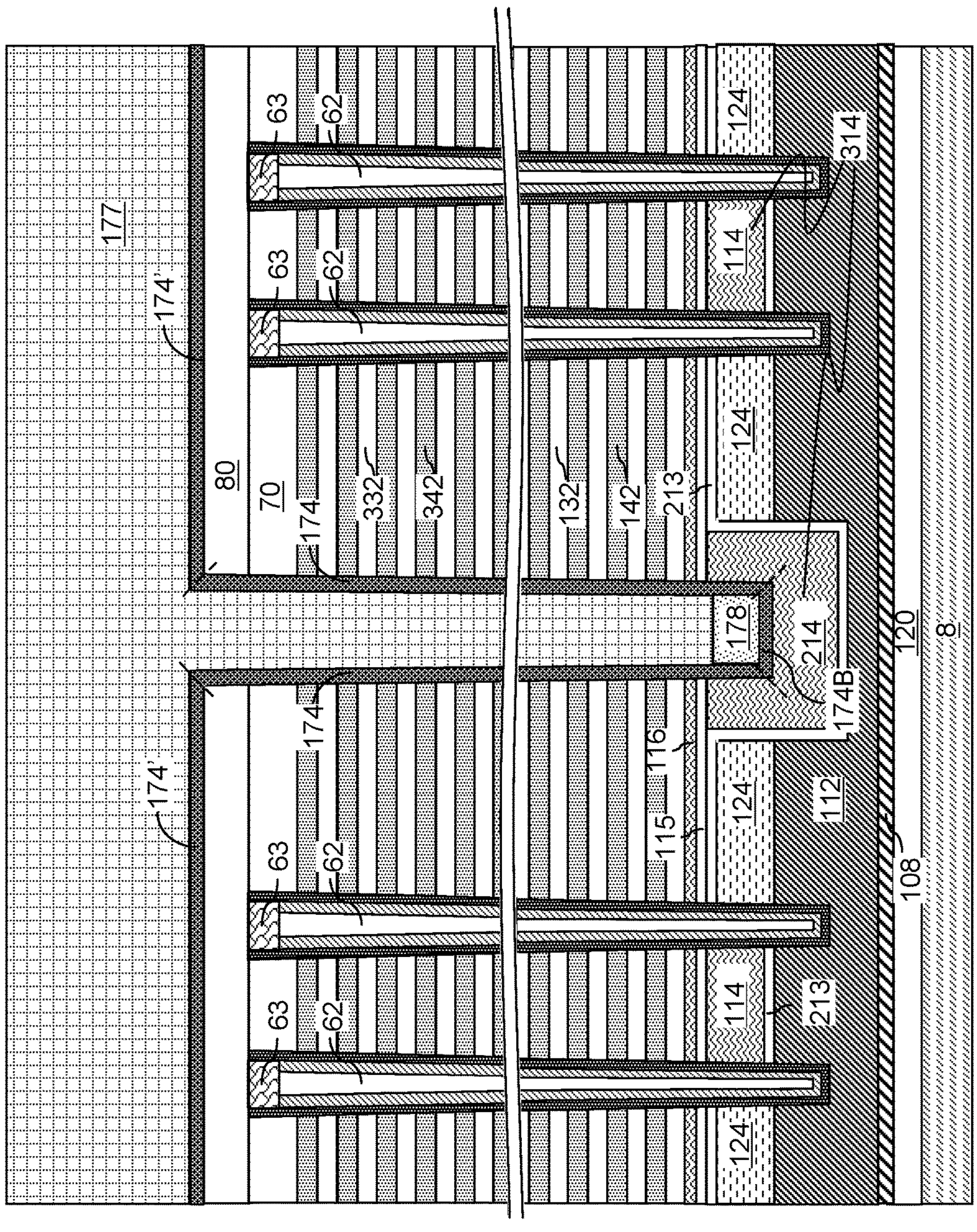
FIG. 49D is a vertical cross-sectional view of the fourth exemplary structure of FIG. 49B along the vertical plane D-D'.

Referring to FIGS. 48A and 48B, a photoresist layer 177 can be applied over the fourth exemplary structure and can be lithographically patterned to form a line-and-space pattern that laterally extends along a third horizontal direction hd3. The third horizontal direction hd3 is different from the first horizontal direction hd1, and may, or may not, be the same as the second horizontal direction hd2. The ratio of the width of the lines to the width of the spaces in the patterned photoresist layer 177 can be selected such that only a fraction of the entire area of the structural-reinforcement portion 178 is covered by the patterned photoresist layer 177. The fraction can correspond to a percentage between 20% to 80% of the entire area of the structural-reinforcement portion 178. The pitch of the line-and-space pattern can be in a range from 100 nm to 1,000 nm, although lesser and greater distances can also be employed.

Referring to FIGS. 49A-49D, the trench liner layer 174L can be patterned by an anisotropic etch into a continuous dielectric material structure (174, 174', 174B) including trench spacers 174, trench liner strips 174', and dielectric bridges 174B. The patterned photoresist layer 177 can be employed as an etch mask, and unmasked regions of the structural-reinforcement portion 178 can be removed by a first anisotropic etch process. The first anisotropic etch process divides each structural-reinforcement portion 178 in a backside trench 79 into multiple discrete structural-reinforcement portions 178.

Subsequently, a second anisotropic etch process can be performed to remove unmasked horizontal portions of the trench liner layer 174L. Each remaining continuous vertical portion of the trench liner layer 174L constitutes a trench spacer 174. Each remaining horizontal portion of the trench liner layer 174L that overlies the contact level dielectric layer 80 and underlies the patterned photoresist layer 177 constitutes a trench liner strip 174'. Each remaining horizontal portion of the trench liner layer 174L located at the bottom of a backside trench 79 and underlies the patterned photoresist layer 177 constitutes a dielectric bridge 174B. Bottom portions of a pair of lengthwise sidewalls of the trench spacer 174 can be connected through the dielectric bridges 174B, each of which underlies a respective structural-reinforcement portion 178. A top surface of the sacrificial semiconductor line 214 is physically exposed upon removal of horizontal portions of the trench liner layer 174L that are not covered by the multiple discrete structural-reinforcement portions 178.

Figure 50A:
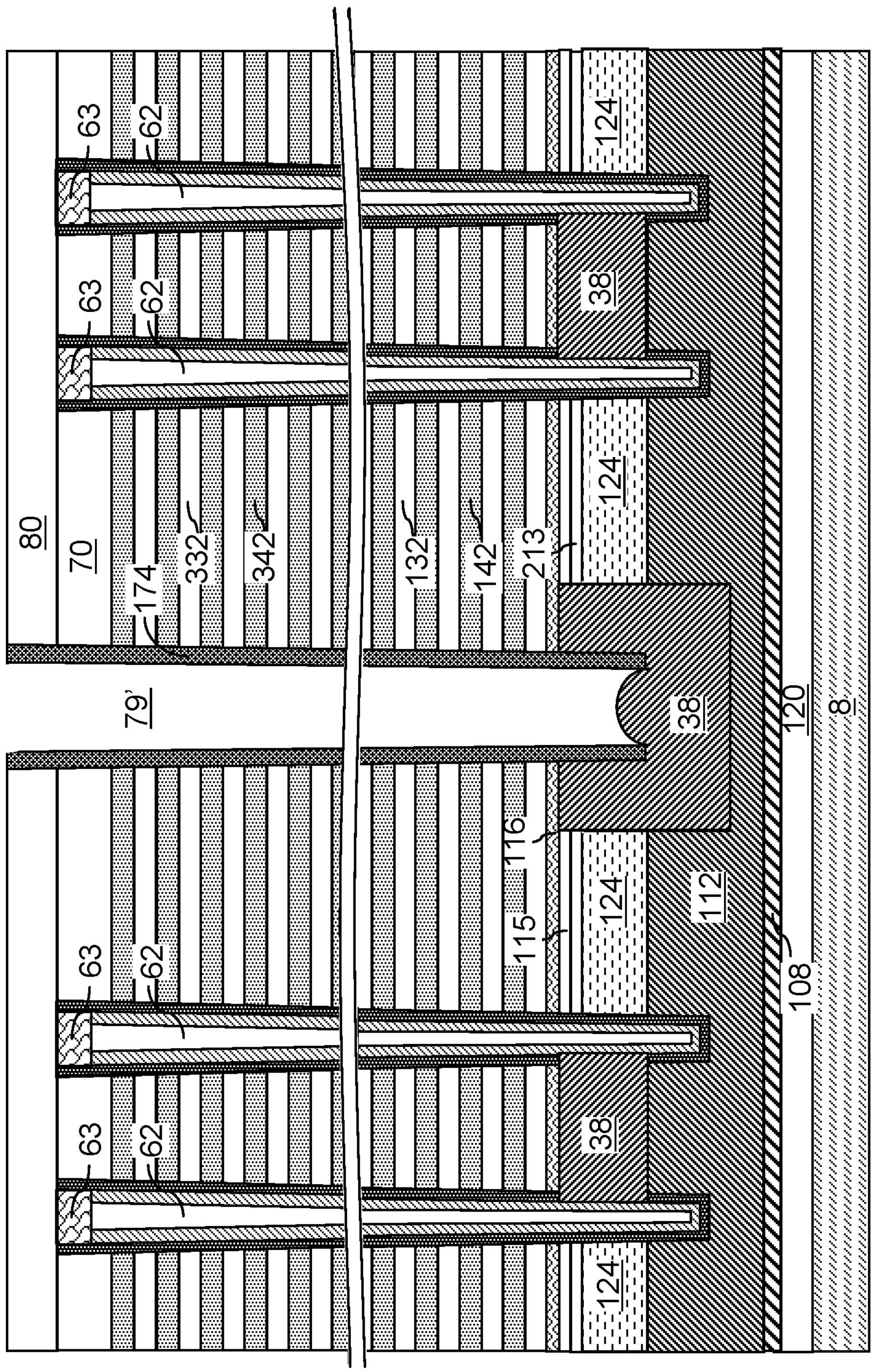
FIG. 50A is a vertical cross-sectional view of the fourth exemplary structure after formation of source strap rails along a vertical cross-sectional plane corresponding to the vertical cross-sectional plane C-C' in FIG. 49B according to the fourth embodiment of the present disclosure.
Figure 50B:
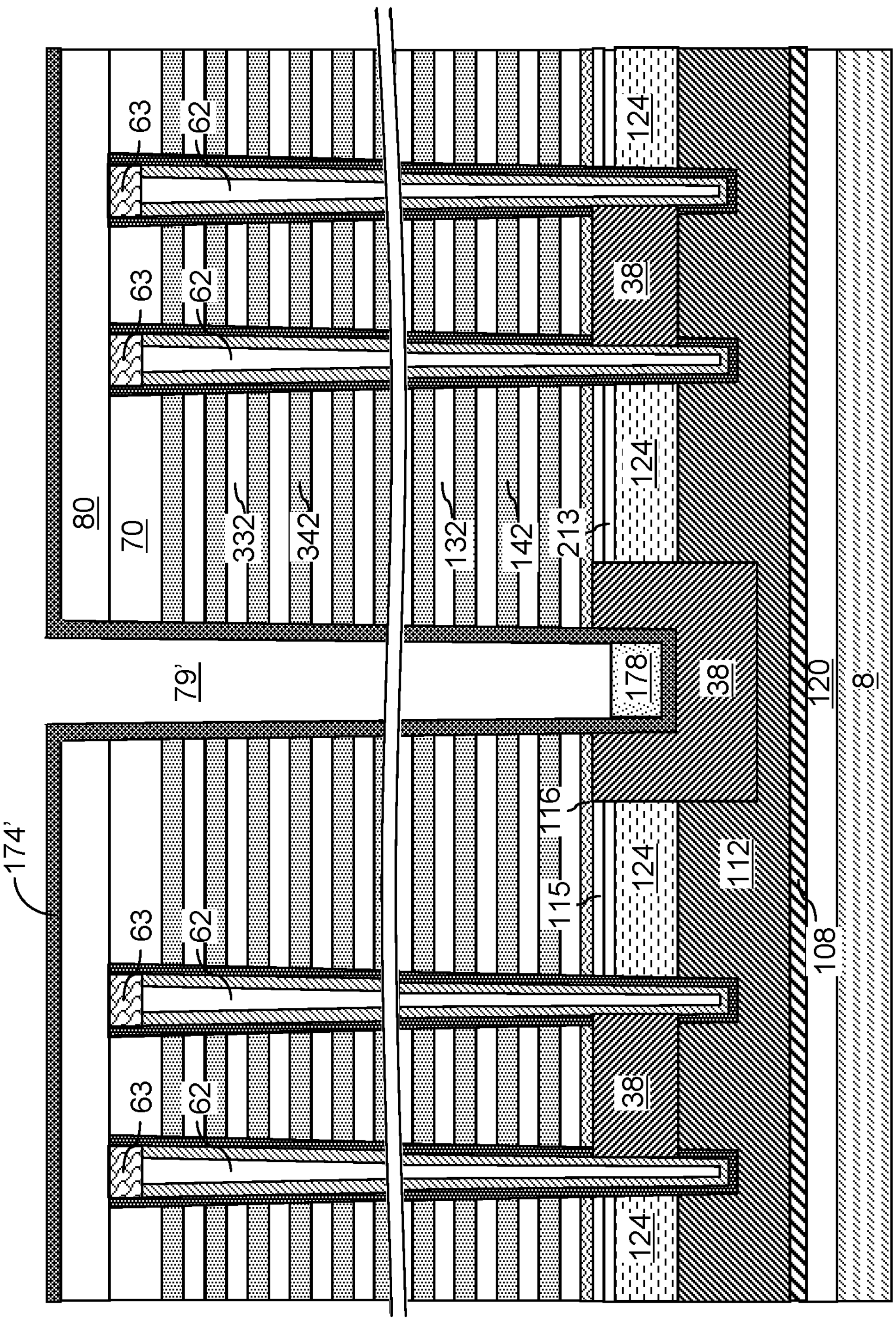
FIG. 50B is a vertical cross-sectional view of the fourth exemplary structure of FIG. 50A along a vertical cross-sectional plane corresponding to the vertical cross-sectional plane D-D' in FIG. 49B according to the fourth embodiment of the present disclosure.

Referring to FIGS. 50A and 50B, the processing steps of FIGS. 18 and 19 can be performed to remove the semiconductor materials of the sacrificial semiconductor lines 214 and the sacrificial semiconductor material portions 114, and the dielectric materials of the memory films 50 and the dielectric liners (213, 115). The openings between each neighboring pair of structural-reinforcement portions 178 and each neighboring pair of dielectric bridges 174B can provide paths for the etchants during the etch processes that form the source cavities 119. Portions of the bottom surface of the cap semiconductor layer 116, portions of the sidewalls of the semiconductor channels 60, and portions of the top surface of the source semiconductor layer 112 can be physically exposed to the source cavities 119.

The multiple discrete structural-reinforcement portions 178 and the underlying remaining horizontal portions of the trench liner layer 174L (i.e., the dielectric bridges 174B) provide structural support to the at least one vertically alternating stack{(132, 142), (232, 242), (332, 342)} during removal of the sacrificial semiconductor line 214, the sacrificial semiconductor material portions 114, and portions of each memory film 50 adjacent to the sacrificial semiconductor material portions 114 and during formation of the source strap material portions 38. Thus, the structural integrity of the fourth exemplary structure can be enhanced by the presence of the structural-reinforcement portions 178 and the dielectric bridges 174B.

Subsequently, the processing steps of FIG. 20 can be performed to form source strap material portions 38 in the source cavities 119. The openings between each neighboring pair of structural-reinforcement portions 178 and each neighboring pair of dielectric bridges 174B can provide paths for reactants and etchants of the selective semiconductor deposition process employed to form the source strap material portions 38. The source strap material portions 38 can be formed directly on sidewalls of the semiconductor channels 60, portions of the top surface of the source semiconductor layer 112, and portions of the bottom surface of the cap semiconductor layer 116. Each source strap material portion 38 can have first portions having a first thickness and located outside areas of the backside trenches 79, and second portions having a greater second thickness and located around the backside trenches 79. The first thickness can be about the sum of the thickness of the dielectric material portions 124, the first dielectric liner 213, and the second dielectric liner 115. The second thickness can be the vertical distance between the bottom surface of the cap semiconductor layer 116 and the recessed top surface of the source semiconductor layer 112.

Figure 51:
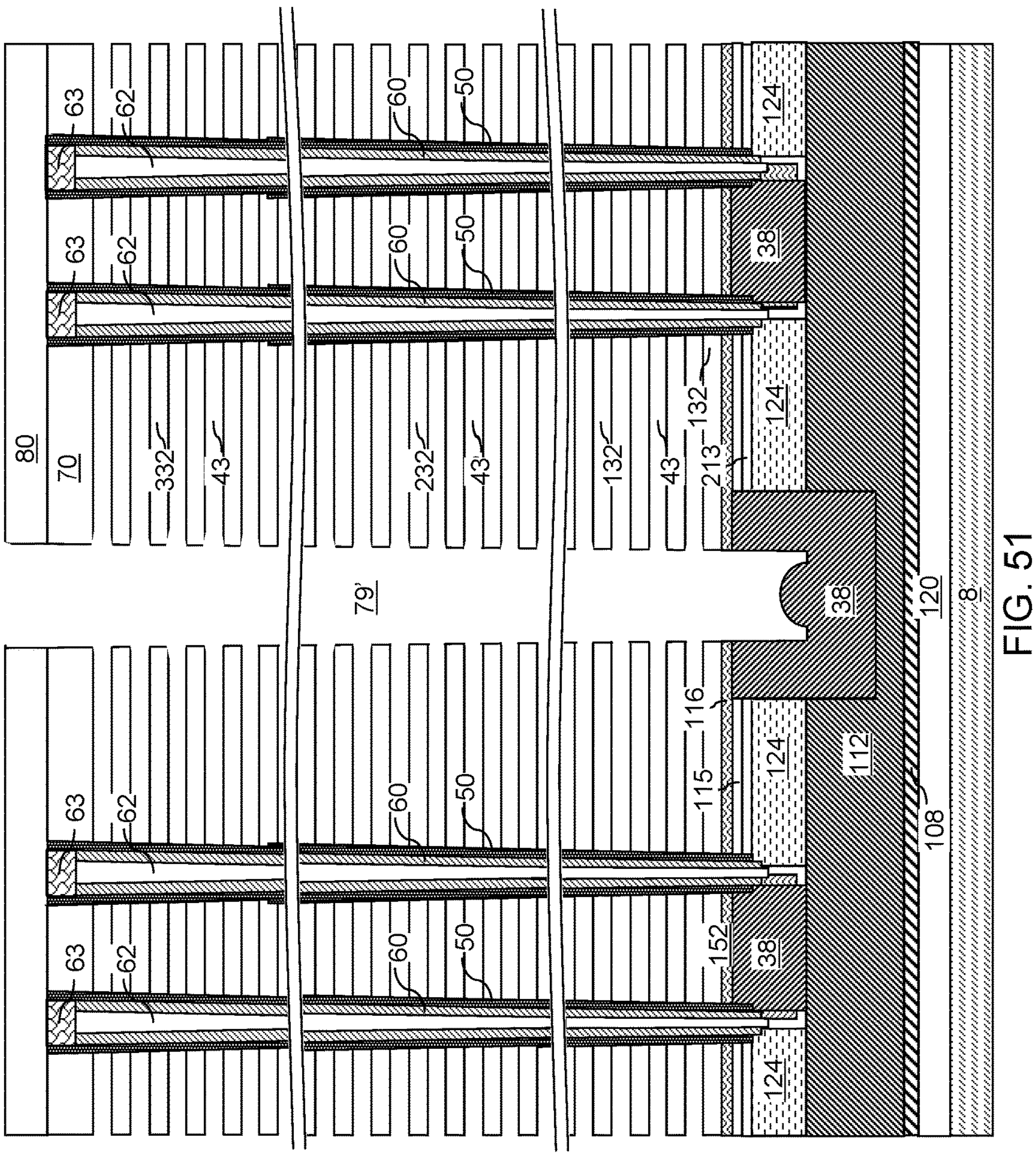
FIG. 51 is a vertical cross-sectional view of the fourth exemplary structure after formation of backside recesses along a vertical cross-sectional plane corresponding to the vertical cross-sectional plane C-C' in FIG. 49B according to the fourth embodiment of the present disclosure.

Referring to FIG. 51, the structural-reinforcement portions 178 can be removed by an etch process, which may be an isotropic etch or an anisotropic etch. Alternatively, if the structural-reinforcement portion 178 can be removed collaterally in a subsequent etch process. The processing steps of FIG. 21 can be performed to remove the materials of the trench spacers 174 and the second material of the sacrificial material layers (142, 242, 342) selective to the first material of the insulating layers (132, 232, 332). Backside cavities 43 can be thus formed as in the first embodiment.

Figure 52:
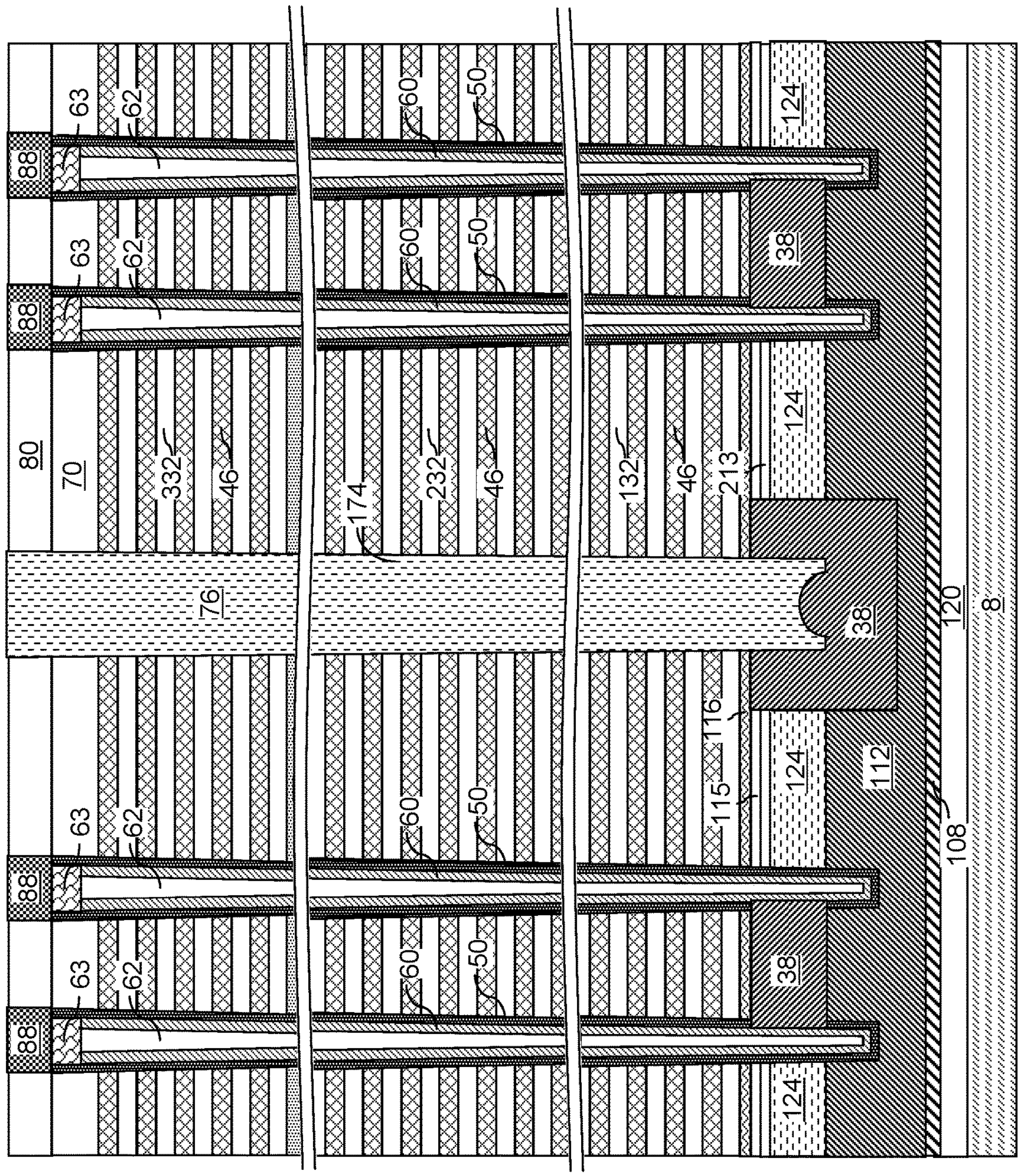
FIG. 52 is a vertical cross-sectional view of the fourth exemplary structure after formation of electrically conductive layers, an insulating wall structure, and various contact via structures along a vertical cross-sectional plane corresponding to the vertical cross-sectional plane C-C' in FIG. 49B according to the fourth embodiment of the present disclosure.

Referring to FIG. 52, the processing steps of FIGS. 22, 23, and 24A-24C can be sequentially performed to form electrically conductive layers 46 and an insulating wall structure 76. The insulating wall structure 76 contacts sidewalls of the insulating layers (132, 232, 332) and the electrically conductive layers 46 and top surfaces of the source strap material portions 38. Various contact via structures can be formed as in the previous embodiments.

Figure 53A:
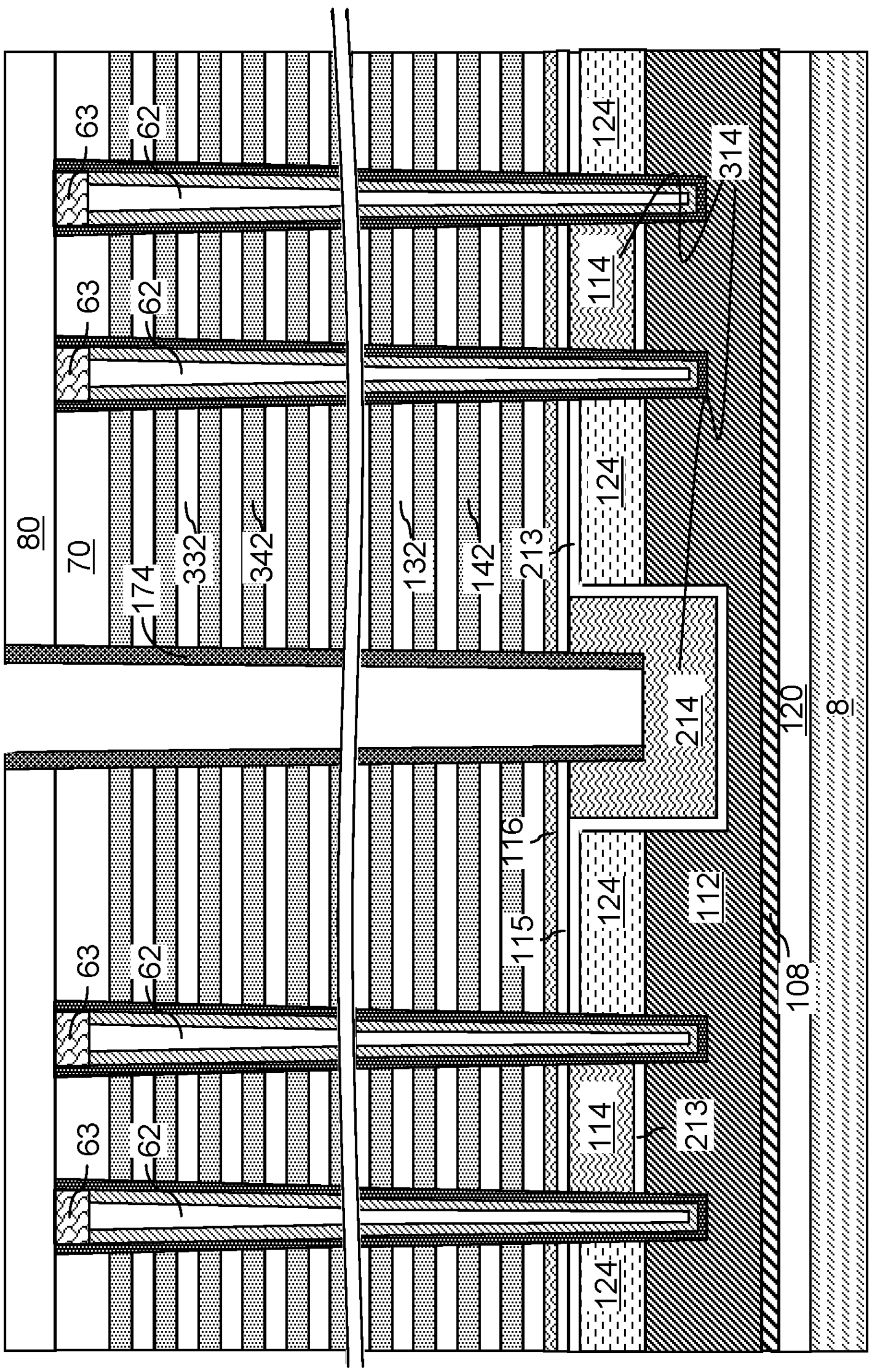
FIG. 53A is a vertical cross-sectional view of an alternative configuration of the fourth exemplary structure after patterning of a trench liner layer into trench spacers and trench liner strips along a vertical cross-sectional plane corresponding to the vertical cross-sectional plane C-C' in FIG. 49B according to the fourth embodiment of the present disclosure.
Figure 53B:
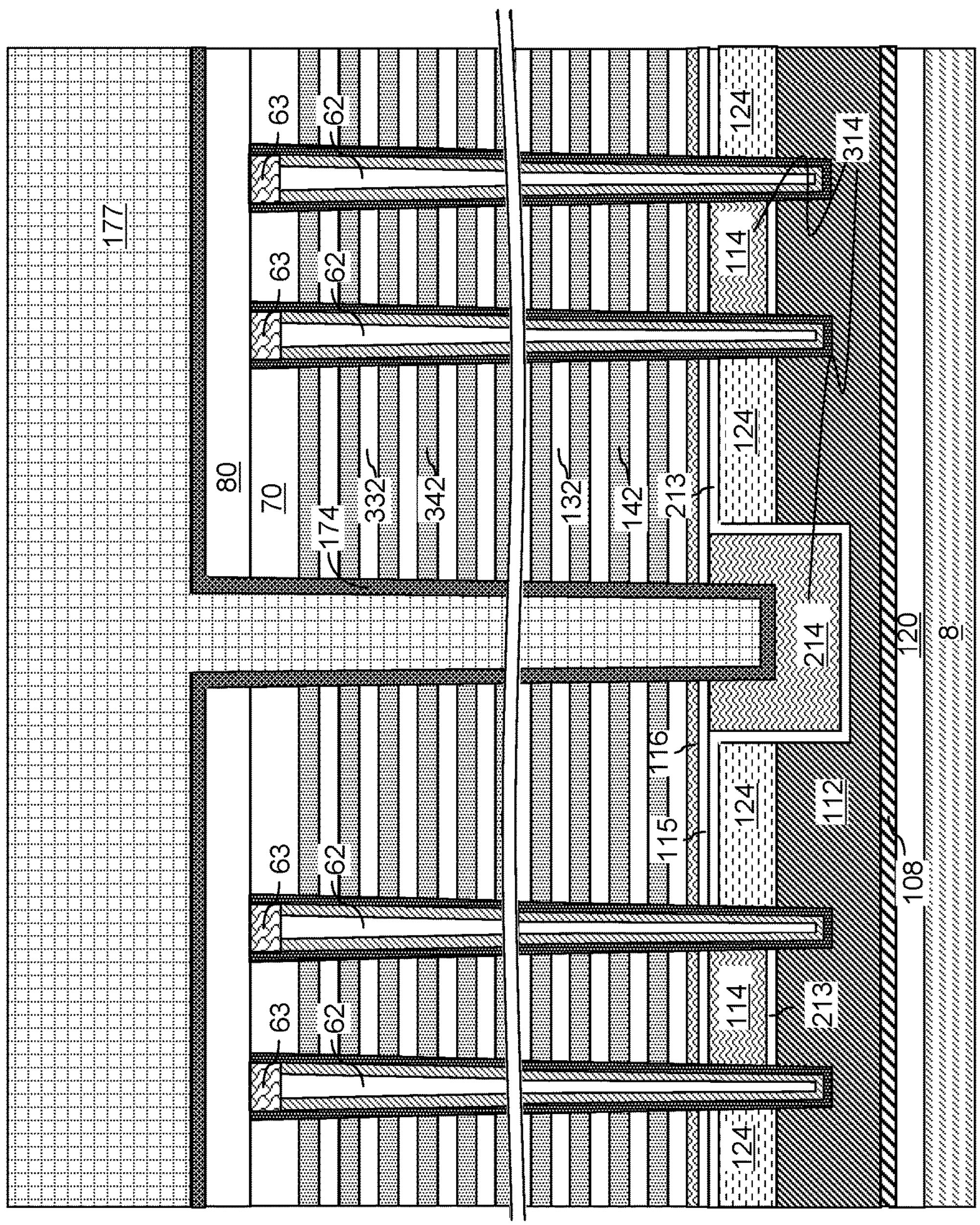
FIG. 53B is a vertical cross-sectional view of the alternative configuration the fourth exemplary structure of FIG. 53A along a vertical cross-sectional plane corresponding to the vertical cross-sectional plane D-D' in FIG. 49B according to the fourth embodiment of the present disclosure.

Referring to FIGS. 53A and 53B, an alternative configuration of the fourth exemplary structure according to the fourth embodiment of the present disclosure can be derived from the third exemplary structure illustrated in FIGS. 42A and 42B by forming the patterned photoresist layer 177 thereupon. The pattern of the patterned photoresist layer 177 can be the same as in the fourth exemplary structure illustrated in FIGS. 48A and 48B. Thus, the patterned photoresist layer 177 can have a line-and-space pattern that laterally extends along a third horizontal direction hd3. The third horizontal direction hd3 is different from the first horizontal direction hd1, and may, or may not, be the same as the second horizontal direction hd2. The ratio of the width of the lines to the width of the spaces in the patterned photoresist layer 177 can be selected such that only a fraction of the entire area of the trench liner layer 174L is covered by the patterned photoresist layer 177. The fraction can correspond to a percentage between 20% to 80% of the entire area of the trench liner layer 174L. The pitch of the line-and-space pattern can be in a range from 100 nm to 1,000 nm, although lesser and greater distances can also be employed.

Figure 54A:
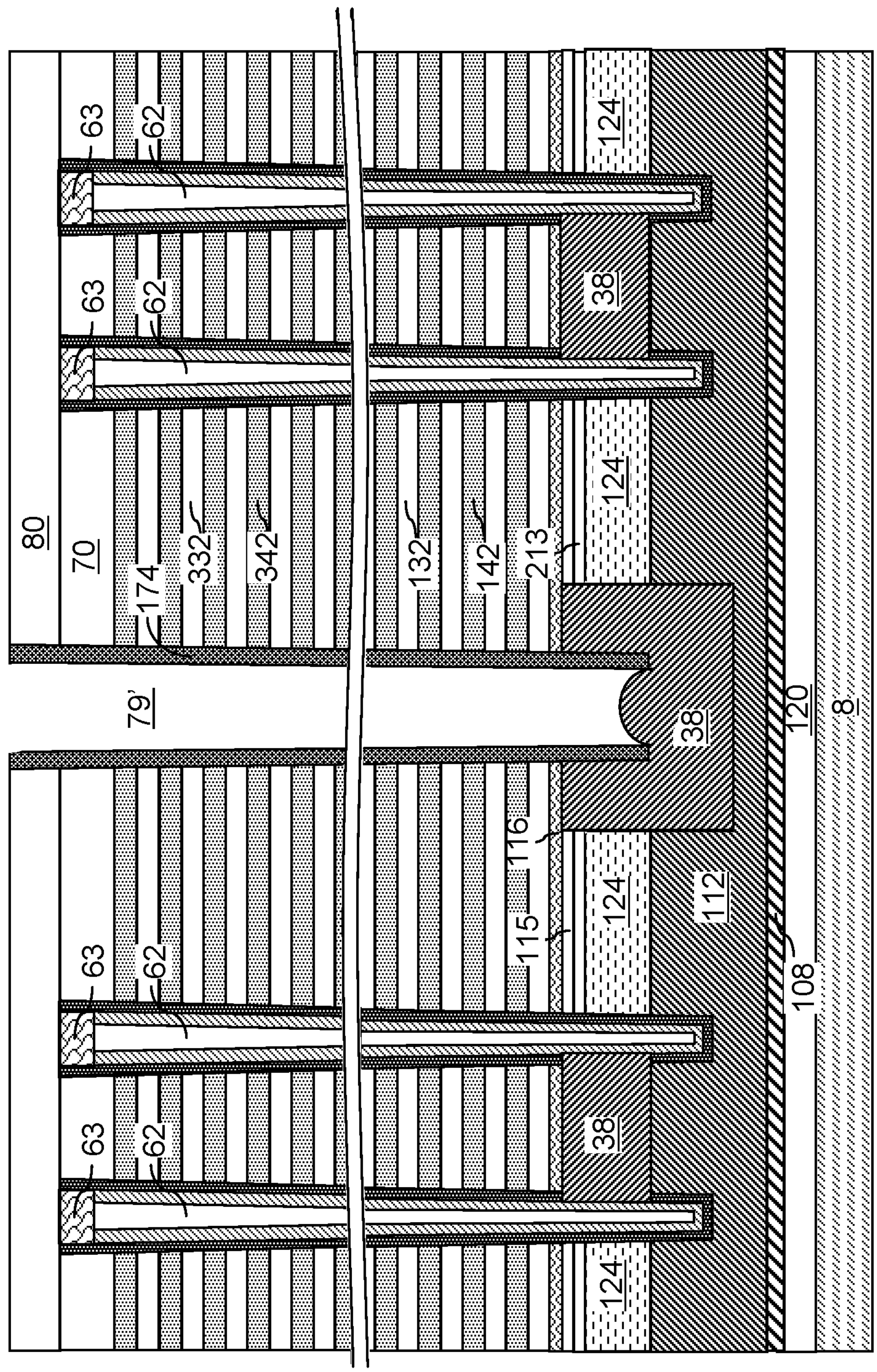
FIG. 54A is a vertical cross-sectional view of the alternative configuration of the fourth exemplary structure after formation of source strap rails along a vertical cross-sectional plane corresponding to the vertical cross-sectional plane C-C' in FIG. 49B according to the fourth embodiment of the present disclosure.
Figure 54B:
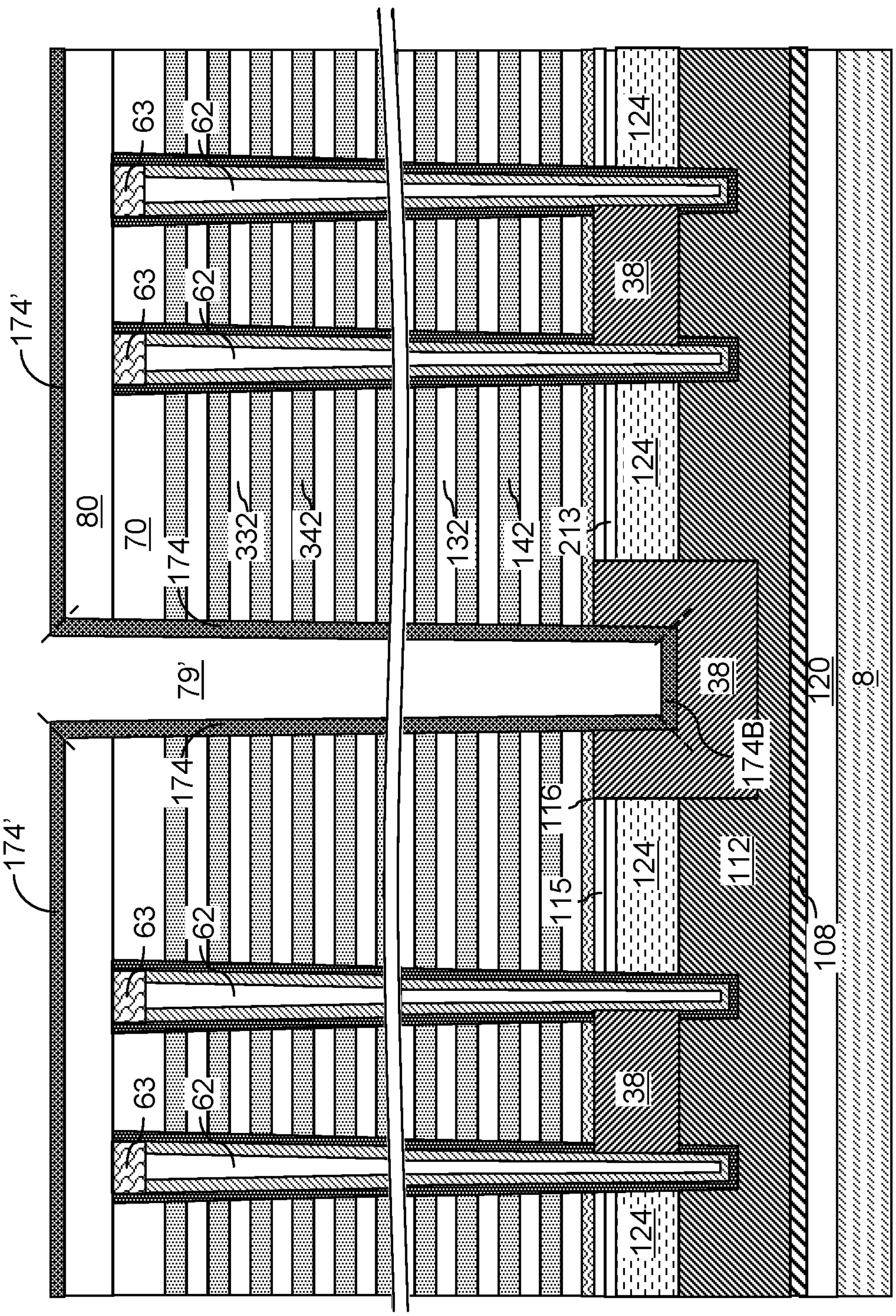
FIG. 54B is a vertical cross-sectional view of the alternative configuration the fourth exemplary structure of FIG. 54A along a vertical cross-sectional plane corresponding to the vertical cross-sectional plane D-D' in FIG. 49B according to the fourth embodiment of the present disclosure.

Referring to FIGS. 54A and 54B, the trench liner layer 174L can be patterned by an anisotropic etch into a continuous dielectric material structure (174, 174', 174B) including trench spacers 174, trench liner strips 174', and dielectric bridges 174B. The patterned photoresist layer 177 can be employed as an etch mask, and unmasked regions of the trench liner layer 174L can be removed by the anisotropic etch process. Each remaining continuous vertical portion of the trench liner layer 174L constitutes a trench spacer 174. Each remaining horizontal portion of the trench liner layer 174L that overlies the contact level dielectric layer 80 and underlies the patterned photoresist layer 177 constitutes a trench liner strip 174'. Each remaining horizontal portion of the trench liner layer 174L located at the bottom of a backside trench 79 and underlies the patterned photoresist layer 177 constitutes a dielectric bridge 174B. Bottom portions of a pair of lengthwise sidewalls of the trench spacer 174 can be connected through the dielectric bridges 174B. A top surface of the sacrificial semiconductor line 214 is physically exposed upon removal of horizontal portions of the trench liner layer 174L that are not covered by the multiple discrete structural-reinforcement portions 178.

The processing steps of FIGS. 18 and 19 can be performed to remove the semiconductor materials of the sacrificial semiconductor lines 214 and the sacrificial semiconductor material portions 114, and the dielectric materials of the memory films 50 and the dielectric liners (213, 115). The openings between each neighboring pair of dielectric bridges 174B can provide paths for the etchants during the etch processes that form the source cavities 119. Portions of the bottom surface of the cap semiconductor layer 116, portions of the sidewalls of the semiconductor channels 60, and portions of the top surface of the source semiconductor layer 112 can be physically exposed to the source cavities 119.

The dielectric bridges 174B provide structural support to the at least one vertically alternating stack {(132, 142), (232, 242), (332, 342)} during removal of the sacrificial semiconductor line 214, the sacrificial semiconductor material portions 114, and portions of each memory film 50 adjacent to the sacrificial semiconductor material portions 114 and during formation of the source strap material portions 38. Thus, the structural integrity of the alternative configuration of the fourth exemplary structure can be enhanced by the presence of the dielectric bridges 174B.

Subsequently, the processing steps of FIG. 20 can be performed to form source strap material portions 38 in the source cavities 119. The openings between each neighboring pair of dielectric bridges 174B can provide paths for reactants and etchants of the selective semiconductor deposition process employed to form the source strap material portions 38. The source strap material portions 38 can be formed directly on sidewalls of the semiconductor channels 60, portions of the top surface of the source semiconductor layer 112, and portions of the bottom surface of the cap semiconductor layer 116. Each source strap material portion 38 can have first portions having a first thickness and located outside areas of the backside trenches 79, and second portions having a second thickness and located around the backside trenches 79. The first thickness can be about the sum of the thickness of the dielectric material portions 124, the first dielectric liner 213, and the second dielectric liner 115. The second thickness can be the vertical distance between the bottom surface of the cap semiconductor layer 116 and the recessed top surface of the source semiconductor layer 112.

Figure 55A:
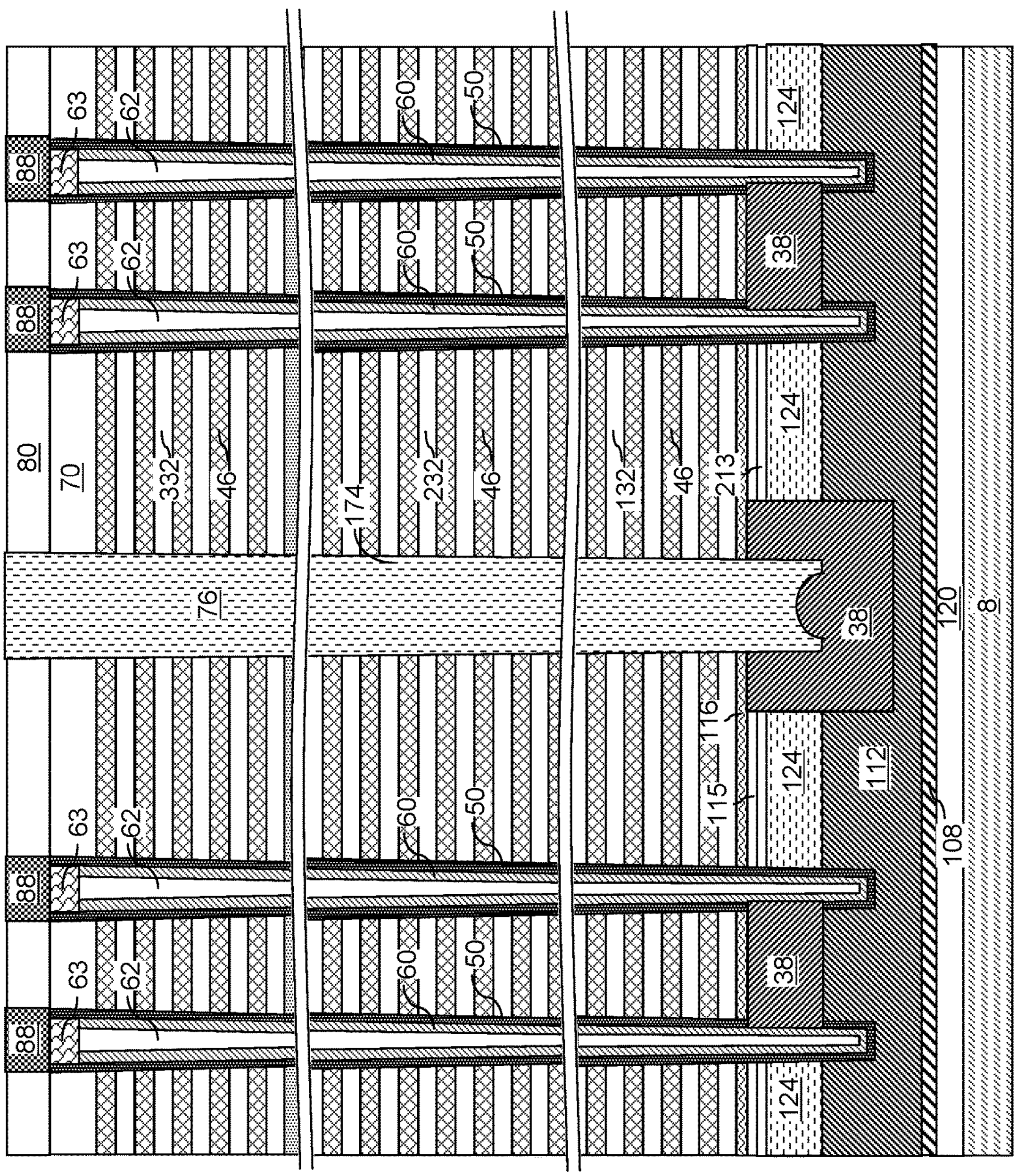
FIG. 55A is a vertical cross-sectional view of the alternative configuration of the fourth exemplary structure after formation of electrically conductive layers, an insulating wall structure, and various contact via structures along a vertical cross-sectional plane corresponding to the vertical cross-sectional plane C-C' in FIG. 49B according to the fourth embodiment of the present disclosure.
Figure 55B:
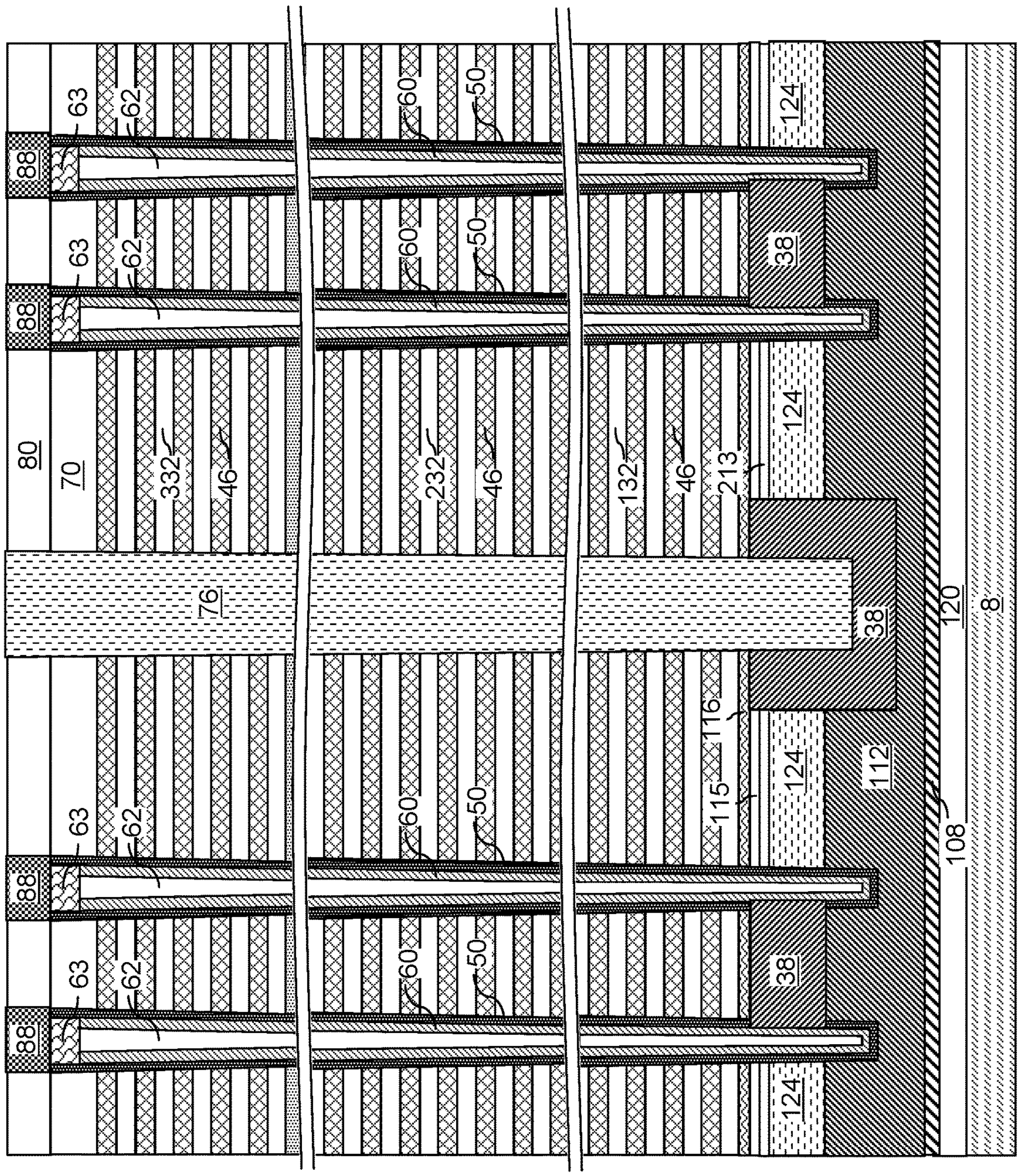
FIG. 55B is a vertical cross-sectional view of the alternative configuration the fourth exemplary structure of FIG. 55A along a vertical cross-sectional plane corresponding to the vertical cross-sectional plane D-D' in FIG. 49B according to the fourth embodiment of the present disclosure.

Referring to FIGS. 55A and 55B, the processing steps of FIG. 21 can be performed to remove the materials of the trench spacers 174 and the second material of the sacrificial material layers (142, 242, 342) selective to the first material of the insulating layers (132, 232, 332). Backside cavities 43 can be thus formed as in the first embodiment.

Subsequently, the processing steps of FIGS. 22, 23, and 24A-24C can be sequentially performed to form electrically conductive layers 46 and an insulating wall structure 76. The insulating wall structure 76 contacts sidewalls of the insulating layers (132, 232, 332) and the electrically conductive layers 46 and top surfaces of the source strap material portions 38. Various contact via structures can be formed as in the previous embodiments.

Figure 56:
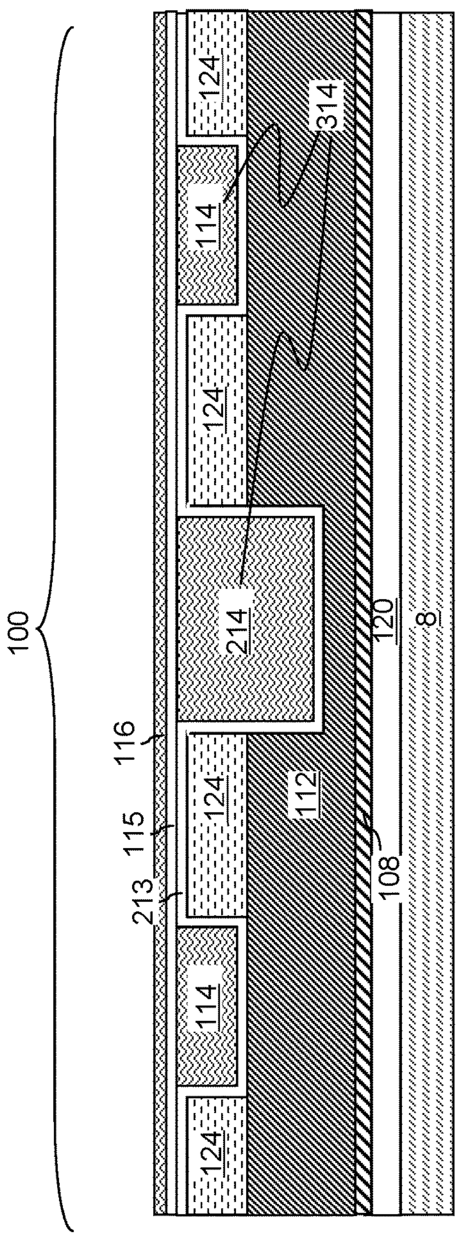
FIG. 56 is a vertical cross-sectional view of a fifth exemplary structure after formation of formation of a second dielectric liner and a cap semiconductor layer according to the fifth embodiment of the present disclosure.

Referring to FIG. 56, a fifth exemplary structure according to the fifth embodiment of the present disclosure can be derived from the third exemplary structure of FIGS. 37A and 37B by depositing a second dielectric liner 115 and a cap semiconductor layer 116 employing the processing steps of FIG. 3.

Figure 57A:
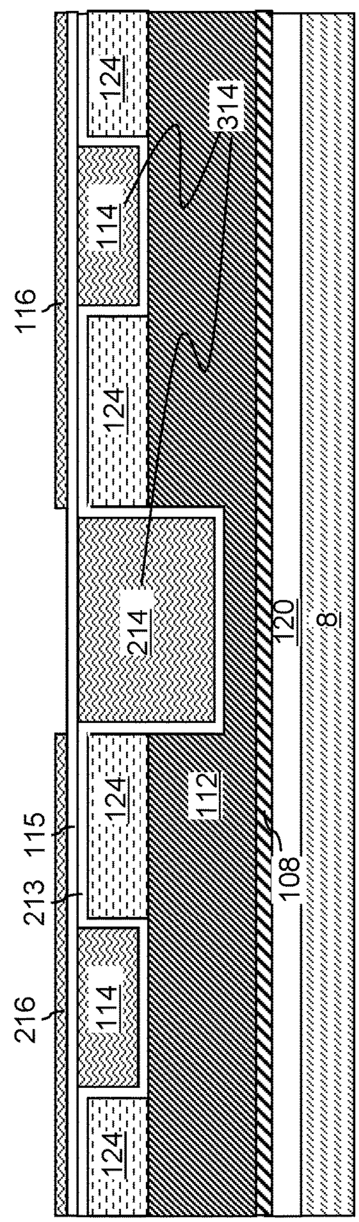
FIG. 57A is a vertical cross-sectional view of the fifth exemplary structure after patterning the cap semiconductor layer according to the fifth embodiment of the present disclosure.
Figure 57B:
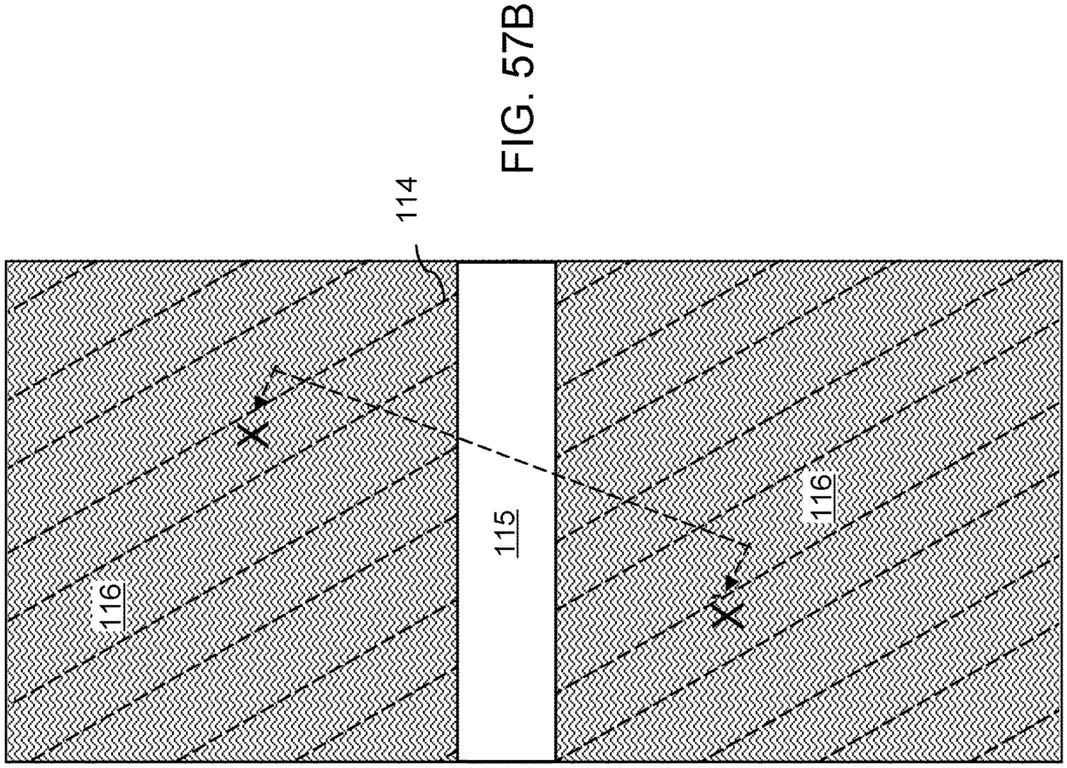
FIG. 57B is a top-down view of the fifth exemplary structure of FIG. 57A. The vertical plane X-X' is the plane of the vertical cross-section of FIG. 57A.

Referring to FIGS. 57A and 57B, the cap semiconductor layer 116 can be patterned to remove a portion of the cap semiconductor layer 116 from above the sacrificial semiconductor line 214. For example, a photoresist layer (not shown) can be applied over the cap semiconductor layer 116 and can be lithographically patterned to form openings in the area of the sacrificial semiconductor line 214. For example, the same lithographic pattern as the one employed to pattern the second line trenches 103 can be employed to pattern the photoresist layer. An isotropic etch or an anisotropic etch can be performed to etch the physically exposed portions of the cap semiconductor layer 116 selective to the material of the second dielectric liner 115. The photoresist layer can be subsequently removed, for example, by ashing.

Figure 58:
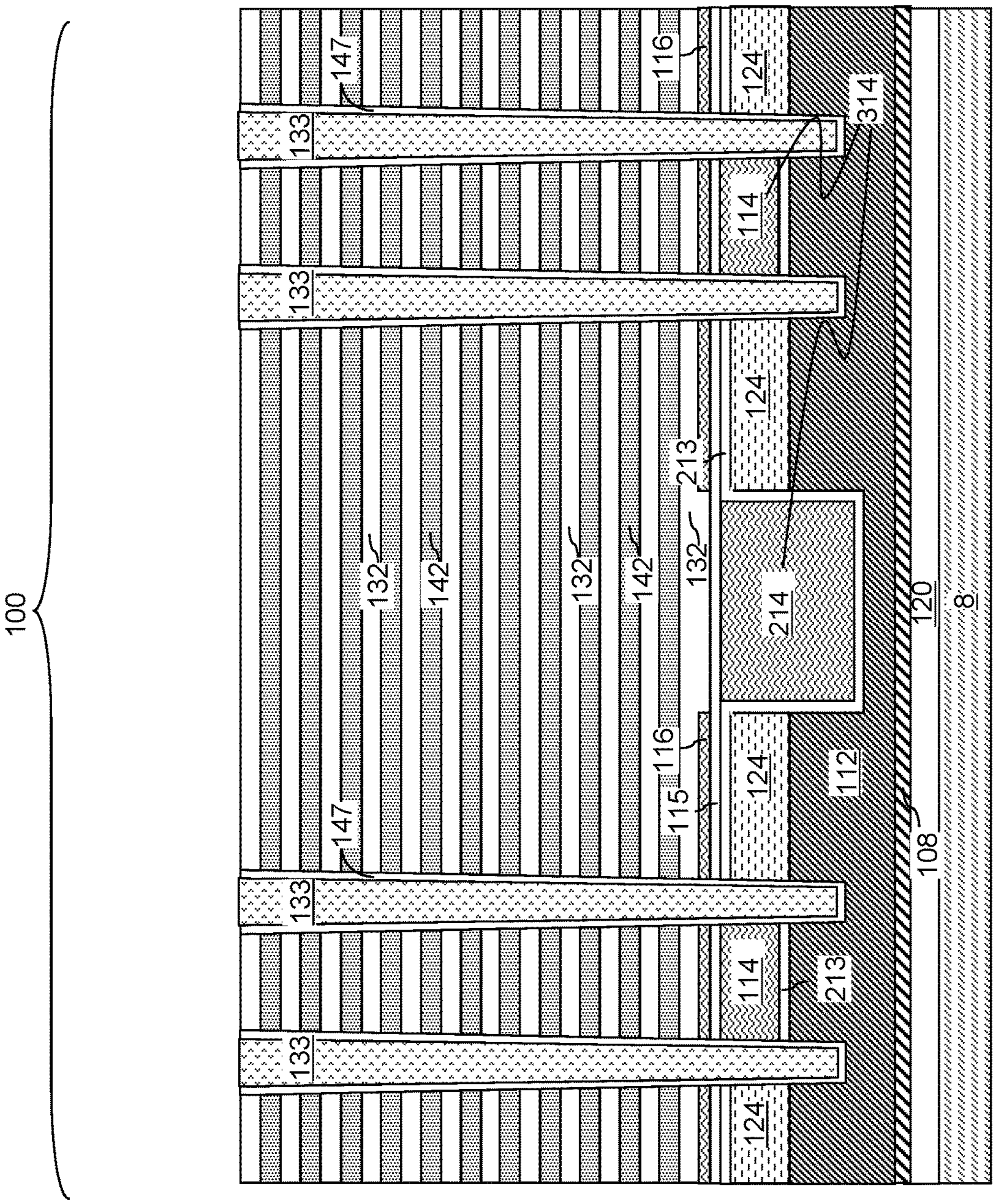
FIG. 58 is a vertical cross-sectional view of the fifth exemplary structure after formation of first-tier sacrificial fill structures according to the fifth embodiment of the present disclosure.

Referring to FIG. 58, a complementary subset of the processing steps of FIG. 3 can be performed to form a first vertically alternating stack (132, 142). A vertically alternating stack of insulating layers and spacer material layers is subsequently formed over the sacrificial semiconductor line 214. As discussed above, the spacer material layers are formed as, or are subsequently replaced with, electrically conductive layers. In one embodiment, the processing steps of FIGS. 8A and 8B can be performed to form a first vertically alternating stack (132, 142) of first insulating layers 132 and first sacrificial material layers 142. The processing steps of FIGS. 9A, 9B, 10, 11, and 12 can be performed to form first-tier memory openings 149 and first tier support openings, first-tier sacrificial liners 147, and first-tier sacrificial fill structures 133.

Figure 59:
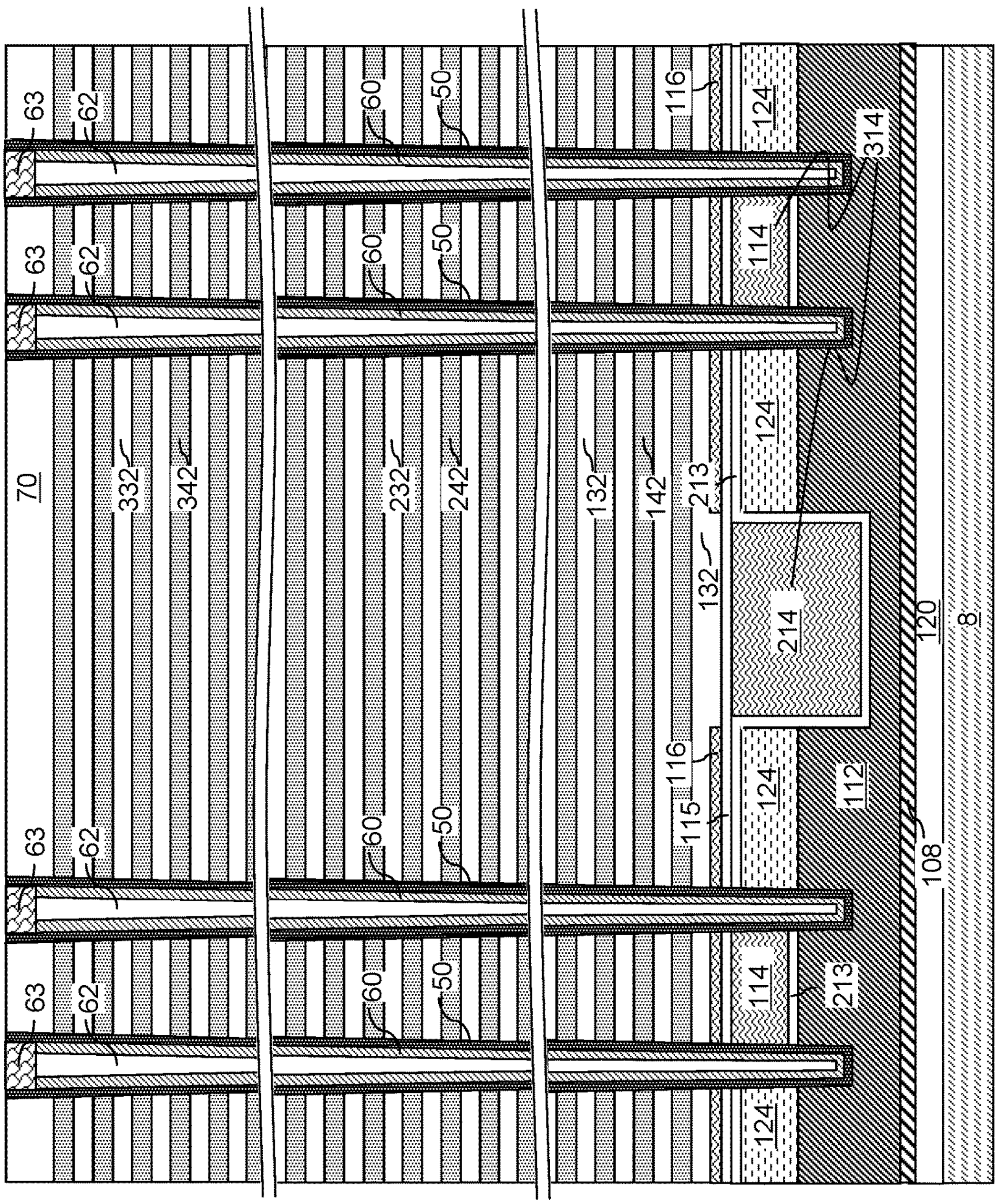
FIG. 59 is a vertical cross-sectional view of the fifth exemplary structure after formation of memory stack structures, dielectric cores, and drain regions according to the fifth embodiment of the present disclosure.

Referring to FIG. 59, the processing steps of FIGS. 13, 14, and 15 can be performed to form memory stack structures (50, 60), dielectric cores 62, and drain regions 63 within each memory opening 49 and each support opening. As in the previous exemplary structures, the memory stack structures (50, 60) are formed through each of the at least one vertically alternating stack {(132. 142), (232, 242), (332, 342)} and the laterally alternating stack (114, 124). Each of the memory stack structures (50, 60) contacts a sidewall of a respective one of the sacrificial semiconductor material portions 114 and a sidewall of a respective one of the dielectric material portions 124.

Figure 60:
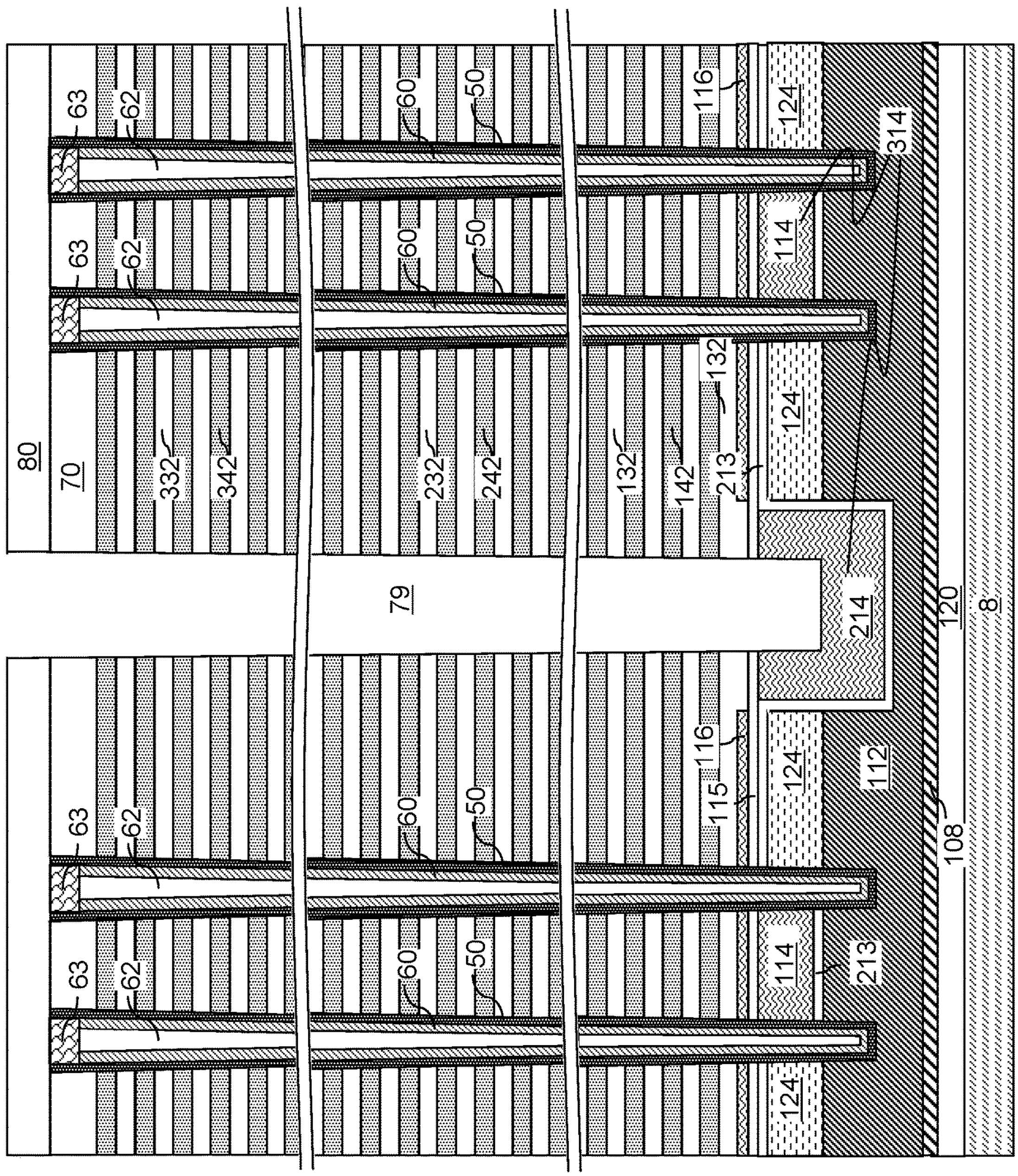
FIG. 60 is vertical cross-sectional view of the fifth exemplary structure after formation of a backside trench according to the fifth embodiment of the present disclosure.

Referring to FIG. 60, a subset of the processing steps of FIG. 41 can be performed to form a contact level dielectric layer 80 and backside trenches 79. The backside trenches 79 can be formed by an anisotropic etch process that etches the materials of the at least one vertically alternating stack {(132. 142), (232, 242), (332, 342)} selective to the semiconductor material of the sacrificial semiconductor line 214. Thus, the sacrificial semiconductor line 214 can be employed as an etch stop structure during formation of the backside trenches 79. A bottom surface of each backside trench 79 can protrude into a recessed portion of an underlying sacrificial semiconductor line 214. In one embodiment, an entire bottom surface of a backside trench 79 can be a recessed top surface of the underlying sacrificial semiconductor line 214.

In the fifth exemplary structure, a trench liner layer 174L or a trench spacer 174 of the third embodiment is not necessary because the cap semiconductor layer 116 is laterally spaced from the backside trenches 79 by a portion of a bottommost insulating layer 132 within the at least one vertically alternating stack {(132. 142), (232, 242), (332, 342)}, and thus, the semiconductor material of the cap semiconductor layer 116 is protected from etchants to be subsequently provided into the backside trenches 79 by portions of the bottommost insulating layer 132.

Figure 61:
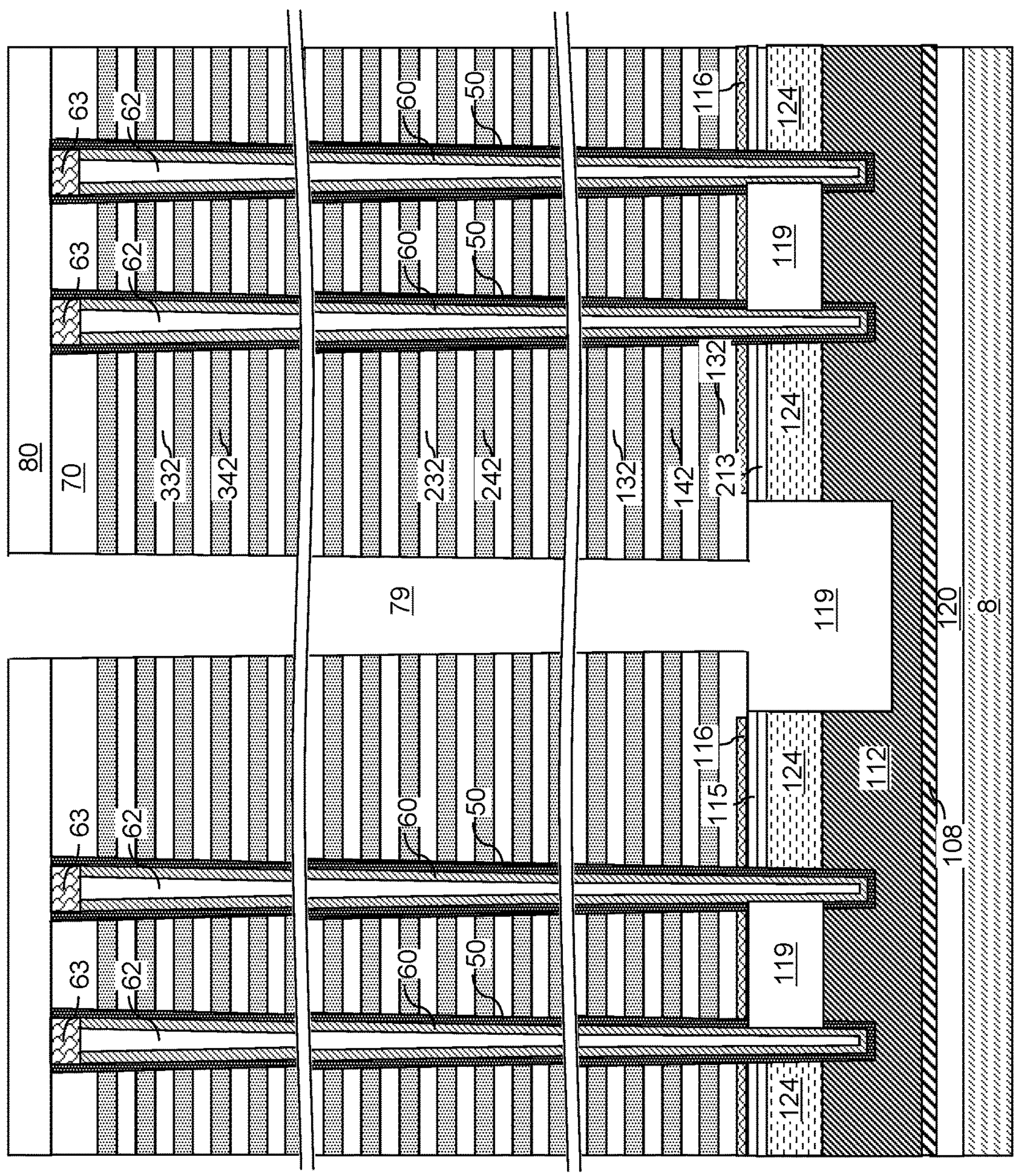
FIG. 61 is a vertical cross-sectional view of the fifth exemplary structure after formation of source cavities and removal of physically exposed portions of memory films according to the fifth embodiment of the present disclosure.

Referring to FIG. 61, the processing steps of FIG. 18 can be performed to form source cavities 119. Specifically, a first isotropic etch process can be performed employing an etchant that etches the material of the sacrificial semiconductor line 214 and the sacrificial source material portions 114 selective to the dielectric material portions 124. The etchant can be introduced through the backside trenches 79. In one embodiment, the etchant can be selected such that the etchant etches the semiconductor material of the sacrificial semiconductor material portions 114 selective to the dielectric materials of the first dielectric liner 213, the second dielectric liner 115, and the dielectric material portions 124. The etchant can be a liquid phase etchant applied in a wet etch process, or a gas phase etchant applied in a dry etch process. For example, if the sacrificial semiconductor material portions 114 include amorphous silicon, a wet etch process employing a trimethyl-2 hydroxyethyl ammonium hydroxide (TMY) solution, a wet etch process employing a KOH solution, or a dry etch process employing gas phase HCl may be employed to isotropically etch that sacrificial semiconductor material portions 114. Source cavities 119 are formed by removal of the sacrificial semiconductor line 214 and the sacrificial semiconductor material portions 119 selective to the dielectric materials of the first dielectric liner 213, the second dielectric liner 115, and the dielectric material portions 124.

Subsequently, the processing steps of FIG. 19 can be performed to expand the source cavities 119. Specifically, a second isotropic etch process can be performed by introducing at least another etchant through the backside trenches 79 into the source cavities 119. The second isotropic etch process removes materials of the memory films 50 and the dielectric liners (213, 115) selective to the cap semiconductor layer 116 and the semiconductor channels 60. Thus, the physically exposed portions of the memory films 50 adjacent to the source cavities 119 can be removed by the second isotropic etch process to physically expose outer sidewalls of the semiconductor channels 60. Portions of the memory films 50 that are adjacent to the sacrificial semiconductor material portions 114 at the processing steps of FIG. 60 are removed to form a lateral opening through each memory film 50. In an illustrative example, a wet etch employing hydrofluoric acid can be employed for the second isotropic etch process. The source cavities 119 can be expanded in volume by removal of the physically exposed portions of the memory films 50 and the portions of the dielectric liners (213, 115) that overlie or underlie the source cavities 119.

Figure 62:
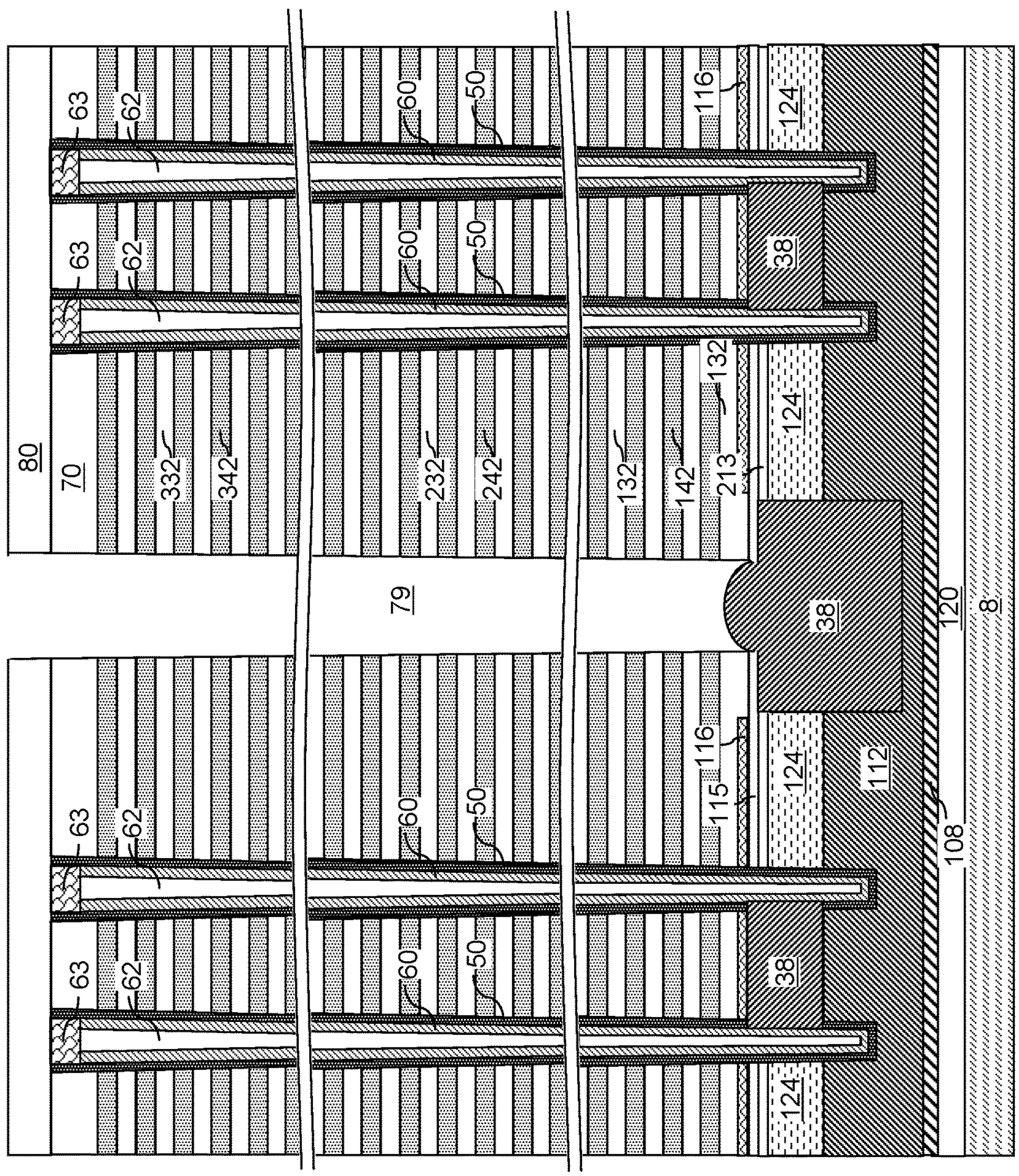
FIG. 62 is a vertical cross-sectional view of the fifth exemplary structure after formation of source strap rails according to the fifth embodiment of the present disclosure.

Referring to FIG. 62, the processing steps of FIG. 20 can be performed to form source strap material portions 38 in the source cavities 119. The source strap material portions 38 can be formed directly on sidewalls of the semiconductor channels 60, portions of the top surface of the source semiconductor layer 112, and portions of the bottom surface of the cap semiconductor layer 116. Each source strap material portion 38 can have first portions having a first thickness and located outside areas of the backside trenches 79, and second portions having a second thickness and located around the backside trenches 79. The first thickness can be about the sum of the thickness of the dielectric material portions 124, the first dielectric liner 213, and the second dielectric liner 115. The second thickness can be the vertical distance between the bottom surface of the cap semiconductor layer 116 and the recessed top surface of the source semiconductor layer 112.

Figure 63:
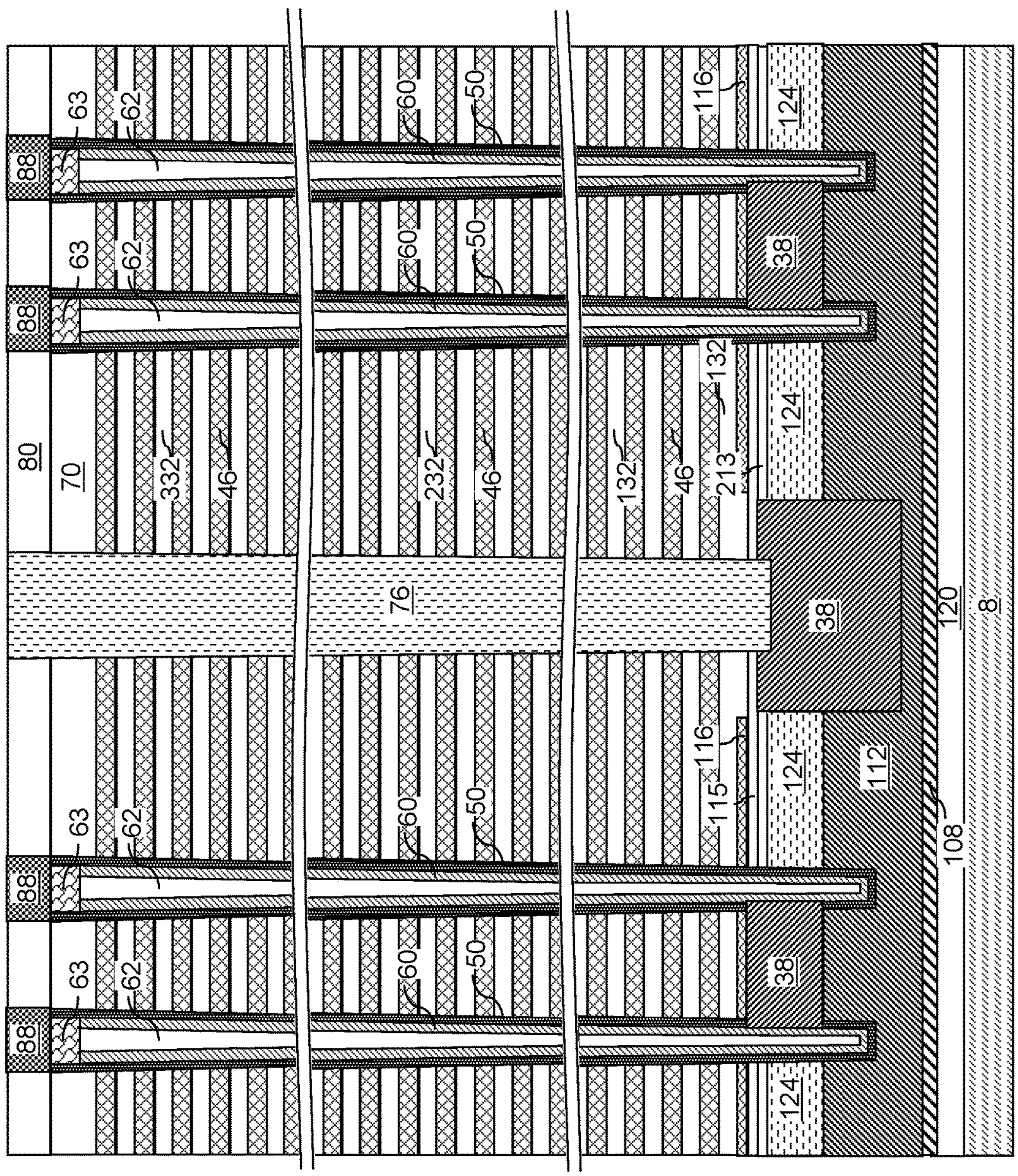
FIG. 63 is a vertical cross-sectional view of the fifth exemplary structure after formation of electrically conductive layers, an insulating wall structure, and various contact via structures according to the fifth embodiment of the present disclosure.

Referring to FIG. 63, the processing steps of FIGS. 21, 22, 23, and 24A-24C can be sequentially performed to replace the sacrificial material layers (142, 242, 342) with electrically conductive layers 46, and to form an insulating wall structure 76. The insulating wall structure 76 contacts sidewalls of the insulating layers (132, 232, 332) and the electrically conductive layers 46 and top surfaces of the source strap material portions 38.

Referring collectively to the third, fourth, and fifth exemplary structures and their alternative configurations, each of the third, fourth, and fifth exemplary structures and their alternative configurations can include a three-dimensional memory device. The three-dimensional memory device includes: a source semiconductor layer 112 having a thickness modulation and located over a substrate 8 and including a recess region (corresponding to a second line trench 103) which can optionally a uniform width therein; a laterally alternating stack (38, 124) of source strap material portions 38 and dielectric material portions 124 located over the source semiconductor layer 112, wherein each of the source strap material portions 38 and the dielectric material portions 124 laterally extends along a first horizontal direction hd1, and the recess region laterally extends along a second horizontal direction hd2 that is different from the first horizontal direction hd1 and is filled by a same semiconductor material as the source strap material portions 38; a vertically alternating stack (132, 232, 332, 46) of electrically conductive layers 46 and insulating layers (132, 232, 332) located over the laterally alternating stack of the source strap material portions 38 and the dielectric material portions 124; and an array of memory stack structures (50, 60) that extend through the vertically alternating stack (132, 232, 332, 46) and into an upper portion of the source semiconductor layer 112, each memory stack structure (50, 60) including a semiconductor channel 60 and a memory film 50 laterally surrounding the semiconductor channel 60 and including an opening through which a respective one of the source strap material portions 38 contacts the semiconductor channel 60.

In one embodiment, a topmost surface of the source semiconductor layer 112 contacts bottom surfaces of the source strap material portions 38 and the dielectric material portions 124 outside the recess region. In one embodiment, sidewalls of the source semiconductor layer 112 contact sidewalls of the source strap material portions 38 at a periphery of the recess region, and a recessed top surface of the source semiconductor layer 112 contacts a downward-protruding portion of the source strap material portions 38 at a bottom of the recess region. In one embodiment, the source strap material portions 38 comprise a doped semiconductor material having a doping of a same conductivity type as the source semiconductor layer 112.

In one embodiment, the three-dimensional memory device can further include an insulating wall structure 76 vertically extending through the vertical alternating stack (132, 232, 332, 46) and laterally extending along a same direction as the recess region and protruding downward into portions of the laterally alternating stack (38, 124) located within the recess region. In one embodiment, the insulating wall structure 76 contacts sidewalls of the insulating layers (132, 232, 332), sidewalls of the electrically conductive layers 46, sidewalls of the source strap material portions 38, sidewalls of the dielectric material portions 124, and recessed top surfaces of the source strap material portions 38.

In one embodiment, a cap semiconductor layer 116 can overlie the laterally alternating stack (38, 124) and underlie the vertically alternating stack (132, 232, 332, 46) and contact sidewalls of the insulating wall structure 76 and top surfaces of the source strap material portions 38 as in the third and fourth exemplary structures and their alternative configurations. Alternatively, a cap semiconductor layer 116 can overlie the laterally alternating stack (38, 124) and underlie the vertically alternating stack (132, 232, 332, 46), and contact top surfaces of the source strap material portions 38, and not contact, and is laterally spaced from, sidewalls of the insulating wall structure 76 by a bottommost insulating layer 132 within the vertically alternating stack (132, 232, 332, 46) as in the fifth exemplary structure.

In one embodiment, a cap semiconductor layer 116 can overlie the laterally alternating stack (38, 124) and underlie the vertically alternating stack (132, 232, 332, 46) and contact top surfaces of the source strap material portions 38, and at least one patterned dielectric liner (such as the second dielectric liner 115) can overlie the dielectric material portions 124 and underlie the cap semiconductor layer 116.

In one embodiment, the array of memory stack structures (50, 60) can protrude downward into the source semiconductor layer 112, and each memory film 50 can comprise, from outside to inside, a blocking dielectric 52, a charge storage layer 54, and a tunneling dielectric layer 56. In one embodiment, the source strap material portions 38 may have voids (i.e., air gaps) encapsulated therein if the semiconductor material of the source strap material portions does not completely fill the source cavities 119.

Figure 64:
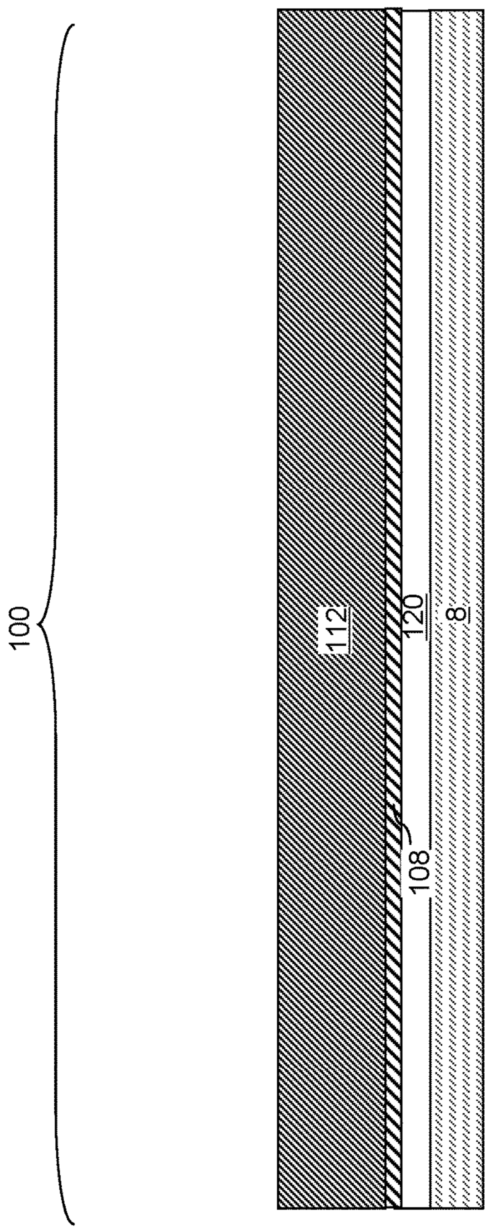
FIG. 64 is a vertical cross-sectional view of a sixth exemplary structure after formation of a metallic source layer and a source semiconductor layer according to a sixth embodiment of the present disclosure.

Referring to FIG. 64, a sixth exemplary structure according to a sixth embodiment of the present disclosure can be derived from the first exemplary structure of FIG. 1 by performing processing steps only up to the step of forming the source semiconductor layer 112. In one embodiment, the source semiconductor layer 112 can include a first n-doped semiconductor material such as n-doped amorphous silicon or n-doped polysilicon.

Figure 65A:
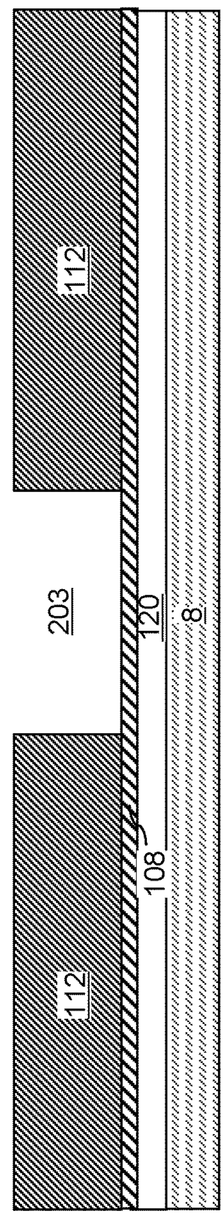
FIG. 65A is a vertical cross-sectional view of the sixth exemplary structure after patterning the source semiconductor layer according to the sixth embodiment of the present disclosure.
Figure 65B:
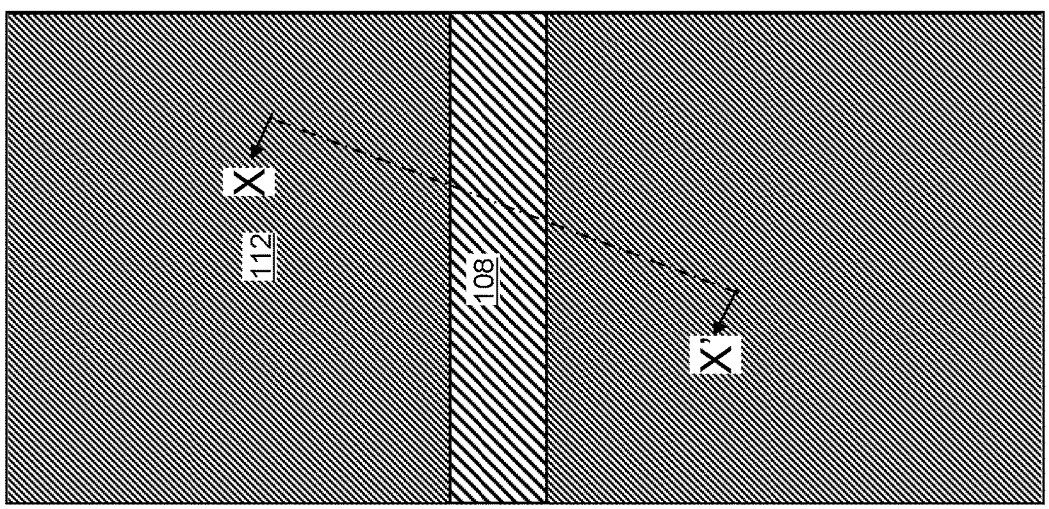
FIG. 65B is a top-down view of the sixth exemplary structure of FIG. 65A. The vertical plane X-X' is the plane of the vertical cross-section of FIG. 65A.

Referring to FIGS. 65A and 65B, the source semiconductor layer 112 can be patterned to form first line trenches 203 therein. For example, a photoresist layer (not shown) can be applied over the source semiconductor layer 112 and lithographically patterned to form linear openings therein. The pattern of the linear openings in the photoresist layer can be transferred through the entirety of the source semiconductor layer 112 to form the first line trenches 203. In this case, each first line trench 203 can vertically extend through the entire thickness of the source semiconductor layer 112. Portions of a top surface of an underlying layer (such as a metallic source layer 108) can be physically exposed underneath the first line trenches 203. The pattern of the first line trenches 203 as seen from above can be the same as the pattern of the pattern of the sacrificial semiconductor line 214 illustrated in FIG. 37B. In other words, the first line trenches 203 can laterally extend along a second horizontal direction hd2. The width of each first line trench 203 can be in a range from 100 nm to 2,000 nm, although lesser and greater widths can also be employed.

Figure 66:
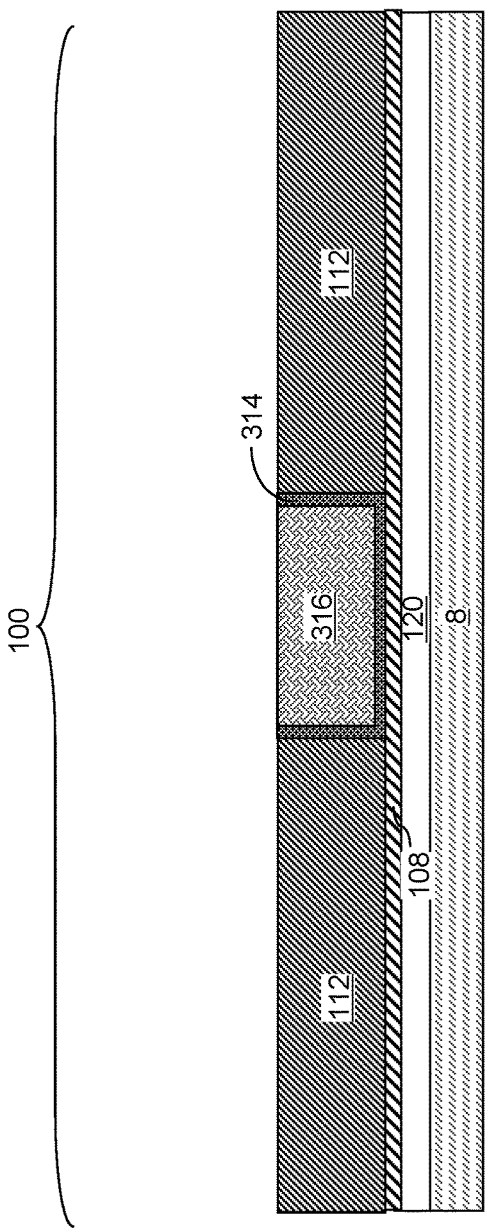
FIG. 66 is a vertical cross-sectional view of the sixth exemplary structure after formation of a diffusion barrier dielectric liner and an etch stop semiconductor rail according to the sixth embodiment of the present disclosure.

Referring to FIG. 66, a combination of a diffusion barrier dielectric liner 314 and an etch stop semiconductor rail 316 can be formed within each first line trench 203. For example, a conformal layer of a diffusion barrier dielectric material such as silicon nitride can be deposited on the physically exposed surfaces of the source semiconductor layer 112 and the underlying layer (such as a metallic source layer 108) by a conformal deposition process such as chemical vapor deposition. The thickness of the conformal layer can be in a range from 5 nm to 30 nm, although lesser and greater thicknesses can also be employed. The remaining unfilled volume of the first line trenches 203 can be filled with a doped semiconductor material. In one embodiment, the doped semiconductor material can be a p-doped semiconductor material such as boron-doped amorphous silicon, boron-doped polysilicon, or a boron-doped silicon-germanium alloy. In one embodiment, the boron doped semiconductor material can include boron at an atomic concentration in a range from $3.0\times10^{18}/cm^3$ to $2.0\times10^{21}/cm^3$, such as from $1.0\times10^{19}/cm^3$ to $1.0\times10^{21}/cm^3$. The boron-doped semiconductor material can be formed, for example, by in-situ doping of boron atoms.

Portions of the doped semiconductor material and the conformal layer can be removed from above the top surface of the source semiconductor layer 112 by a planarization process. The planarization process can employ, for example, at least one recess etch process, chemical mechanical planarization, and/or an isotropic etch process. For example, excess portions of the doped semiconductor material located above the topmost surface of the conformal layer can be removed by chemical mechanical planarization and/or a recess etch that employs the topmost surface of the conformal layer as an etch stop surface or a planarization stopping surface. Horizontal portions of the conformal layer overlying the top surface of the source semiconductor layer 112 can be subsequently removed, for example, by an isotropic or an anisotropic etch. For example, if the conformal layer includes silicon nitride, a wet etch employing hot phosphoric acid can be employed to remove the physically exposed horizontal portions of the conformal layer.

Each remaining portion of the conformal layer in a first line trench 203 constitutes a diffusion barrier dielectric liner 314. Each remaining portion of the doped semiconductor material in a first line trench 203 constitutes a semiconductor rail, which is herein referred to as an etch stop semiconductor rail 316 because the semiconductor rail is subsequently employed as an etch stop structure during an anisotropic etch process. Each etch stop semiconductor rail 316 is formed within a respective diffusion barrier dielectric liner 316, and laterally extends along the second horizontal direction hd2. Generally, each etch stop semiconductor rail 316 can be formed by deposition and planarization of a doped semiconductor material. In one embodiment, the top surface of each etch stop semiconductor rail 316 can be within a same horizontal plane as the top surface of the source semiconductor layer 112.

Figure 67:
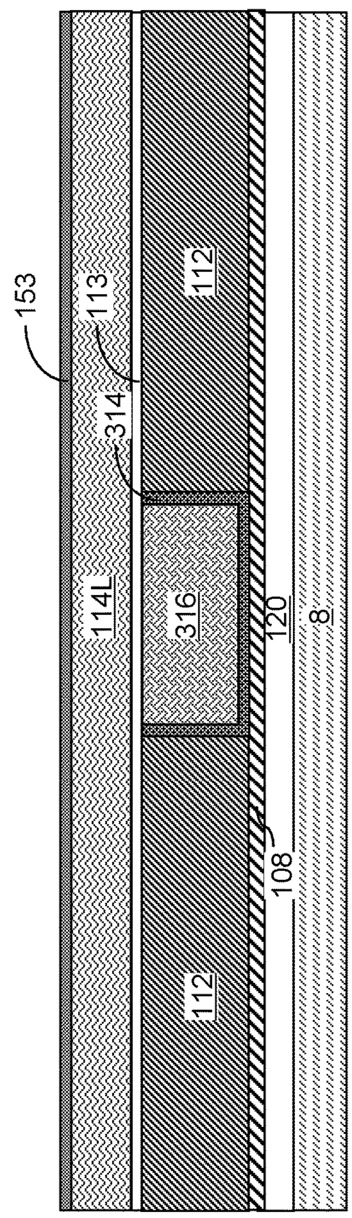
FIG. 67 is a vertical cross-sectional view of the sixth exemplary structure after formation of a first dielectric liner, a sacrificial semiconductor layer, and a cap insulator layer according to the sixth embodiment of the present disclosure.

Referring to FIG. 67, remaining processing steps of FIG. 1 that are not performed at the processing steps of FIG. 64 can be performed to form a first dielectric liner 113, a sacrificial semiconductor layer 114L and a cap insulator layer 153.

Figure 68:
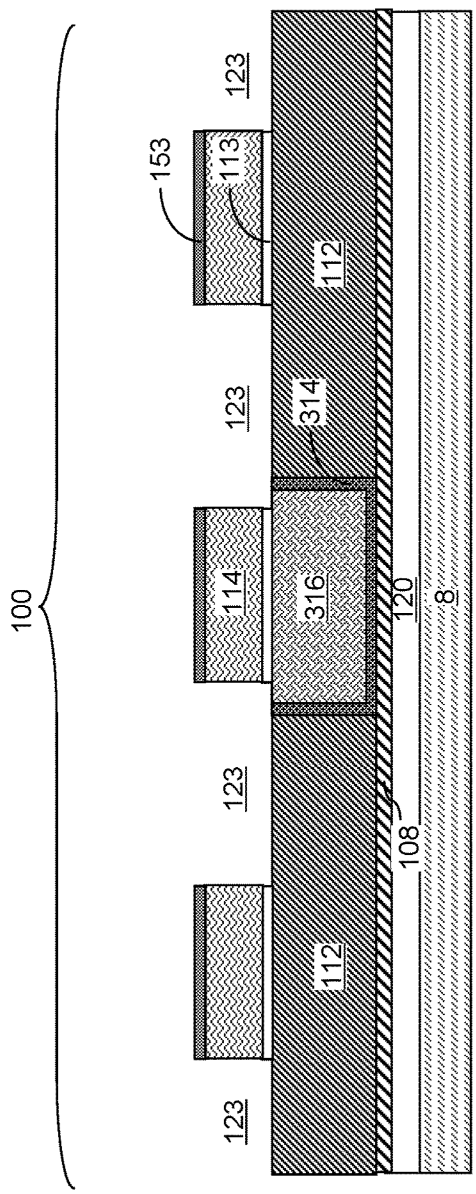
FIG. 68 is a vertical cross-sectional view of the sixth exemplary structure after formation of sacrificial semiconductor rails according to the sixth embodiment of the present disclosure.

Referring to FIG. 68, a subset of the processing steps of FIGS. 2A and 2B can be performed to form second line trenches 123. The second line trenches 123 can be formed through the cap insulator layer 153 and the sacrificial semiconductor layer 114L. The second line trenches 123 can laterally extend along different horizontal direction than the lengthwise direction of the etch stop semiconductor rails 316. The lengthwise direction of the second line trenches 123 is herein referred to as a first horizontal direction, which may be the same as the first horizontal direction hd1 of previously described exemplary structures. The second line trenches 123 can be formed, for example, by applying and patterning a photoresist layer over the sacrificial semiconductor layer 114L, lithographically patterning the photoresist layer to form a line-and-space pattern that extends along the first horizontal direction, and removing unmasked portions of the cap insulator layer 153, the sacrificial semiconductor layer 114L, and optionally the first dielectric liner 113 by an anisotropic etch process. In one embodiment, the second line trenches 123 can extend to the top surface of the first dielectric liner 113, in which case the first dielectric liner 113 can function as an etch stop layer. In another embodiment, the second line trenches 123 can extend to the top surface of the source semiconductor layer 112. The photoresist layer can be subsequently removed, for example, by ashing. Each remaining portion of the sacrificial semiconductor layer 114L constitutes a sacrificial semiconductor rail 114. A plurality of sacrificial semiconductor rails 114 laterally extending along the first horizontal direction hd1 and laterally spaced apart by the line trenches is formed.

Figure 69A:
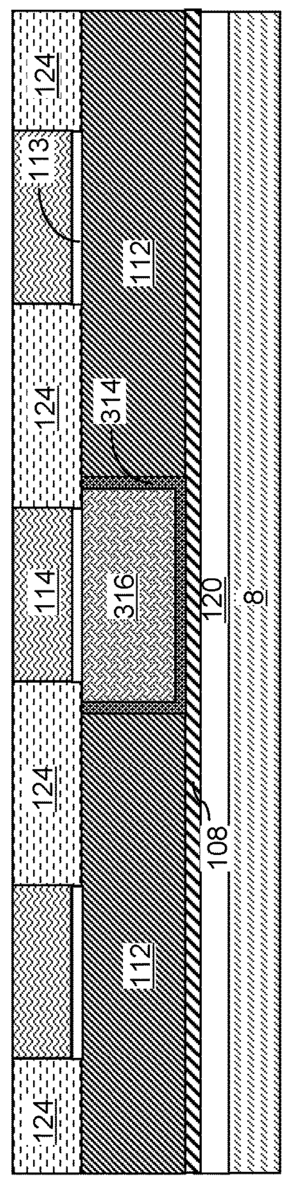
FIG. 69A is a vertical cross-sectional view of the sixth exemplary structure after formation of dielectric rails according to the sixth embodiment of the present disclosure.
Figure 69B:
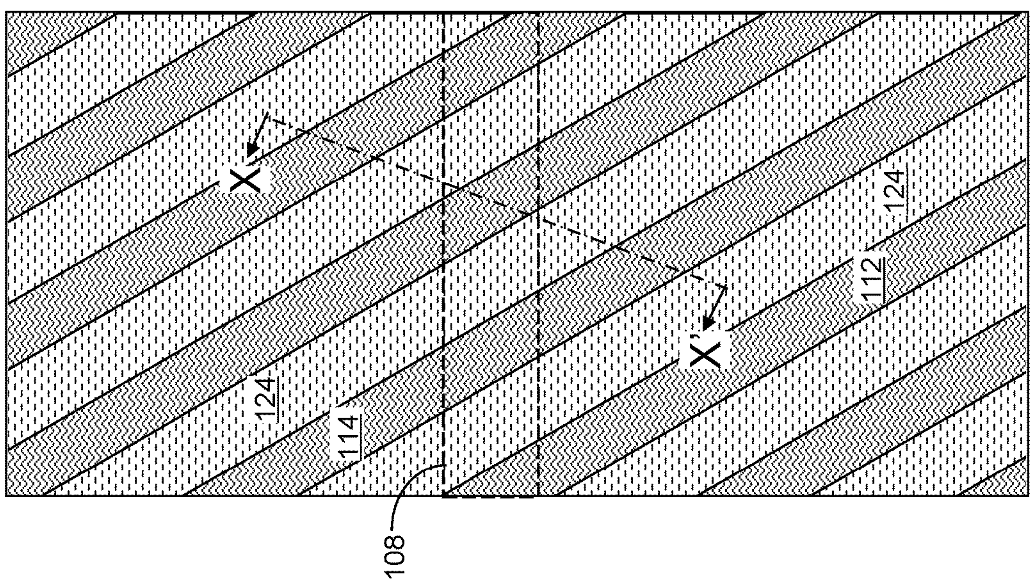
FIG. 69B is a top-down view of the sixth exemplary structure of FIG. 69A. The vertical plane X-X' is the plane of the vertical cross-section of FIG. 69A.

Referring to FIGS. 69A and 69B, a dielectric material, such as an undoped silicate glass, can be deposited in the line trenches by a deposition process such as chemical vapor deposition. Excess portions of the dielectric material can be removed from above the top surface of the cap insulator layer 153 by a planarization process such as chemical mechanical planarization and/or a recess etch. Upon planarization, the deposited dielectric material can be divided into discrete portions that fill the second line trenches 123. Each remaining portion of the deposited and planarized dielectric material is herein referred to as a dielectric rail 124.

The sacrificial semiconductor rails 114 and the dielectric rails 124 can laterally alternate to form a laterally alternating stack. In one embodiment, the sacrificial semiconductor rails 114 may have a same first width along the direction of alternation, and the dielectric rails 124 may have a same second width along the direction of alternation. In this case, the laterally alternating stack may form a periodic one-dimensional array having a pitch. The pitch may be in a range from 100 nm to 500 nm, although lesser and greater pitches may also be employed. In one embodiment, each of the sacrificial semiconductor rails 114 and the dielectric rails 124 can straddle the etch stop semiconductor rail 316.

Optionally, the dielectric rails 124 may be vertically recessed below the top surface of the patterned cap insulator layer 153 such that top surfaces of the dielectric rails 124, as recessed, may be approximately at the level of the top surfaces of the sacrificial semiconductor rails 114. The cap insulator layer 153 can be subsequently removed selective to the laterally alternating stack (114, 124). For example, if the cap insulator layer 153 includes silicon nitride, a wet etch employing hot phosphoric acid may be employed to remove the cap insulator layer 153.

Figure 70:
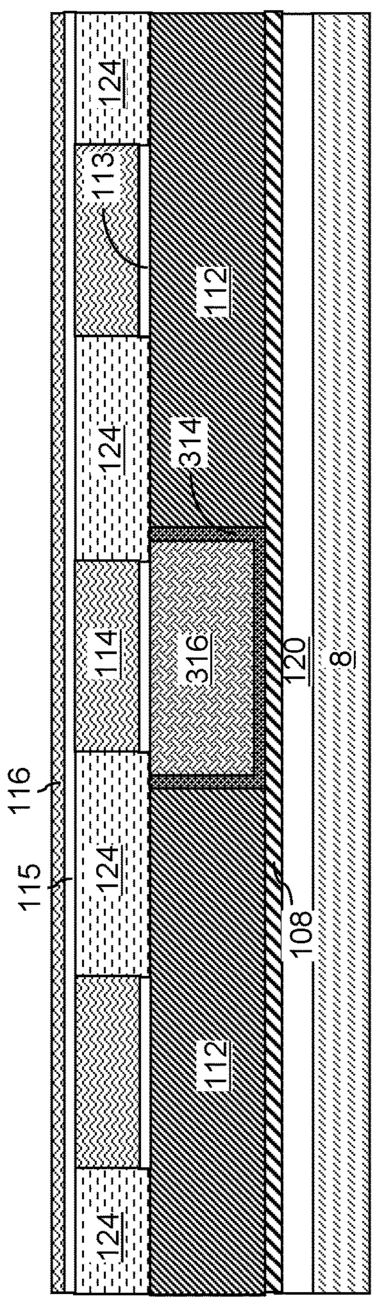
FIG. 70 is a vertical cross-sectional view of the sixth exemplary structure after formation of a second dielectric liner and a cap semiconductor layer according to the sixth embodiment of the present disclosure.

Referring to FIG. 70, the processing steps of FIG. 3 can be performed to form a second dielectric liner 115 and a cap semiconductor layer 116.

Figure 71A:
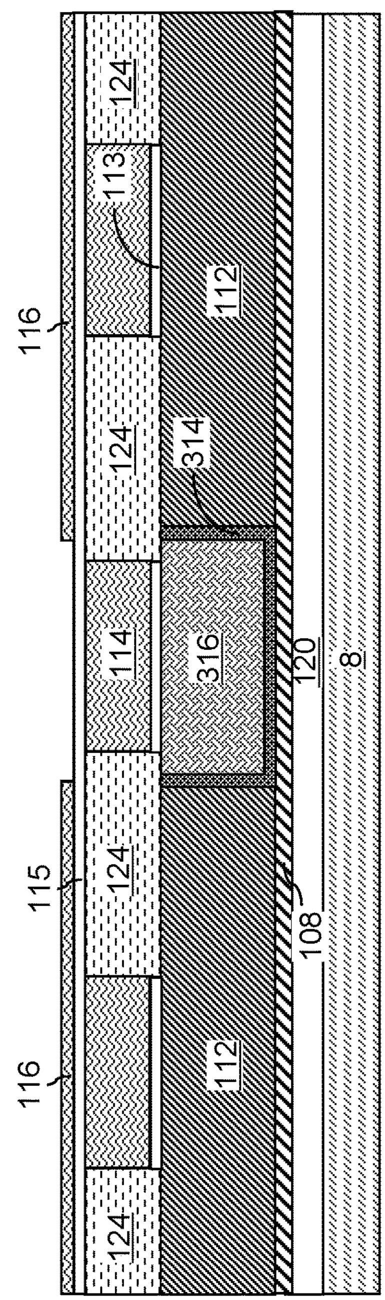
FIG. 71A is a vertical cross-sectional view of the sixth exemplary structure after patterning the cap semiconductor layer according to the sixth embodiment of the present disclosure.
Figure 71B:
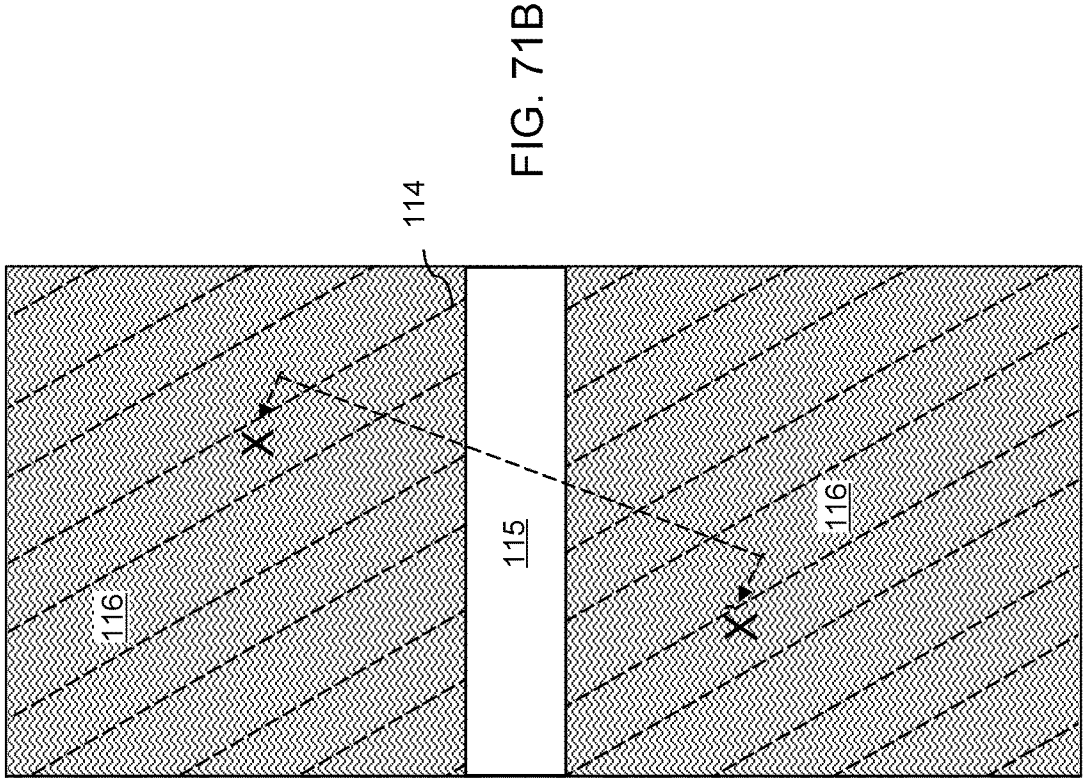
FIG. 71B is a top-down view of the sixth exemplary structure of FIG. 71A. The vertical plane X-X' is the plane of the vertical cross-section of FIG. 71A.

Referring to FIGS. 71A and 71B, the processing steps of FIGS. 57A and 57B can be performed to pattern the cap semiconductor layer 116. Specifically, portions of the cap semiconductor layer 116 overlying the etch stop semiconductor rails 316 can be removed by a masked etch process.

Figure 72A:
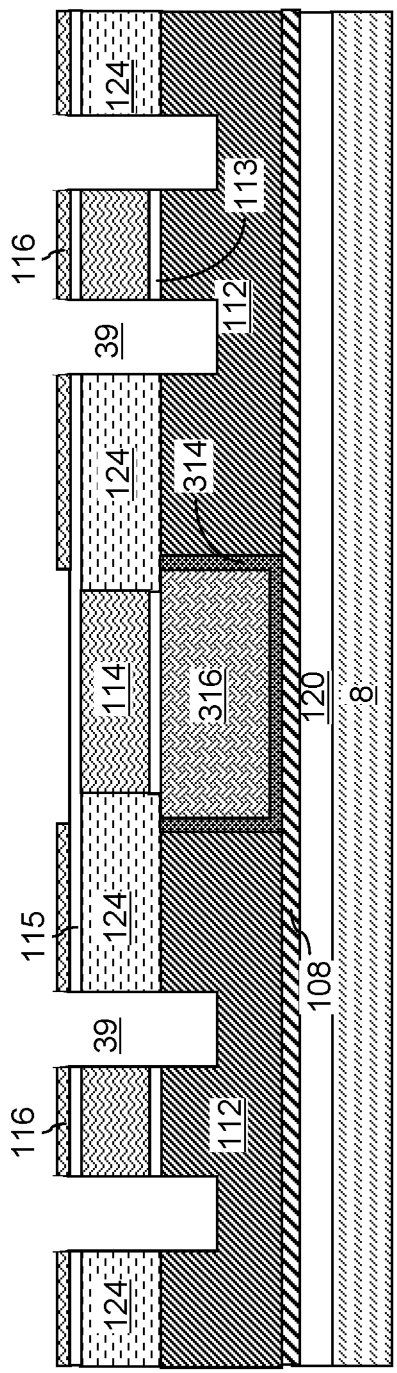
FIG. 72A is a vertical cross-sectional view of the sixth exemplary structure after formation of source-level memory openings according to the sixth embodiment of the present disclosure.
Figure 72B:
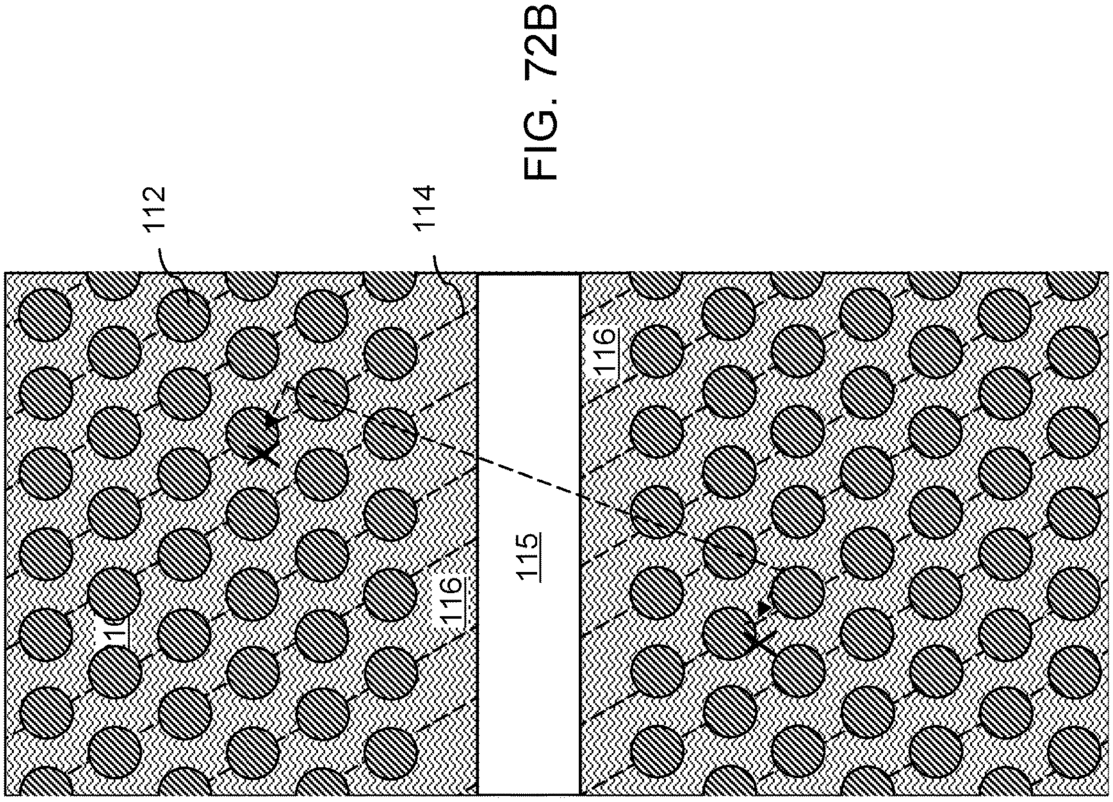
FIG. 72B is a top-down view of the sixth exemplary structure of FIG. 72A. The vertical plane X-X' is the plane of the vertical cross-section of FIG. 72A.

Referring to FIGS. 72A and 72B, the processing steps of FIGS. 4A and 4B can be performed to form source-level memory openings 39. Any of the alternative configurations of the first exemplary structure may be performed to provide alternative shapes for the source-level memory openings 39. In one embodiment, each of the source-level memory openings 39 can straddle an interface between a respective pair of a dielectric rail 124 and a sacrificial semiconductor rail 114. Thus, each source-level memory opening 39 can include a sidewall of a respective one of the sacrificial semiconductor rails 114 and a sidewall of a respective one of the dielectric rails 124. In one embodiment, the source-level memory openings 39 can include a plurality of two-dimensional array of source-level memory openings 39 that are laterally spaced apart from one another by regions that do not include source-level memory openings 39. In one embodiment, the source-level memory openings can be formed only in the memory array region 100, and not formed in the contact region 300. In another embodiment, the source-level memory openings 39 may be formed both in the memory array region 100 and the contact region 300.

Figure 73:
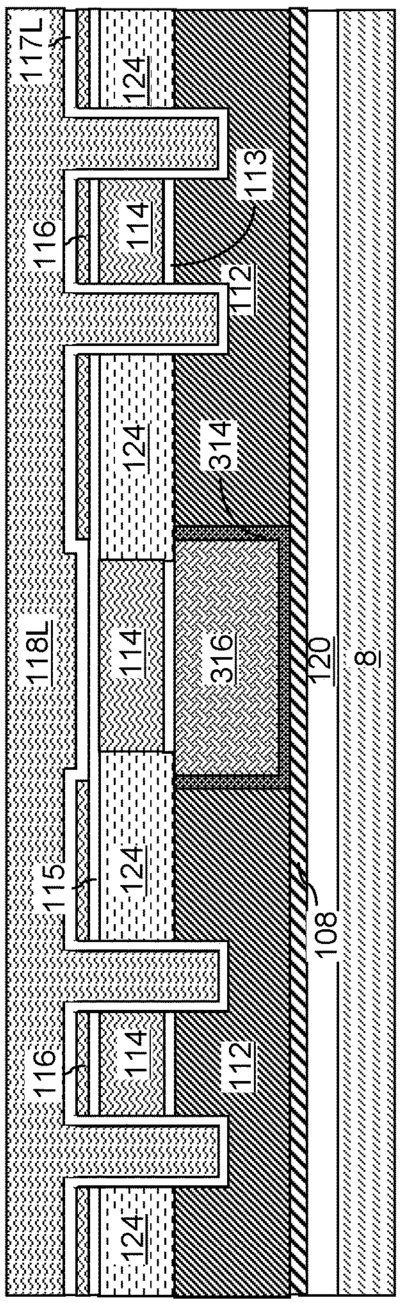
FIG. 73 is a vertical cross-sectional view of the sixth exemplary structure after formation of a pedestal liner layer and a sacrificial semiconductor pedestal material layer according to the sixth embodiment of the present disclosure.

Referring to FIG. 73, the processing steps of FIG. 5 can be performed to form pedestal liner layer 117L and a sacrificial semiconductor pedestal material layer 118L. In one embodiment, the thickness of the pedestal liner layer 117L can be the same as, or greater than, the thickness of the cap semiconductor layer 116. In this case, each area in which the cap semiconductor layer 116 is absent is filled with the pedestal liner layer 117L between a first horizontal plane including the bottom surface of the cap semiconductor layer 116 and a second horizontal plane including the top surface of the cap semiconductor layer 116.

Figure 74:
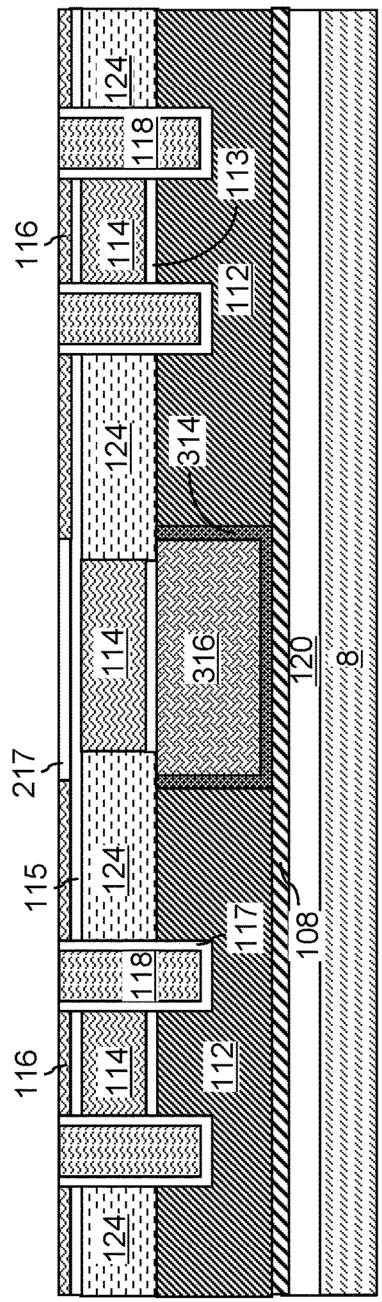
FIG. 74 is a vertical cross-sectional view of the sixth exemplary structure after formation of pedestal liners and sacrificial semiconductor pedestals according to the sixth embodiment of the present disclosure.

Referring to FIG. 74, a planarization process can be performed to remove portions of the sacrificial semiconductor pedestal material layer 118L and the pedestal liner layer 117L from above the horizontal plane including the top surface of the cap semiconductor layer 116. A recess etch and/or chemical mechanical planarization can be employed. Portions of the pedestal liner layer 117L overlying the cap semiconductor layer 116 may be employed as an etch stop layer in a recess etch process or as a stopping layer in chemical mechanical planarization. Additional touch-up etch processes may be employed to enhance planarity of the top surface of the sixth exemplary structure after the planarization process.

Each remaining portion of the sacrificial semiconductor pedestal material layer 118L constitutes a sacrificial semiconductor pedestal 118. Each remaining portion of the pedestal liner layer 117L that laterally surrounds a sacrificial semiconductor pedestal 118 is herein referred to as a pedestal liner 117. Each remaining horizontal portion of the pedestal liner layer 117L in contact with a top surface of the second dielectric liner 115 is herein referred to as a third dielectric liner 217. Thus, a combination of a pedestal liner 117 and a sacrificial semiconductor pedestal 118 is formed within each source-level memory opening 39. The third dielectric liner 217 may have the same composition as, or may have a different composition from, the second dielectric liner 115.

Figure 75:
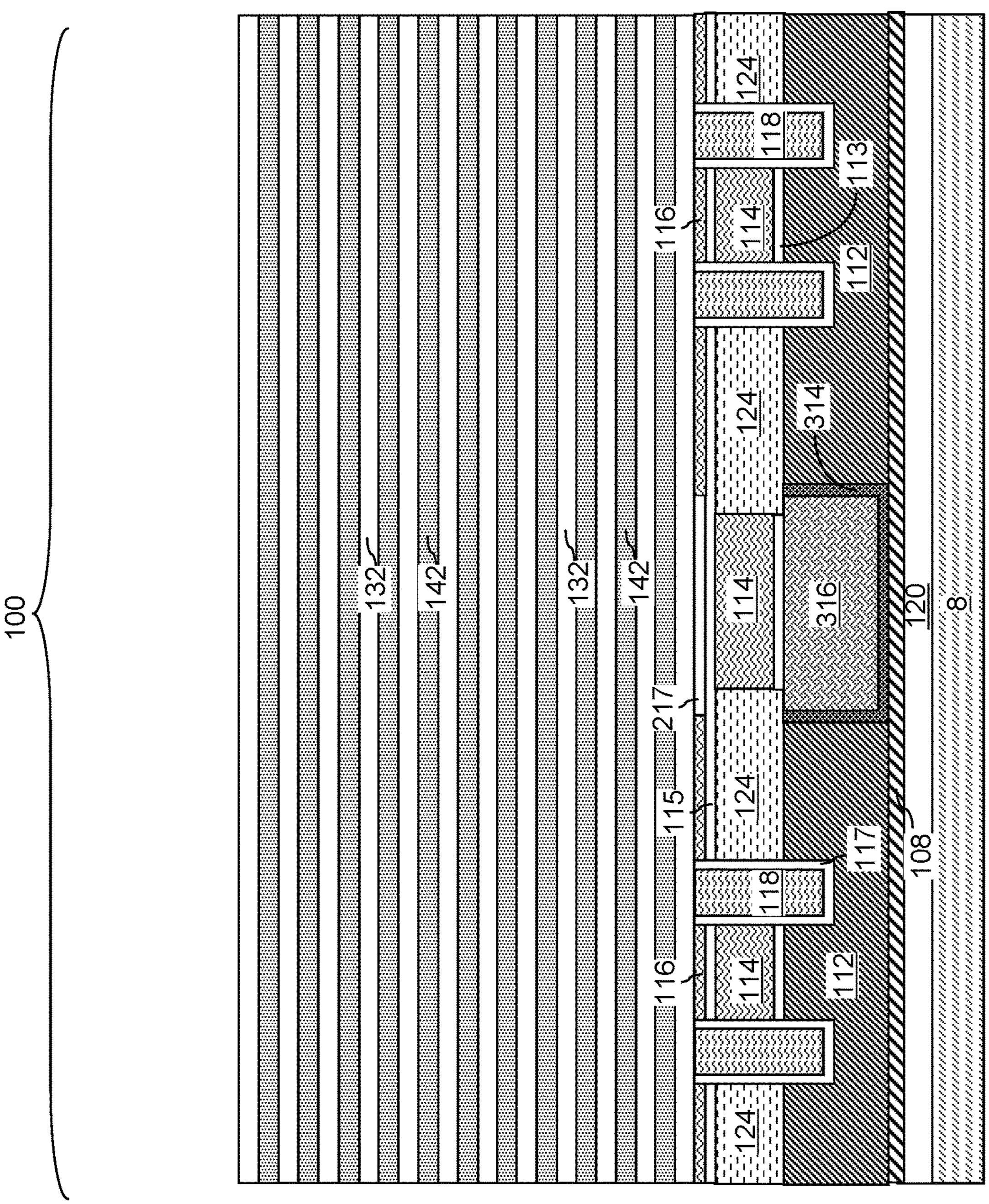
FIG. 75 is a vertical cross-sectional view of the sixth exemplary structure after formation of a first alternating stack of first insulating layers and first sacrificial material layers according to the sixth embodiment of the present disclosure.

Referring to FIG. 75, the processing steps of FIGS. 8A and 8B can be performed to form a stack of an alternating plurality of first material layers (which can be the first insulating layers 132) and second material layers (which can be spacer material layers such as the first sacrificial material layer 142). As discussed above, the spacer material layers are formed as, or are subsequently replaced with, electrically conductive layers. A stepped cavity and a retro-stepped dielectric material portion 65 may be formed as in the first exemplary structure.

Figure 76A:
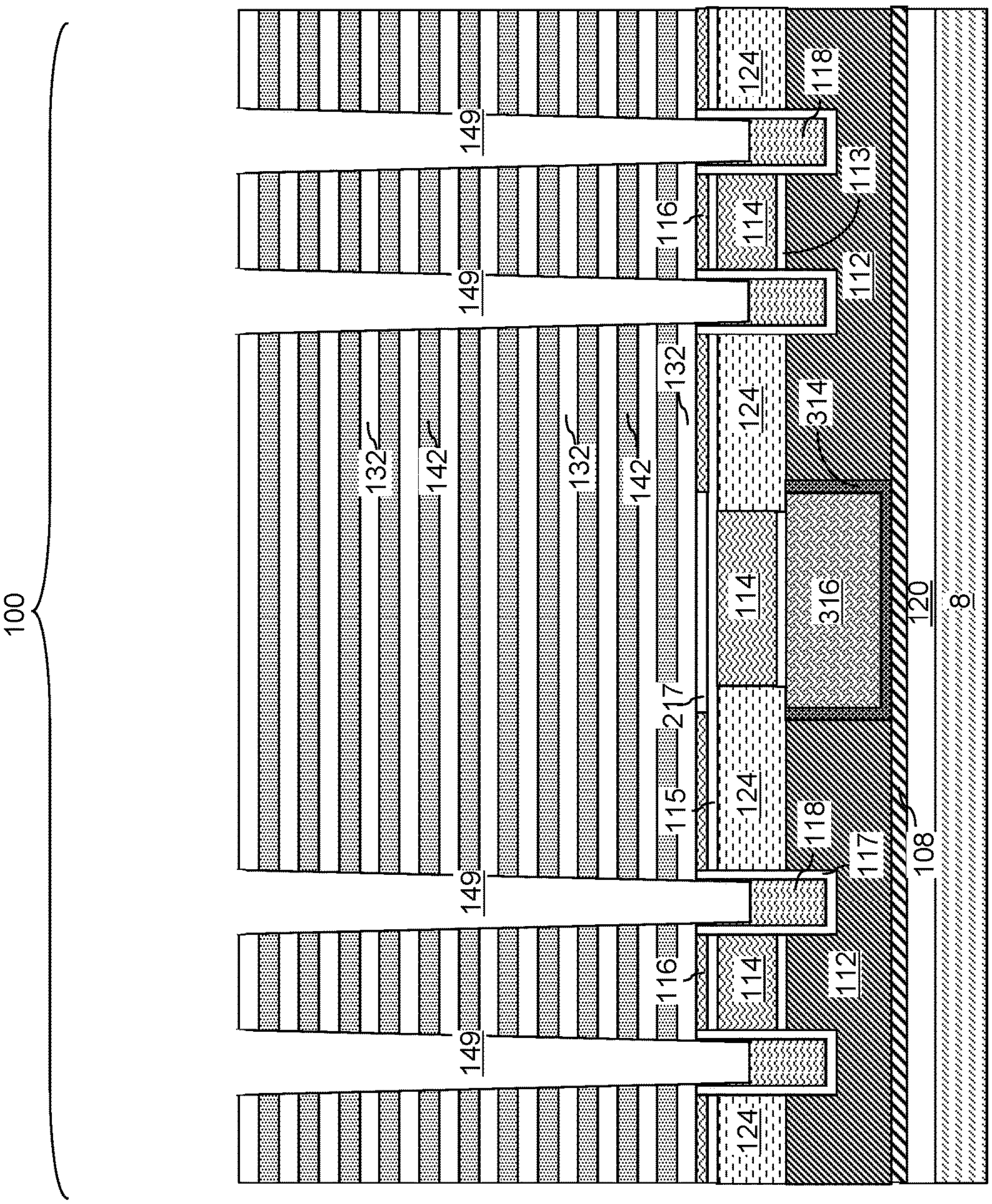
FIG. 76A is a vertical cross-sectional view of the sixth exemplary structure after formation of first-tier memory openings according to the sixth embodiment of the present disclosure.
Figure 76B:
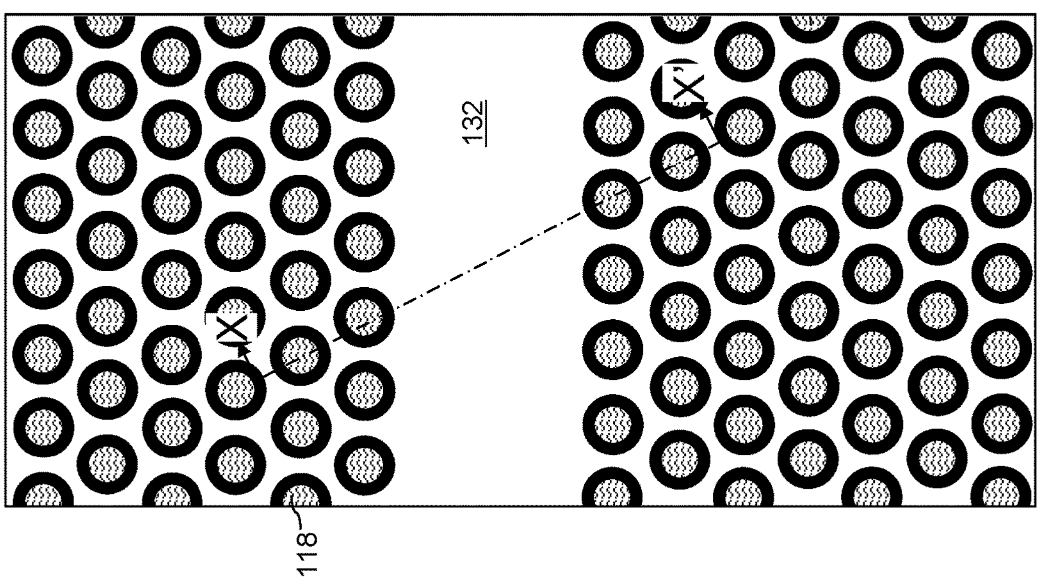
FIG. 76B is a horizontal cross-sectional view of the sixth exemplary structure of FIG. 76A. The plane X-X' is the plane of the vertical cross-section of FIG. 76A.

Referring to FIGS. 76A and 76B, the processing steps of FIGS. 9A, 9B, and 10 can be performed to form first tier memory openings 149 and first tier support openings. The locations of the first-tier memory openings 149 can be selected to overlap with locations of the source-level memory openings 39, i.e., the pairs of a pedestal liner 117 and a sacrificial semiconductor pedestal 118. Thus, each bottom surface of the first-tier memory openings 39 can be formed within an area defined by a top periphery of an underlying source-level memory opening 39, which can coincide with a top periphery of an underlying pedestal liner 117. In one embodiment, the sacrificial semiconductor pedestals 118 can function as an etch stop structure during an anisotropic etch process that forms the first-tier memory openings 149 and the first-tier support openings 119.

Figure 77:
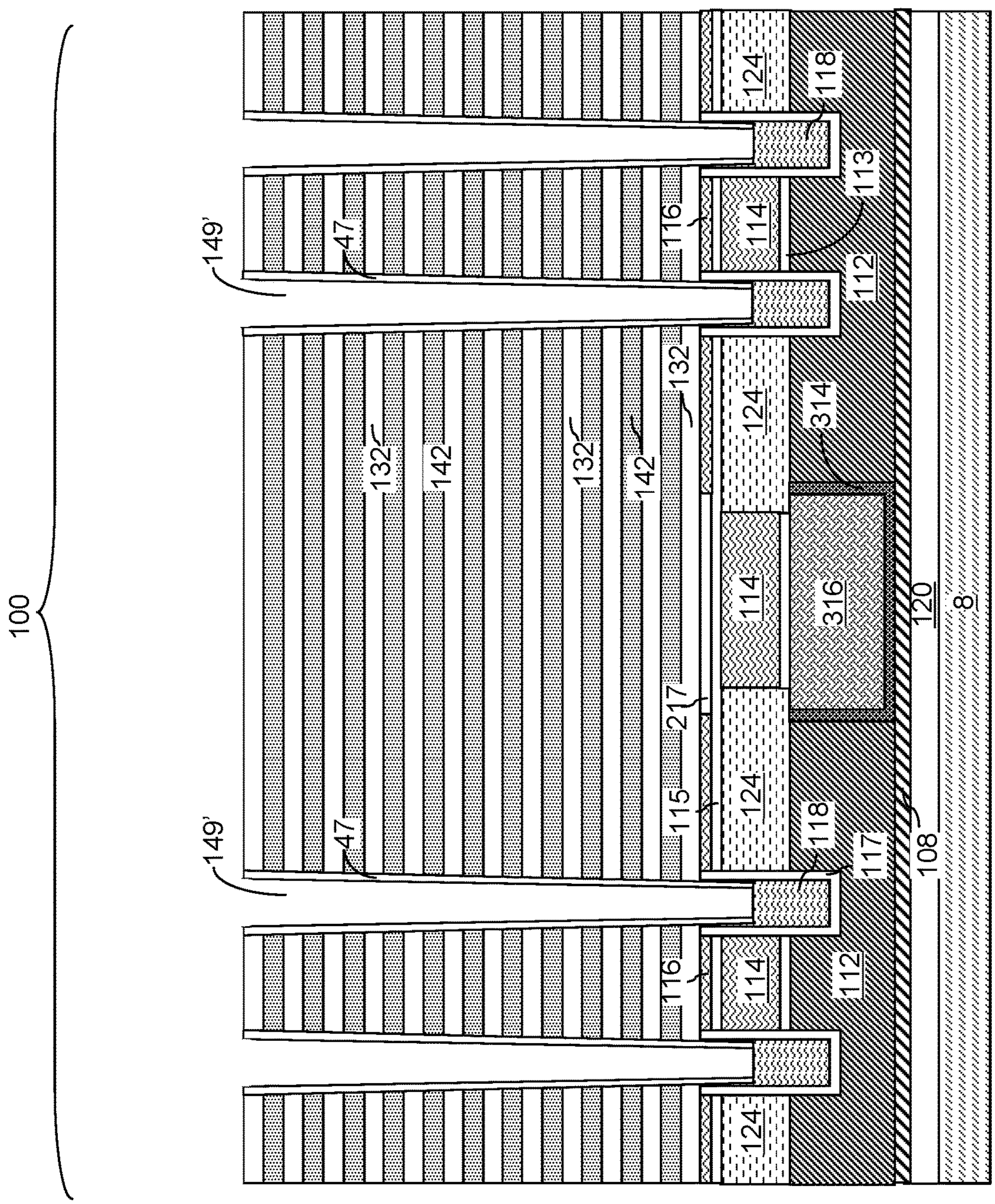
FIG. 77 is a vertical cross-sectional view of the sixth exemplary structure after formation of first-tier sacrificial liners according to the sixth embodiment of the present disclosure.

Referring to FIG. 77, the processing steps of FIG. 11 can be performed to form first-tier sacrificial liners 147.

Figure 78:
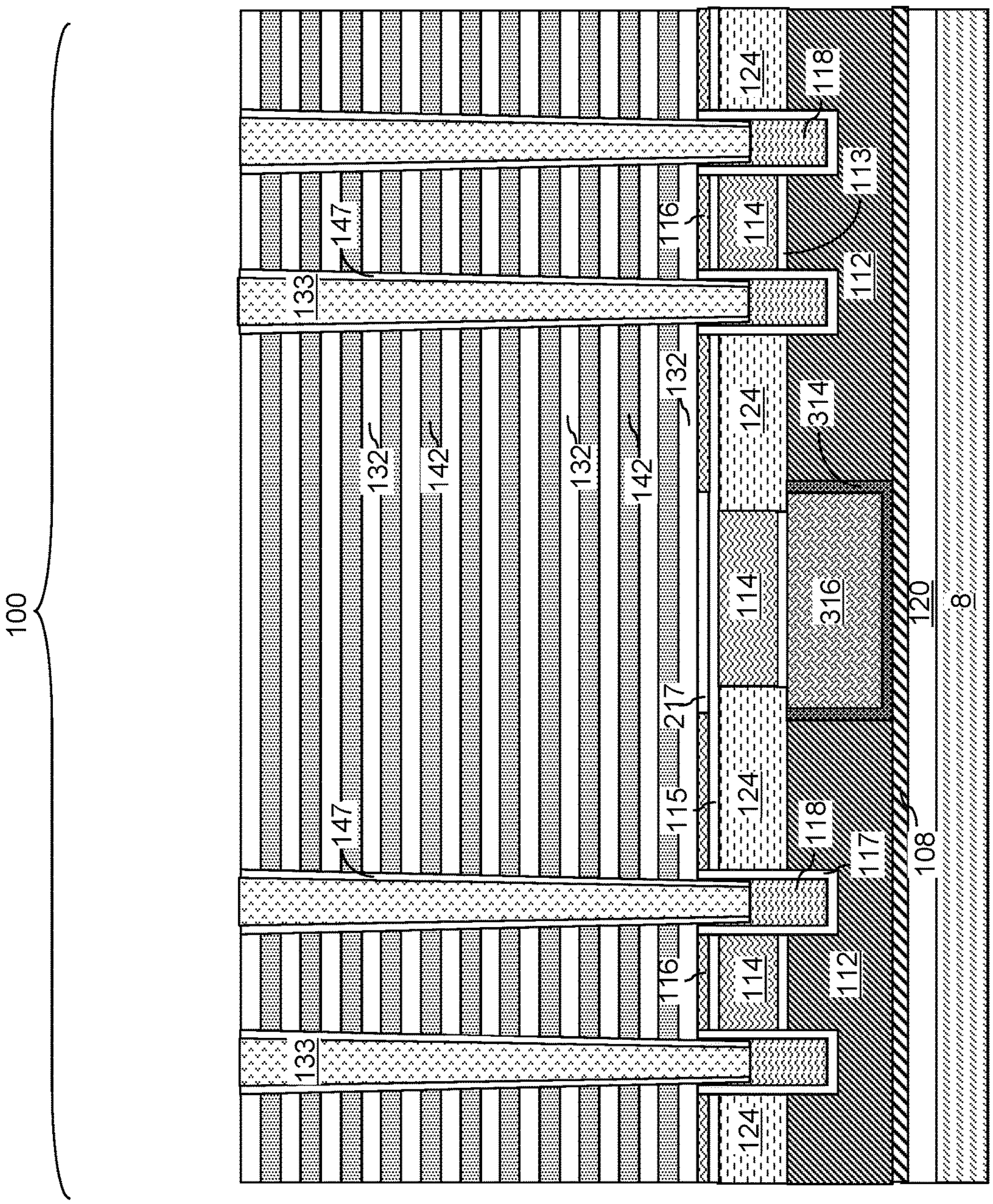
FIG. 78 is a vertical cross-sectional view of the sixth exemplary structure after formation of first-tier sacrificial fill structures according to the sixth embodiment of the present disclosure.

Referring to FIG. 78, the processing steps of FIG. 12 can be performed to form first-tier sacrificial fill structures 133.

Figure 79:
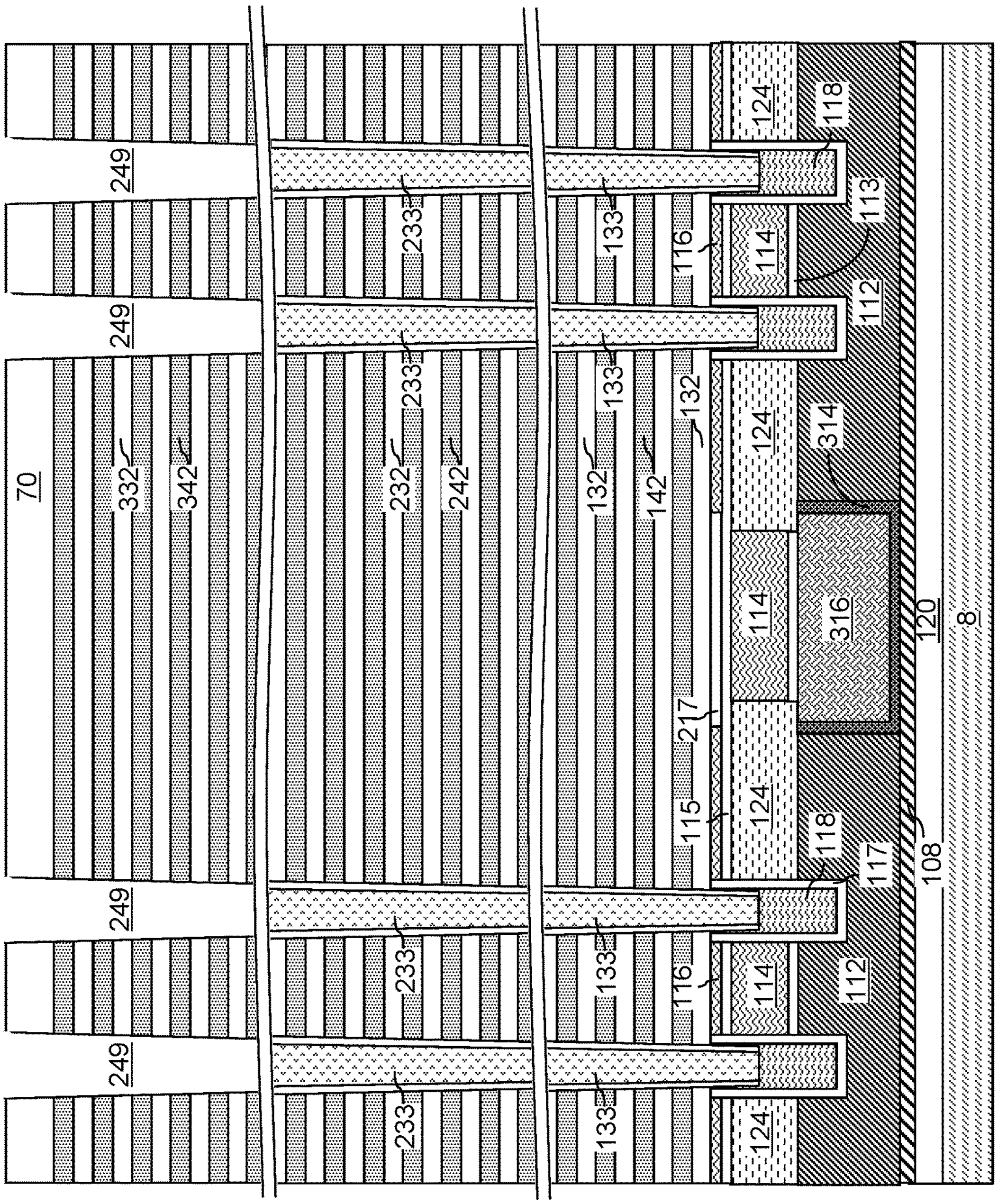
FIG. 79 is a vertical cross-sectional view of the sixth exemplary structure after formation of a topmost-tier structure and topmost-tier memory openings according to the sixth embodiment of the present disclosure.

Referring to FIG. 79, the processing steps of FIG. 13 can be performed to form at least one intermediate-tier structure and a topmost-tier structure, and respective structures embedded therein.

Figure 80:
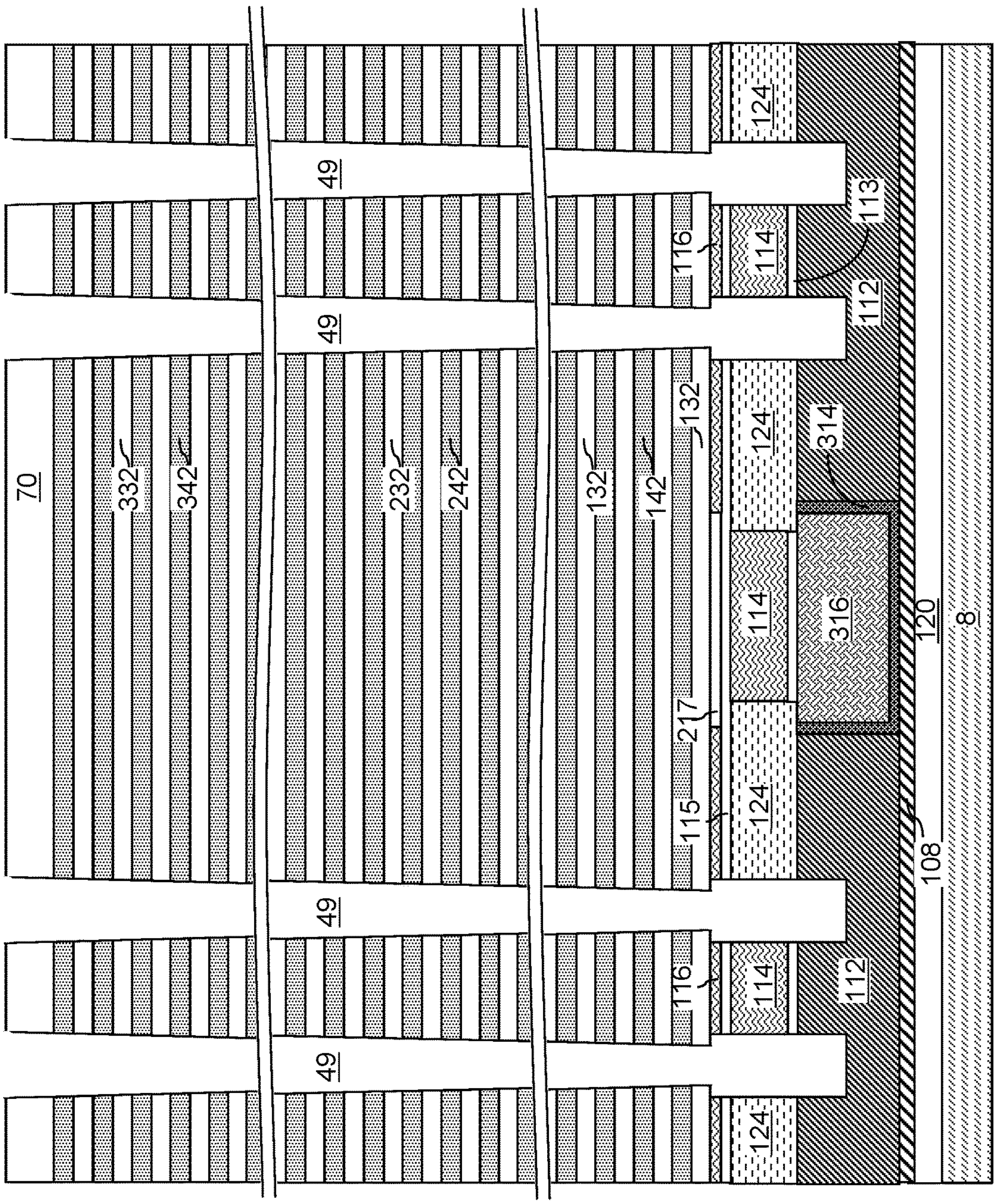
FIG. 80 is a vertical cross-sectional view of the sixth exemplary structure after formation of memory openings according to the sixth embodiment of the present disclosure.

Referring to FIG. 80, the processing steps of FIG. 14 can be performed to form memory openings 49. Each of the memory openings 49 can include a bulging portion at a bottom. Specifically, each of the memory openings 49 can be formed with a bulging portion formed by removal of a respective one of the sacrificial semiconductor pedestals 118 and a tapered portion that extend through at least a bottom portion of the first vertically alternating stack (132, 142) and having a bottom end that adjoins the bulging portion. Each of the sacrificial semiconductor pedestals 118 may be formed with a greater lateral extent than the bottom end of the tapered portion. In one embodiment, the bulging portion of each memory opening 49 can have a greater lateral extent (such as a diameter of a major axis or otherwise a greatest lateral dimension for a given two-dimensional cross-sectional shape) than a bottom end of the tapered portion.

Figure 81:
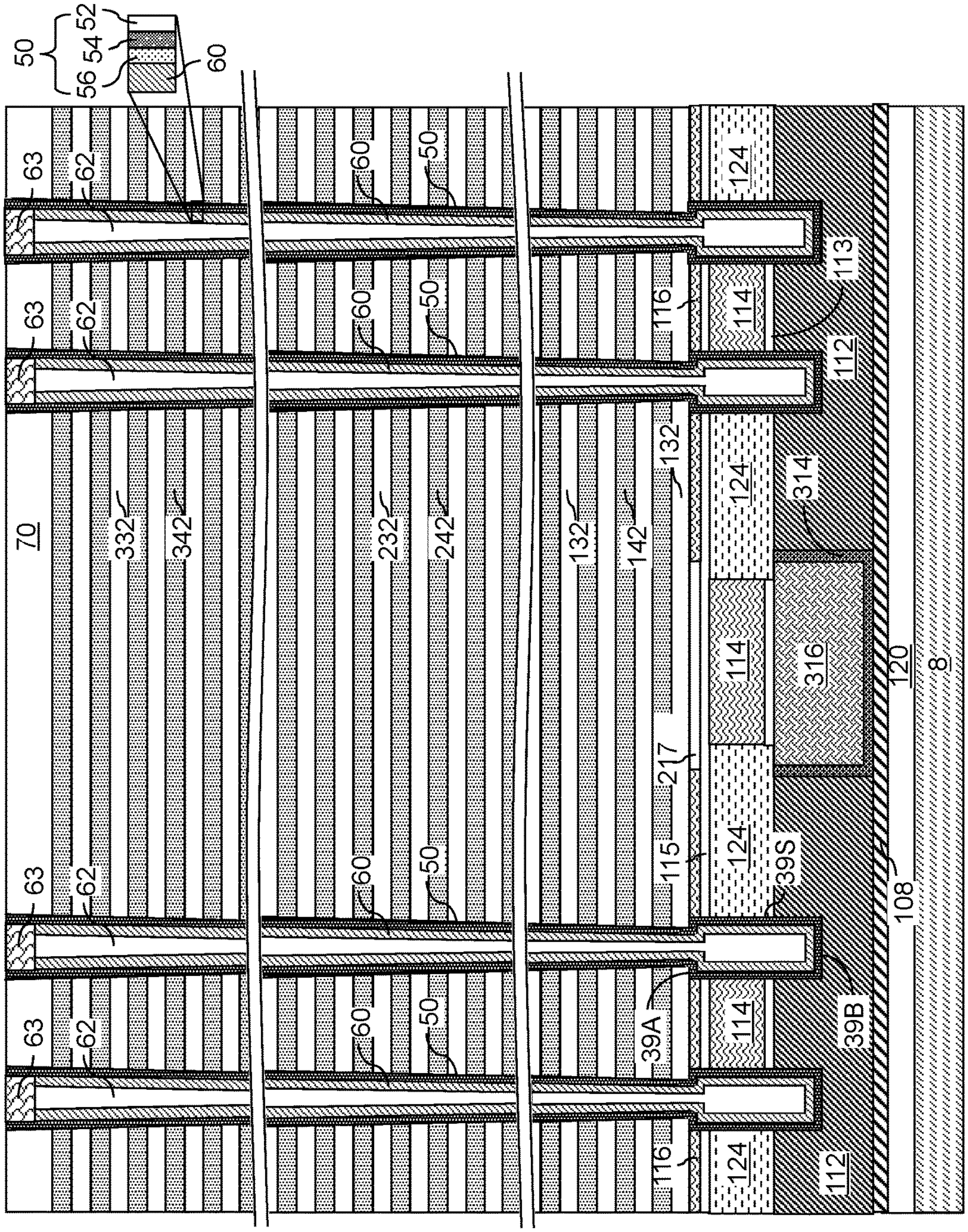
FIG. 81 is a vertical cross-sectional view of the sixth exemplary structure after formation of memory stack structures, dielectric cores, and drain regions according to the sixth embodiment of the present disclosure.

Referring to FIG. 81, the processing steps of FIG. 15 can be performed to form memory stack structures (50, 60), dielectric cores 62, and drain regions 63 within the memory openings 49.

Figure 82:
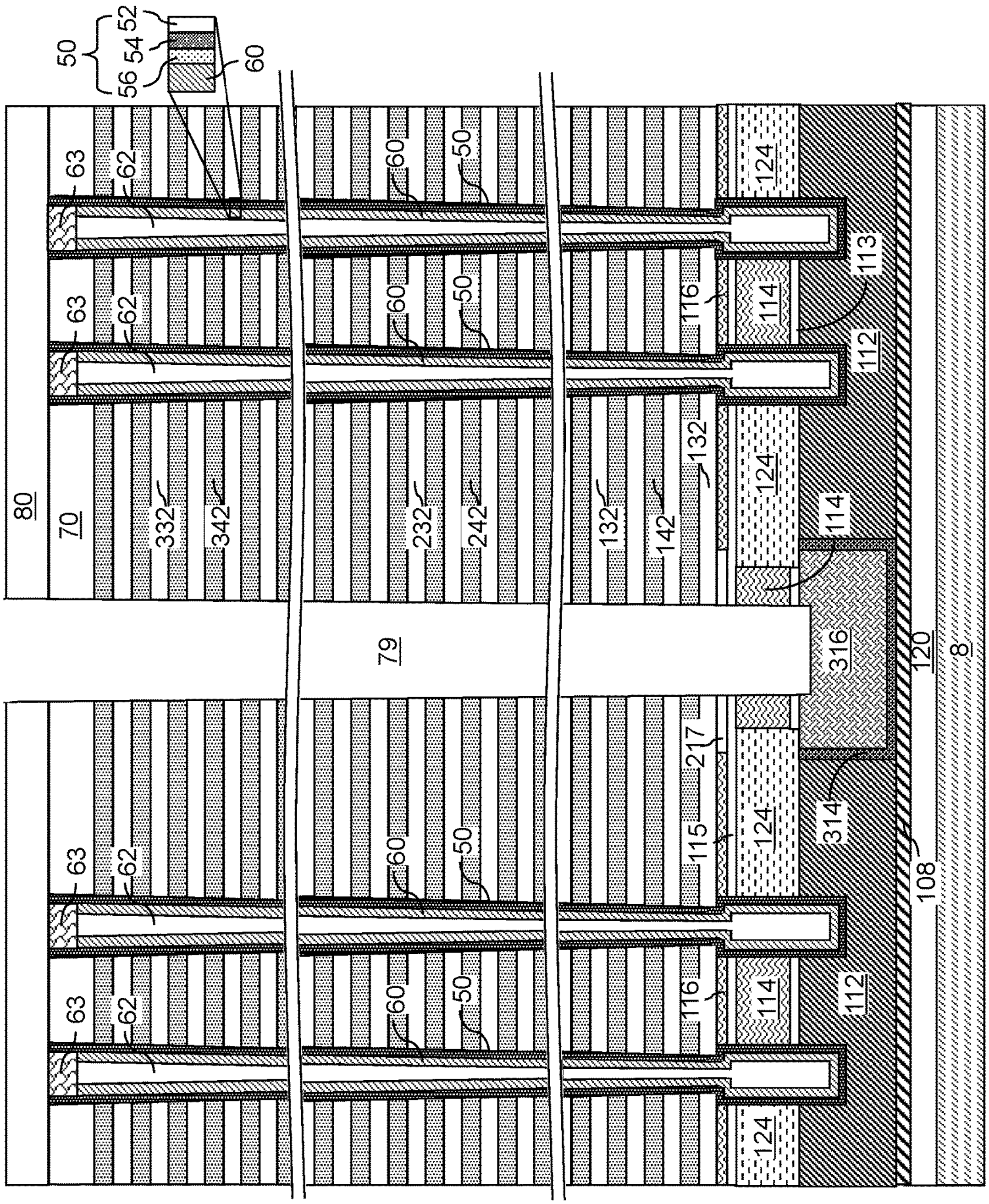

Referring to FIG. 82, a contact level dielectric layer 80 can be optionally formed over the insulating cap layer 70.

The contact level dielectric layer 80 includes a dielectric material that is different from the dielectric material of the sacrificial material layers (142, 242, 342). For example, the contact level dielectric layer 80 can include silicon oxide. The contact level dielectric layer 80 can have a thickness in a range from 50 nm to 500 nm, although lesser and greater thicknesses can also be employed.

A photoresist layer (not shown) can be applied over the contact level dielectric layer 80, and can be lithographically patterned to form openings in areas between clusters of memory stack structures (50, 60). The pattern in the photoresist layer can be transferred through the contact level dielectric layer 80, the at least one vertically alternating stack {(132, 142), (232, 242), (332, 342)} and/or the at least one retro-stepped dielectric material portion 65 employing an anisotropic etch to form backside trenches 79. In one embodiment, the etch stop semiconductor rail 316 can be employed as an etch stop structure during the anisotropic etch. Specifically, the chemistry of the anisotropic etch process can be selected such that the anisotropic etch is selective to the material of the etch stop semiconductor rail 316. For example, if the etch stop semiconductor rail 316 includes boron-doped semiconductor material such as boron-doped amorphous silicon, boron-doped polysilicon, or a boron-doped silicon-germanium alloy, a selectivity of an anisotropic etch process that employs a hydrofluorocarbon gas as an etchant and the boron-doped semiconductor material as a stopping material can be significantly increased compared to an anisotropic etch process that employs the same hydrofluorocarbon gas as an etchant and undoped semiconductor material as a stopping material. In other words, presence of boron in the etch stop structure (as embodied as the etch stop semiconductor rail 316) can significantly increase the effectiveness of the etch stop semiconductor rail 316 as an etch stop structure. In one embodiment, a portion of the top surface of the etch stop semiconductor rail 316 can be vertically recessed at a terminal portion of the anisotropic etch process, during which the etch stop semiconductor rail 316 functions as an etch stop structure providing high resistivity to the etch chemistry.

The backside trenches 79 vertically extend from the top surface of the contact level dielectric layer 80, through the third dielectric liner 217 and the second dielectric liner 115, and at least to the top surface of the sacrificial semiconductor rails 114. In one embodiment, the backside trenches 79 can laterally extend through the memory array region 100 and the contact region 300. The backside trenches 79 can be formed between clusters of memory stack structures (50, 60), and can laterally extend along a different horizontal direction than the sacrificial semiconductor rails 114. In one embodiment, the backside trenches 79 can laterally extend along the second horizontal direction hd2. The photoresist layer can be removed, for example, by ashing.

Figure 83:
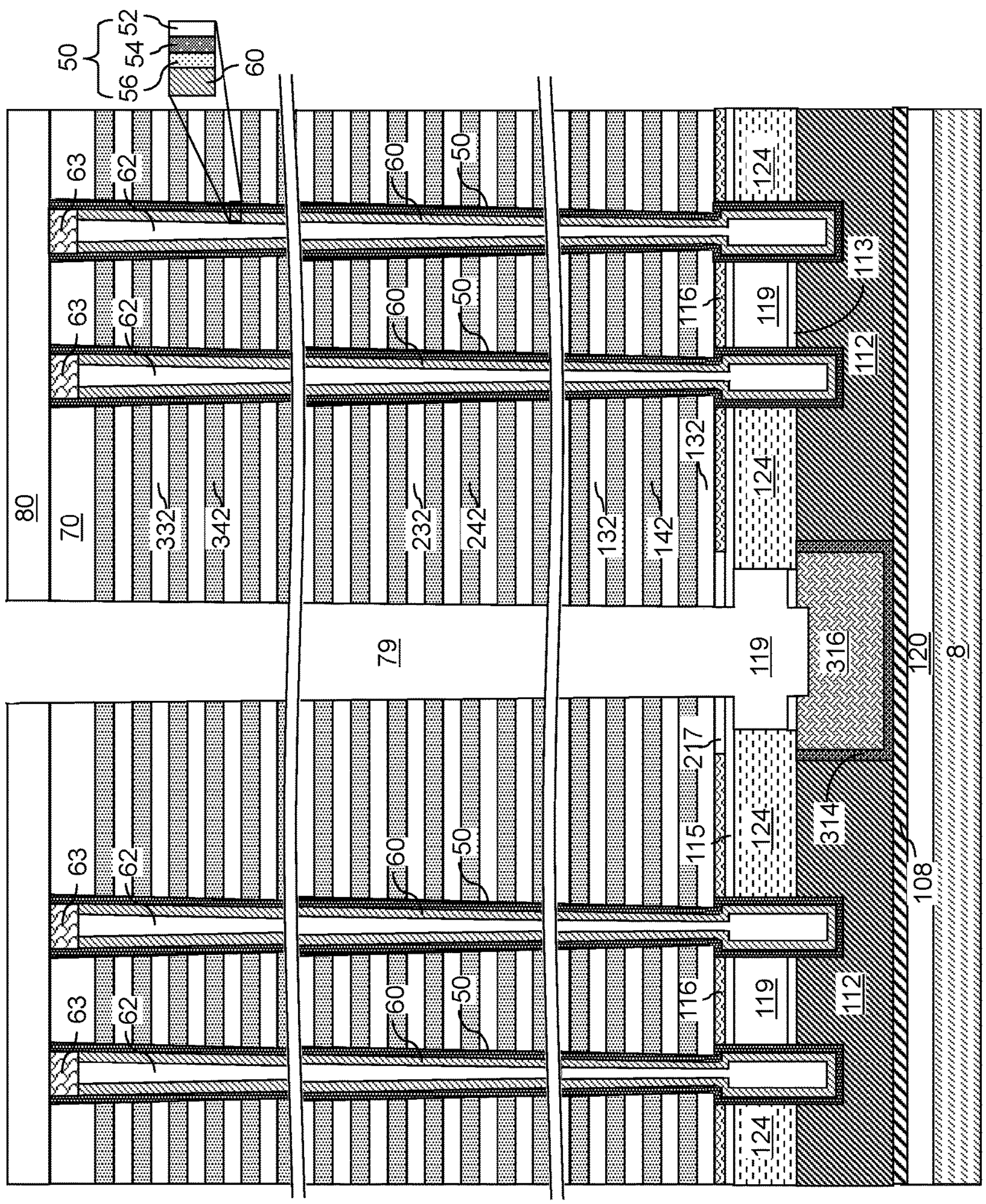

Referring to FIG. 83, a first isotropic etch process can be performed employing an etchant that etches the material of the sacrificial source rails 114 selective to the dielectric rails 124 and selective to the etch stop semiconductor rail 316. The etchant can be introduced through the backside trenches 79. In one embodiment, the etchant can be selected such that the etchant etches the semiconductor material of the sacrificial semiconductor rails 114 selective to the dielectric materials of the first dielectric liner 113, the second dielectric liner 115, the third dielectric liner 217, and the dielectric rails 124 and selective to the semiconductor material of the etch stop semiconductor rail 316. The etchant can be a liquid phase etchant applied in a wet etch process, or a gas phase etchant applied in a dry etch process. For example, if the sacrificial semiconductor rails 114 include undoped amorphous silicon (i.e., amorphous silicon deposited in the absence of any dopant gas flow) and if the etch stop semiconductor rail 316 includes boron-doped amorphous silicon, a wet etch process employing a trimethyl-2 hydroxyethyl ammonium hydroxide (TMY) solution may be employed to isotropically etch that sacrificial semiconductor rails 114 with minimal etching of the etch stop semiconductor rail 316. Source cavities 119 are formed by removal of the sacrificial semiconductor rails 114 in the first isotropic etch process.

Figure 84:
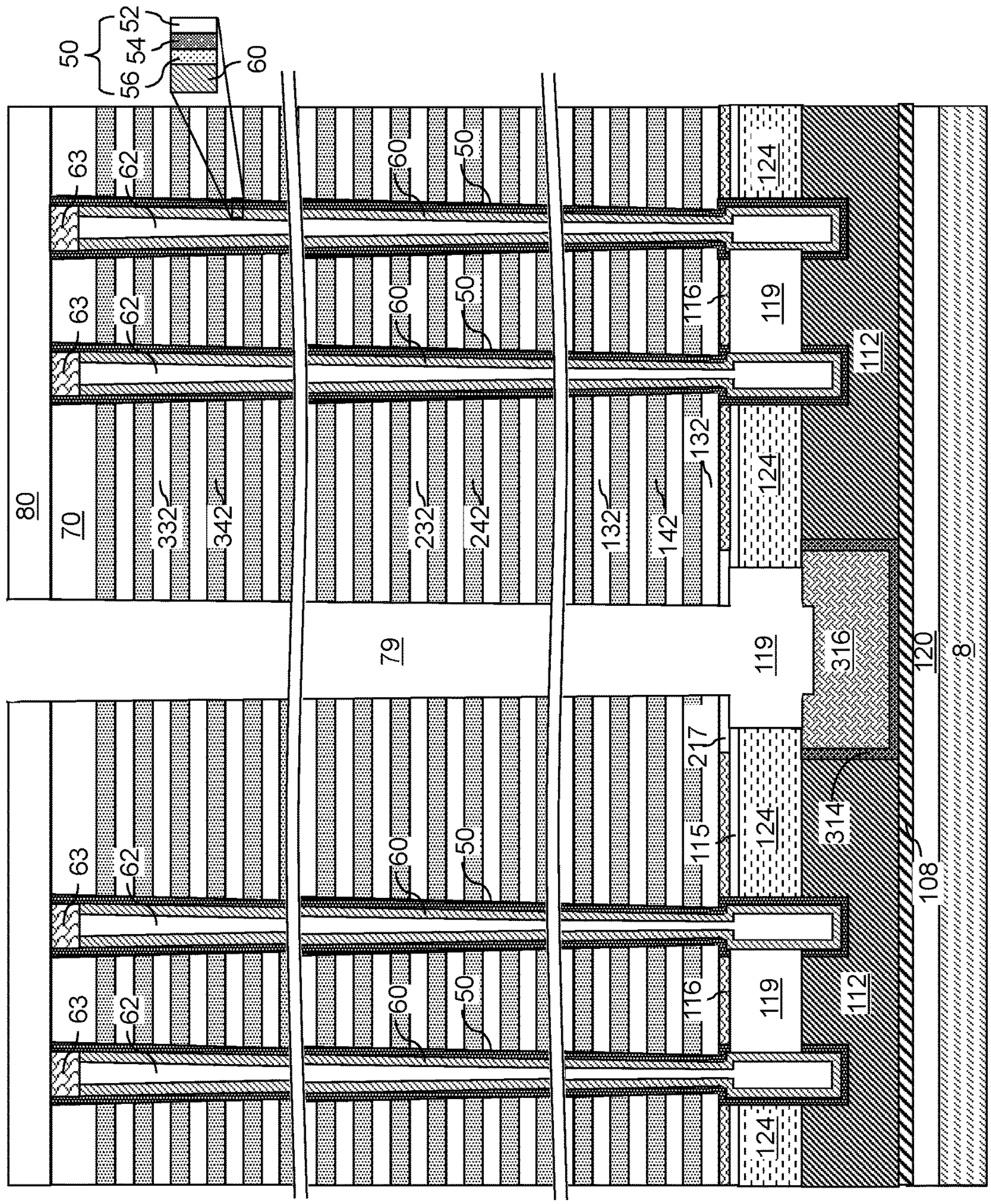

Referring to FIG. 84, a second isotropic etch process can be performed by introducing at least another etchant through the backside trenches 79 into the source cavities 119. The second isotropic etch process removes materials of the memory films 50 and the dielectric liners (113, 115, 217) selective to the cap semiconductor layer 116 and the semiconductor channels 60. Thus, the physically exposed portions of the memory films 50 adjacent to the source cavities 119 can be removed by the second isotropic etch process to physically expose outer sidewalls of the semiconductor channels 60 in the bulging portions of the memory stack structures (50, 60). Portions of the memory films 50 that are adjacent to the sacrificial semiconductor rails 114 at the processing steps of FIG. 82 are removed to form a lateral opening through each memory film 50. In an illustrative example, a wet etch employing hydrofluoric acid can be employed for the second isotropic etch process. The source cavities 119 can be expanded in volume by removal of the physically exposed portions of the memory films 50 and the portions of the dielectric liners (113, 115) that overlie or underlie the source cavities 119. Thus, the source cavities 119 are formed by removing the sacrificial semiconductor rails 114 and portions of each memory film 50 adjacent to the sacrificial semiconductor rails 114.

Figure 85:
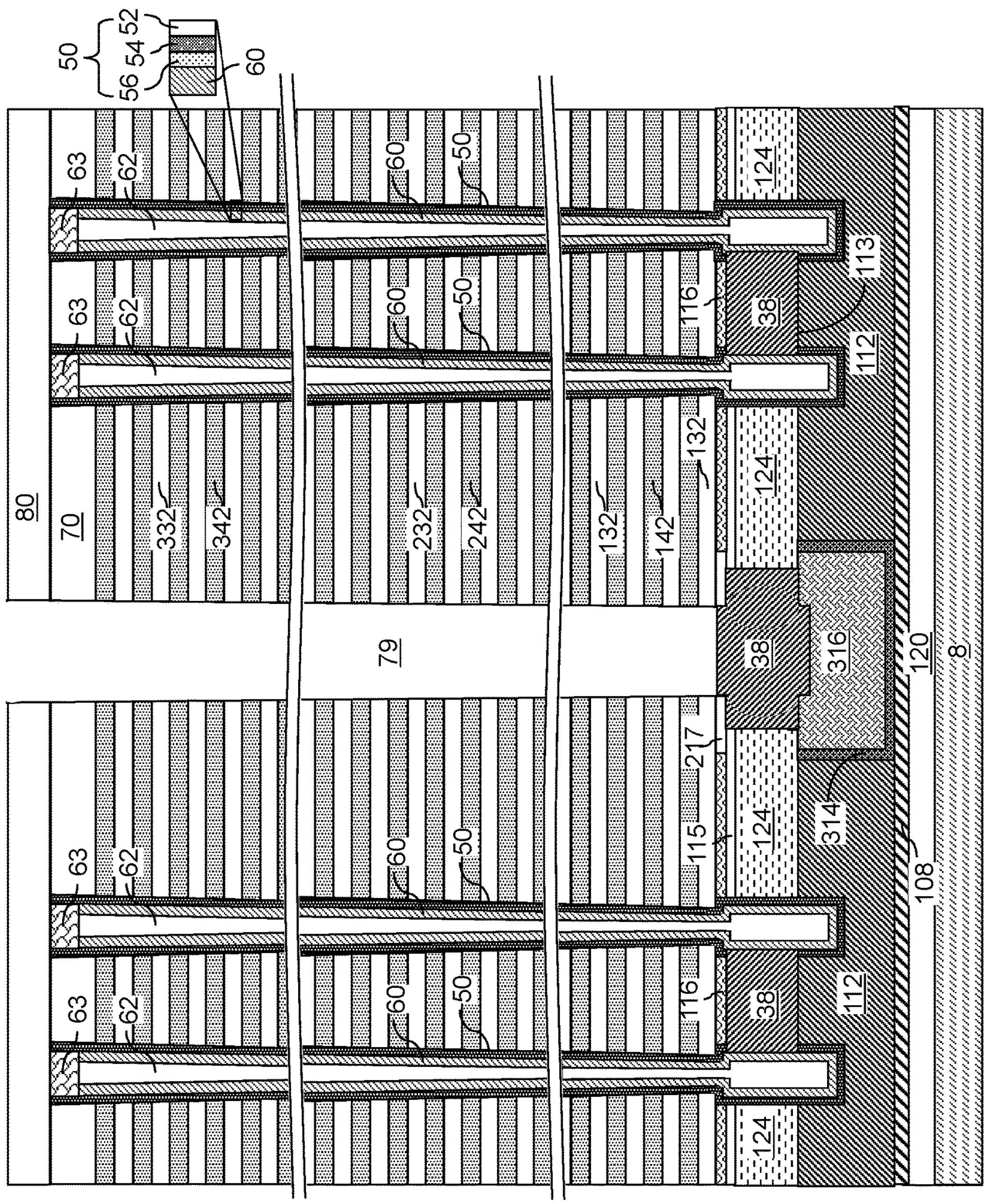

Referring to FIG. 85, the processing steps of FIG. 20 can be performed to form source strap rails 38 in the source cavities 119. The source strap rails 38 can be formed directly on the semiconductor channels 60, the physically exposed top surfaces of the source semiconductor layer 112, and the physically exposed bottom surfaces of the cap semiconductor layer 116. The doped semiconductor material can have the same conductivity type as the conductivity type of the source semiconductor layer 112. For example, if the source semiconductor layer 112 includes an n-doped semiconductor material, the source strap rails 38 can include an n-doped semiconductor material. The source strap rails 38 are formed directly on the outer sidewalls of the semiconductor channels 60, portions of the top surface of the source conductive layer 112 that do not contact the dielectric rails 124, and portions of the bottom surface of the cap semiconductor layer 116 that do not contact the dielectric rails 124. The source strap rails 38 can laterally extend along the first horizontal direction hd1, and can contact a respective subset of the semiconductor channels 60 of the memory stack structures (50, 60) at a level of the bulging portion of each memory stack structure (50, 60). The source strap rails 38 provide electrically conductive paths between the source semiconductor layer 112 and bottom sidewall portions of the semiconductor channels 60. A p-n junction can be formed between the etch stop semiconductor rail 316 and the source strap rails 38.

In one embodiment, the source semiconductor layer 112 can include a first n-doped semiconductor material (such as n-doped silicon having a first concentration of n-type dopants), the source strap rails 38 can include a second n-doped semiconductor material (such as n-doped silicon having a second concentration of n-type dopants that may, or may not, be the same as the first concentration), and the etch stop semiconductor rail 316 can include a p-doped semiconductor material (such as a boron-doped semiconductor material).

Figure 86A:
Figure 86B:
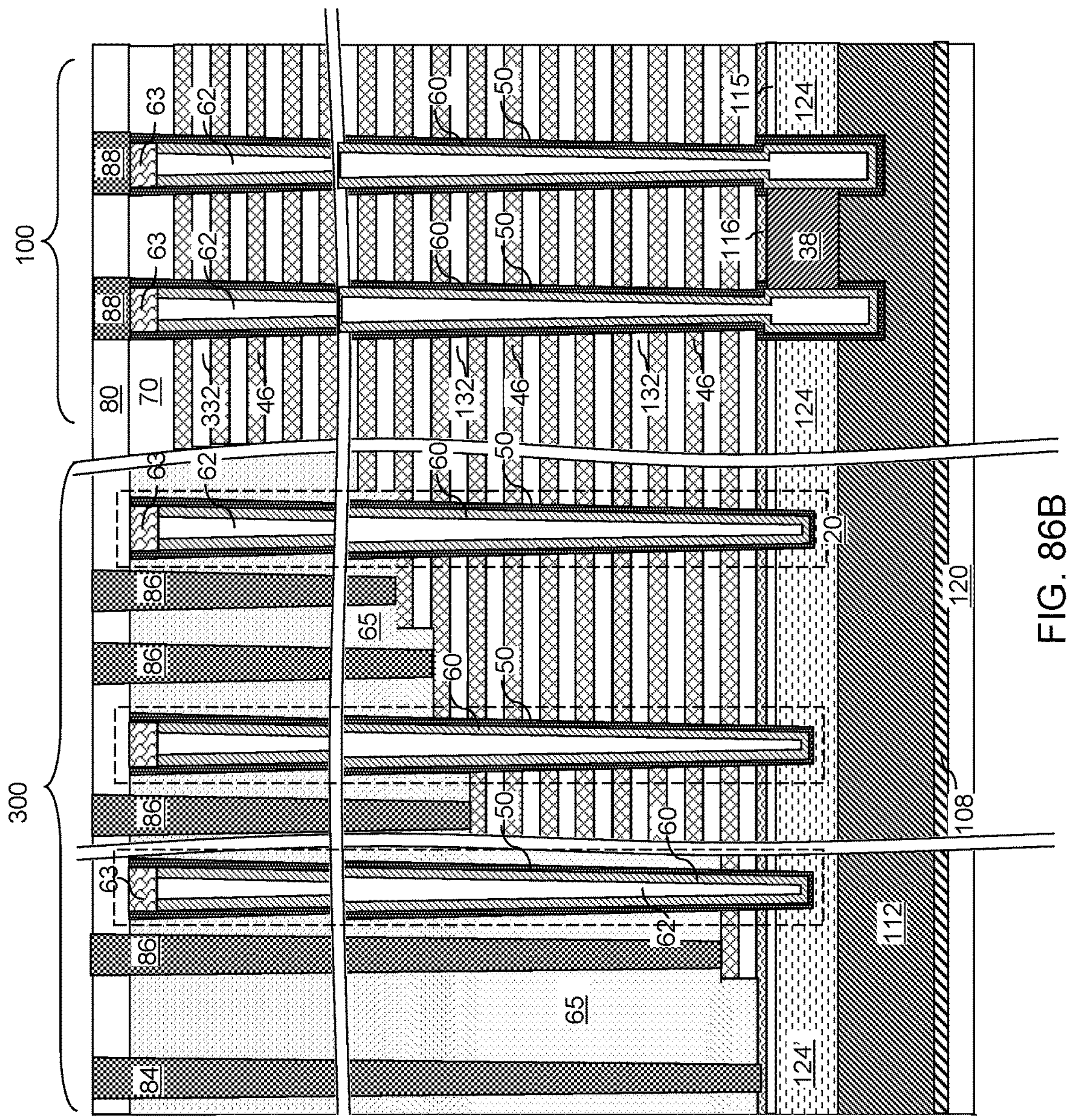

Referring to FIGS. 86A and 86B, the processing steps of FIGS. 22, 23, and 24A-24C can be performed to replace the sacrificial material layers (142, 242, 342) with electrically conductive layers 46, to form an insulating wall structure 76, and to form various contact via structures.

The sixth exemplary structure can include a three-dimensional memory device. The three-dimensional memory device includes: a vertically alternating stack of electrically conductive layers 46 and insulating layers (132, 232, 332) located over a source semiconductor layer 112 over a substrate 8; an array of memory stack structures (50, 60) that extend through the vertically alternating stack (132, 232, 332, 46) and into an upper portion of the source semiconductor layer 112, each memory stack structure (50, 60) including a semiconductor channel 60 and a memory film 50 laterally surrounding the semiconductor channel 60, wherein a lower portion of each memory stack structure (50, 60) has a bulging portion that has a greater lateral dimension than an overlying portion of the respective memory stack structure (50, 60) that adjoins a top end of the bulging portion; and source strap rails 38 laterally extending along a first horizontal direction hd1 and contacting a respective subset of the semiconductor channels of 60 the memory stack structures (50, 60) at a level of the bulging portion of each memory stack structure (50, 60).

In one embodiment, the memory film 50 of each memory stack structure (50, 60) can include a lateral opening through which a respective source strap rail 38 extends to provide physical contact between a respective semiconductor channel 60 and the respective source strap rail 38. In one embodiment, dielectric rails 124 can be located between neighboring pairs of the source strap rails 38, wherein the memory film 50 of each memory stack structure (50, 60) contacts a sidewall of a respective one of the dielectric rails 124. In one embodiment, the source strap rails 38 contact a respective portion of a planar top surface of the source semiconductor layer 112, and the source strap rails 38 comprise a doped semiconductor material having a doping of a same conductivity type as the source semiconductor layer 112.

An insulating wall structure 76 can be provided, which vertically extends through each of the at least one vertically alternating stack (132, 232, 332, 46) and laterally extends along a second horizontal direction hd2 that is different from the first horizontal direction hd1 and straddles each of the source strap rails 38. The etch stop semiconductor rail 316 can extend through an entire thickness of the source semiconductor layer 112, and can underlie the insulating wall structure 76 and laterally extend along the same horizontal direction as the insulating wall structure. The source strap rails 38 can contact a top surface of, and straddle, the etch stop semiconductor rail 316. A p-n junction can be provided between the etch stop semiconductor rail 316 and the source strap rails 38.

Figure 87:
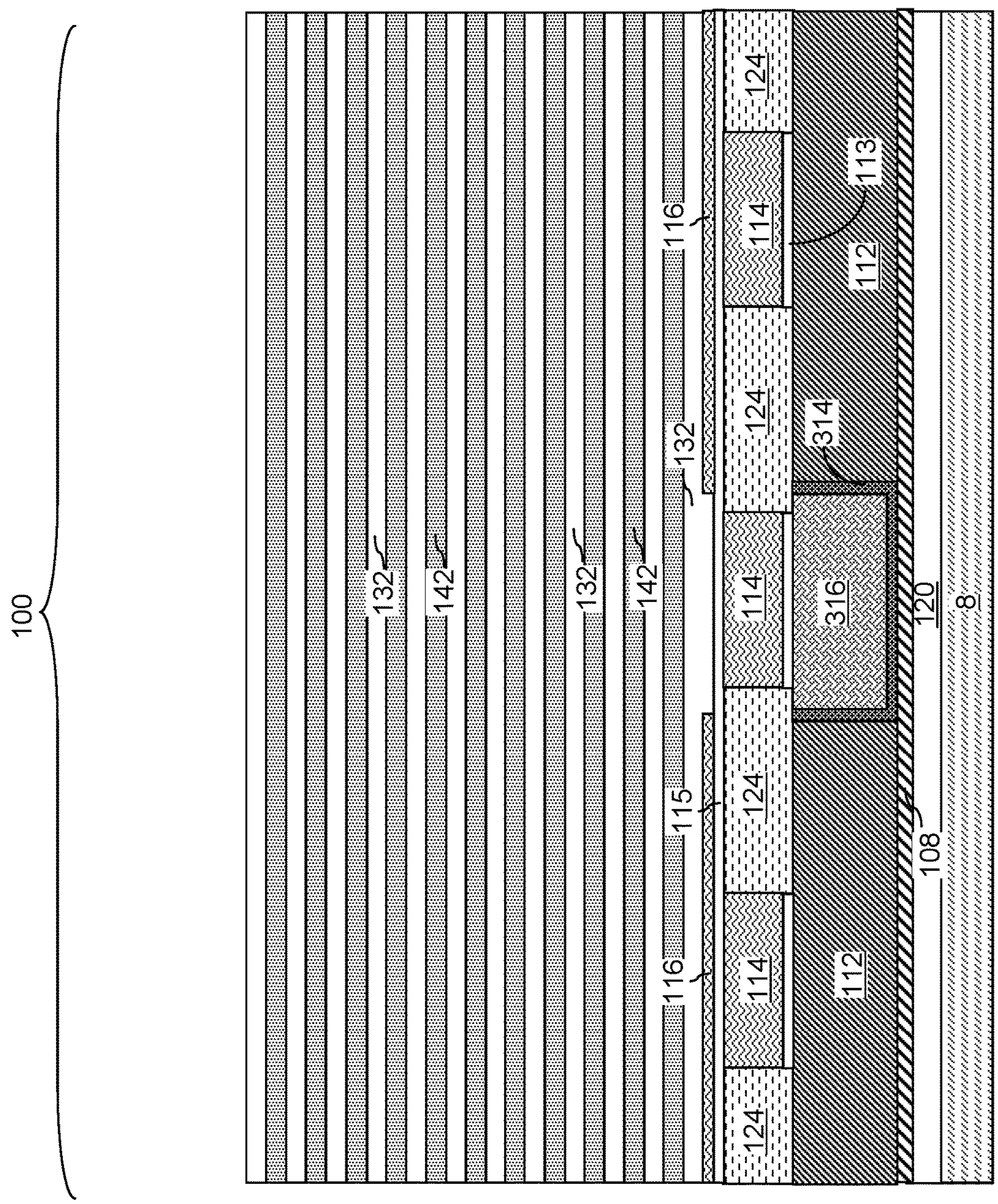

Referring to FIG. 87, a seventh exemplary structure according to the seventh embodiment of the present disclosure can be derived from the sixth exemplary structure of FIGS. 71A and 71B by omitting the processing steps of FIGS. 72A, 72B, 73, and 74, and by performing the processing steps of FIG. 75.

Figure 88:
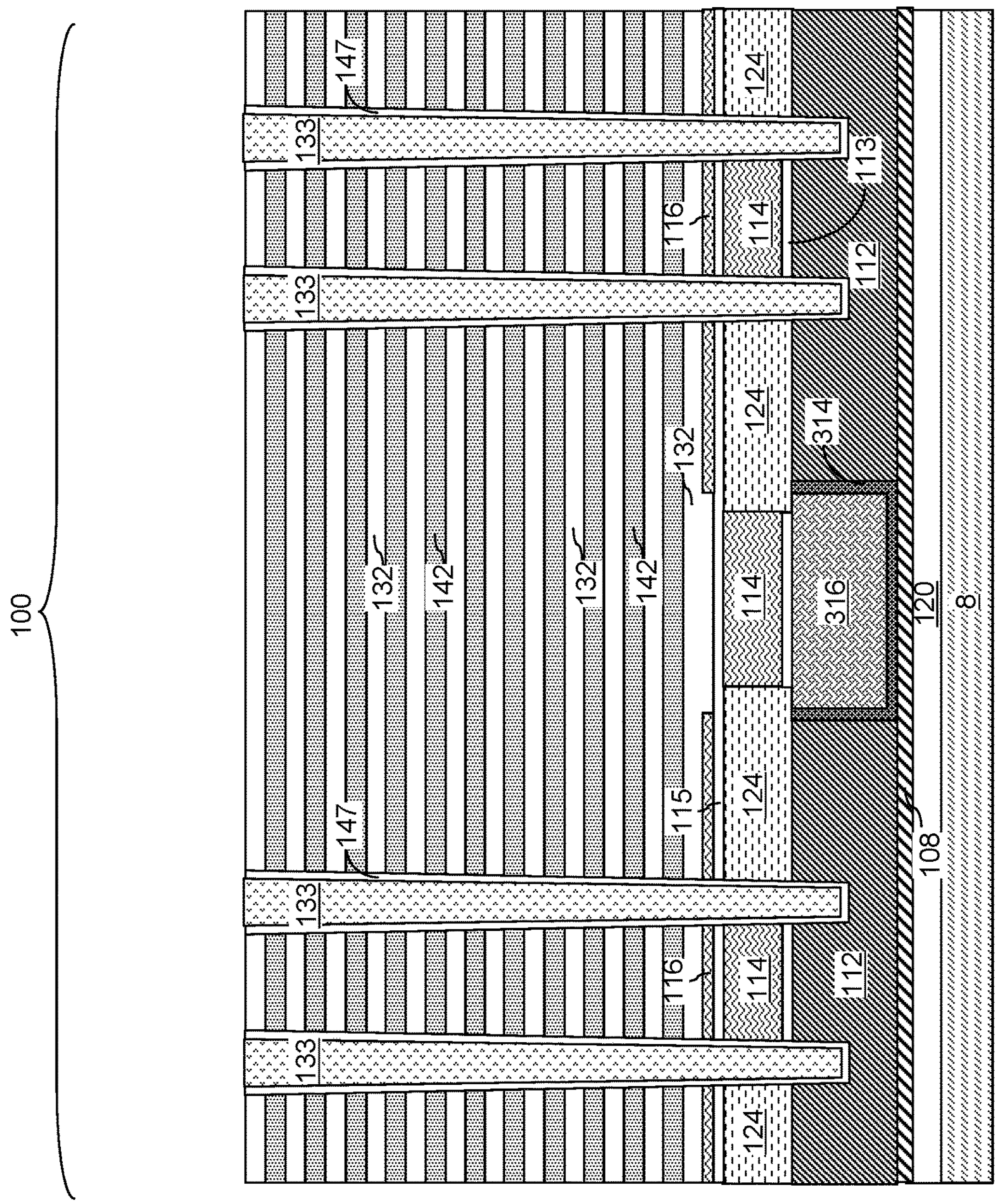

Referring to FIG. 88, the processing steps of FIGS. 76A and 76B can be performed to form first-tier memory openings 149. However, duration of the anisotropic etch and/or an endpoint detection method are modified to terminate the anisotropic etch process after the first-tier memory openings 149 extends through the laterally alternating stack (114, 124) and into an upper region of the source semiconductor layer 112 compared with the anisotropic etch process of FIGS. 76A and 76B because sacrificial semiconductor pedestals 118 are not employed in the seventh exemplary structure, and thus, cannot be employed as an etch stop structure.

The locations of the first-tier memory openings 149 can be selected such that each of the first-tier memory openings 149 can straddle an interface between a respective pair of a dielectric rail 124 and a sacrificial semiconductor rail 114. Thus, each first-tier memory opening 149 can include a sidewall of a respective one of the sacrificial semiconductor rails 114 and a sidewall of a respective one of the dielectric rails 124. In one embodiment, the first-tier memory openings 149 can include a plurality of two-dimensional array of first-tier memory openings 149 that are laterally spaced apart from one another by regions that do not include first-tier memory openings 149 as in the first exemplary structure. A two-dimensional array of first-tier memory openings 149 can be formed in the memory array region 100. A two-dimensional array of first-tier support openings can be formed in the contact region 300. The sidewalls of the first-tier memory openings can be tapered or substantially vertical. Subsequently, the processing steps of FIGS. 11 and 12 can be performed to form first-tier sacrificial liners 147 and first-tier sacrificial fill structures 133.

Figure 89:
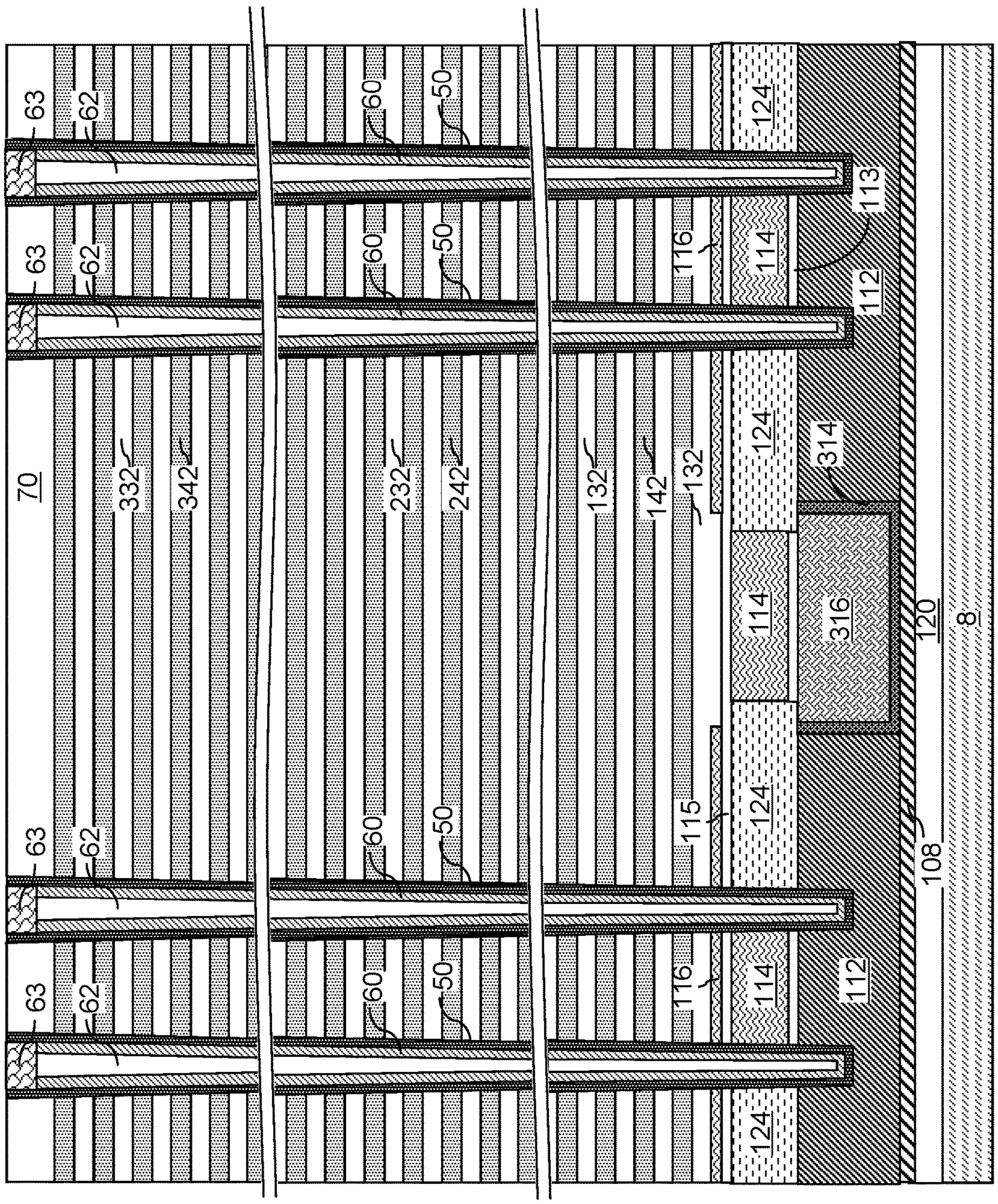

Referring to FIG. 89, the processing steps of FIG. 13 can be performed to form at least one intermediate-tier structure and a topmost-tier structure, and respective structures embedded therein. The processing steps of FIG. 14 can be performed thereafter to form memory openings 49. Each memory openings 49 is formed through the at least one vertically alternating stack {(132, 142), (232, 242), (332, 342)} and the laterally alternating stack (114, 124). Surfaces of each memory opening 49 include a sidewall of a respective sacrificial semiconductor rail 114 and a sidewall of a respective dielectric rail 124.

In one embodiment, each memory opening 49 can have a monotonically increasing lateral extent as a function of a vertical distance from the substrate 8 between a bottommost surface of a respective memory opening 49 and a bottommost spacer material layer (such as the bottommost first sacrificial material layer 142) within the at least one vertically alternating stack {(132, 142), (232, 242), (332, 342)}. As used herein, a "monotonically increasing" quantity as a function of a parameter refers to a quantity of which the value does not decrease, i.e., remains the same or increases, for any increase in the value of the parameter. In one embodiment, each memory opening 49 can be tapered, and thus, have a strictly increasing lateral extent as a function of a vertical distance from the substrate 8 between a bottommost surface of a respective memory opening 49 and a bottommost spacer material layer (such as the bottommost first sacrificial material layer 142) within the at least one vertically alternating stack {(132, 142), (232, 242), (332, 342)}. As used herein, a "strictly increasing" quantity as a function of a parameter refers to a quantity of which the value does increases for any increase in the value of the parameter. Subsequently, the processing steps of FIG. 15 can be performed to form memory stack structures (50, 60), dielectric cores 62, and drain regions 63 within the memory openings 49.

Figure 90:
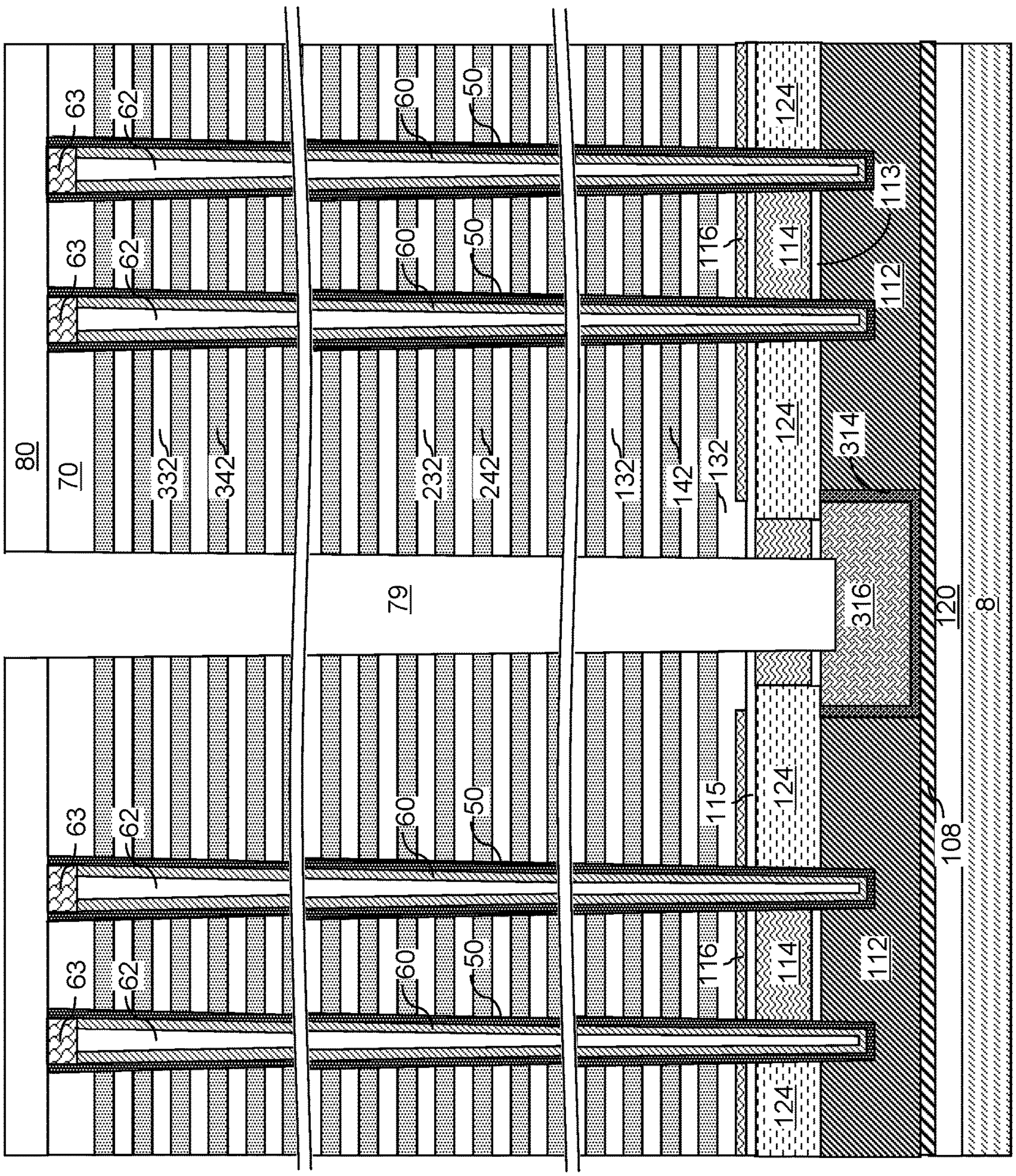

Referring to FIG. 90, the processing steps of FIG. 82 can be performed to form a contact level dielectric layer 80 and backside trenches 79.

Figure 91:
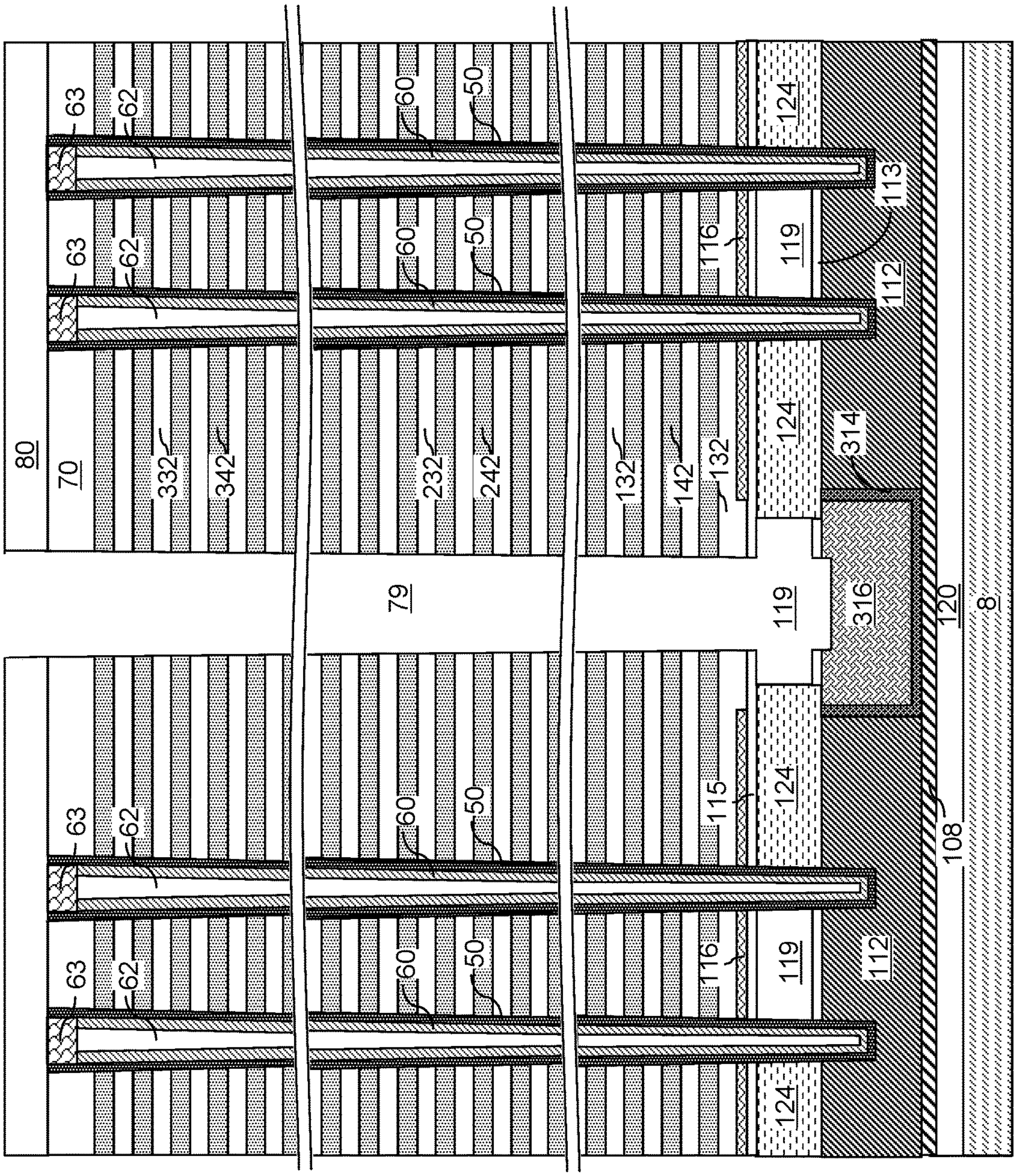

Referring to FIG. 91, the processing steps of FIG. 83 can be performed to form source cavities 119, i.e., to perform the first isotropic etch process that etches the material of the sacrificial source rails 114 selective to the dielectric materials of the first dielectric liner 113, the second dielectric liner 115, and the dielectric rails 124 and selective to the semiconductor material of the etch stop semiconductor rail 316.

Figure 92:
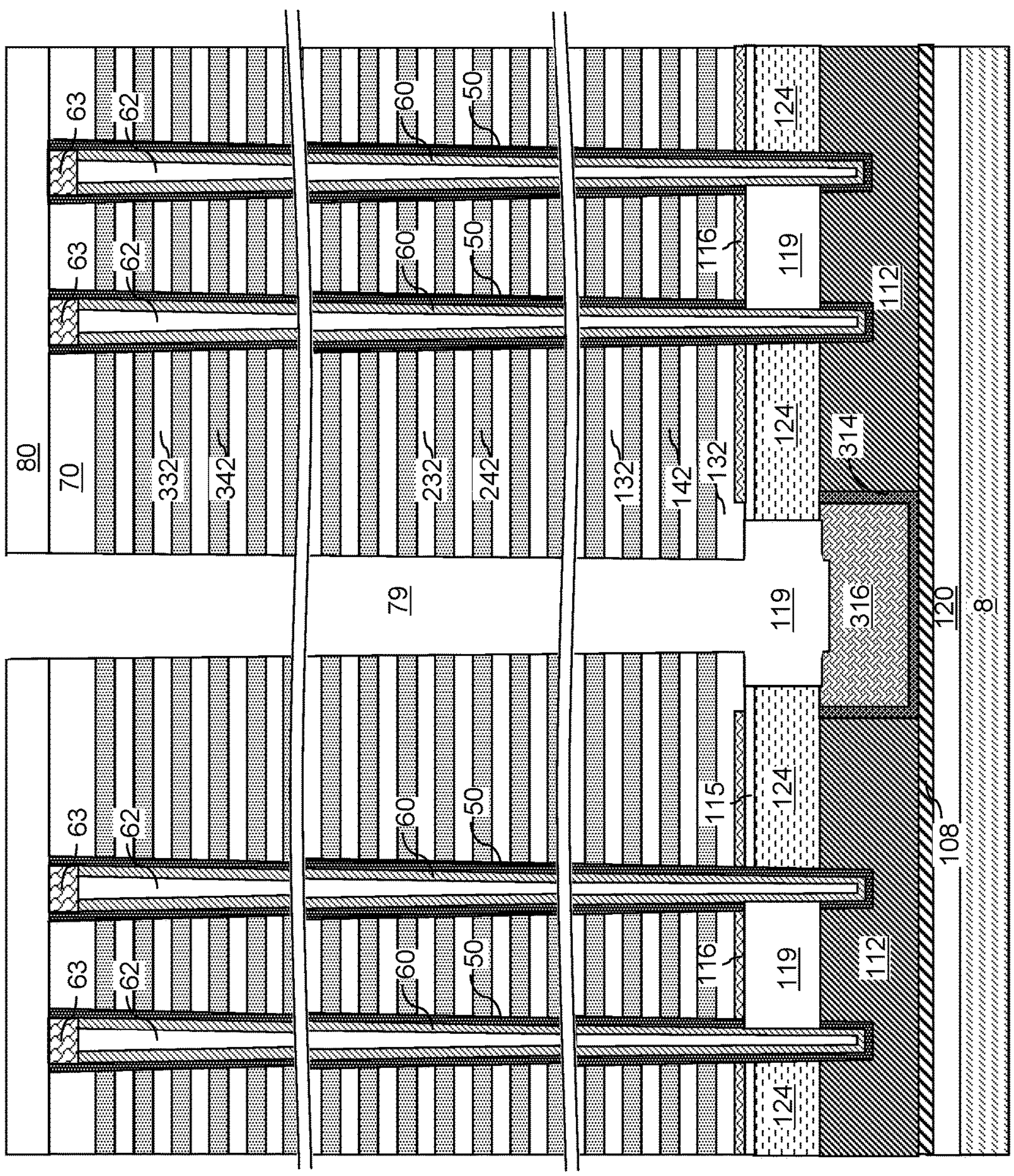

Referring to FIG. 92, the processing steps of FIG. 84 can be performed to expand the source cavities 119. A second isotropic etch process can be performed by introducing at least another etchant through the backside trenches 79 into the source cavities 119. Portions of the memory films 50 that are adjacent to the sacrificial semiconductor rails 114 at the processing steps of FIG. 90 are removed to form a lateral opening through each memory film 50. In an illustrative example, a wet etch employing hydrofluoric acid can be employed for the second isotropic etch process. The source cavities 119 can be expanded in volume by removal of the physically exposed portions of the memory films 50 and the portions of the dielectric liners (113, 115) that overlie or underlie the source cavities 119. Thus, the source cavities 119 are formed by removing the sacrificial semiconductor rails 114 and portions of each memory film 50 adjacent to the sacrificial semiconductor rails 114.

Referring to FIG. 93, the processing steps of FIG. 85 can be formed to form source strap rails 38 in the source cavities 119. The source strap rails 38 can be formed directly on the semiconductor channels 60, the physically exposed top surfaces of the source semiconductor layer 112, and the physically exposed bottom surfaces of the cap semiconductor layer 116. The doped semiconductor material can have the same conductivity type as the conductivity type of the source semiconductor layer 112. For example, if the source semiconductor layer 112 includes an n-doped semiconductor material, the source strap rails 38 can include an n-doped semiconductor material. The source strap rails 38 are formed directly on the outer sidewalls of the semiconductor channels 60, portions of the top surface of the source conductive layer 112 that do not contact the dielectric rails 124, and portions of the bottom surface of the cap semiconductor layer 116 that do not contact the dielectric rails 124. The source strap rails 38 can laterally extend along the first horizontal direction hd1, and can contact a respective subset of the semiconductor channels 60 of the memory stack structures (50, 60). The source strap rails 38 provide electrically conductive paths between the source semiconductor layer 112 and bottom sidewall portions of the semiconductor channels 60. A p-n junction can be formed between the etch stop semiconductor rail 316 and the source strap rails 38.

In one embodiment, the source semiconductor layer 112 can include a first n-doped semiconductor material (such as n-doped silicon having a first concentration of n-type dopants), the source strap rails 38 can include a second n-doped semiconductor material (such as n-doped silicon having a second concentration of n-type dopants that may, or may not, be the same as the first concentration), and the etch stop semiconductor rail 316 can include a p-doped semiconductor material (such as a boron-doped semiconductor material).

Referring to FIG. 94, the processing steps of FIGS. 86A and 86B can be performed to replace the sacrificial material layers (142, 242, 342) with electrically conductive layers 46, to form an insulating wall structure 76, and to form various contact via structures.

Each of the sixth and seventh exemplary structures can include a three-dimensional memory device. The three-dimensional memory device can include: a source semiconductor layer 112 located over a substrate 8; an etch stop semiconductor rail 316 located in a trench in the source semiconductor layer 112; a laterally alternating stack (38, 124) of source strap rails 38 and dielectric rails 124 located over the source semiconductor layer 112 and the etch stop semiconductor rail 316 and having a different composition than the etch stop semiconductor rail 316, wherein each of the source strap rails 38 and the dielectric rails 124 laterally extends along a first horizontal direction hd1, the etch stop semiconductor rail 316 laterally extends along a second horizontal direction hd2, and the source strap rails 38 straddle the etch stop semiconductor rail 316; a vertically alternating stack of electrically conductive layers 46 and insulating layers (132, 232, 332) located over the laterally alternating stack (38, 124) of the source strap rails 38 and the dielectric rails 124; and an array of memory stack structures (50, 60) that extend through the vertically alternating stack (132, 232, 332, 46) and into an upper portion of the source semiconductor layer 112, each memory stack structure (50, 60) including a semiconductor channel 60 and a memory film 50 laterally surrounding the semiconductor channel 60 and including an opening through which a respective one of the source strap rails 38 contacts the semiconductor channel 60.

In one embodiment, a diffusion barrier dielectric liner 314 can be provided, which includes vertical portions that laterally separate the etch stop semiconductor rail 316 from the source semiconductor layer 112 and a horizontal portion that underlies the etch stop semiconductor rail 316. In one embodiment, a bottom surface of the diffusion barrier dielectric liner 314 can be within a same horizontal plane as a bottom surface of the source semiconductor layer 112.

In one embodiment, the source semiconductor layer 112 comprises a first n-doped semiconductor material; the source strap rails 38 comprise a second n-doped semiconductor material; and the etch stop semiconductor rail 316 comprises a p-doped semiconductor material such as boron-doped amorphous silicon, boron-doped polysilicon, or a boron-doped silicon-germanium alloy.

In one embodiment, a backside trench 79 can vertically extend through the vertically alternating stack (132, 232, 332, 46), can overlie the etch stop semiconductor rail 316, and can laterally extend along the second horizontal direction hd2. In one embodiment, an insulating wall structure 76 can be located within the backside trench 79. In one embodiment, the source strap rails 38 contacts a recessed horizontal surface of the etch stop semiconductor rail 316.

In one embodiment, the three-dimensional memory device can include: a patterned dielectric liner (such as the second dielectric liner 115) overlying the dielectric rails 124; and a cap semiconductor layer 116 overlying the patterned dielectric liner 115, underlying the vertically alternating stack (132, 232, 332, 46), and contacting top surfaces of the source strap rails 38.

In one embodiment, a lower portion of each memory stack structure (50, 60) can have a bulging portion that has a greater lateral dimension than an overlying portion of the respective memory stack structure (50, 60) that adjoins a top end of the bulging portion, and source strap rails 38 contact semiconductor channels 60 of the memory stack structures (50, 60) at a level of the bulging portion of each memory stack structure (50, 60) as illustrated in the sixth exemplary structure. A cap semiconductor layer 116 can overlie the laterally alternating stack (38, 124) and underlie the vertically alternating stack (132, 232, 332, 46). A top surface of the bulging portion can be within a same horizontal plane as a top surface of the cap semiconductor layer 116.

In one embodiment, each of the memory stack structures (50, 60) can be located within a respective memory opening 49 having a monotonically increasing lateral extent as a function of a vertical distance from the substrate 8 between a bottommost surface of a respective memory stack structure (50, 60) and a bottommost electrically conductive layer 46 within the vertically alternating stack (132, 232, 332, 46) as illustrated in the seventh exemplary structure.

Each of the exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate 8 can comprise a silicon substrate. The vertical NAND memory device can comprise an array of monolithic three-dimensional NAND strings over the silicon substrate. At least one memory cell (containing a portion of a charge storage layer 54 at a level of an electrically conductive layer 46) in a first device level of the array of monolithic three-dimensional NAND strings can be located over another memory cell (containing another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. For example, the semiconductor devices 210 (illustrated in FIG. 1) can be employed as the integrated circuit including the driver circuit. The electrically conductive layers 46 can comprise a plurality of control gate electrodes having a strip shape extending substantially parallel to the top surface of the substrate 8, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion of each of the plurality of semiconductor channels 60 extends substantially perpendicular to a top surface of the substrate 8; and a plurality of charge storage elements (as embodied as charge trapping material portions). Each charge storage element can be located adjacent to a respective one of the plurality of semiconductor channels 60.

The various embodiments of the present disclosure can provide various advantages over prior art structures and methods, which include, but are not limited to, improved process stability for reliability providing an etch stop structure during formation of the backside trenches 79, increase in the structural stability during replacement of the sacrificial semiconductor rails 114 through use of dielectric bridges 174B and/or structural-reinforcement portion 178, reliable formation of source strap rails 38 with minimal collateral overetch during formation of the source cavities 119, increase in the contact area between the source strap rails 38 and the semiconductor channels 60, ease of optimization of gate induced drain leakage (GIDL) current at a lower portion of the semiconductor channels 60 that are controlled by source-select gate electrodes through the use of thickness-modulated source semiconductor layer 112.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of forming a three-dimensional memory device, comprising:

forming a source semiconductor layer over a substrate;

forming a line trench through the source conductive layer;

forming a etch stop semiconductor rail within the line trench;

forming a laterally alternating stack of dielectric rails and sacrificial semiconductor rails over the source conductive layer and the etch stop semiconductor rail;

forming a vertically alternating stack of insulating layers and spacer material layers over the laterally alternating stack, wherein the spacer material layers are formed as, or are subsequently replaced with, electrically conductive layers;

forming memory stack structures through the vertically alternating stack and the laterally alternating stack, each memory stack structure including a semiconductor channel and a memory film laterally surrounding the semiconductor channel;

forming a backside trench through the vertically alternating stack and the laterally alternating stack by an anisotropic etch process that employs the etch stop semiconductor rail as an etch stop structure;

forming source cavities by removing the sacrificial semiconductor rails and portions of each memory film adjacent to the sacrificial semiconductor rails; and forming source strap rails in the source cavities and directly on sidewalls of the semiconductor channels.

2. The method of claim 1, further comprising forming a diffusion barrier dielectric liner in the line trench, wherein the etch stop semiconductor rail is formed within the diffusion barrier dielectric liner.

3. The method of claim 1, wherein:

the line trench extends through an entire thickness of the source semiconductor layer;

the etch stop semiconductor rail is formed by deposition and planarization of a doped semiconductor material; and a top surface of the etch stop semiconductor rail is within a same horizontal plane as a top surface of the source semiconductor layer.

4. The method of claim 1, wherein:

the source semiconductor layer comprises a first n-doped semiconductor material;

the source strap rails comprise a second n-doped semiconductor material; and the etch stop semiconductor rail comprises a p-doped semiconductor material.

5. The method of claim 1, wherein:

each of the dielectric rails and the sacrificial semiconductor rails laterally extend along a first horizontal direction;

the etch stop semiconductor rail extends along a second horizontal direction that is different from the first horizontal direction.

6. The method of claim 1, further comprising forming an insulating wall structure within the backside trench after formation of the source strap rails.

7. The method of claim 1, further comprising:

forming a dielectric liner over the laterally alternating stack; and forming a cap semiconductor layer over the dielectric liner, wherein:

the vertically alternating stack is formed over the cap semiconductor layer;

portions of the dielectric liner overlying the sacrificial semiconductor rails is removed after removal of the sacrificial semiconductor rails; and the source strap rails are formed on a bottom surface of the cap semiconductor layer.

8. The method of claim 1, further comprising:

forming source-level memory openings within the laterally alternating stack of the dielectric rails and the sacrificial semiconductor rails;

forming sacrificial semiconductor pedestals within the source-level memory openings; and forming memory openings through the vertically alternating stack by etching through the vertically alternating stack and by removing the sacrificial semiconductor pedestals, wherein each of the memory openings includes a volume of a respective one of the sacrificial semiconductor pedestals, wherein memory stack structures are formed in the memory openings.

9. The method of claim 8, wherein:

a lower portion of each memory stack structure including a volume of a respective sacrificial semiconductor pedestal has a bulging portion that has a greater lateral dimension than an overlying portion of the respective memory stack structure that adjoins a top end of the bulging portion; and the source strap rails contact the semiconductor channels of the memory stack structures at a level of the bulging portion of each memory stack structure.

10. The method of claim 1, further comprising forming memory openings through the vertically alternating stack and the laterally alternating stack, wherein:

surfaces of each memory opening include a sidewall of a respective sacrificial semiconductor rail and a sidewall of a respective dielectric rail; and each memory opening has a monotonically increasing lateral extent as a function of a vertical distance from the substrate between a bottommost surface of a respective memory opening and a bottommost spacer material layer within the vertically alternating stack.

* * * * *